United States Patent
Kawakami et al.

(10) Patent No.: US 7,879,464 B2
(45) Date of Patent: Feb. 1, 2011

(54) ANTHRACENE DERIVATIVE, MATERIAL FOR LIGHT EMITTING ELEMENT, LIGHT EMITTING ELEMENT, LIGHT EMITTING DEVICE, AND ELECTRONIC APPLIANCE

(75) Inventors: Sachiko Kawakami, Kanagawa (JP); Harue Nakashima, Kanagawa (JP); Kumi Kojima, Tokyo (JP); Ryoji Nomura, Kanagawa (JP); Nobuharu Ohsawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 365 days.

(21) Appl. No.: 11/996,051

(22) PCT Filed: Jul. 20, 2006

(86) PCT No.: PCT/JP2006/314823
§ 371 (c)(1),
(2), (4) Date: Jan. 17, 2008

(87) PCT Pub. No.: WO2007/013537
PCT Pub. Date: Feb. 1, 2007

(65) Prior Publication Data
US 2009/0102360 A1  Apr. 23, 2009

(30) Foreign Application Priority Data
Jul. 27, 2005  (JP) ............... 2005-216971

(51) Int. Cl.
*H01L 51/50*  (2006.01)

(52) U.S. Cl. ............. 428/690; 313/504; 548/444

(58) Field of Classification Search ............... None
See application file for complete search history.

(56) References Cited

U.S. PATENT DOCUMENTS

| 5,811,834 | A | 9/1998 | Tamano et al. |
| 6,743,948 | B1 | 6/2004 | Hosokawa et al. |
| 6,951,693 | B2 | 10/2005 | Hosokawa et al. |
| 2004/0161632 | A1* | 8/2004 | Seo et al. ............... 428/690 |
| 2004/0161633 | A1 | 8/2004 | Seo et al. |
| 2005/0038296 | A1 | 2/2005 | Hosokawa et al. |
| 2005/0225235 | A1 | 10/2005 | Kim et al. |
| 2006/0068221 | A1 | 3/2006 | Saitoh et al. |
| 2006/0189828 | A1 | 8/2006 | Hosokawa et al. |
| 2008/0114178 | A1 | 5/2008 | Kawakami et al. |
| 2009/0058261 | A1 | 3/2009 | Kawakami et al. |

FOREIGN PATENT DOCUMENTS

| JP | 09-157643 | 6/1997 |
| JP | 09-249876 A | 9/1997 |
| JP | 2001-131541 | 5/2001 |
| JP | 2003-031371 A | 1/2003 |
| JP | 2004-103467 | 4/2004 |
| JP | 2004-178896 | 6/2004 |
| WO | WO 03/050201 A1 | 6/2003 |
| WO | WO 2004/075603 A2 | 9/2004 |
| WO | WO 2005/090512 A1 | 9/2005 |
| WO | WO 2006/070897 A1 | 7/2006 |

OTHER PUBLICATIONS

Manifar et al., Measurement . . . of Solubility . . . Arylamine, 2005, J. Chem. Eng. Data, vol. 50, p. 1794-1800.*
Getautis et. al., Influence of methyl substitution in phenylenediamine . . . , 2000, J. Prakt. Chem 342, No. 1, p. 58-62.*
Andrew Kung et al.; "Diphenylnitrenium Ion: Cyclization, Electron Transfer, and Polymerization Reactions"; *Journal of Organic Chemistry*, vol. 70, No. 13, pp. 5283-5290 Mar. 24, 2005.
International Search Report (Application No. PCT/JP2006/314823) dated Sep. 26, 2006 (2 pages).
Written Opinion (Application No. PCT/JP2006/314823) dated Sep. 26, 2006 (3 pages).

Catalog—*Chemicals for Xerography and OLED Fine Chemicals Custom Synthesis*; p. 77; 2003.

* cited by examiner

*Primary Examiner*—D. Lawrence Tarazano
*Assistant Examiner*—Gregory Clark
(74) *Attorney, Agent, or Firm*—Fish & Richardson P.C.

(57) ABSTRACT

The present invention provides an anthracene derivative represented by the following general formula (1). In the general formula (1), R1 and R2 individually represent hydrogen or an alkyl group having 1 to 4 carbon atoms, and at least one of R1 and R2 is hydrogen. Further, R3 represents an aryl group having 6 to 15 carbon atoms. R4 represents hydrogen, an alkyl group having 1 to 4 carbon atoms, or an aryl group having 6 to 15 carbon atoms. R5 represents hydrogen, an alkyl group having 1 to 4 carbon atoms, or an aryl group having 6 to 15 carbon atoms. R6 represents an aryl group having 6 to 15 carbon atoms. X1 represents an arylene group having 6 to 15 carbon atoms. General formula (1) is inserted.

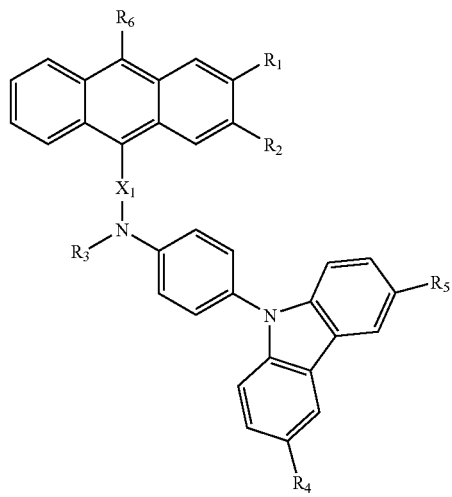

10 Claims, 23 Drawing Sheets

ANTHRACENE DERIVATIVE, MATERIAL FOR LIGHT EMITTING ELEMENT, LIGHT EMITTING ELEMENT, LIGHT EMITTING DEVICE, AND ELECTRONIC APPLIANCE

TECHNICAL FIELD

The present invention relates to a light emitting material and a light emitting element using the light emitting material. Moreover, the present invention relates to a light emitting device having such a light emitting element.

BACKGROUND ART

A light emitting element formed using a light emitting material has characteristics of being thin, lightweight, high-speed response, direct current low voltage drive, and the like. Therefore, there are high expectations for its application in next generation flat panel displays. Further, since a light emitting device in which light emitting elements are arranged in a matrix form has a wider viewing angle as compared with a conventional liquid crystal display device, the light emitting device has excellent visibility.

A light emitting mechanism of a light emitting element is shown below. Upon applying voltage to a light emitting layer interposed between a pair of electrodes, electrons injected from a cathode and holes injected from an anode are recombined at a center of light emission of the light emitting layer to generate molecular excitons. Then, since the molecular excitons emit light energy upon returning to a ground state, light emission is generated. As excited states, a singlet excited state and a triple excited state are known, and light emission can be generated through either the singlet excited state and the triplet excited state.

A light emission wavelength of a light emitting element is determined by a bandgap of a light emitting molecule contained in the light emitting element. Therefore, by adjusting structures of light emitting molecules, light emitting elements having various types of light emission colors can be obtained. Further, by using light emitting elements capable of emitting light with red, blue, and green, which are three primary colors of light, a full-color light emitting device can be manufactured.

In order to manufacture a full-color light emitting device having excellent color reproducibility, red, green, and blue light emitting elements each having high reliability along with excellent color purity are required. As a result of development of materials in recent years, as for red and green light emitting elements, high reliability and excellent color purity have been already achieved. However, as for a blue light emitting element, sufficient reliability and excellent color purity have not been achieved yet. In order to solve this problem, many researches have been done in a blue light emitting element (e.g., see patent document 1).

[Patent Document 1]: Japanese Patent Application Laid-Open No. 2003-31371

DISCLOSURE OF INVENTION

The present invention is made in view of the above problems. It is an object of the present invention to provide a new material providing excellent color purity as a blue color, a light emitting element using the material, and a light emitting device using the light emitting element.

Moreover, it is another object of the present invention to provide a new material with high reliability, a light emitting element using the new material, and a light emitting device using the light emitting element.

An anthracene derivative of the present invention is represented by the following general formula (1). Note that in the general formula (1), $R_1$ and $R_2$ individually represent hydrogen or an alkyl group having 1 to 4 carbon atoms. At least one of $R_1$ and $R_2$ is hydrogen. Further, $R_3$ represents an aryl group having 6 to 15 carbon atoms, and this aryl group may have an alkyl group having 1 to 4 carbon atoms. Furthermore, $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms. $R_6$ represents an aryl group having 6 to 15 carbon atoms, and this aryl group may have an alkyl group having 1 to 4 carbon atoms. $X_1$ represents an arylene group having 6 to 15 carbon atoms, and the arylene group may have an alkyl group having 1 to 4 carbon atoms.

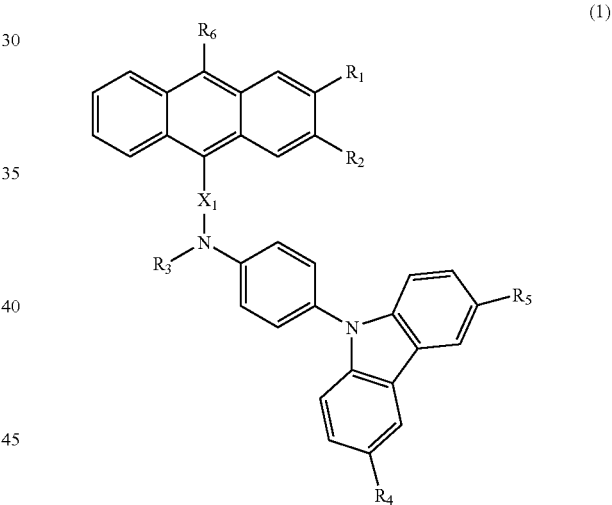

(1)

An anthracene derivative of the present invention is represented by the following general formula (2). Note that in the general formula (2), $R_1$ and $R_2$ individually represent hydrogen or an alkyl group having 1 to 4 carbon atoms. At least one of $R_1$ and $R_2$ is hydrogen. Further, $R_3$ represents an aryl group having 6 to 15 carbon atoms, and this aryl group may have an alkyl group having 1 to 4 carbon atoms. Furthermore, $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms. Further, $R_7$ to $R_{11}$ individually represent hydrogen, an alkyl group having 1 to 4 carbon atoms, or a phenyl group. $R_{12}$ to $R_{15}$ individually represent hydrogen or an alkyl group having 1 to 4 carbon atoms.

(2)

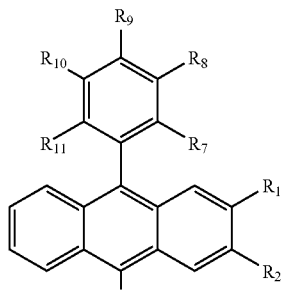

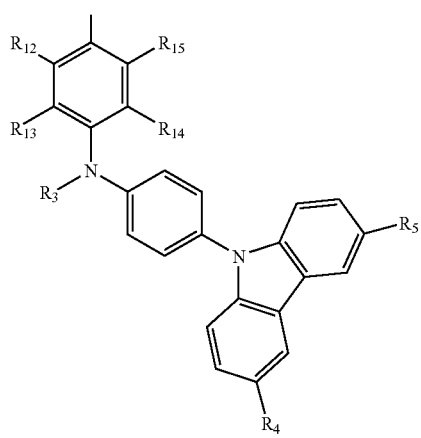

An anthracene derivative of the present invention is represented by the following general formula (3). Note that in the general formula (3), $R_1$ and $R_2$ individually represent hydrogen or an alkyl group having 1 to 4 carbon atoms. At least one of $R_1$ and $R_2$ is hydrogen. Further, $R_3$ represents an aryl group having 6 to 15 carbon atoms, and this aryl group may have an alkyl group having 1 to 4 carbon atoms. Furthermore, $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms.

(3)

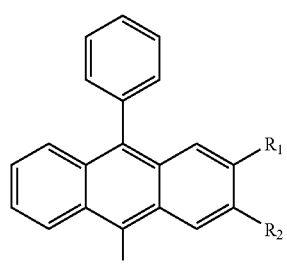

-continued

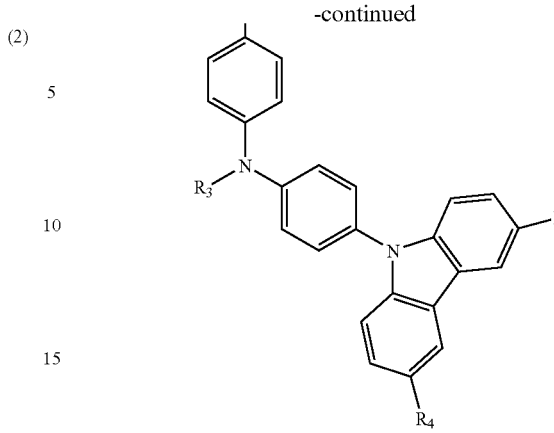

An anthracene derivative of the present invention is represented by the following general formula (4). Note that in the general formula (4), $R_3$ represents an aryl group having 6 to 15 carbon atoms, and this aryl group may have an alkyl group having 1 to 4 carbon atoms. Furthermore, $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms.

(4)

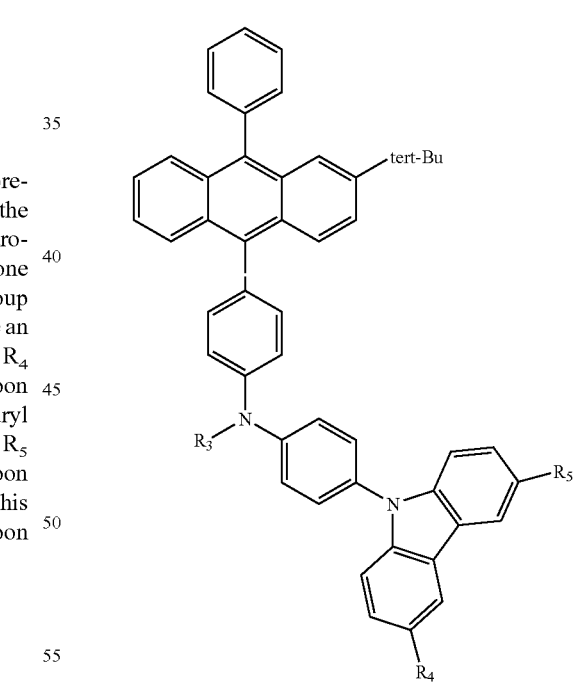

An anthracene derivative of the present invention is represented by the following general formula (5). Note that in the general formula (5), $R_3$ represents an aryl group having 6 to 15 carbon atoms, and this aryl group may have an alkyl group having 1 to 4 carbon atoms. Furthermore, $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms.

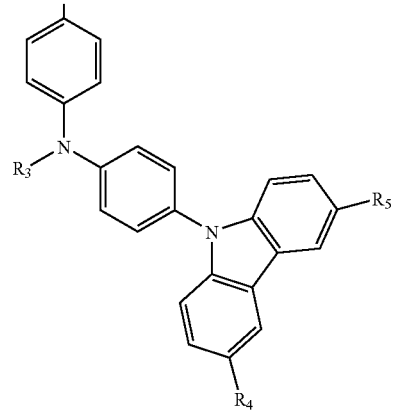

(5)

An anthracene derivative of the present invention is represented by the following general formula (6). Note that in the general formula (6), $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms.

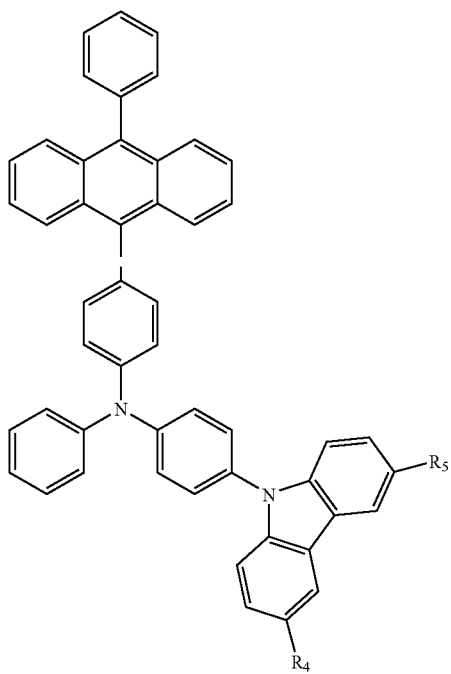

(6)

An anthracene derivative of the present invention is represented by the following general formula (7). Note that in the general formula (7), $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms.

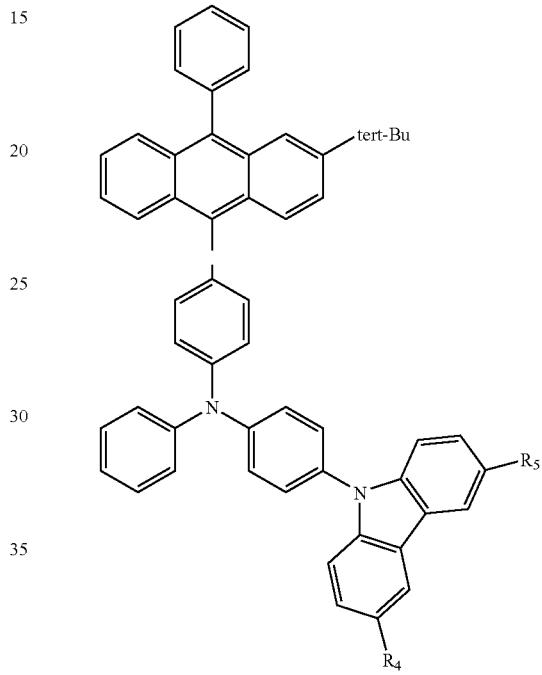

(7)

An anthracene derivative of the present invention is represented by the following general formula (8). Note that in the general formula (8), $R_4$ represents hydrogen, an alkyl group having 1 to 4 carbon atoms, or an aryl group having 6 to 15 carbon atoms. This aryl group may have an alkyl group having 1 to 4 carbon atoms. $R_5$ represents hydrogen, an alkyl group having 1 to 4 carbon atoms, or an aryl group having 6 to 15 carbon atoms, and this aryl group may have an alkyl group having 1 to 4 carbon atoms.

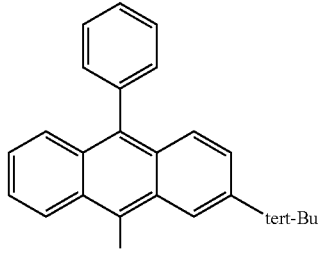

(8)

An anthracene derivative of the present invention is represented by the following structural formula (9).

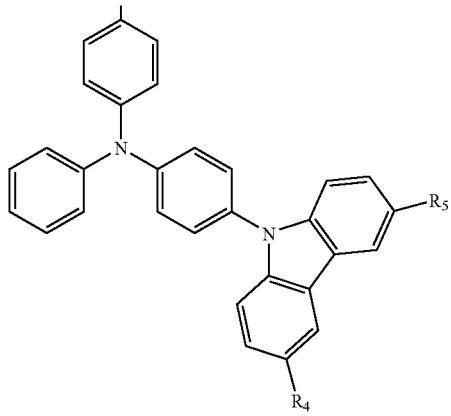

(9)

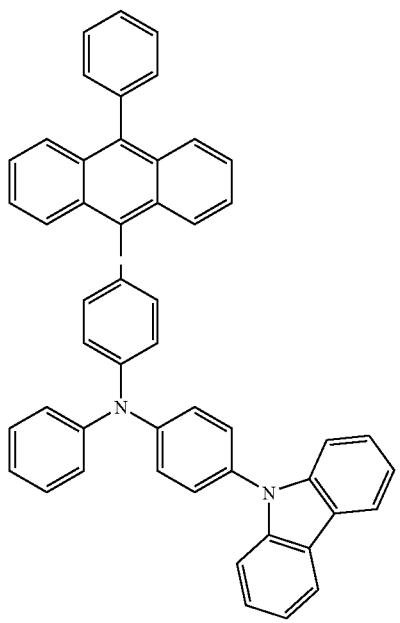

An anthracene derivative of the present invention is represented by the following structural formula (10).

(10)

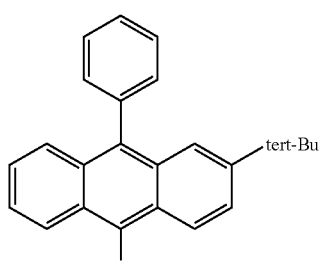

An anthracene derivative of the present invention is represented by the following structural formula (10).

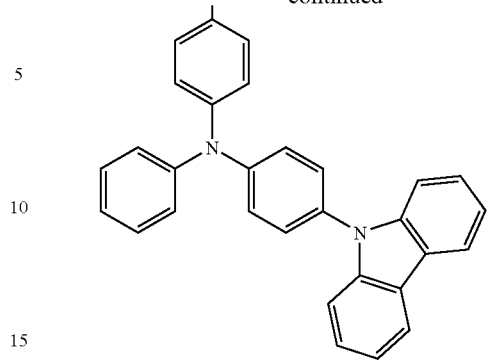

(11)

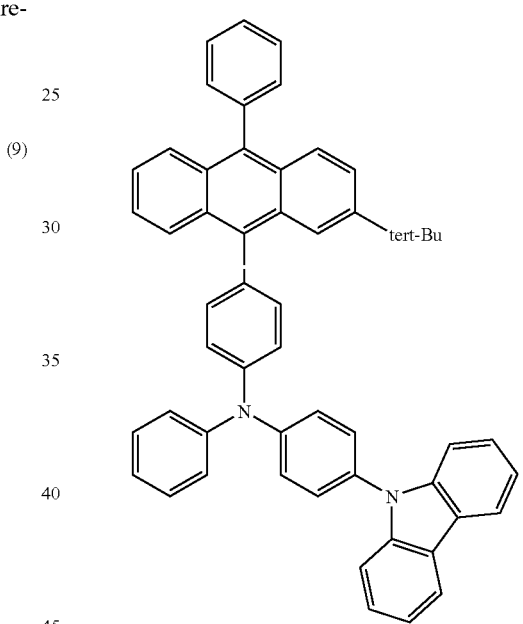

In an aspect of the present invention for solving the above problem, a material for a light emitting element includes any one of the above described anthracene derivatives.

In another aspect of the present invention for solving the above problem, a light emitting element includes a layer containing an organic compound layer interposed between a first electrode and a second electrode, and the organic compound layer contains any one of the above described anthracene derivatives.

In another aspect of the present invention for solving the above problem, a light emitting device includes the above described light emitting element and a means for controlling light emission of the light emitting element.

In another aspect of the present invention for solving the above problem, an electronic appliance includes a display portion, which includes the above described light emitting element, and a means for controlling the light emitting element.

The anthracene derivatives of the present invention can obtain blue light emission with excellent color purity.

Further, by using the anthracene derivatives as light emitting materials, light emitting elements having excellent blue color purity along with high reliability can be obtained.

By using the anthracene derivatives for light emitting elements, light emitting elements having excellent blue color purity along with high reliability can be provided.

Furthermore, by using the light emitting elements for a light emitting device, a light emitting device having excellent color reproducibility, high display quality, and high reliability can be provided.

Moreover, by using the light emitting element for an electronic appliance, an electronic appliance having excellent color reproducibility, high display quality, and high reliability can be provided.

BEST MODE FOR CARRYING OUT THE INVENTION

Embodiment Modes

Figure 1:
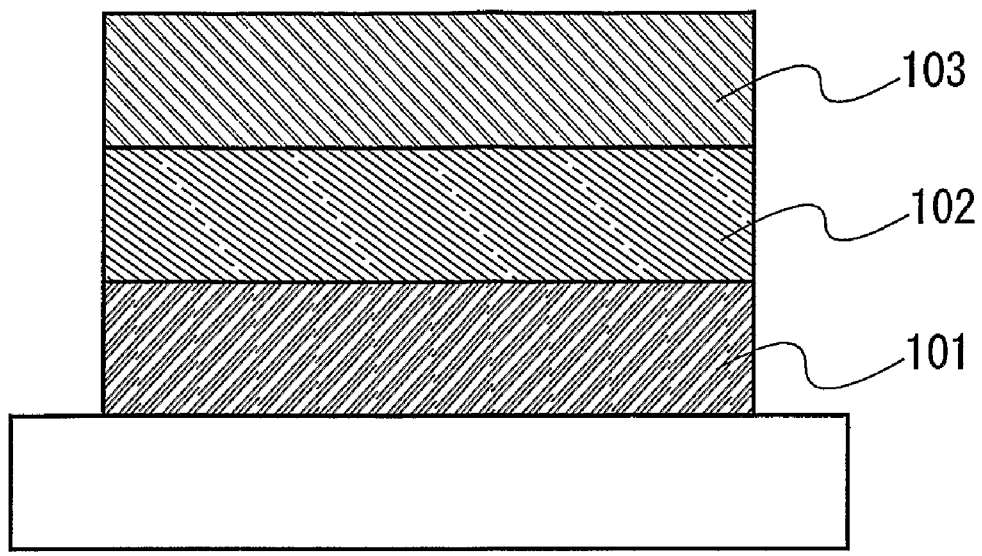
FIG. 1 is a cross sectional view showing a light emitting element of the present invention.

The embodiment modes according to the present invention will hereinafter be described with reference to the accompanying drawings. Note that the present invention is not limited to explanations below. It is easily understood by those skilled in the art that the embodiment modes and details herein disclosed can be modified in various ways without departing from the purpose and the scope of the present invention. The present invention should not be interpreted as being limited to the description of the embodiment modes to be given below.

Embodiment Mode 1

An anthracene derivative of the present invention will be described in this embodiment mode.

An anthracene derivative of the present invention is represented by the following general formula (1).

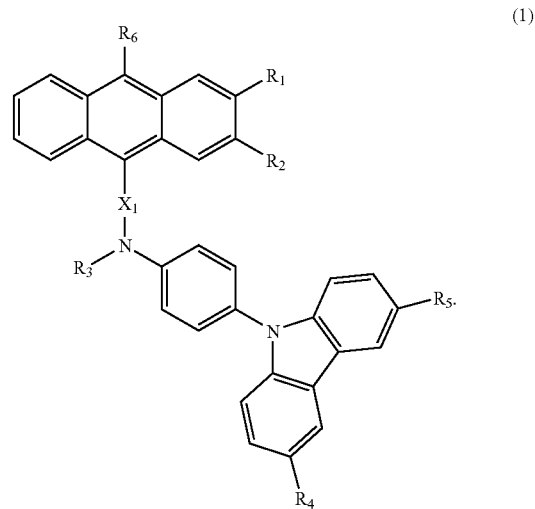

In the general formula (1), $R_1$ and $R_2$ individually represent hydrogen or an alkyl group having 1 to 4 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. Note that at least one of $R_1$ and $R_2$ is hydrogen. Further, the other of $R_1$ and $R_2$ is preferably any one of hydrogen, a methyl group, and a t-butyl group.

Further, in the general formula (1), $R_3$ represents a substituent having 6 to 15 carbon atoms. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group. Among them, when using a phenyl group as $R_3$, high chromaticity as a blue light emitting element can be obtained.

In the general formula (1), $R_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group. Among them, hydrogen is preferable as $R_4$.

In the general formula (1), $R_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group. Among them, hydrogen is preferable as $R_5$.

In the general formula (1), $R_6$ represents a substituent having 6 to 36 carbon atoms. Preferably, $R_6$ is a substituent having 6 to 15 carbon atoms. As the substituent having 6 to 15 carbon atoms, aryl groups such as a phenyl group, a naphthyl group, a biphenylyl group, and a fluorenyl group can be given. Among them, when using a phenyl group as $R_6$, high chromaticity and high reliability as a blue light emitting element can be obtained. Note that each of these aryl groups may have a substituent. In a case where each of the aryl groups has a substituent, an alkyl group having 1 to 4 carbon atoms or a phenyl group is preferable as the substituent of the aryl group. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (1), $X_1$ represents a substituent having 6 to 22 carbon atoms. Preferably, $X_1$ is a substituent having 6 to 15 carbon atoms. As the substituent having 6 to 15 carbon atoms, arylene groups such as a phenylene group, a naphthylene group, an anthrylene group, and a florene-diyl group can be given. Among them, the phenylene group is preferable. In particular, a p-phenylene group is more preferable. Each of these arylene groups may have a substituent or no substituent. When each of these arylene groups has a substituent, an alkyl group having 1 to 4 carbon atoms is preferable as the substituent of the arylene group, and specifically, a methyl group, an ethyl group, an n-propyl group, an i-propyl group, an n-butyl group, an i-butyl group, an s-butyl group, a t-butyl group, and the like can be given. Further, the florene-diyl group is preferably a 9,9-dimethyl-florene-diyl group.

Further, an anthracene derivative of the present invention is represented by the following general formula (2).

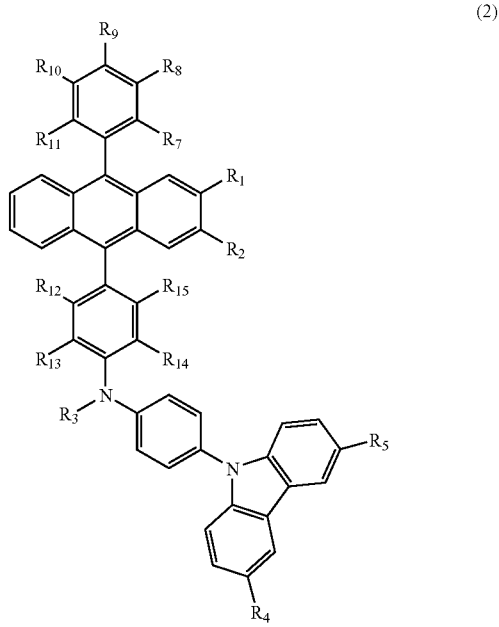

In the general formula (2), $R_1$ and $R_2$ individually represent hydrogen or an alkyl group having 1 to 4 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like are given. Note that at least one of $R_1$ and $R_2$ is hydrogen. Further, the other of $R_1$ and $R_2$ is any one of hydrogen, a methyl group, and a t-butyl group.

Further, in the general formula (2), $R_3$ represents a substituent having 6 to 15 carbon atoms. As the substituent having 6 to 15 carbon atoms, aryl groups such as a phenyl group, a naphthyl group, a biphenylyl group, and a fluorenyl group can be given. Among them, when using a phenyl group, high chromaticity as a blue light emitting element can be obtained.

Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (2), $R_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (2), $R_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like are given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (2), $R_7$ to $R_{11}$ individually represent hydrogen, an alkyl group having 1 to 4 carbon atoms, or a phenyl group. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. Among them, hydrogen is preferable.

In the general formula (2), $R_{12}$ to $R_{15}$ individually represent hydrogen or an alkyl group having 1 to 4 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. Each of $R_{12}$ to $R_{15}$ is preferably hydrogen or a methyl group, and more preferably, hydrogen.

Further, an anthracene derivative of the present invention is represented by the following general formula (3).

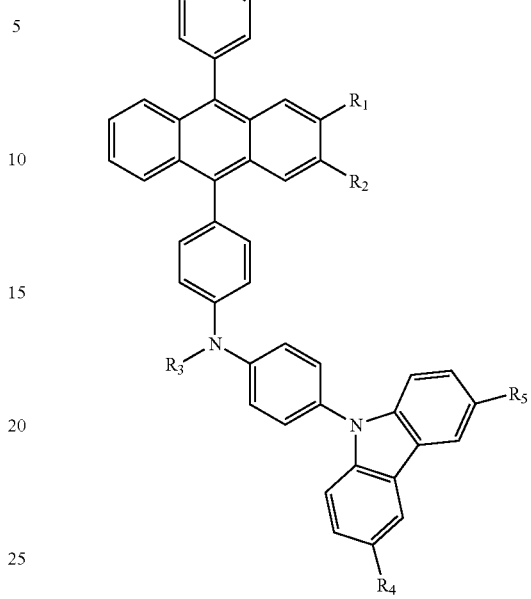

(3)

In the general formula (3), $R_1$ and $R_2$ individually represent hydrogen or an alkyl group having 1 to 4 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like are given. Note that at least one of $R_1$ and $R_2$ is hydrogen. Further, the other of $R_1$ and $R_2$ is preferably any one of hydrogen, a methyl group, and a t-butyl group.

Further, in the general formula (3), $R_3$ represents a substituent having 6 to 15 carbon atoms. As the substituent having 6 to 15 carbon atoms, aryl groups such as a phenyl group, a naphthyl group, a biphenylyl group, and a fluorenyl group can be given. Among them, when using a phenyl group, high chromaticity as a blue light emitting element can be obtained. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (3), $R_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like are given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (3), $R_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

Further, an anthracene derivative of the present invention is represented by the following general formula (4).

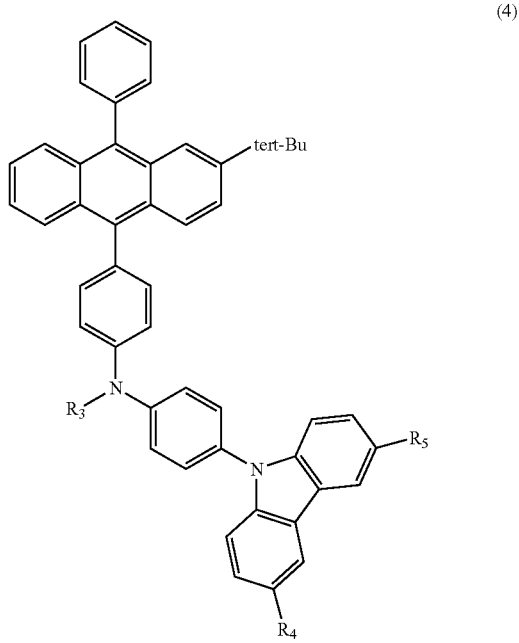

(4)

In the general formula (4), $R_3$ represents a substituent having 6 to 15 carbon atoms. As the substituent having 6 to 15 carbon atoms, aryl groups such as a phenyl group, a naphthyl group, a biphenylyl group, and a fluorenyl group can be given. Among them, when using a phenyl group, high chromaticity as a blue light emitting element can be obtained. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (4), $R_4$ represents hydrogen, an alkyl group having 1 to 4 carbon atoms, or an aryl group having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like are given. As the aryl group having 6 to 15 carbon atoms, a phenyl group, a naphthyl group, a biphenylyl group, a fluorenyl group, and the like can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (4), $R_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

Further, an anthracene derivative of the present invention is represented by the following general formula (5).

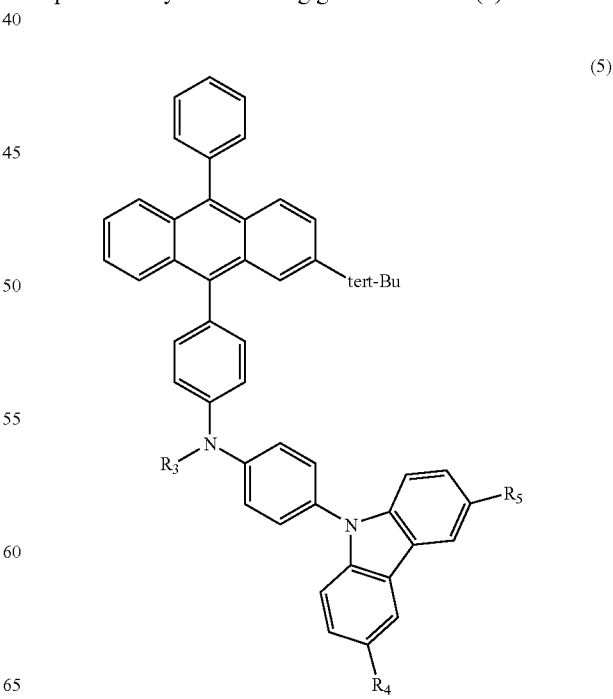

(5)

In the general formula (5), $R_3$ represents a substituent having 6 to 15 carbon atoms. As the substituent having 6 to 15 carbon atoms, aryl groups such as a phenyl group, a naphthyl group, a biphenylyl group, and a fluorenyl group can be given. Among them, when using a phenyl group, high chromaticity as a blue light emitting element can be obtained. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (5), $R_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (5), $R_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

Further, an anthracene derivative of the present invention is represented by the following general formula (6).

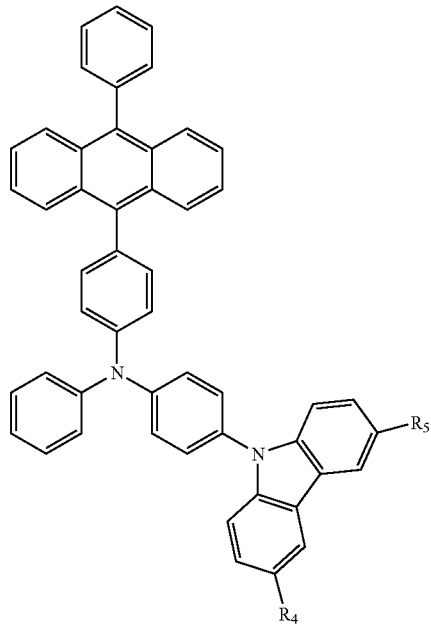

(6)

In the general formula (6), $R_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (6), $R_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

Further, an anthracene derivative of the present invention is represented by the following general formula (7).

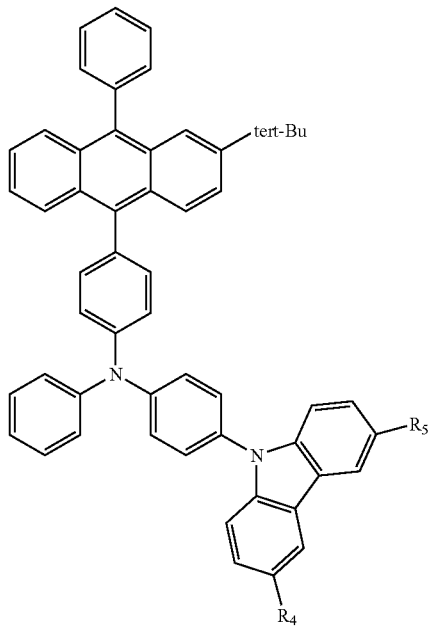

(7)

In the general formula (7), R$_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (7), R$_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

Further, an anthracene derivative of the present invention is represented by the following general formula (8).

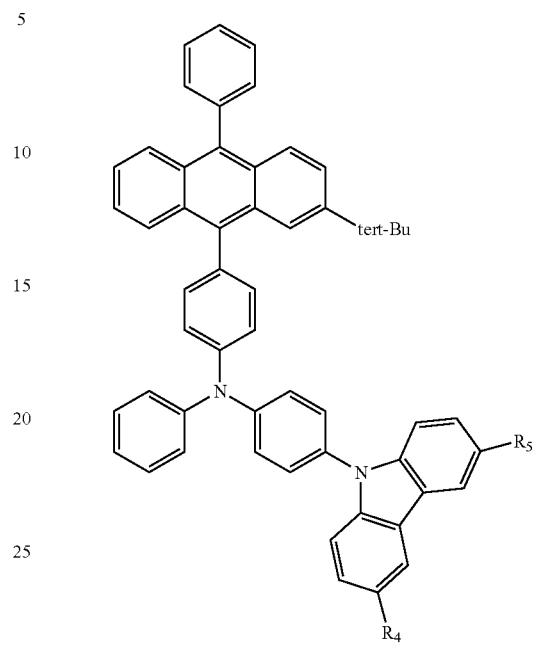

(8)

In the general formula (8), R$_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

In the general formula (8), R$_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. In a case where each of the aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Among them, the methyl group and the t-butyl group are preferable. Further, the fluorenyl group is preferably a 9,9-dimethylflorene-yl group.

As part of an anthracene derivative of the present invention, anthracene derivatives represented by the following structural formulas (9) to (302) are exemplified. Note that an anthracene derivative of the present invention is not limited thereto.
(9)
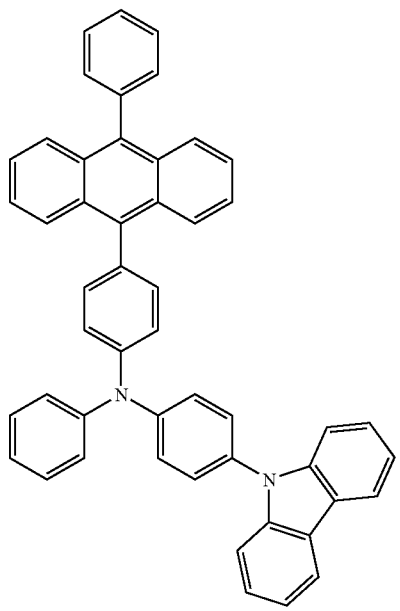
(10)
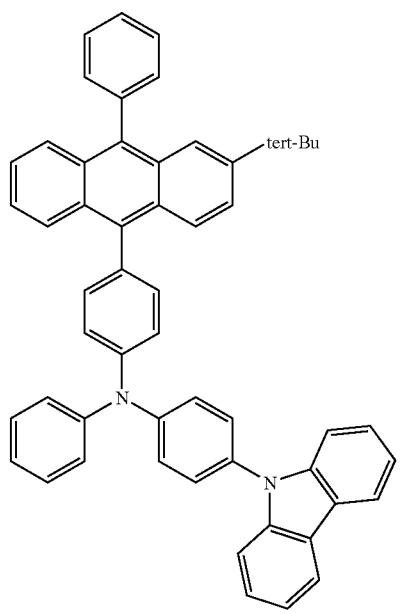
-continued
(11)
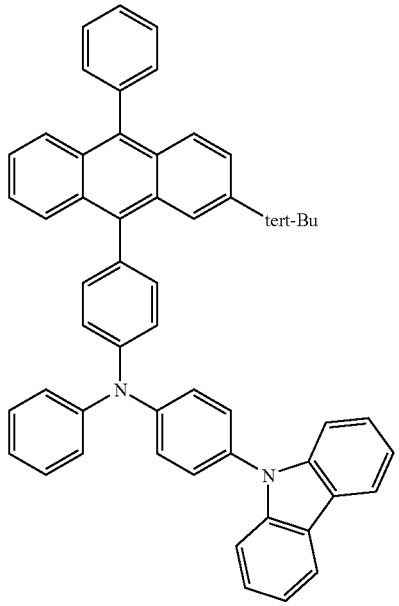
(12)
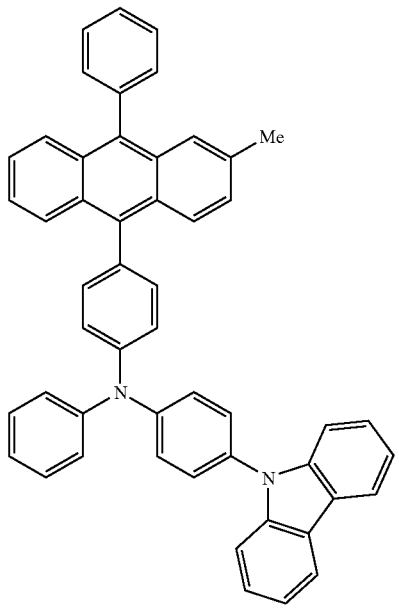

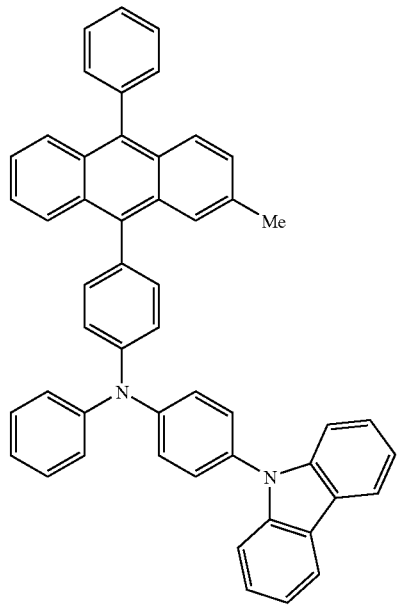
(13)
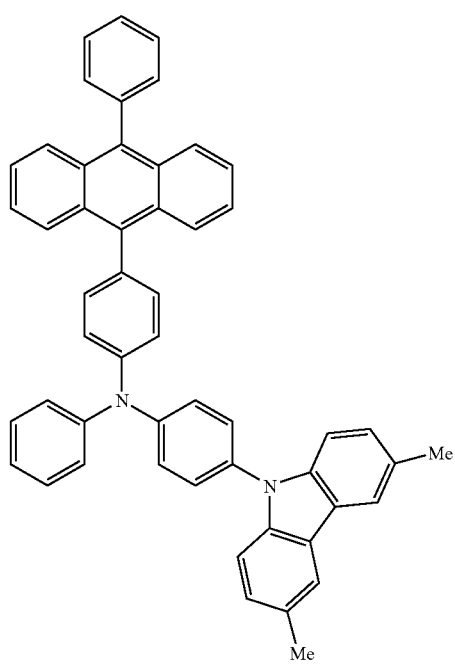
(14)
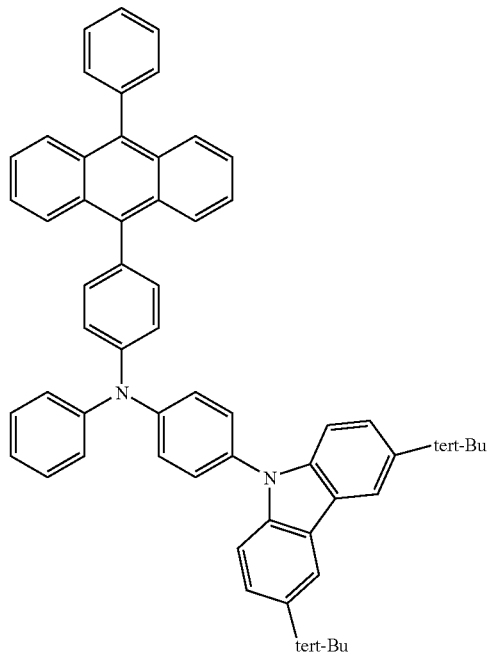
(15)
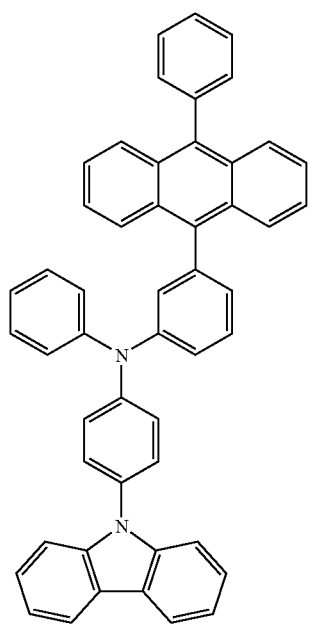
(16)

-continued
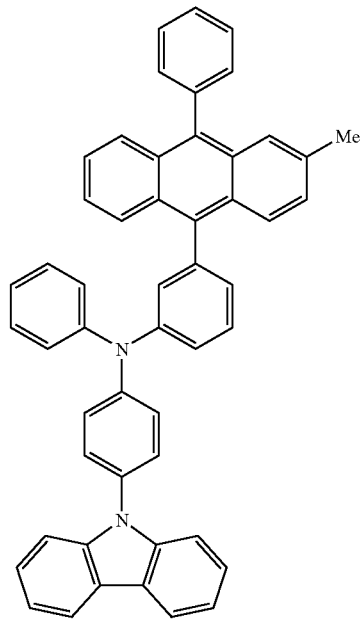
(17)
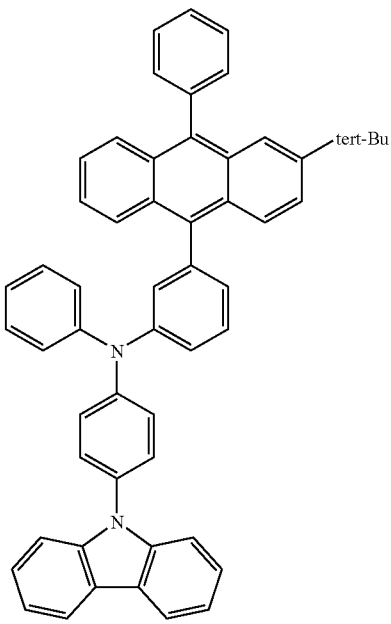
(19)
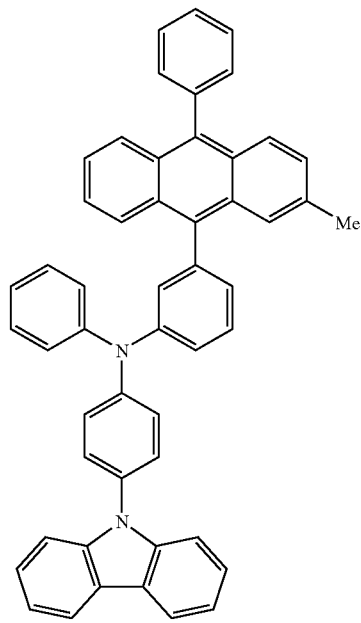
(18)
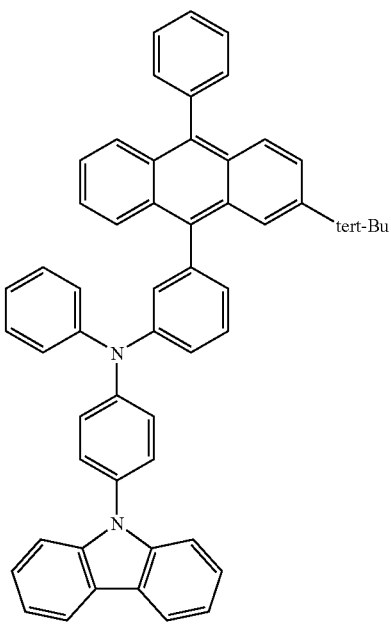
(20)

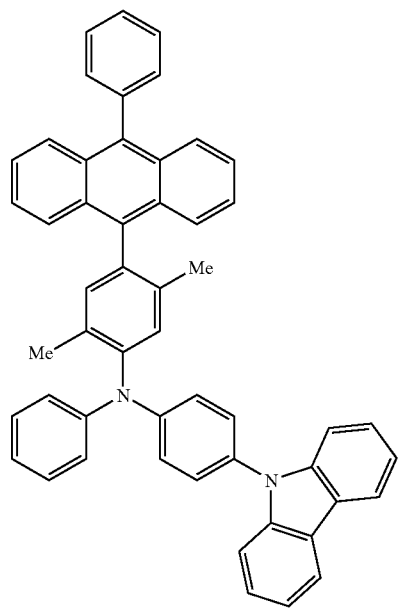 (21)
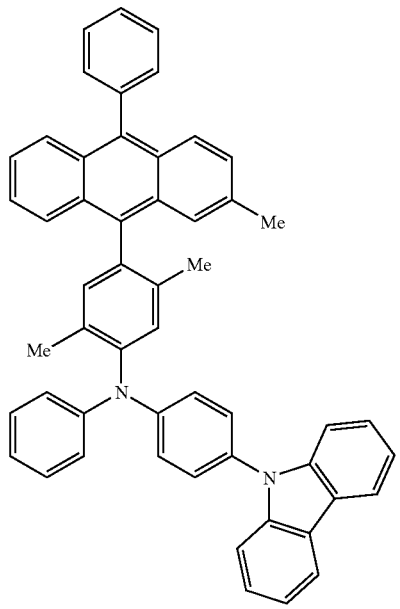 (23)
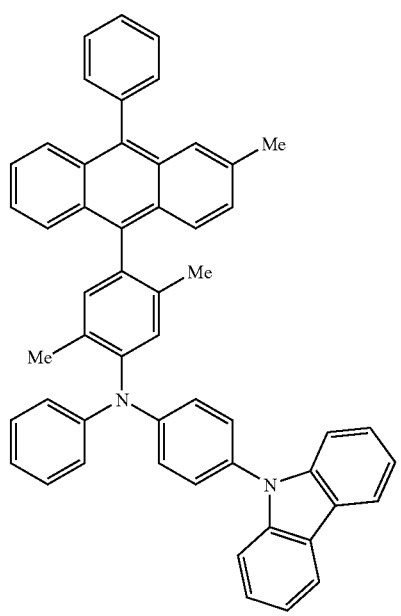 (22)
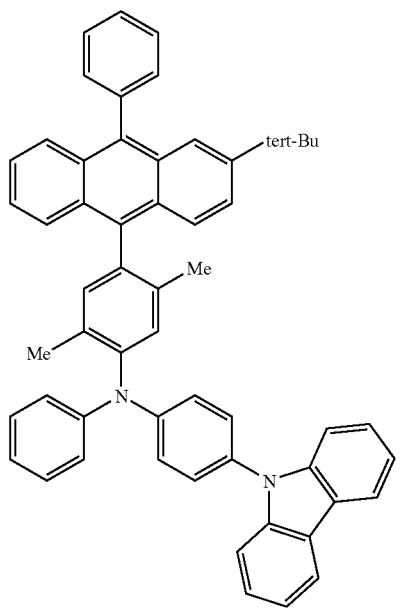 (24)

-continued
(25)
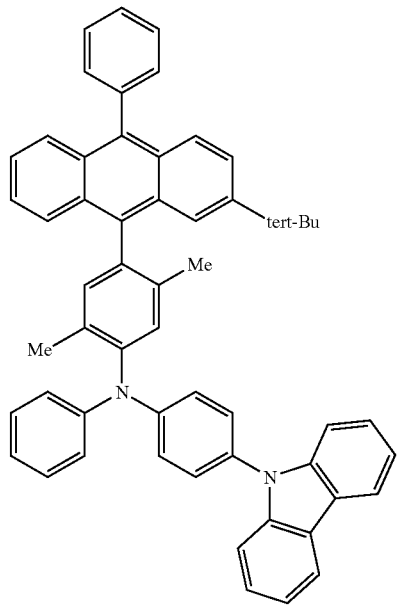
(27)
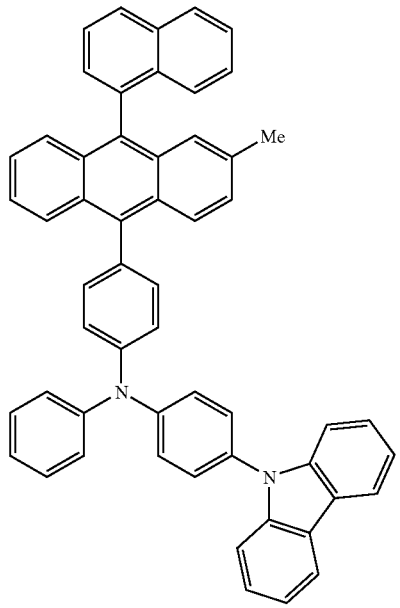
(26)
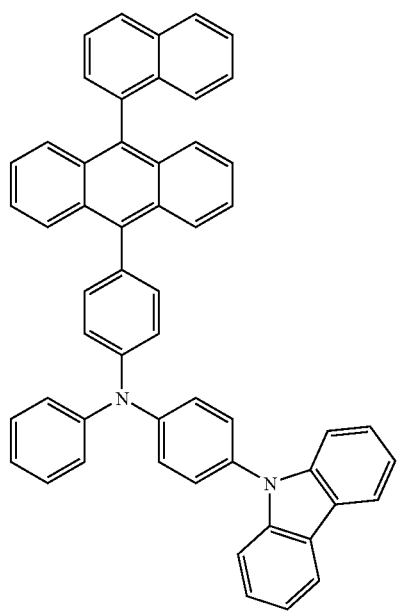
(28)
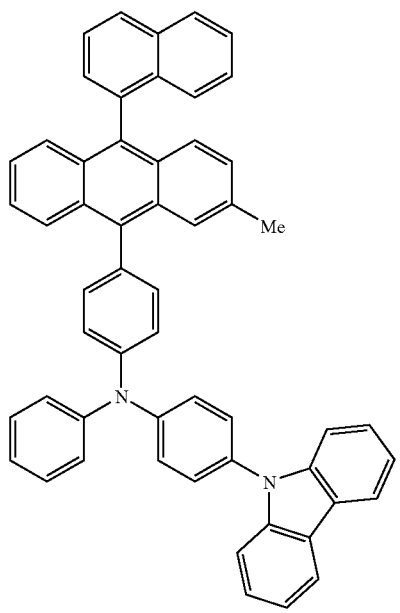

-continued
(29)
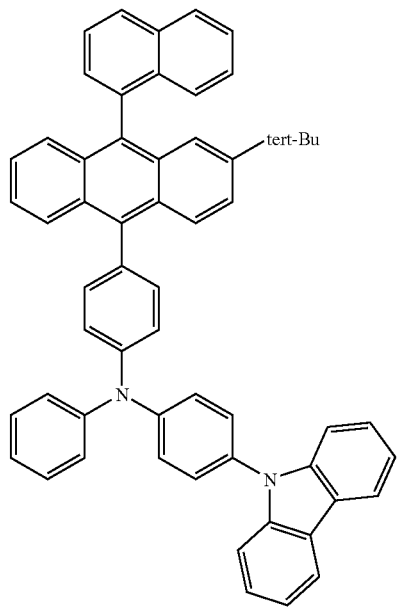
(30)
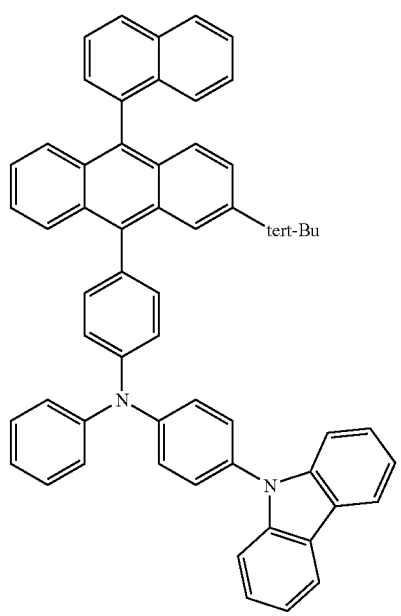
-continued
(31)
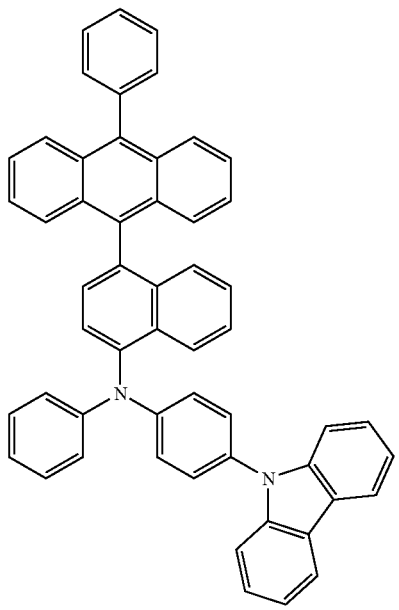
(32)
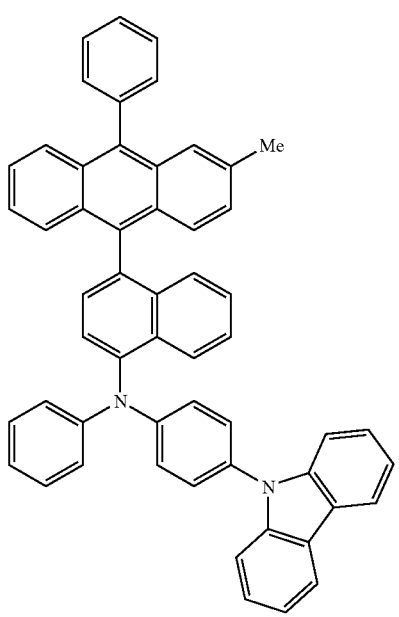

(33)
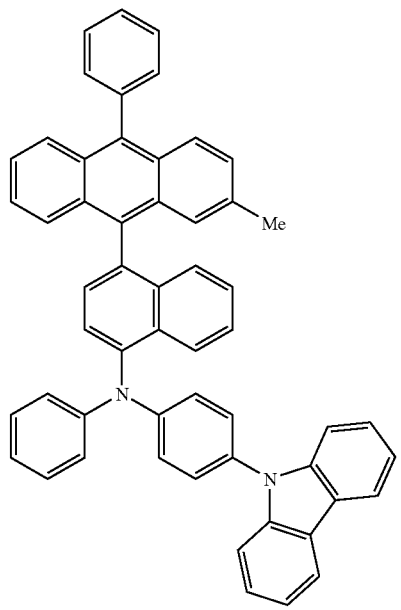
(34)
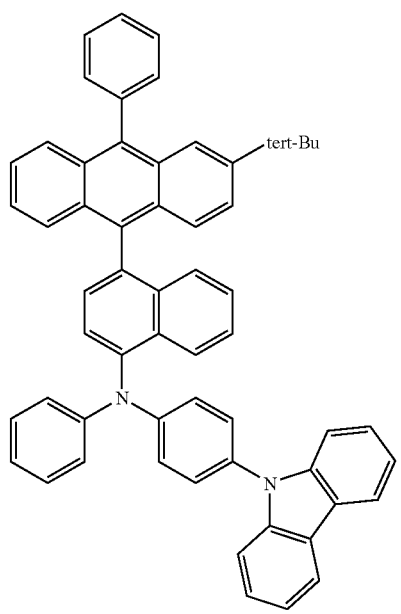
(35)
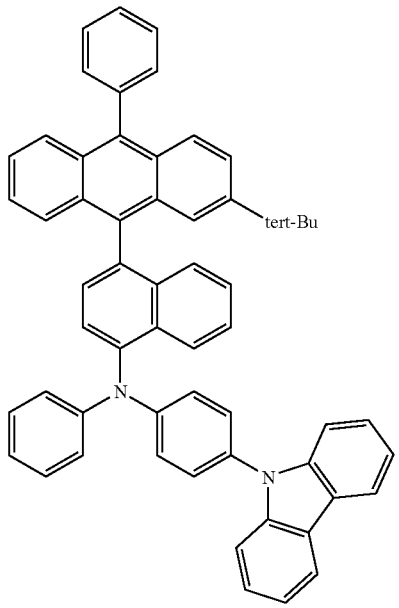
(36)
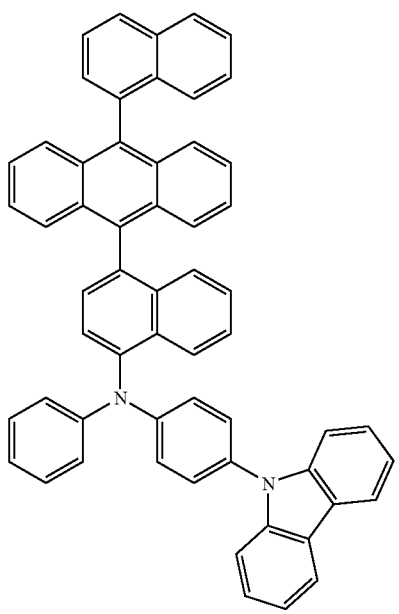

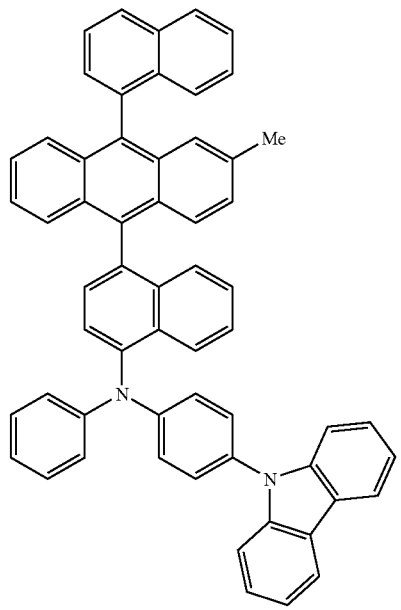
(37)
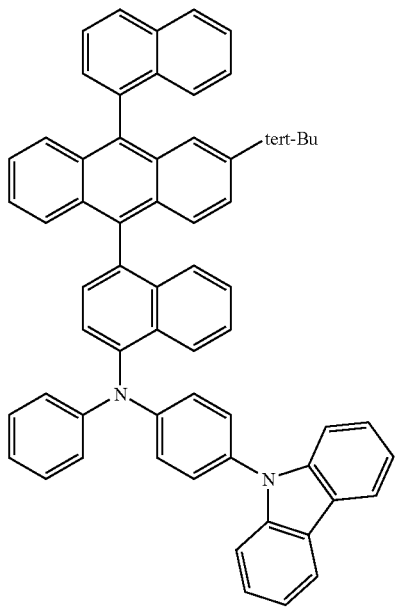
(39)
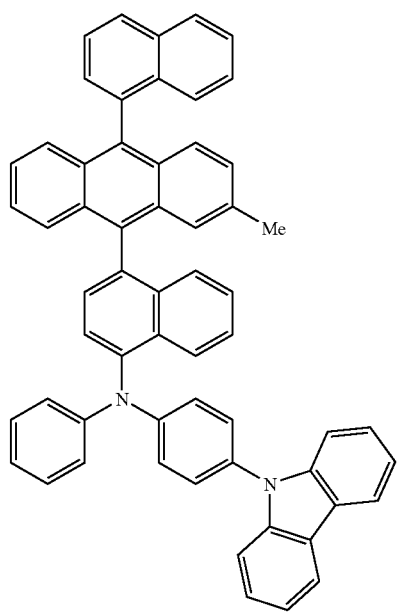
(38)
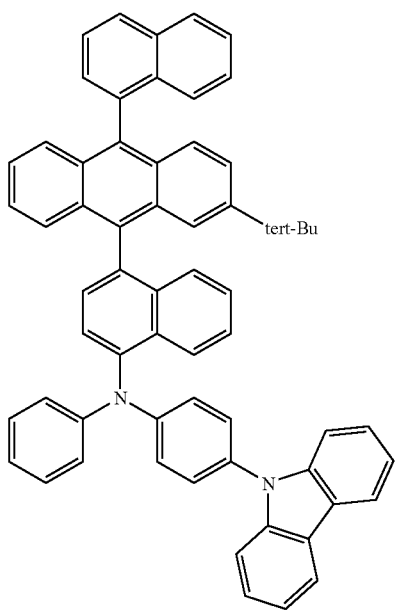
(40)

-continued
(41)
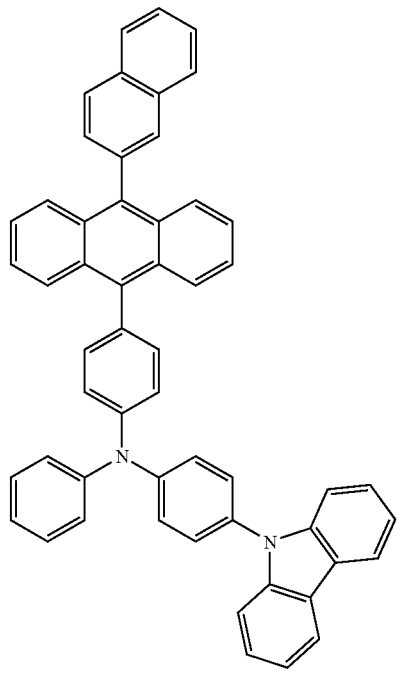
(42)
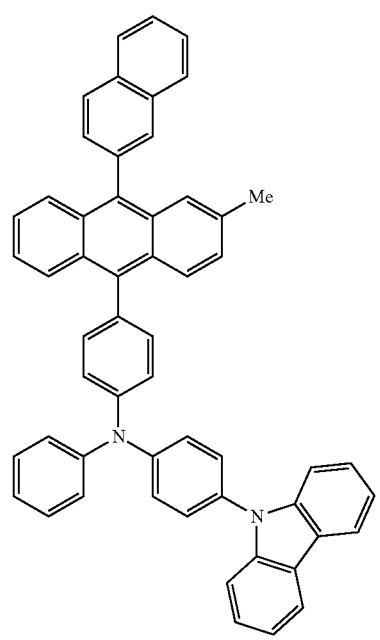
-continued
(43)
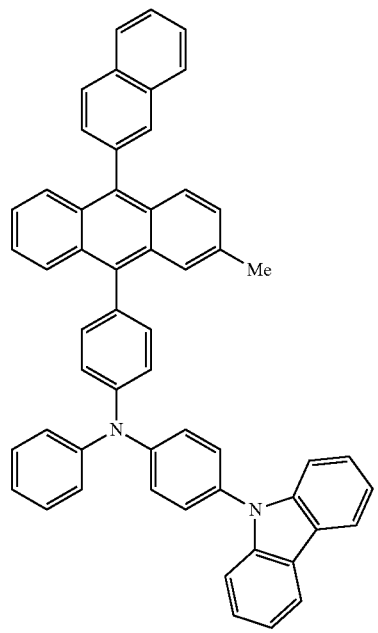
(44)
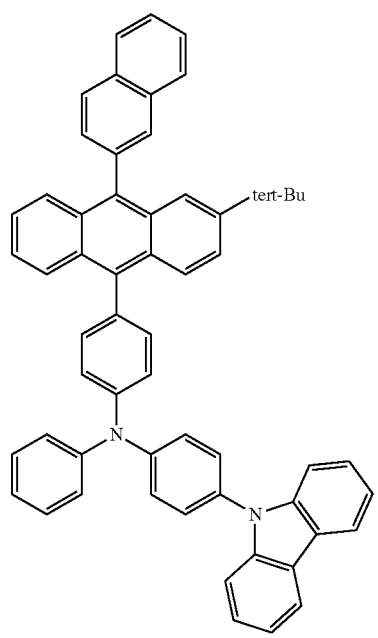

(45)
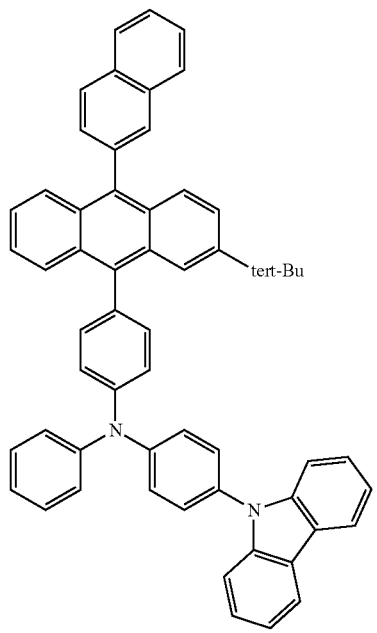
(47)
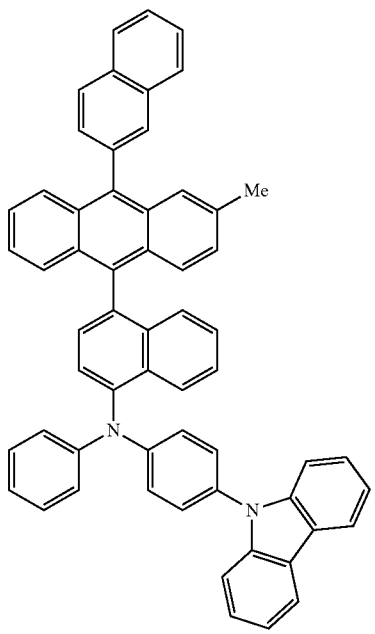
(46)
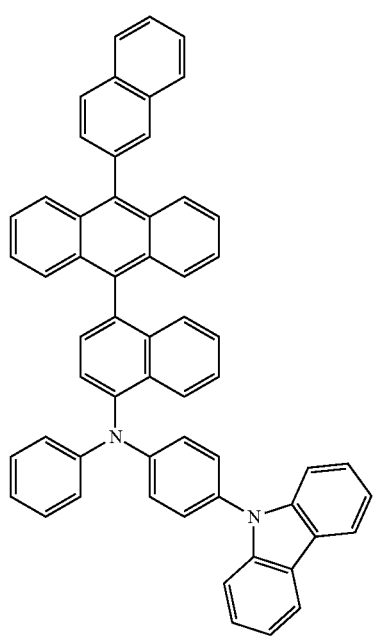
(48)
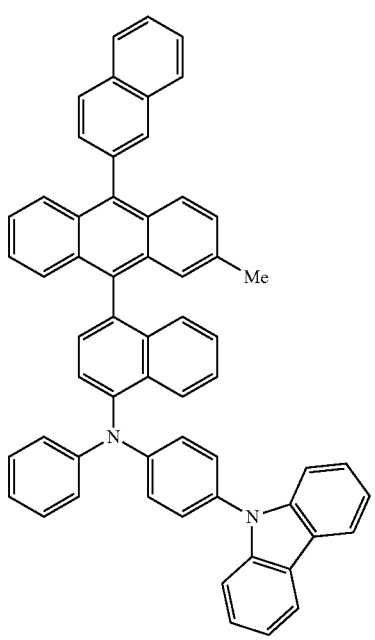

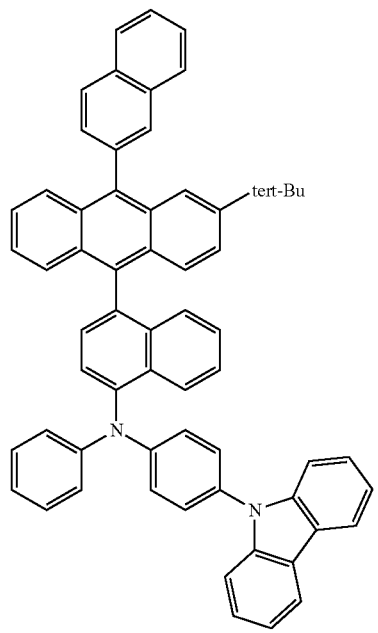
(49)
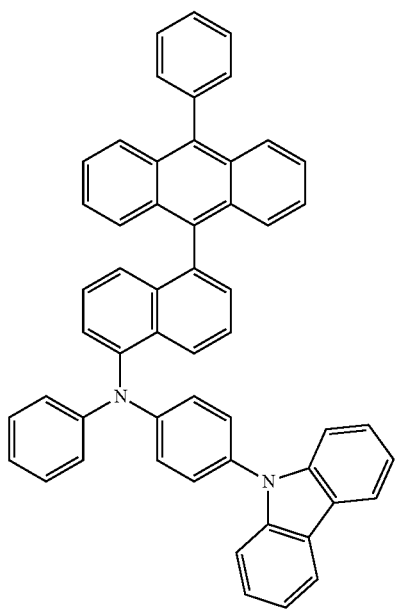
(51)
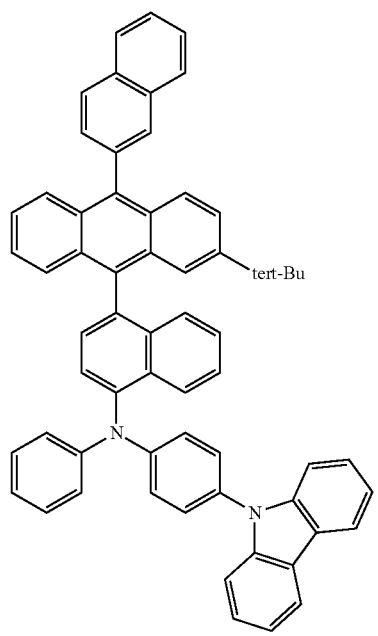
(50)
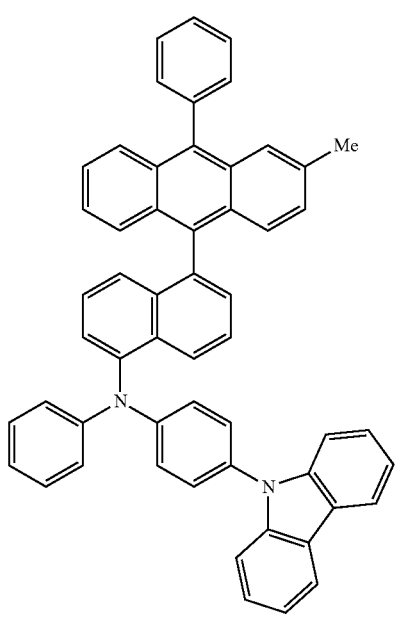
(52)

(53)
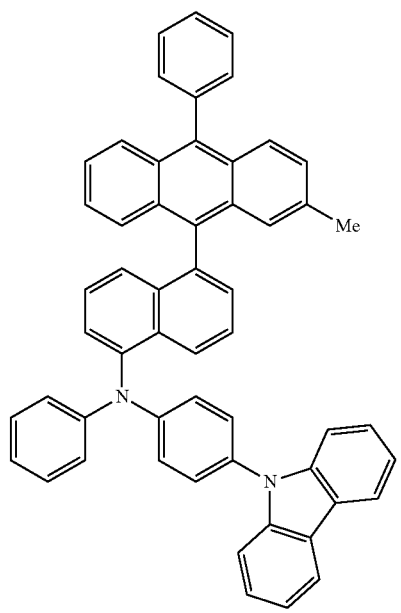
(55)
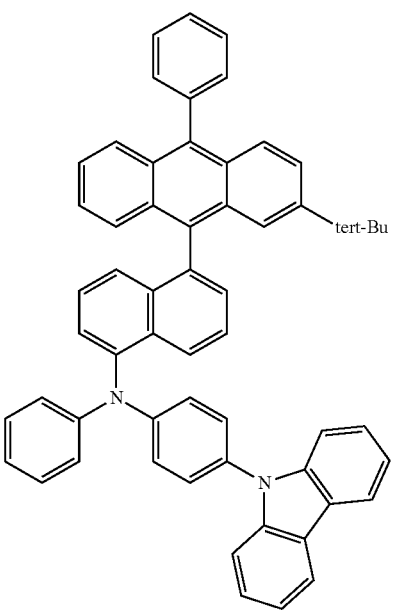
(54)
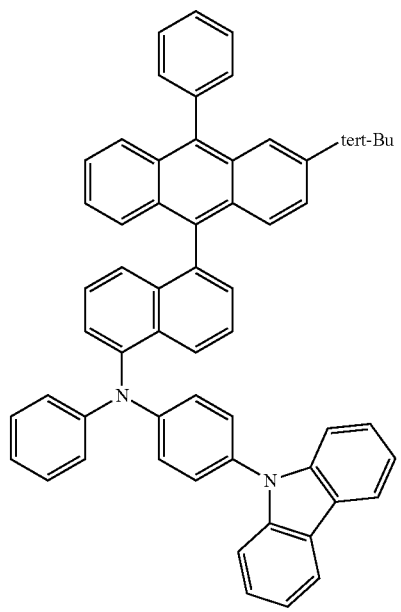
(56)
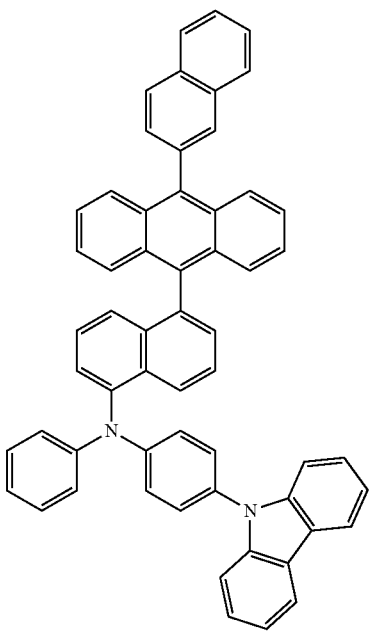

-continued
(57)
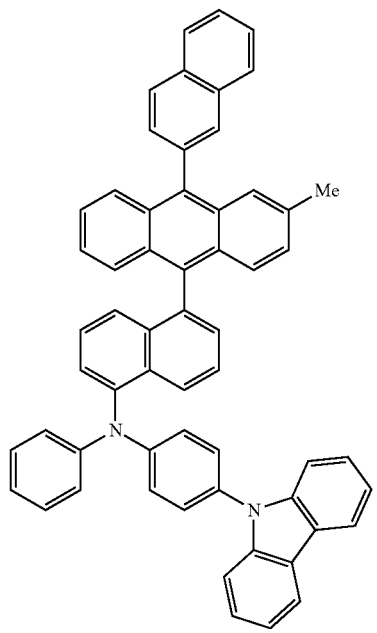
(59)
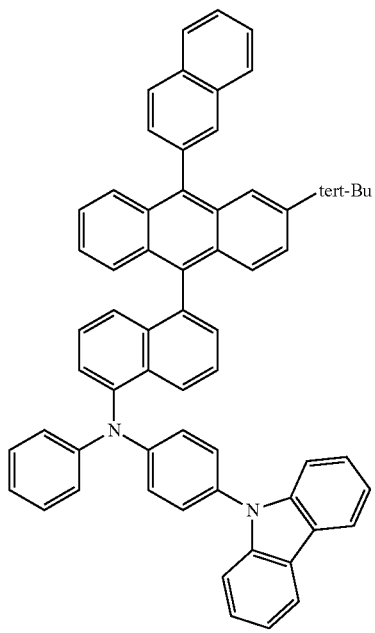
(58)
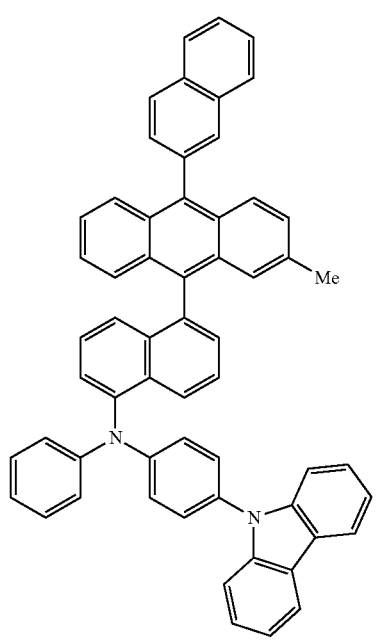
(60)
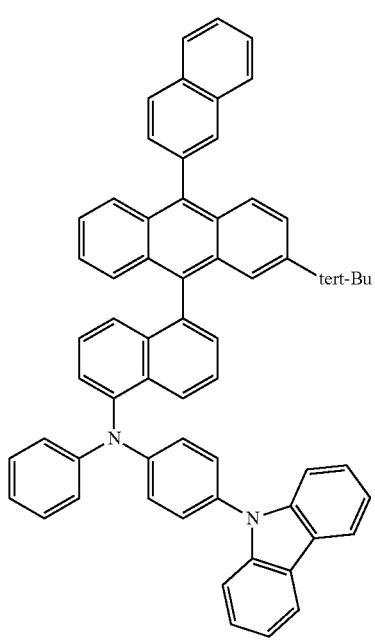

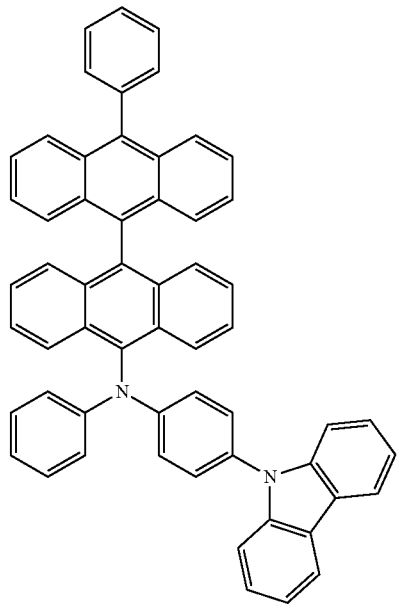
(61)
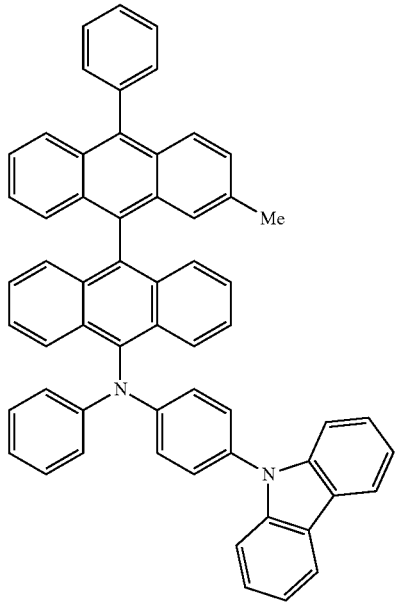
(63)
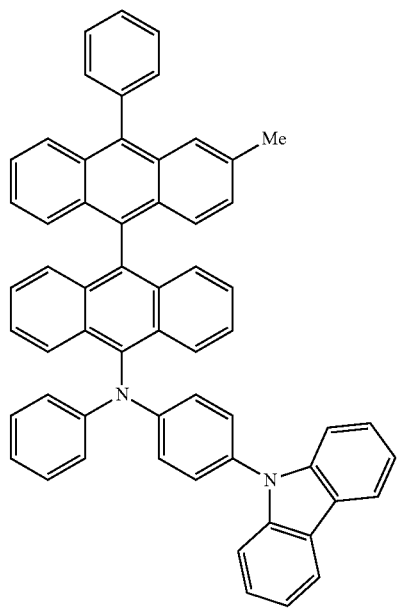
(62)
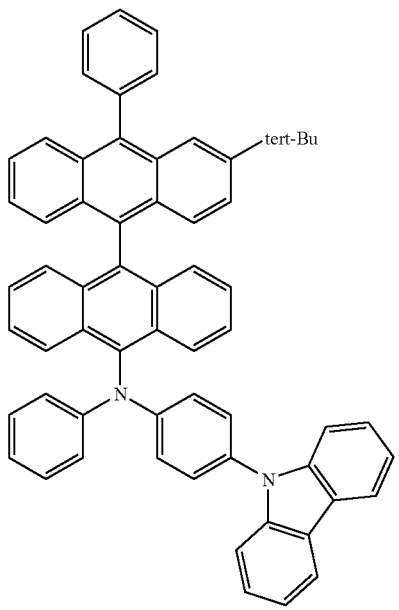
(64)

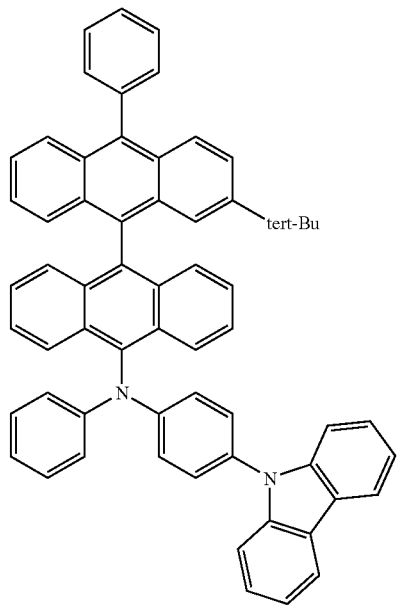
(65)
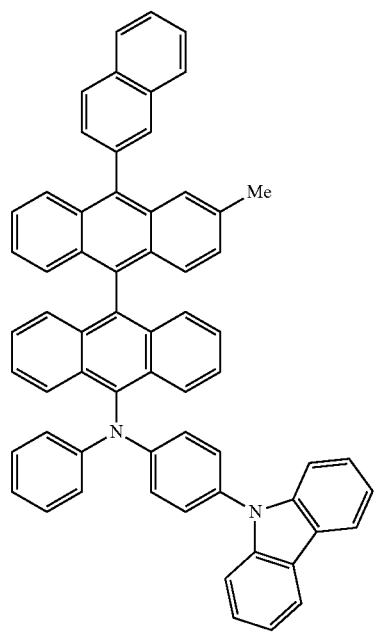
(67)
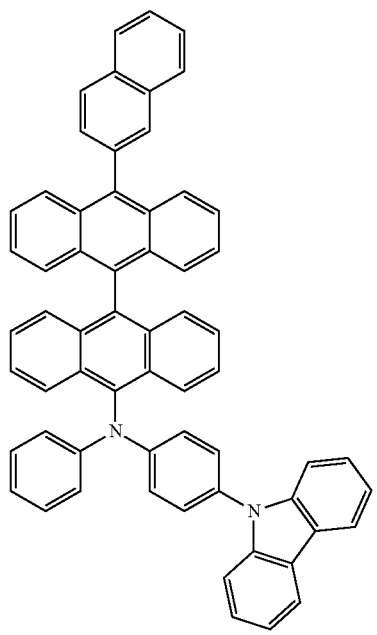
(66)
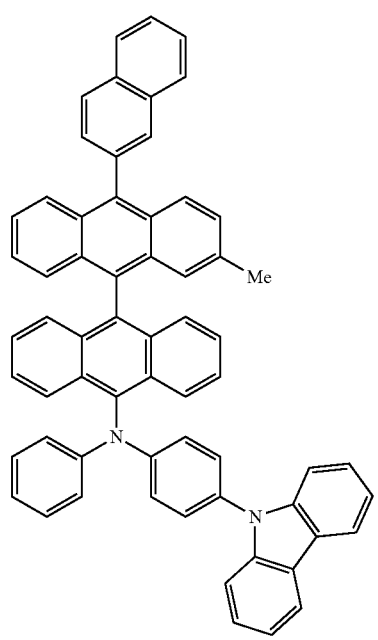
(68)

-continued
(69)
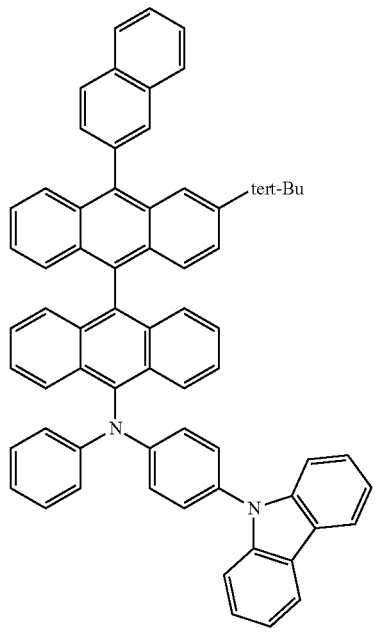
(70)
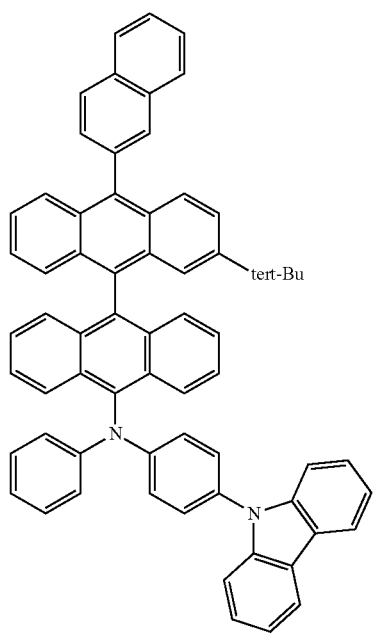
-continued
(71)
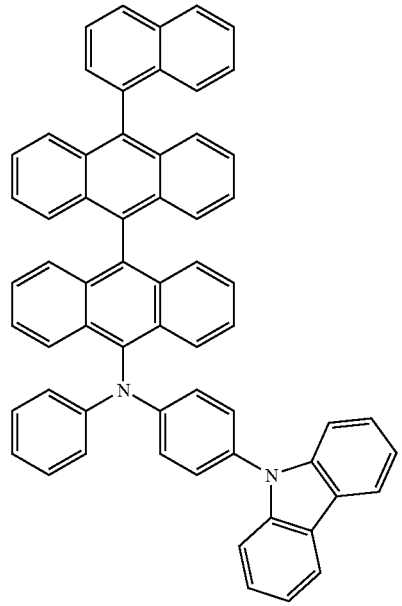
(72)
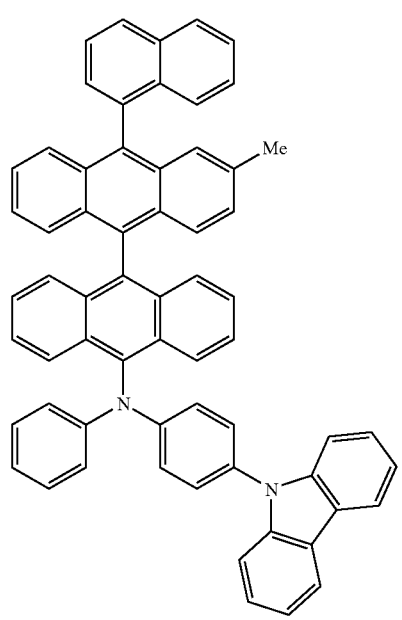

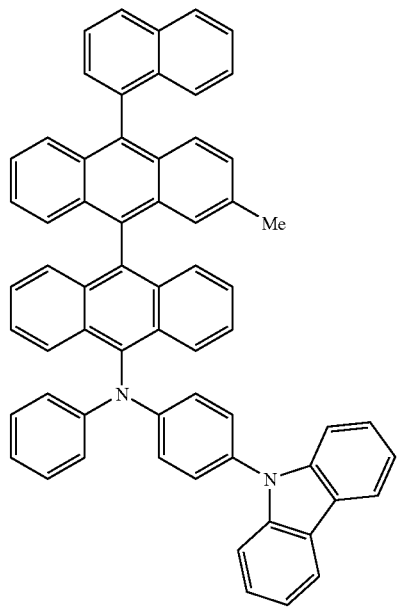
(73)
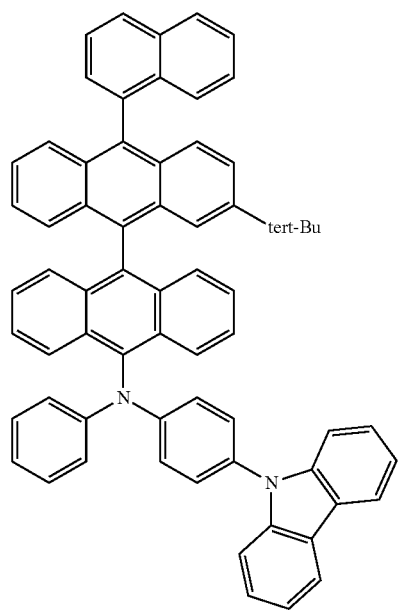
(75)
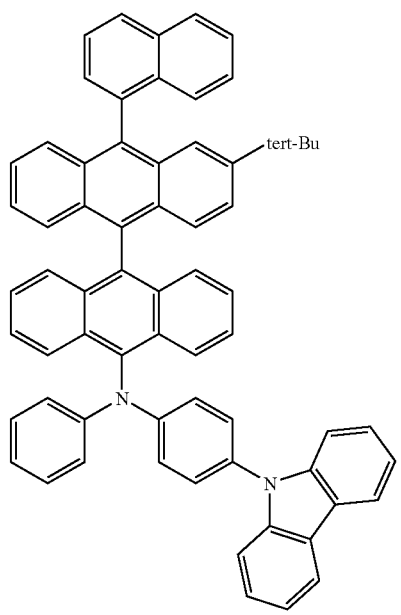
(74)
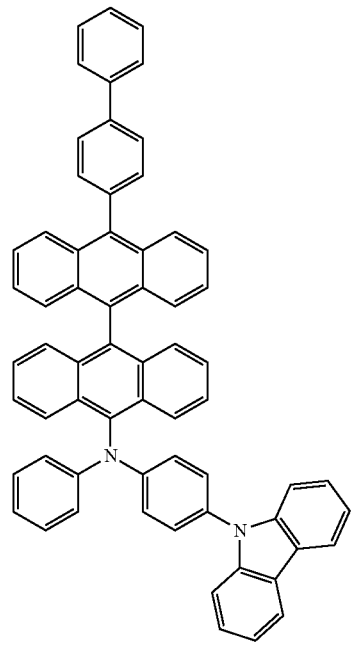
(76)

(77) 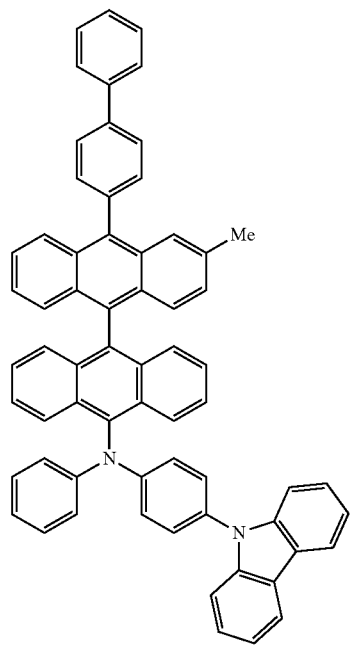
(79) 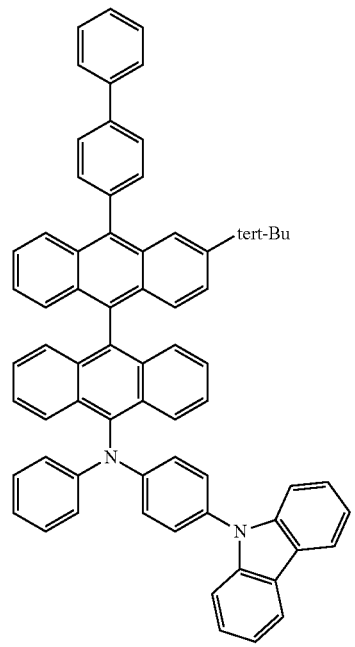
(78) 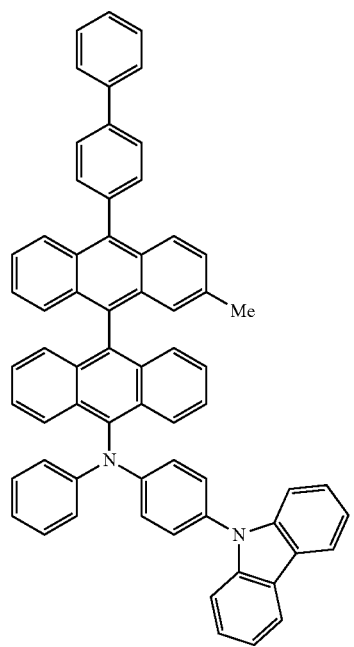
(80) 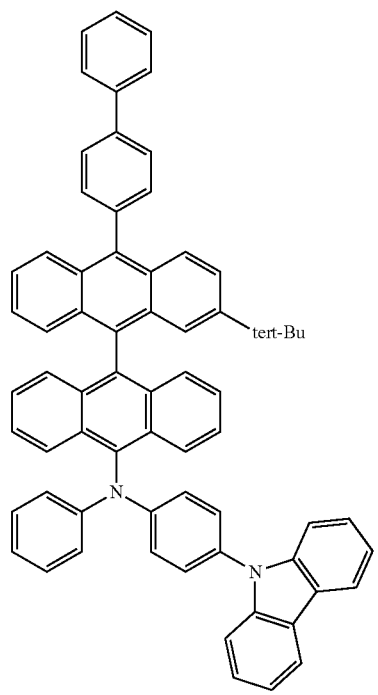

-continued
(81)
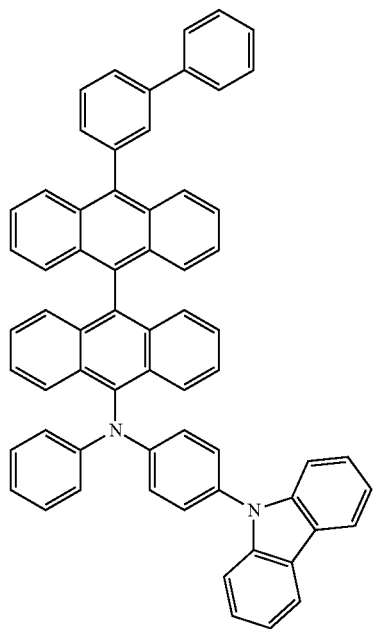
(83)
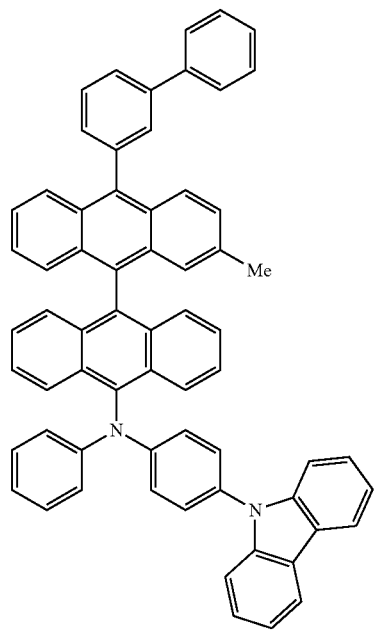
(82)
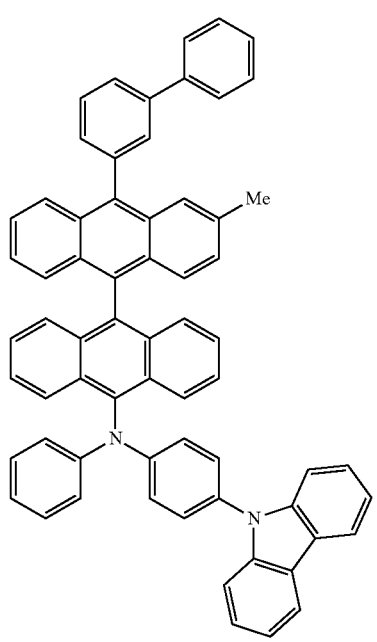
(84)
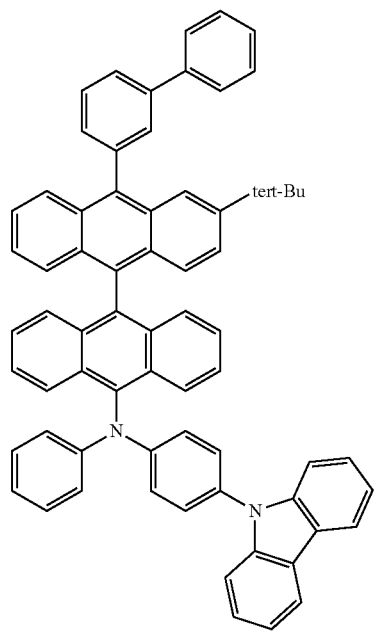

(85)
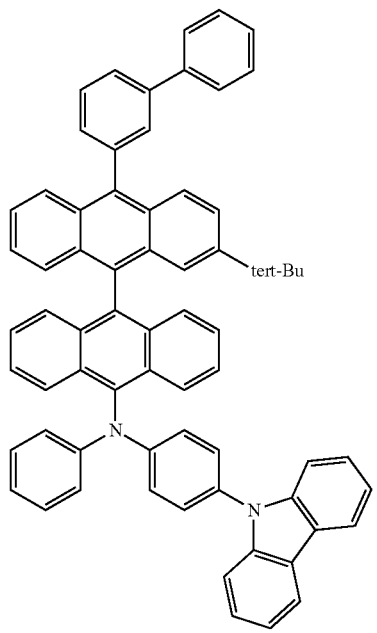
(87)
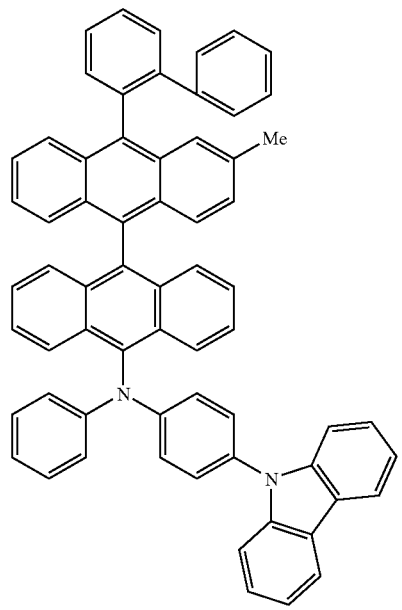
(86)
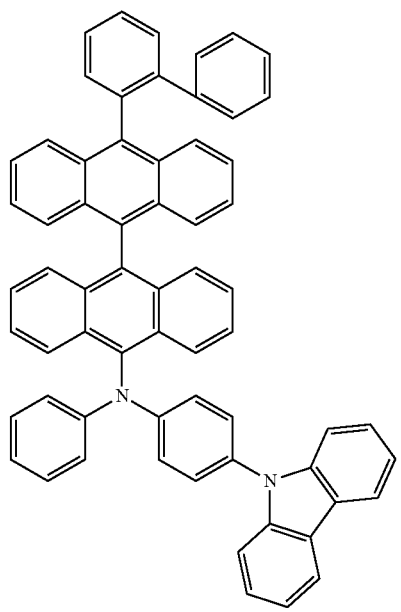
(88)
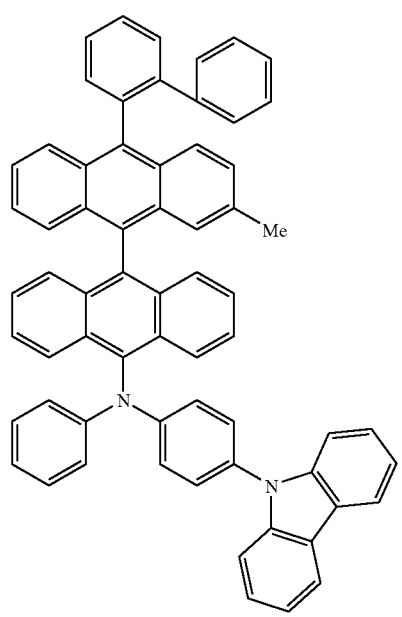

-continued
(89)
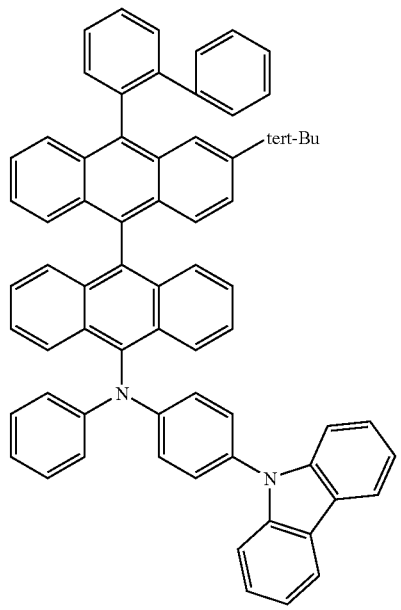
(91)
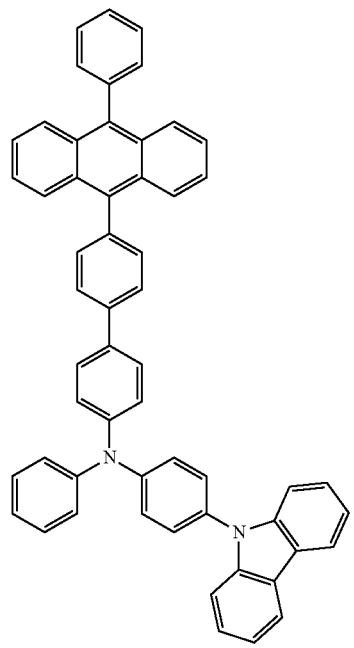
(90)
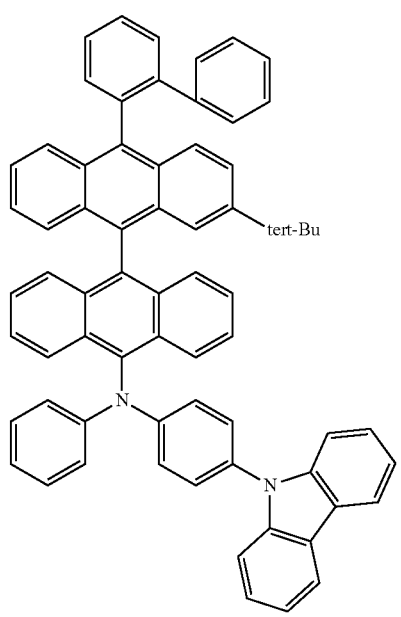
(92)
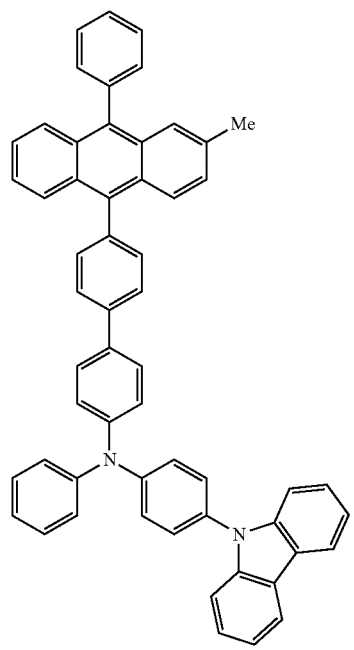

(93)
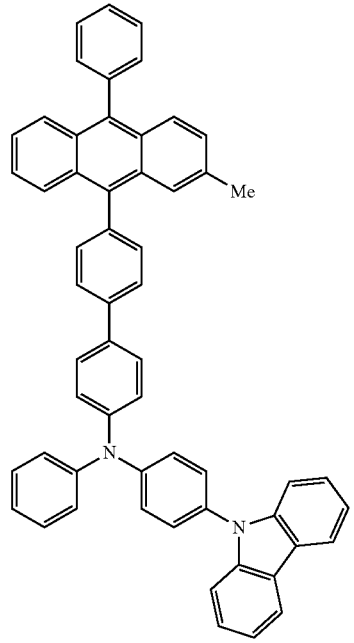
(95)
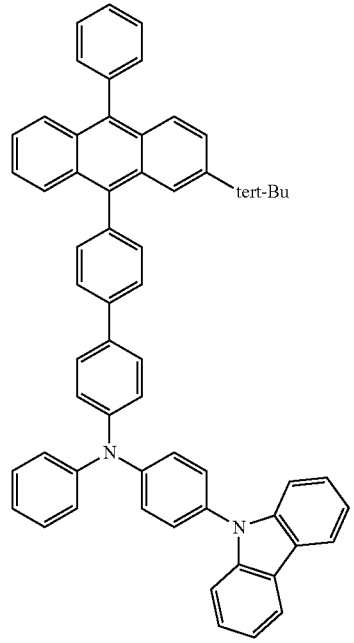
(94)
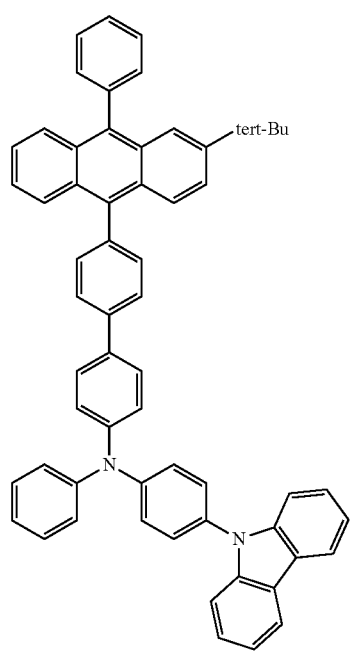
(96)
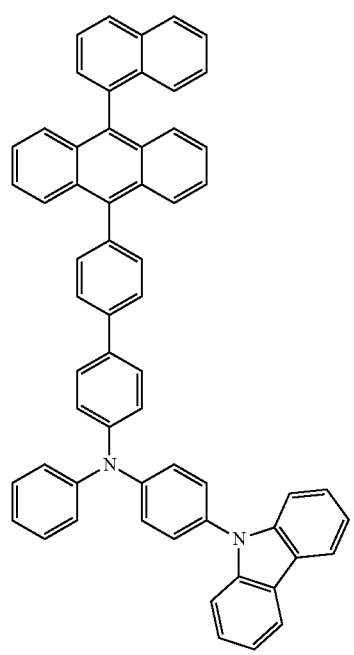

(97)
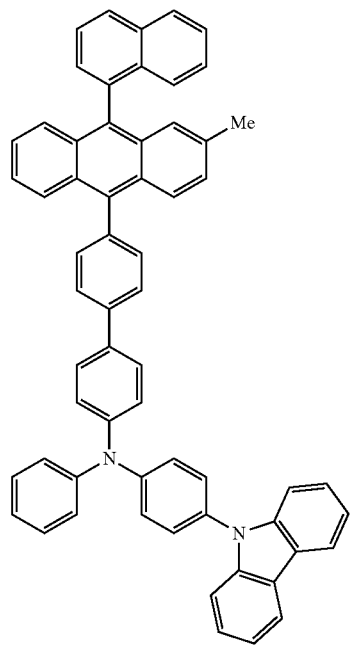
(99)
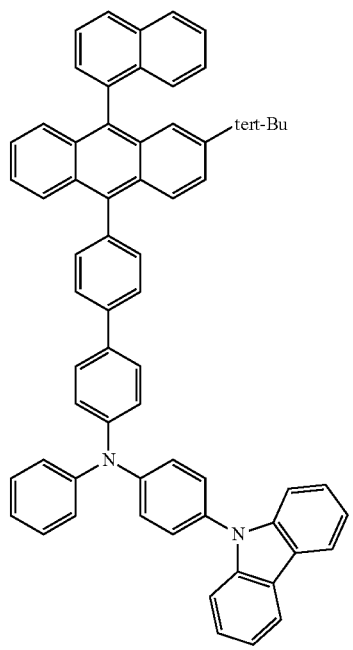
(98)
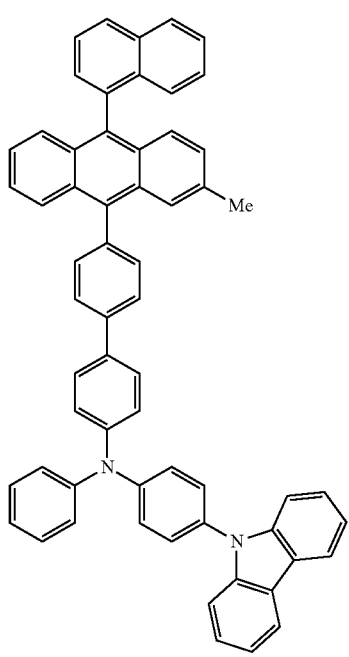
(100)
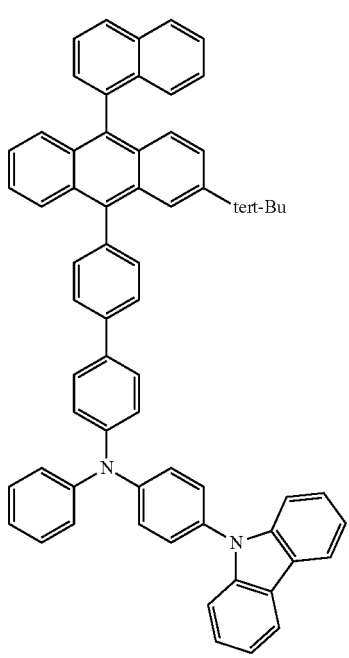

(101)
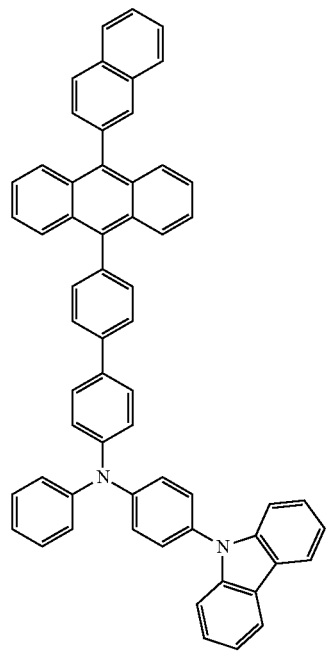
(102)
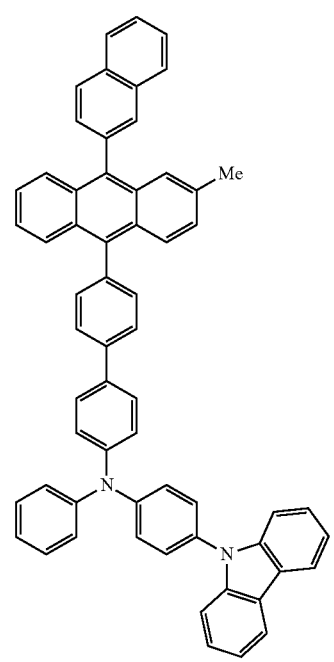
(103)
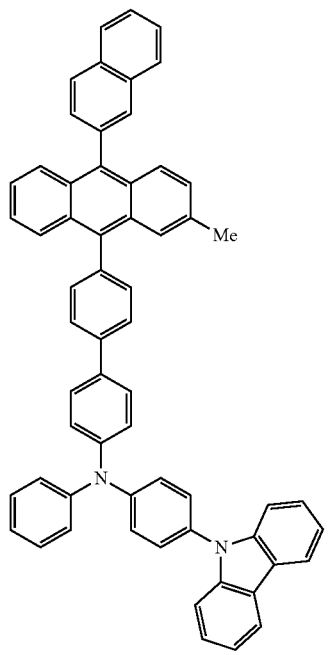
(104)
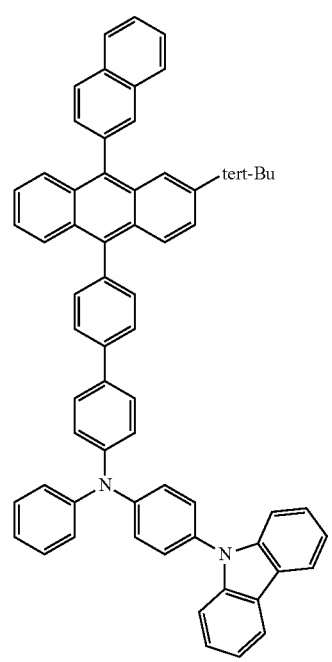

(105)
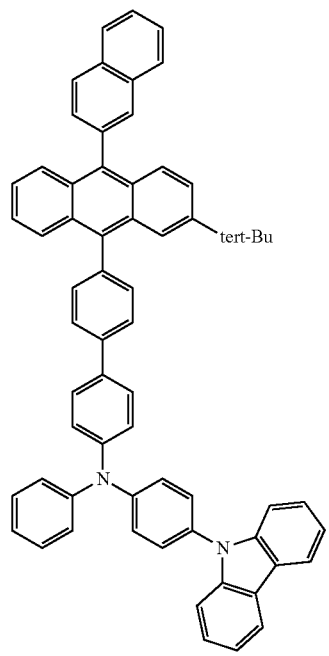
(106)
(107)
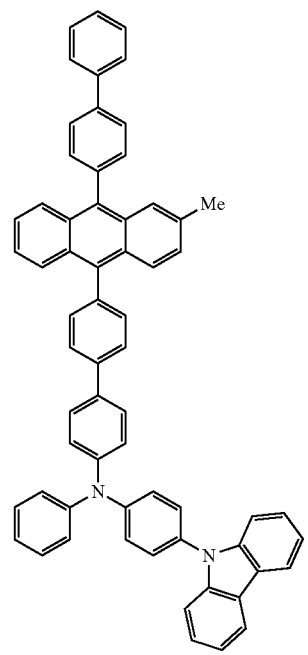
(108)
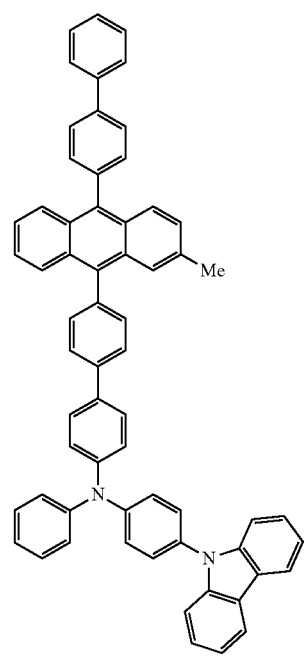

-continued
(109)
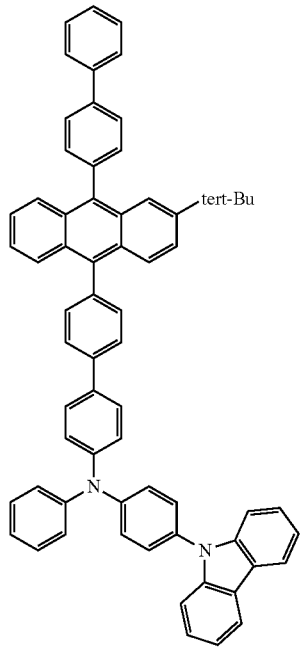
(111)
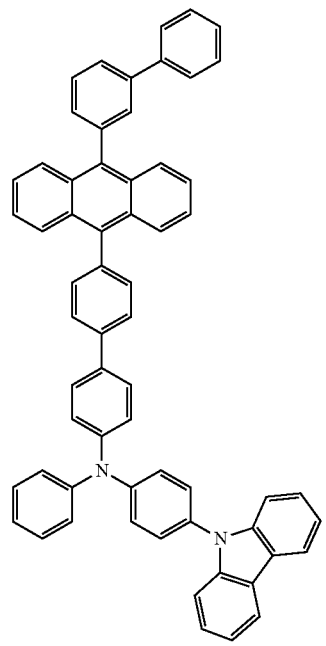
(110)
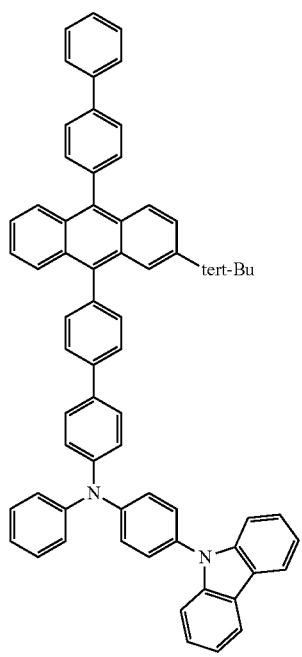
(112)
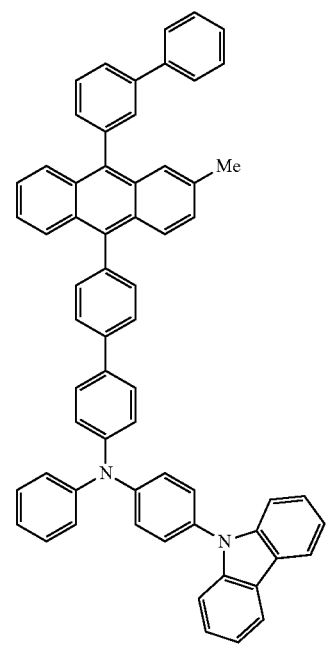

-continued
(113)
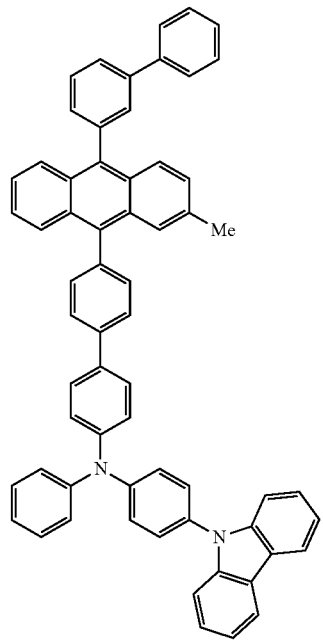
(114)
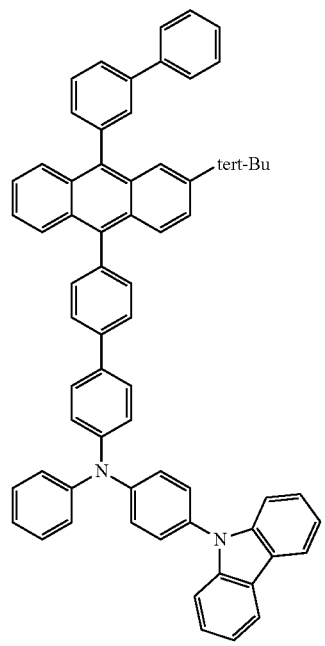
-continued
(115)
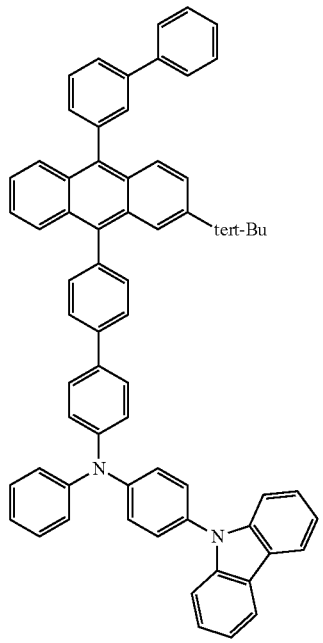
(116)
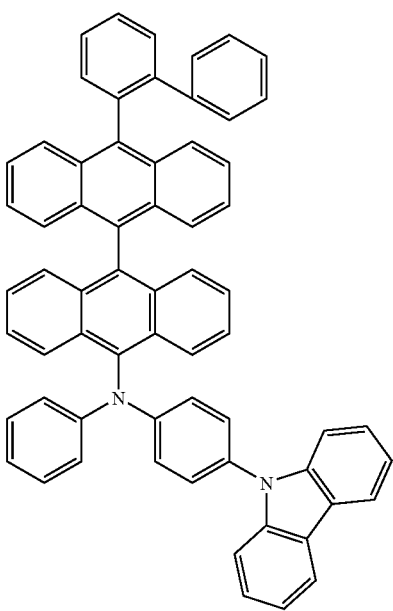

-continued
(117)
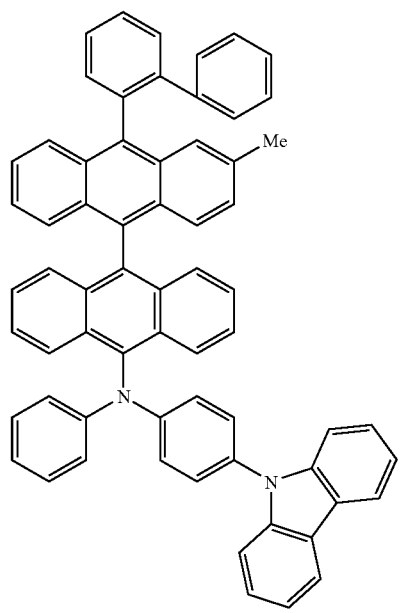
(119)
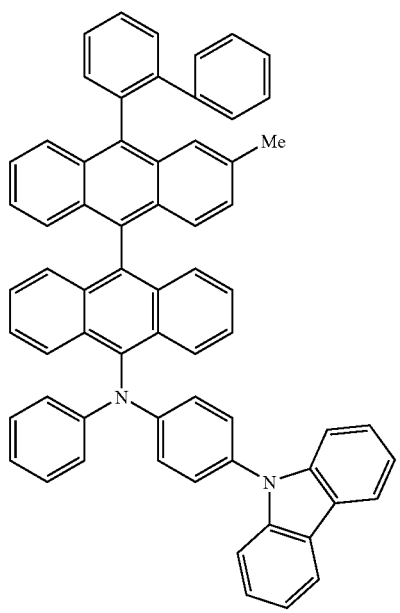
(118)
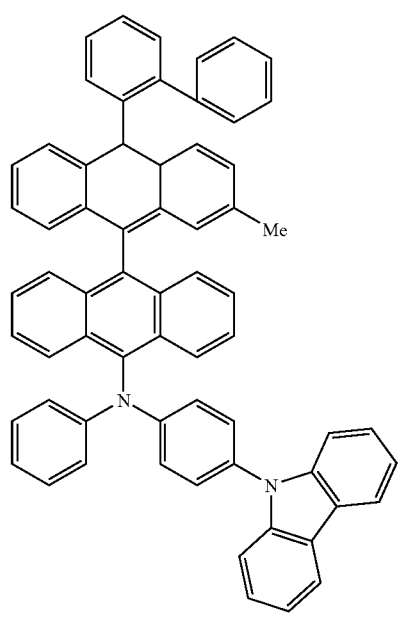
(120)
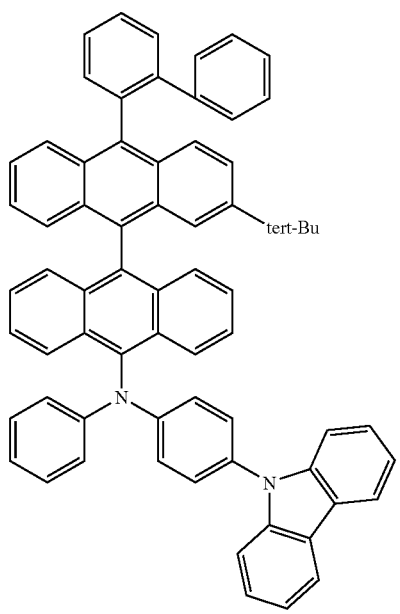

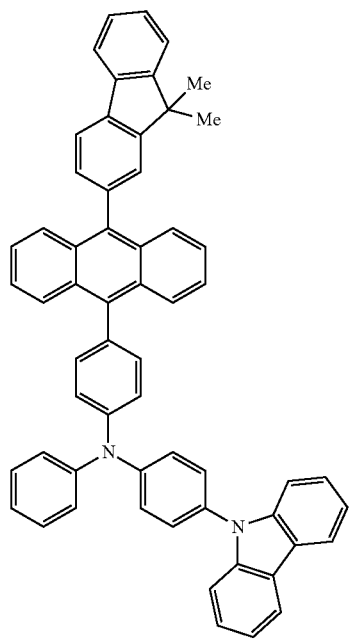
(121)
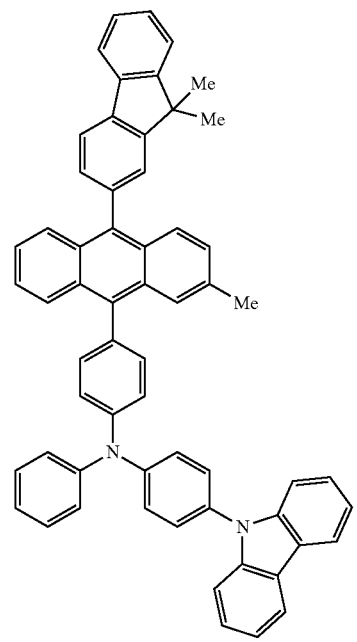
(123)
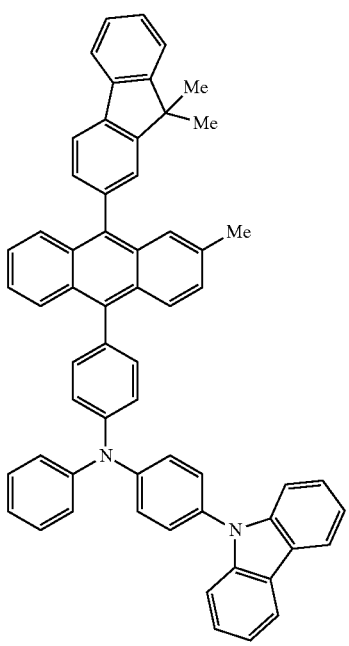
(122)
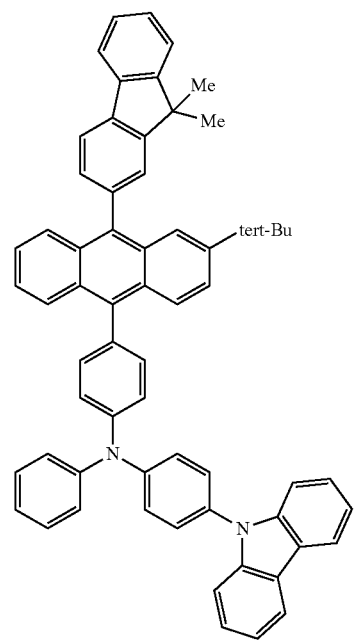
(124)

(125)
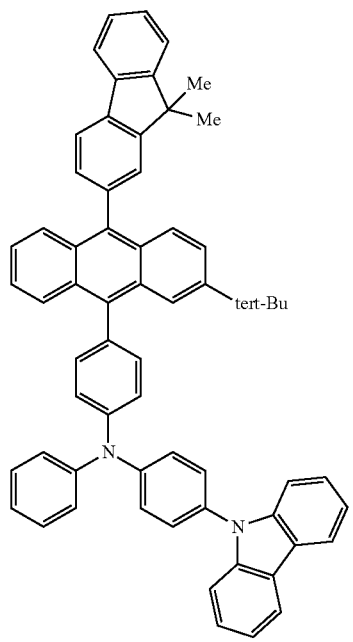
(126)
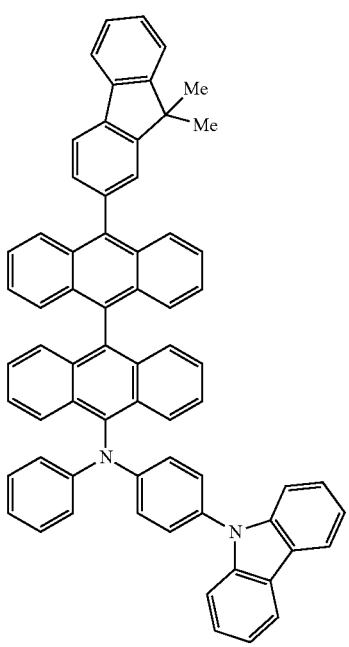
(127)
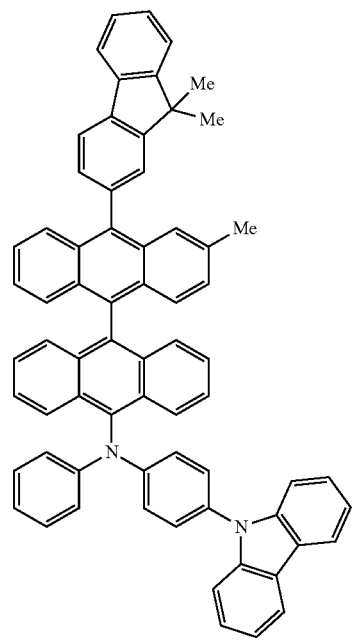
(128)
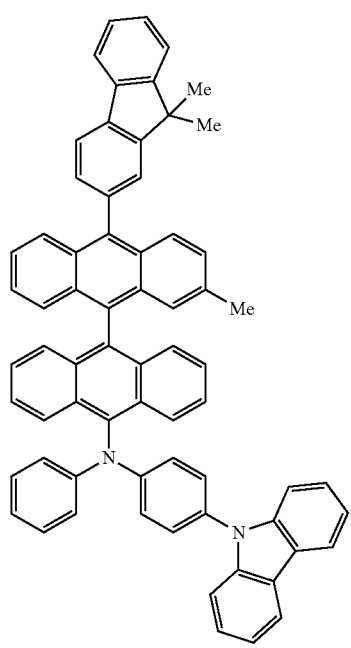

(129) 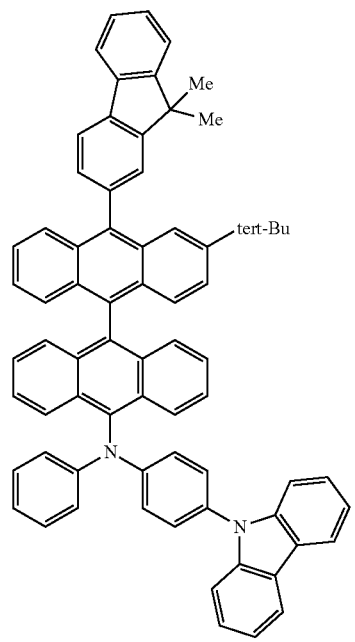
(131) 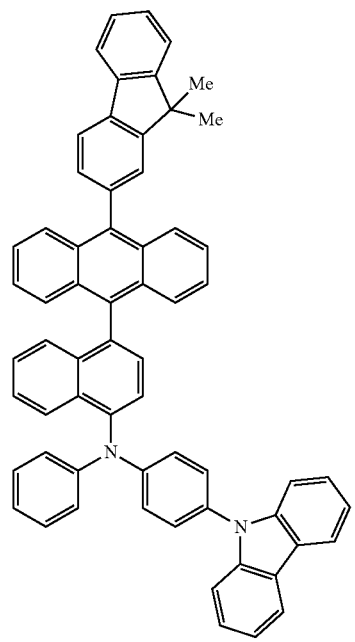
(130) 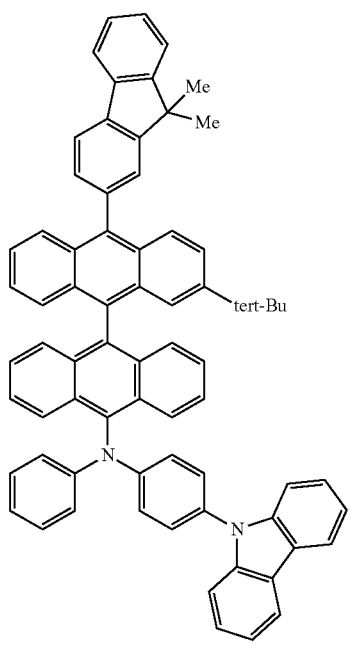
(132) 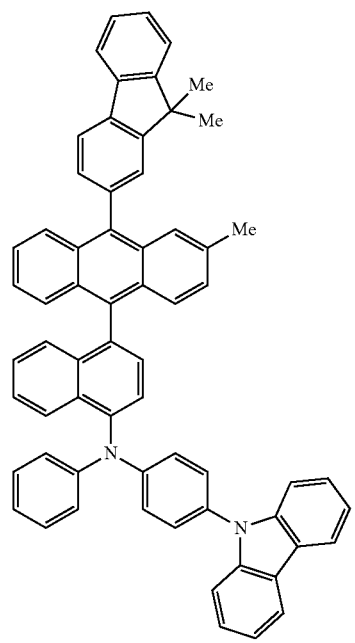

-continued
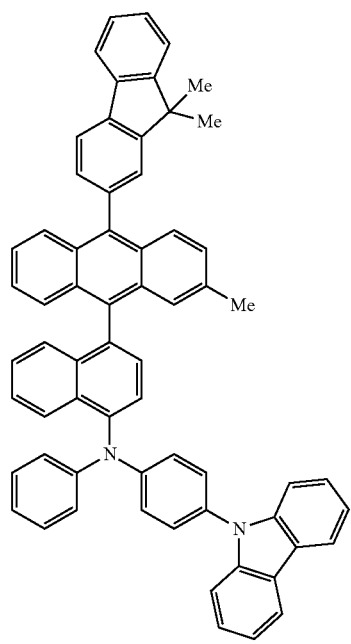
(133)
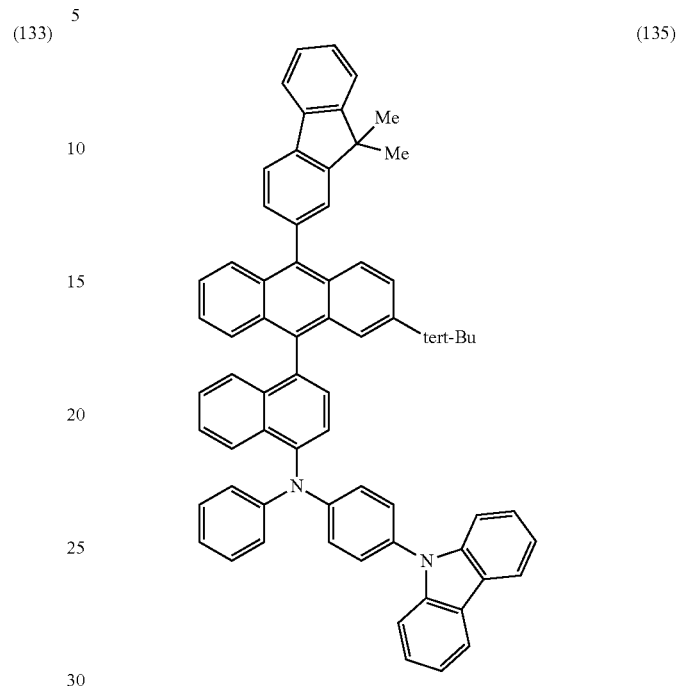
(135)
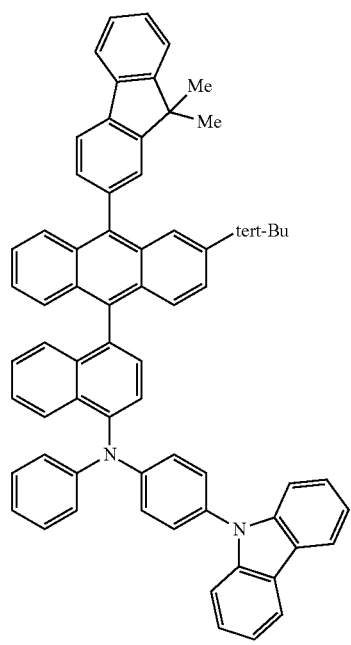
(134)
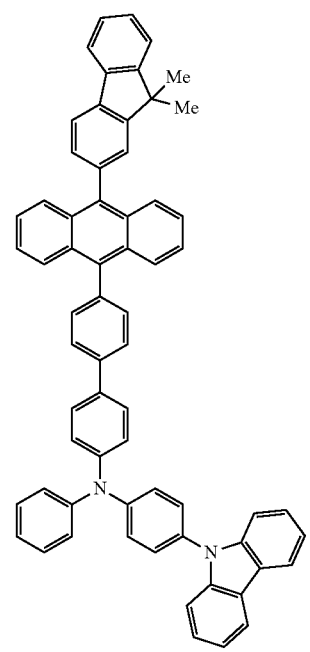
(136)

(137)
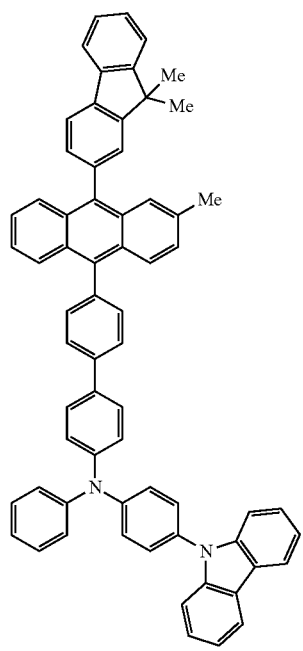
(139)
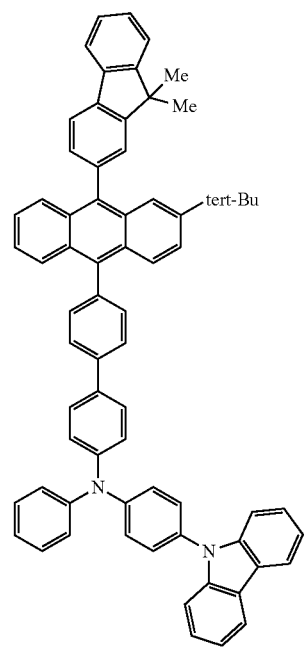
(138)
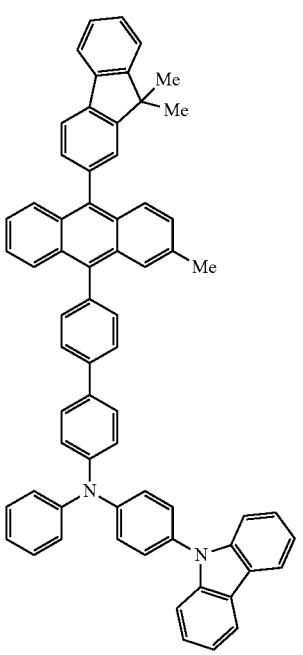
(140)
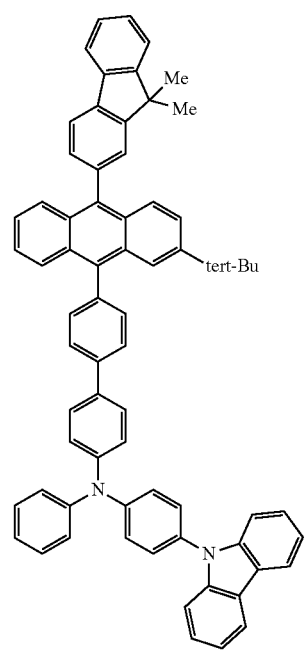

(141) 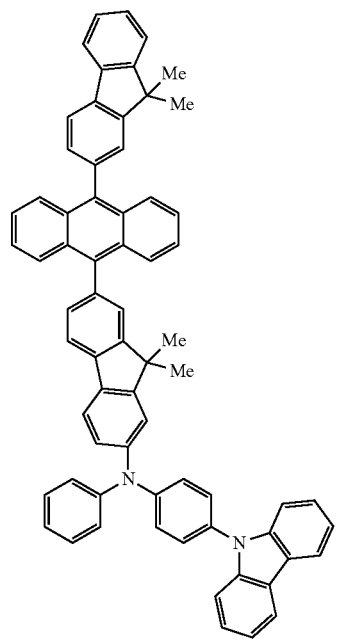
(142) 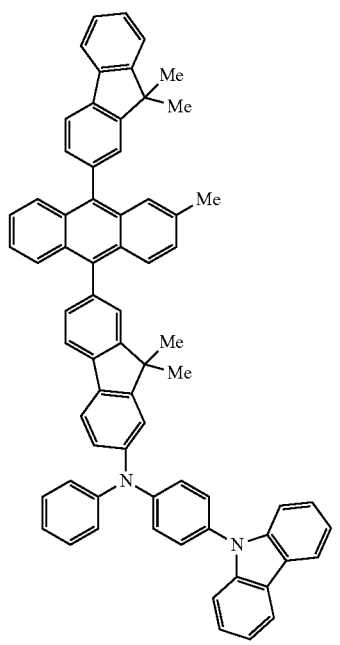
(143) 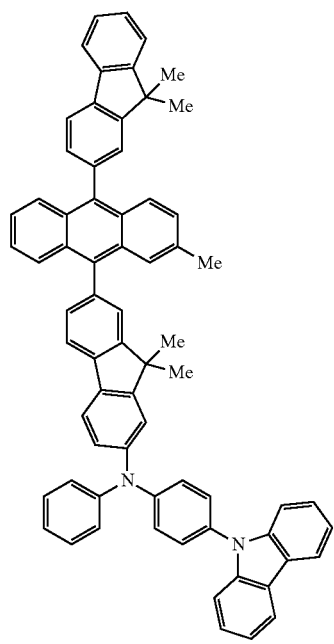
(144) 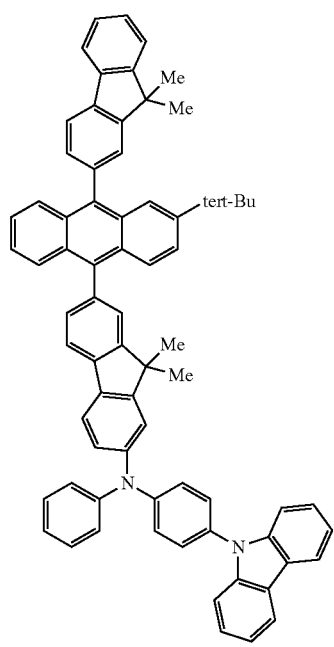

(145) 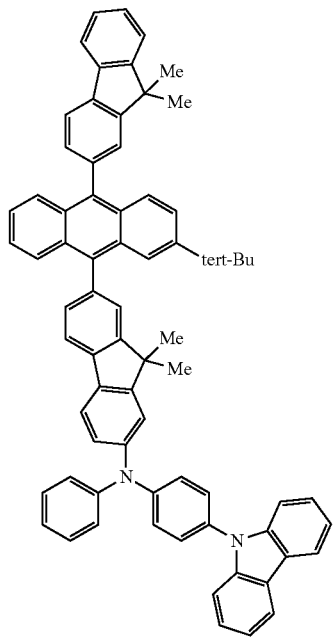
(146) 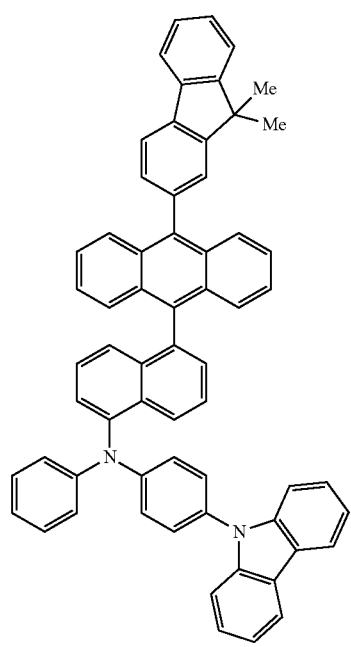
(147) 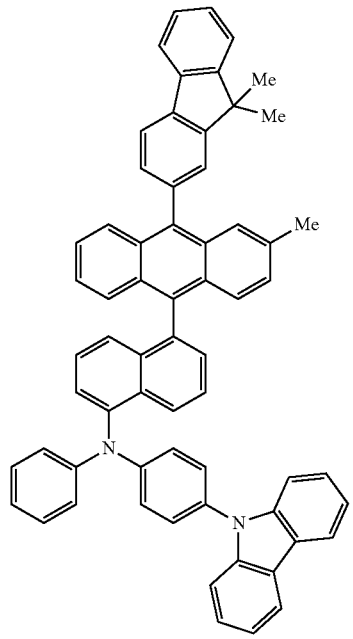
(148) 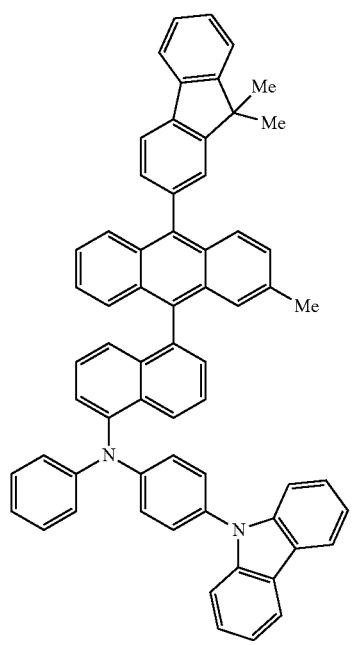

91
-continued
(149)
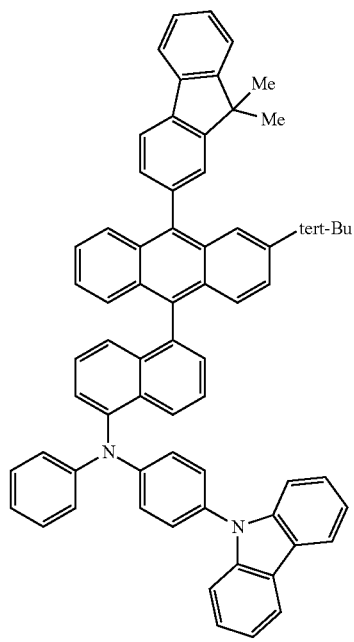
92
-continued
(151)
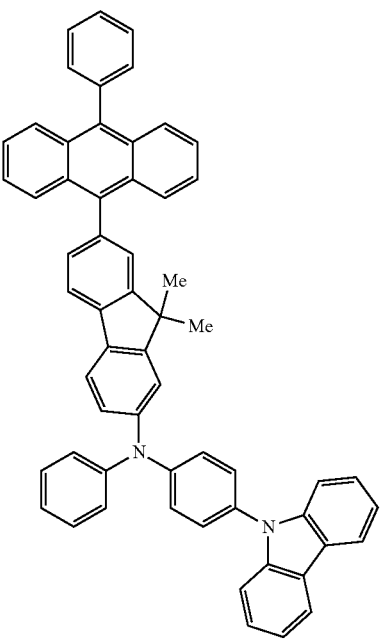
(150)
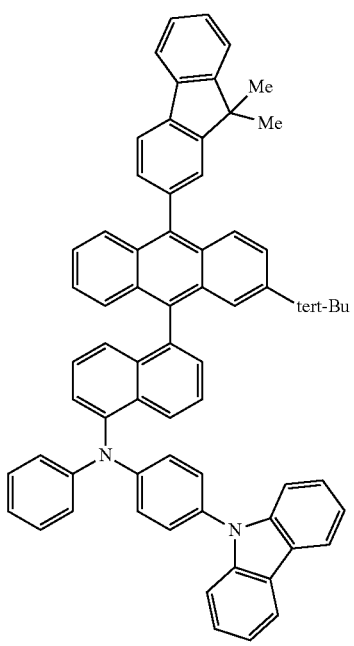
(152)
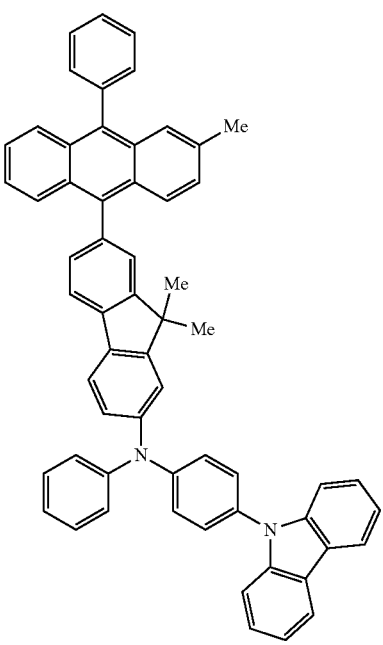

(153)

(154)

(155)

(156)

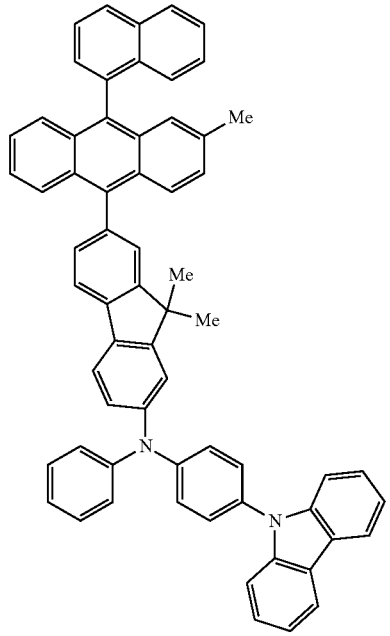
(157)
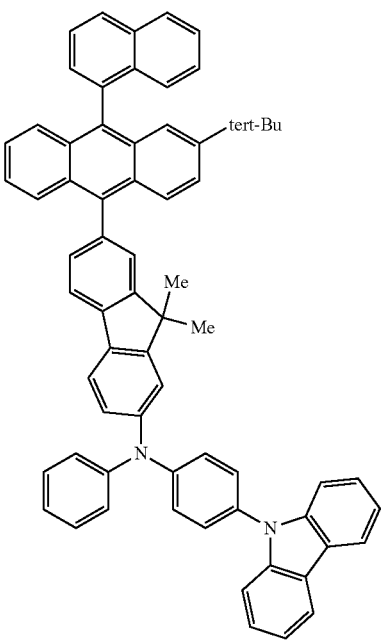
(159)
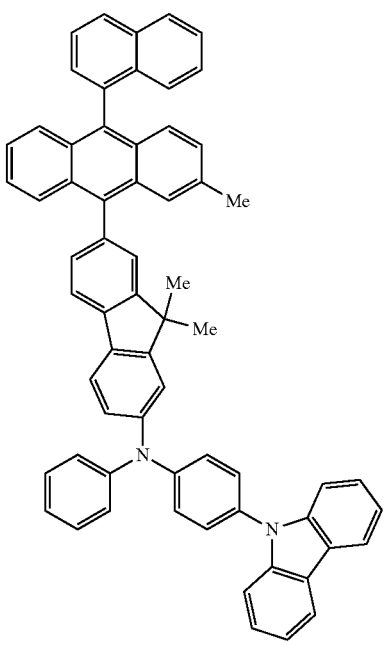
(158)
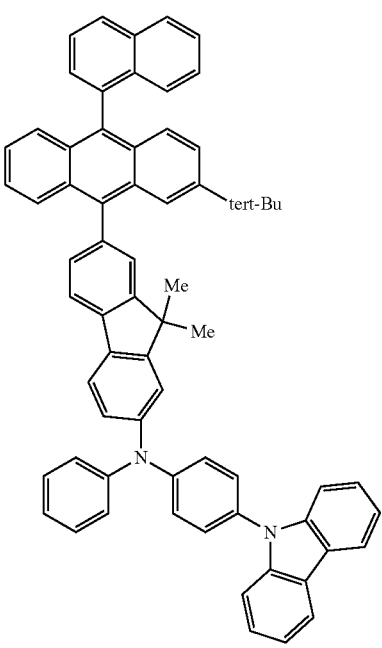
(160)

(161)
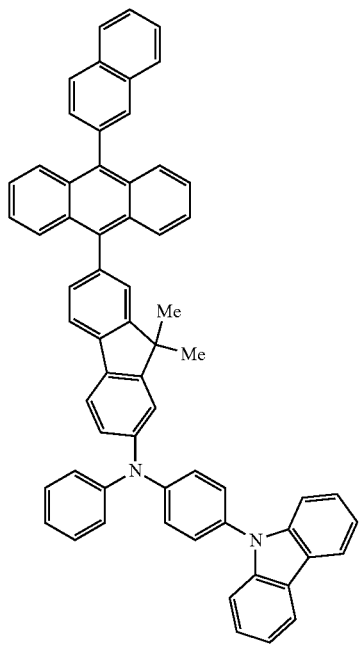
(162)
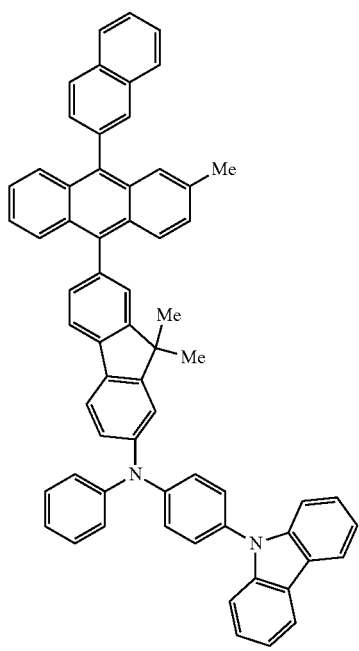
(163)
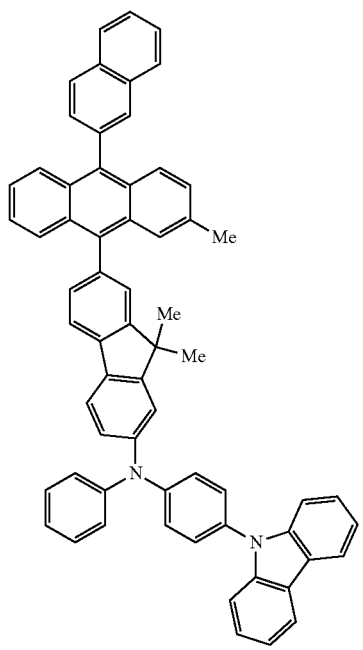
(164)
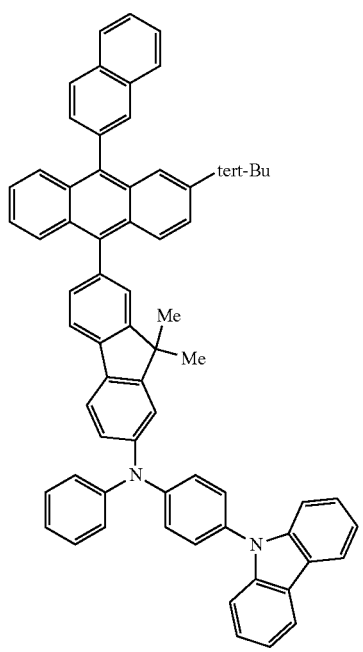

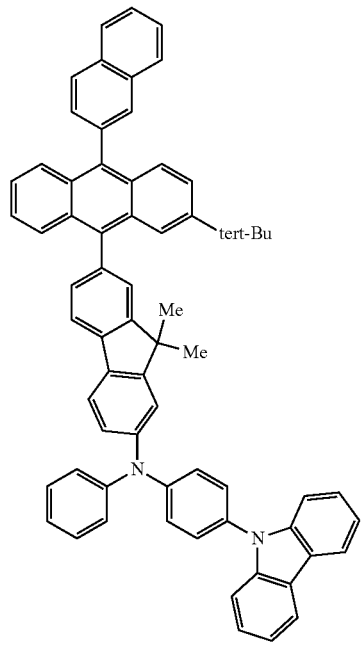 (165)
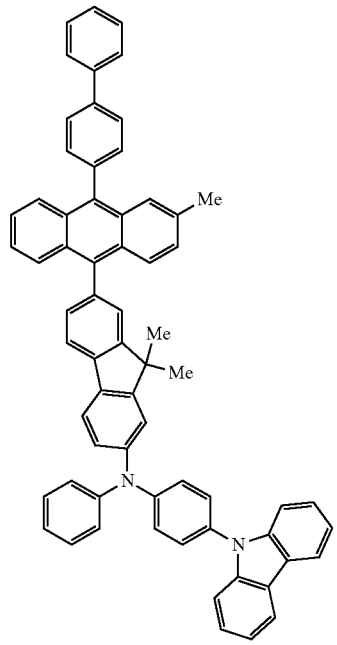 (167)
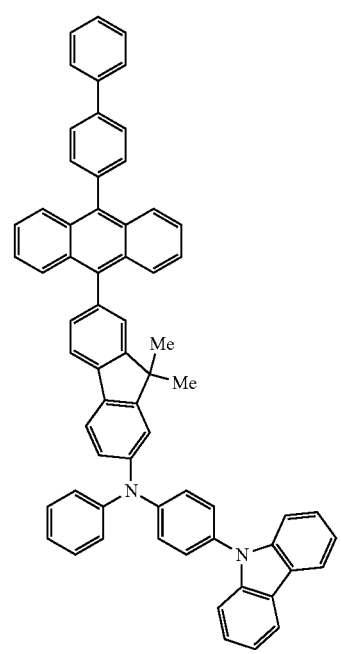 (166)
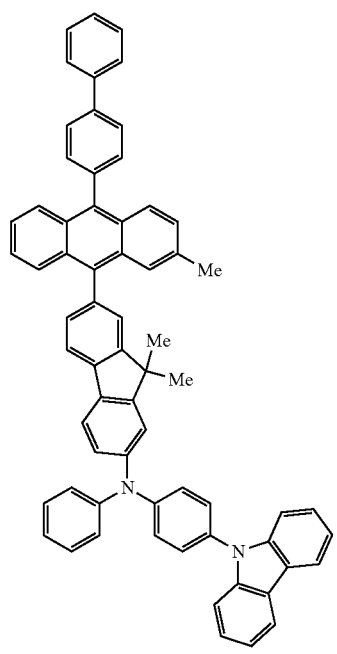 (168)

101
-continued
(169)
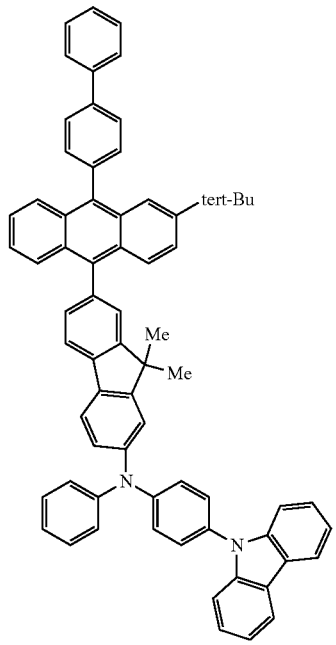
(170)
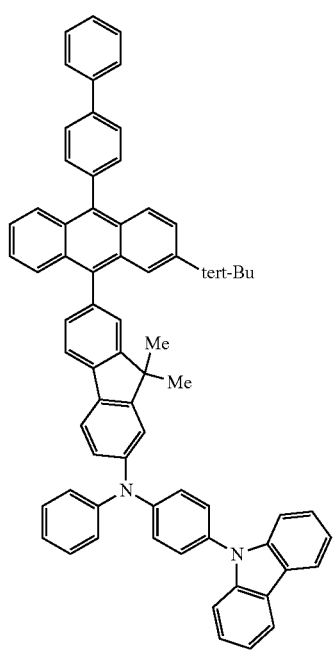
102
-continued
(171)
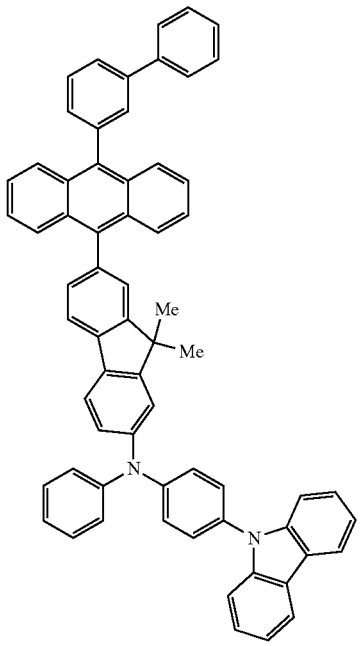
(172)
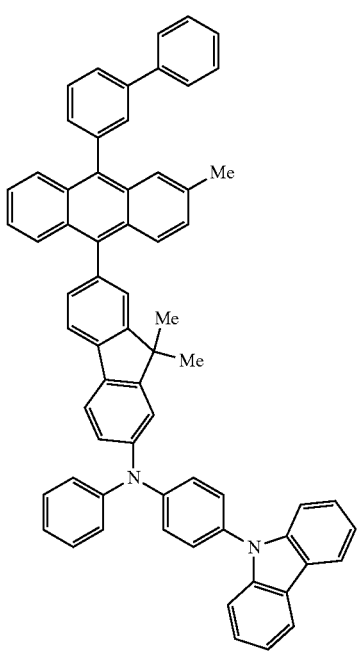

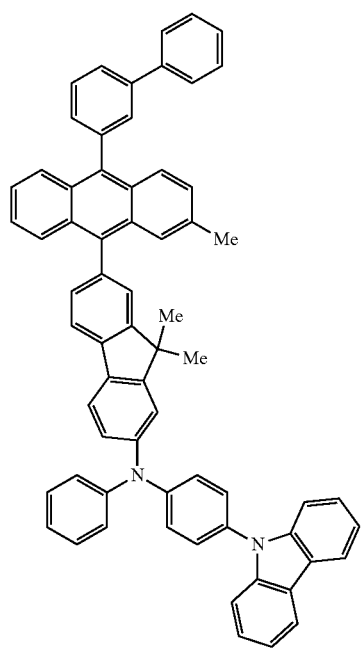
(173)
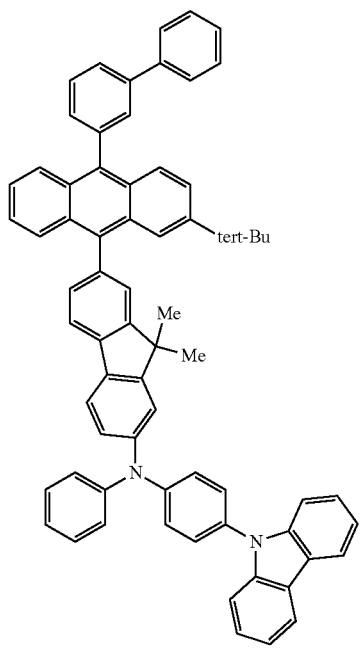
(175)
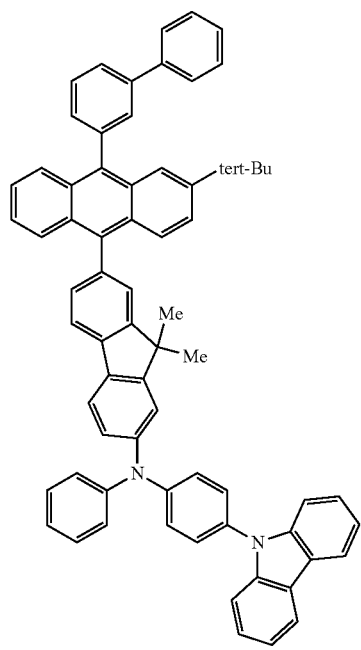
(174)
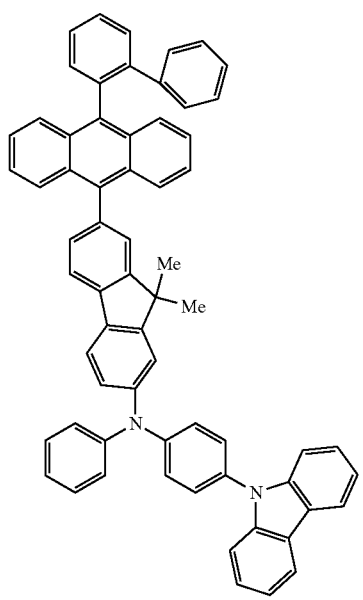
(176)

-continued
(177) 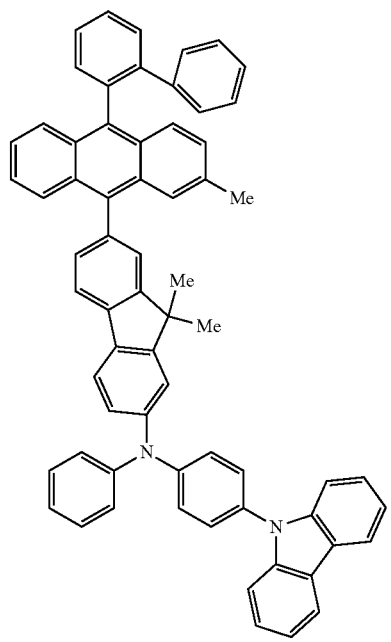
(178) 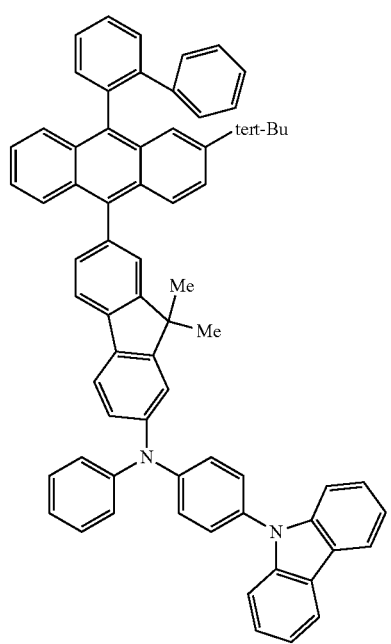
(179) 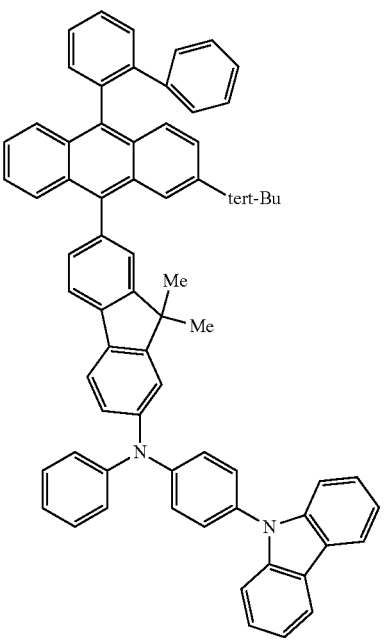
(180) 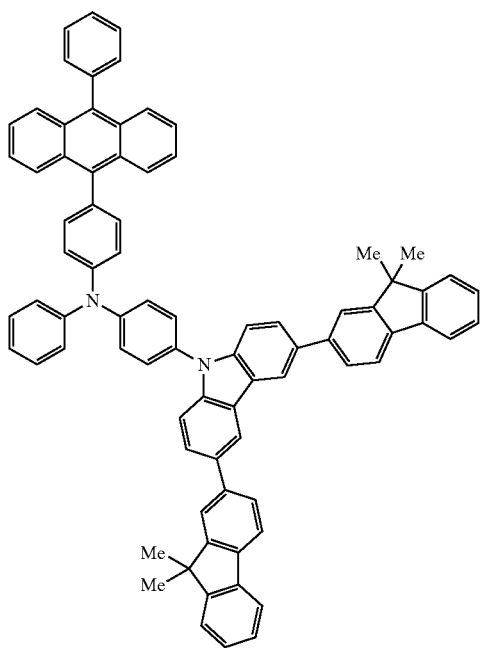

-continued
(181) 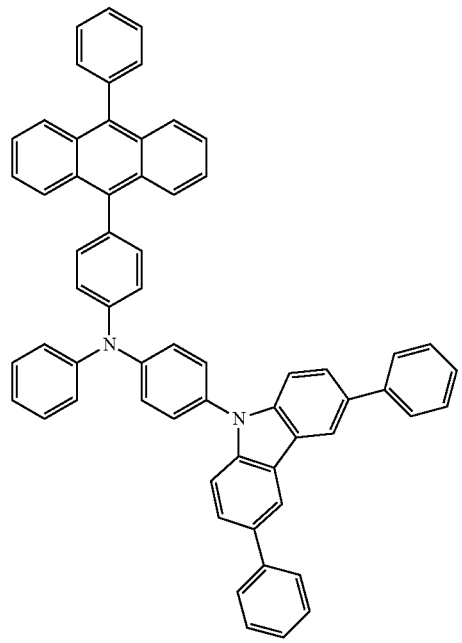
(182) 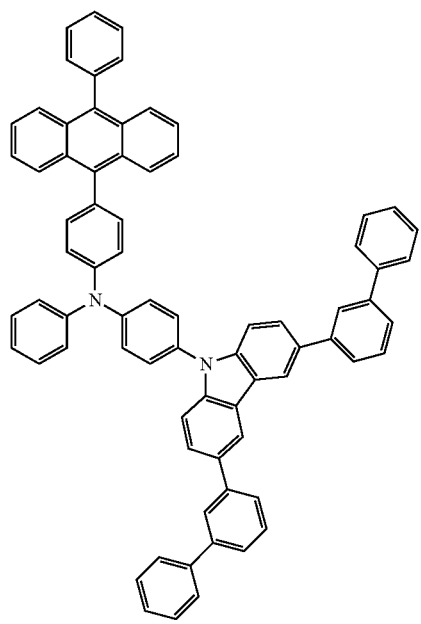
(183) 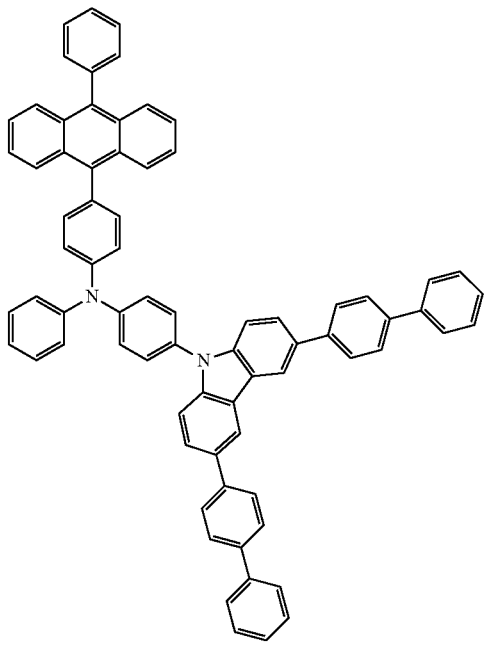
(184) 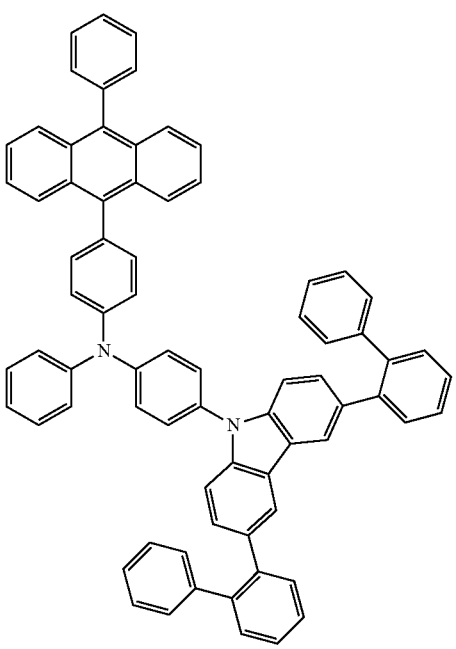

(185)
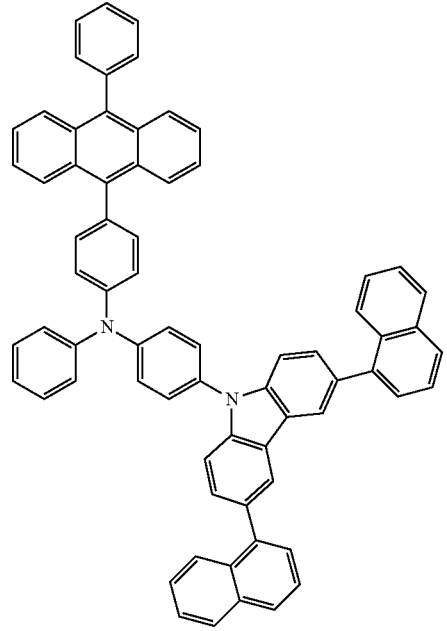
(186)
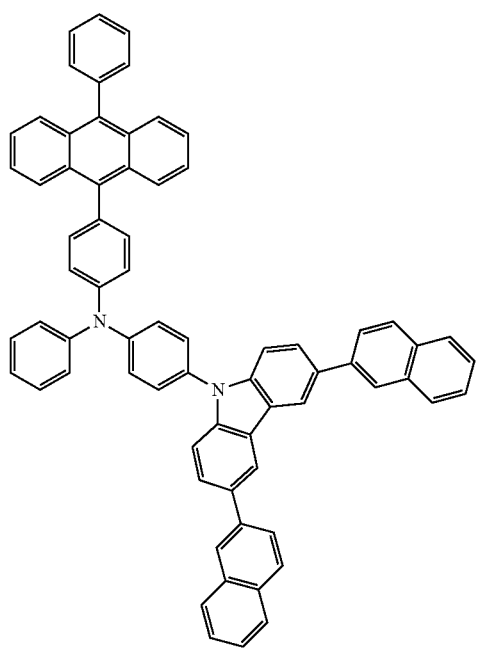
(187)
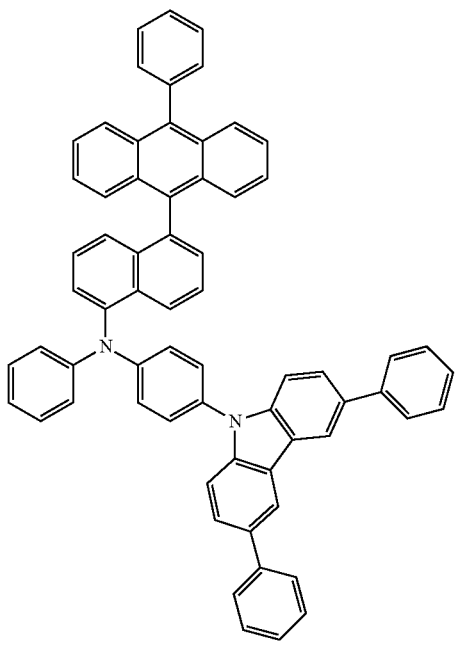
(188)
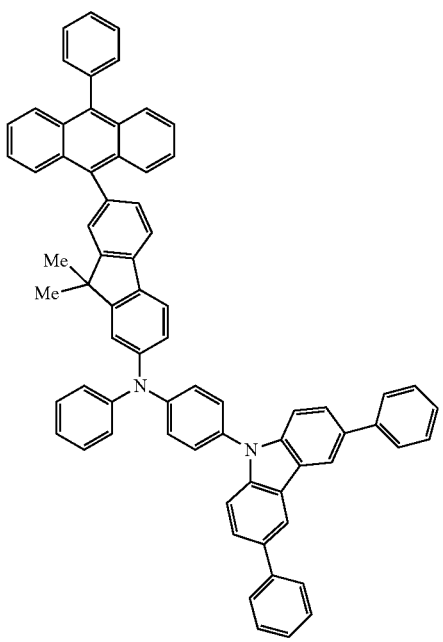

-continued (189)

(190)

-continued (191)

(192)

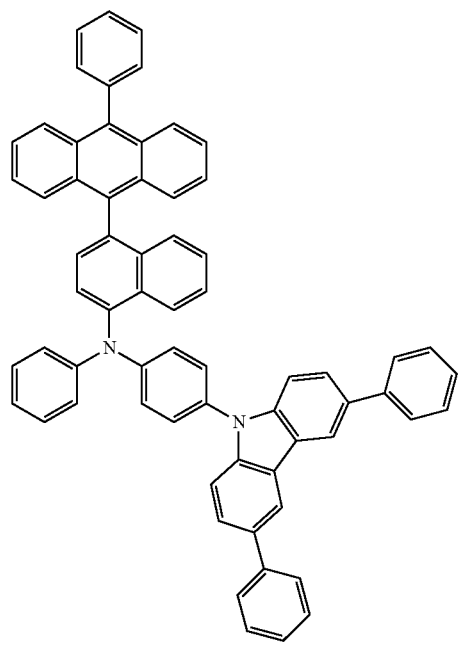
(193)
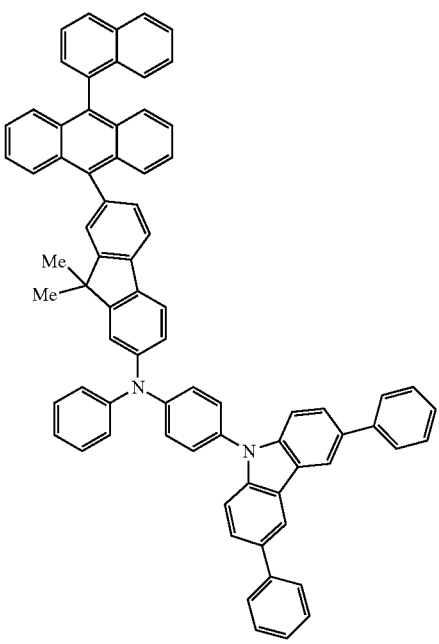
(195)
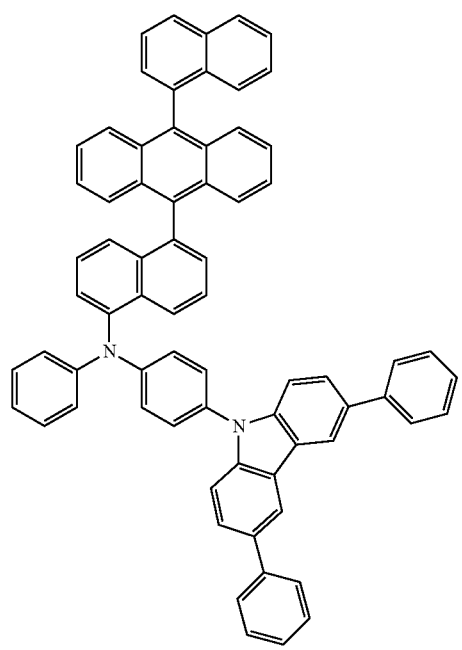
(194)
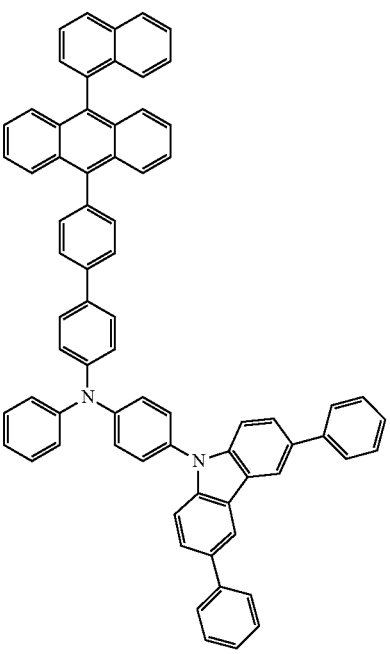
(196)

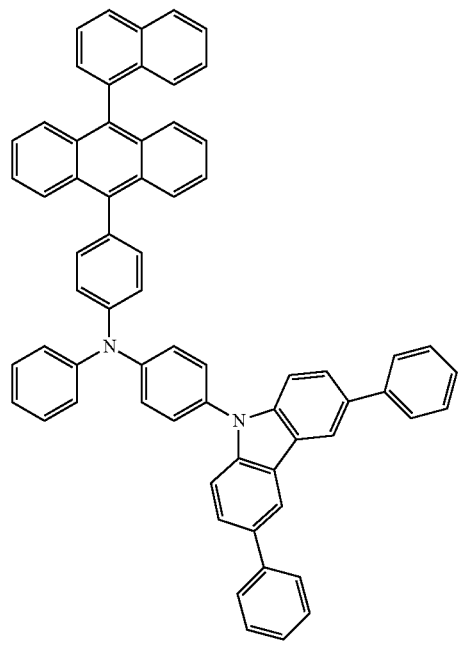
(197)
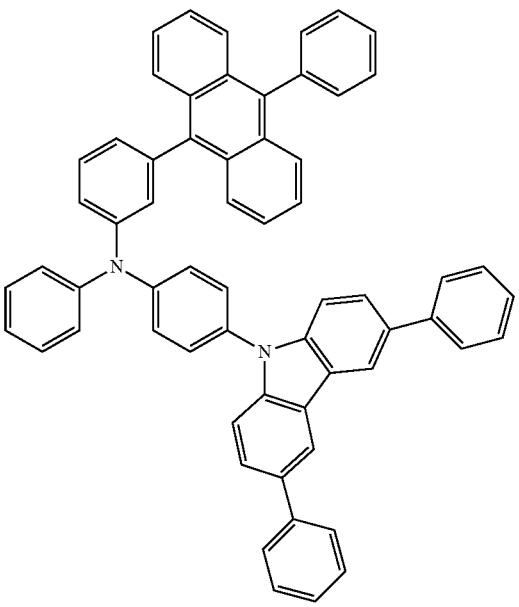
(199)
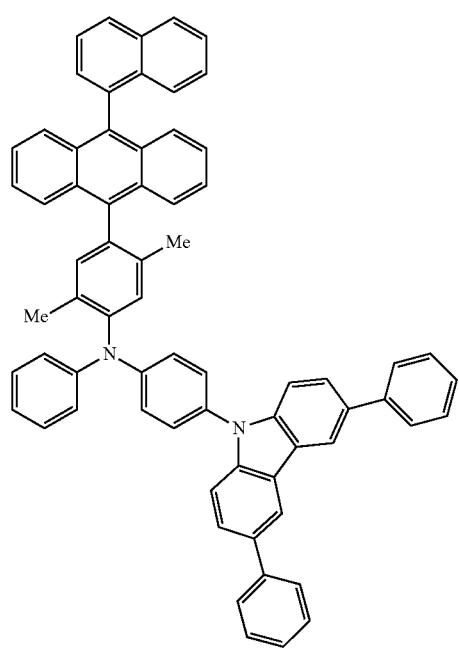
(198)
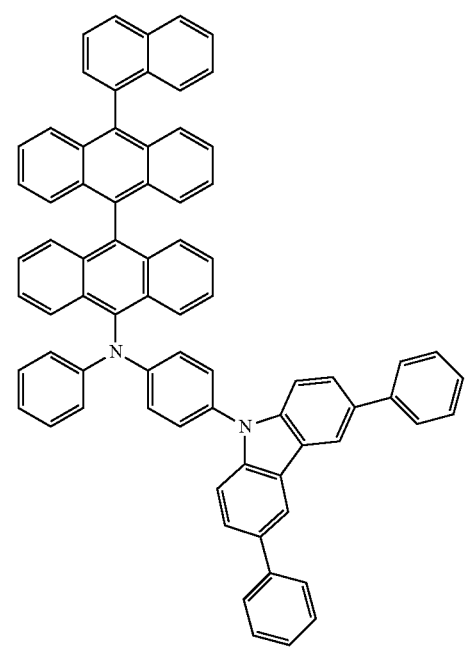
(200)

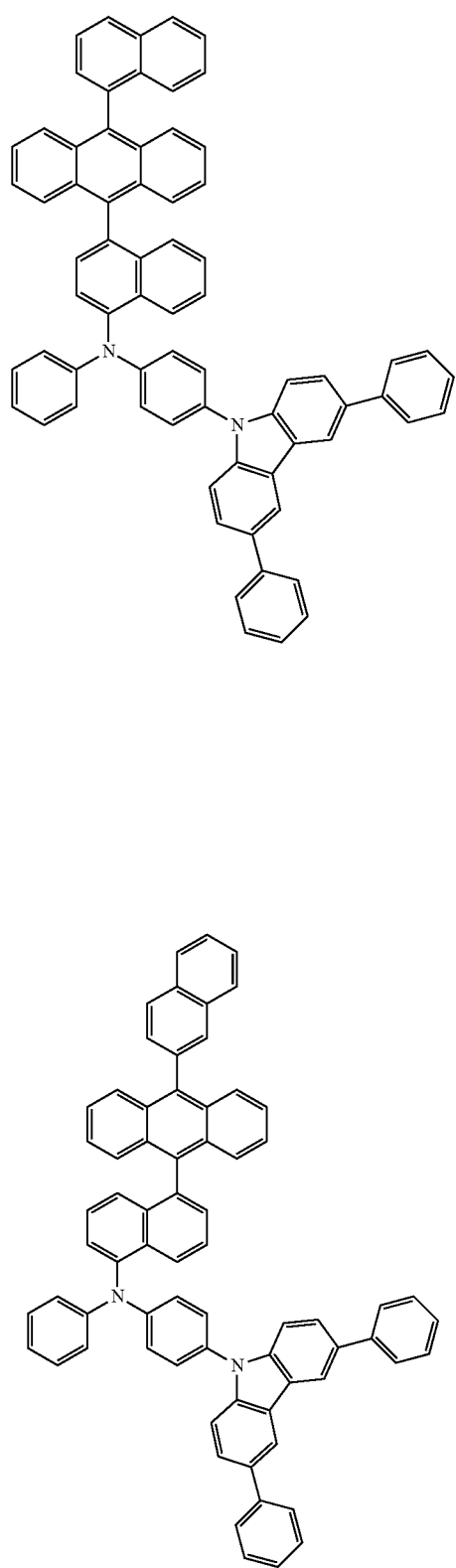
(201)
(202)
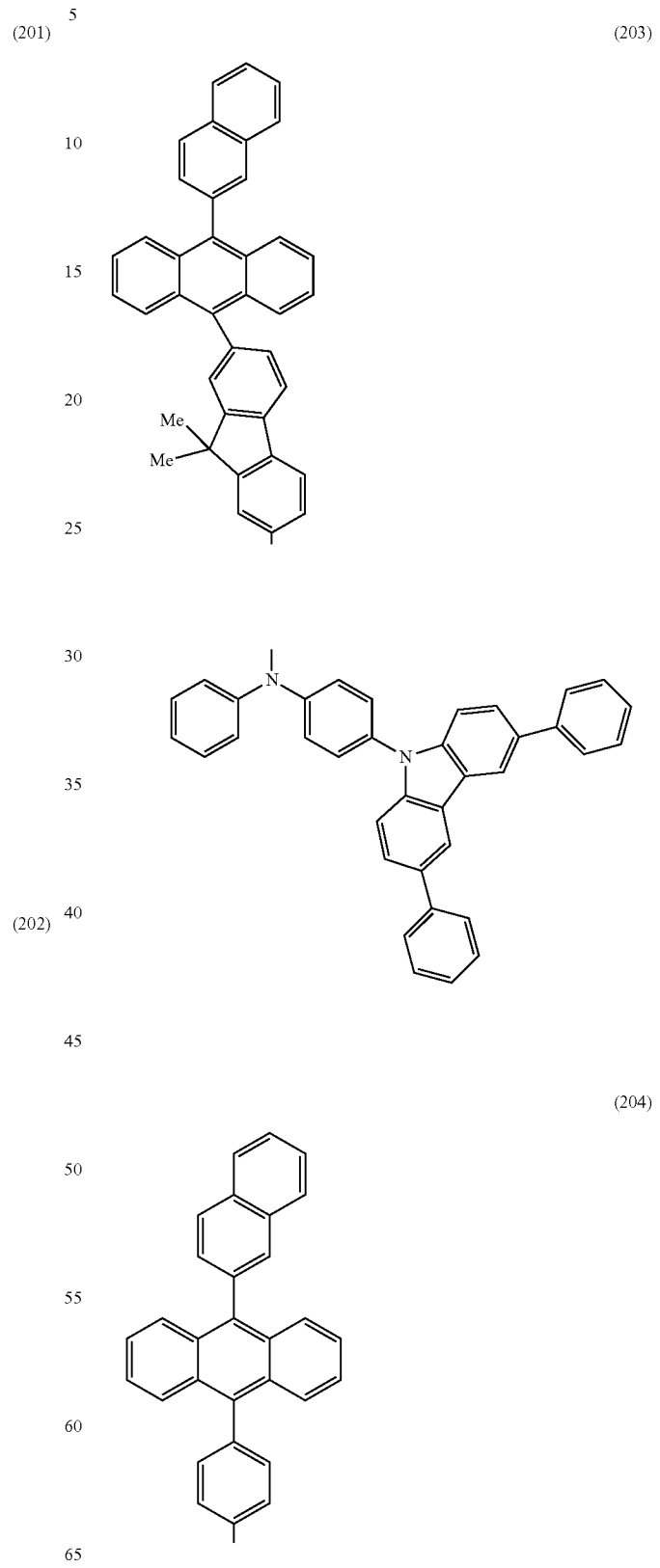
(203)
(204)

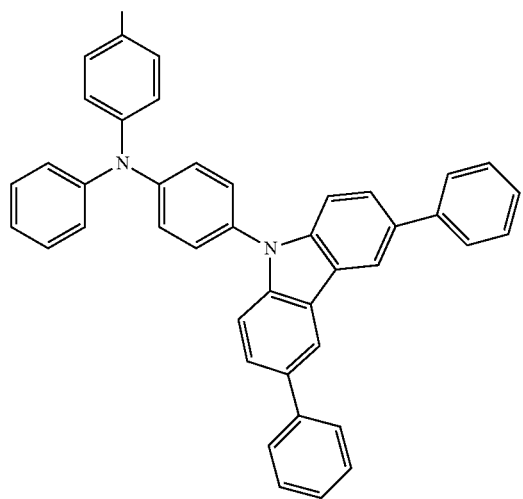
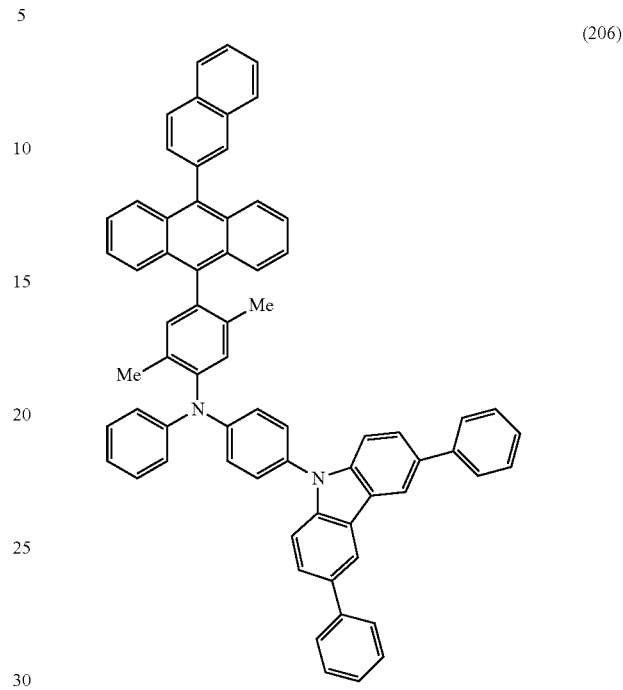
(206)
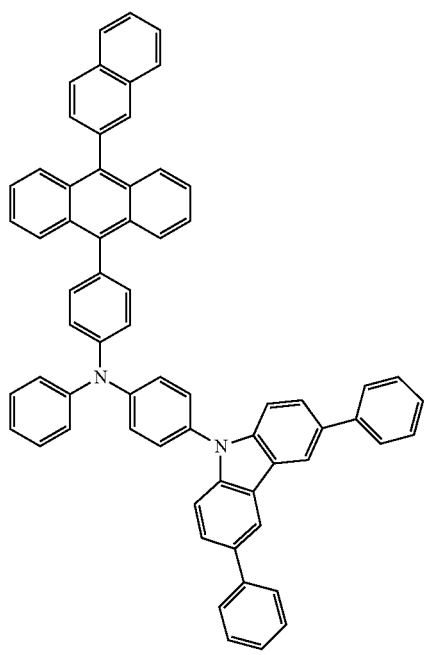
(205)
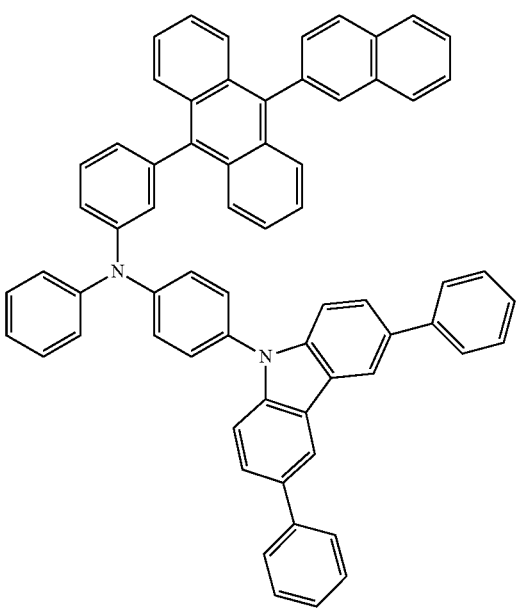
(207)

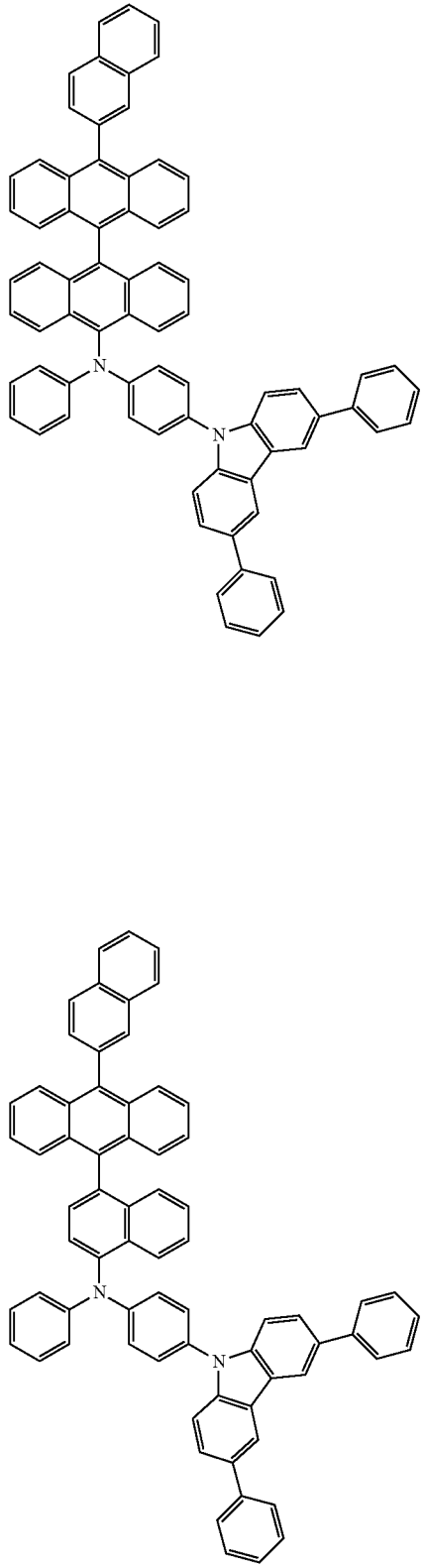
(208)
(209)
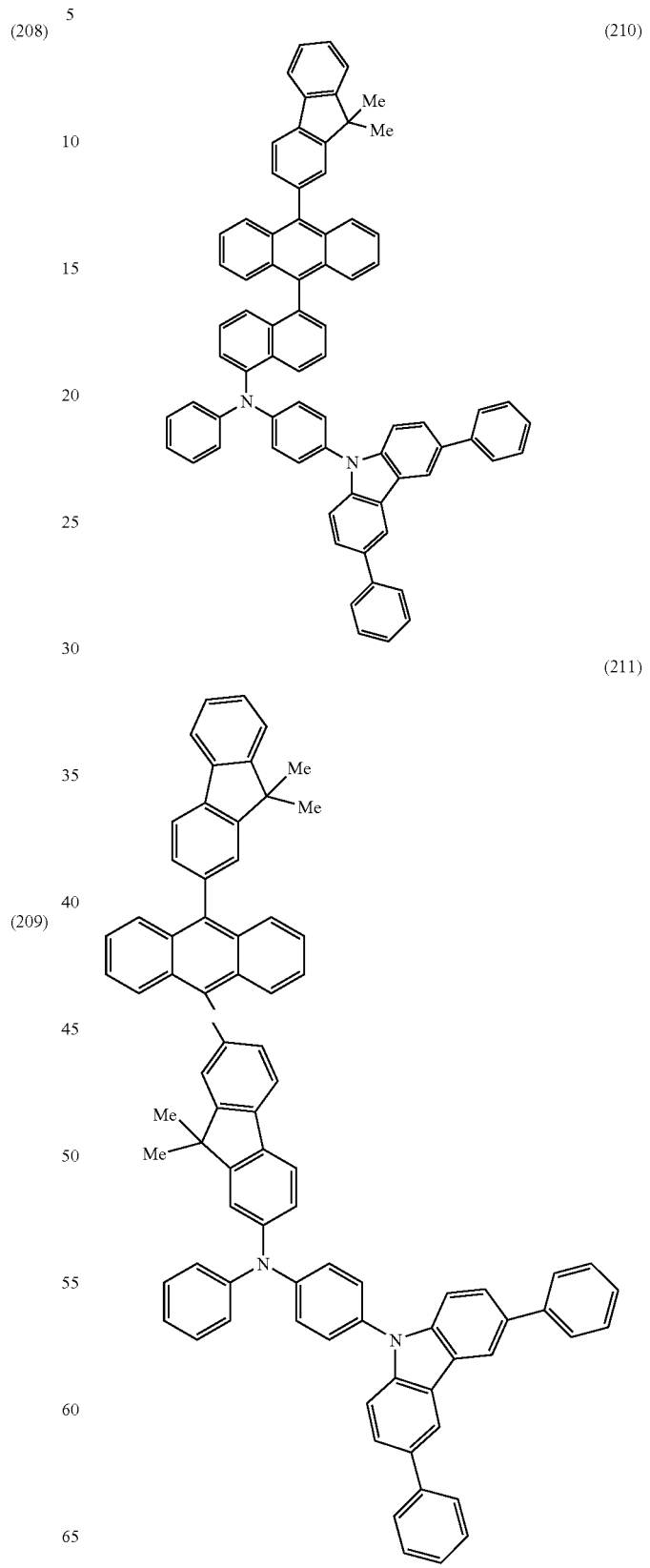
(210)
(211)

(212)
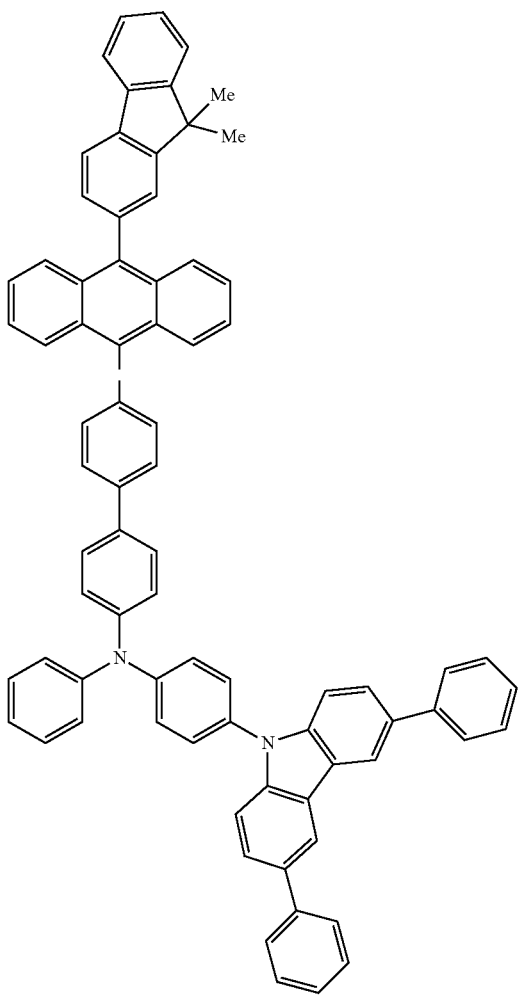
(213)
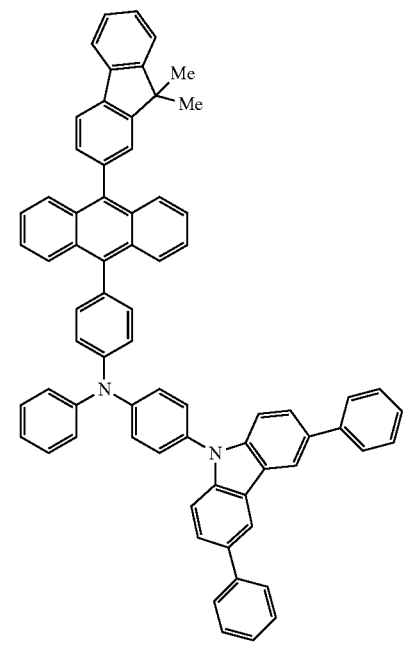
(214)
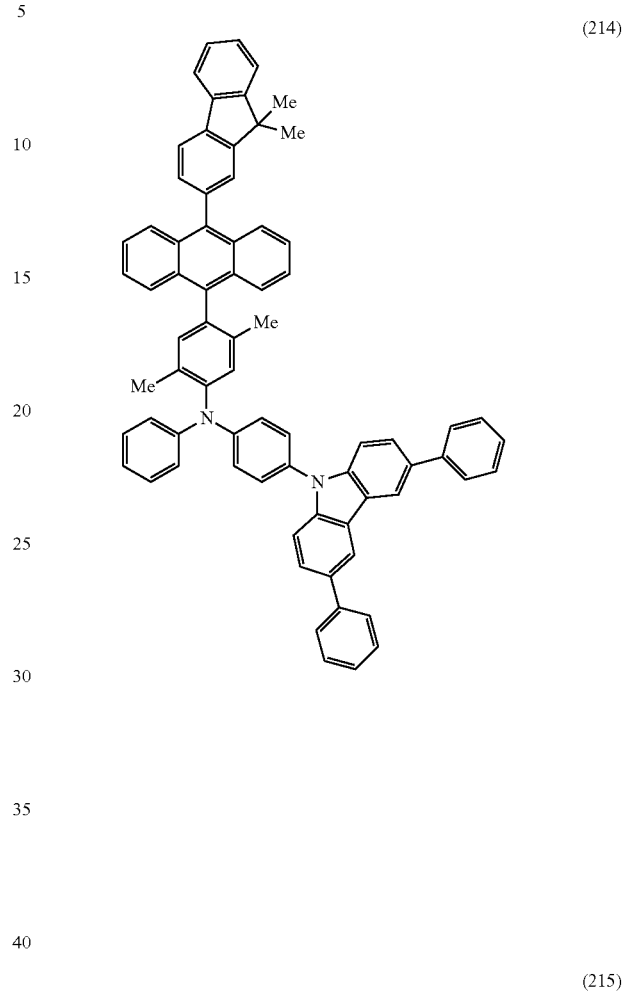
(215)
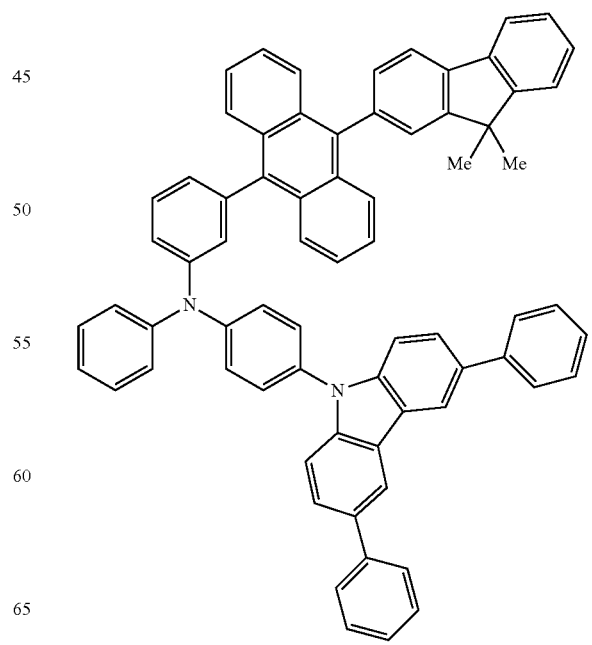

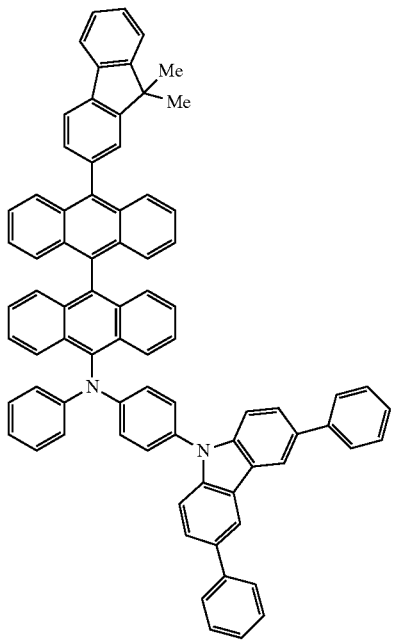
(216)
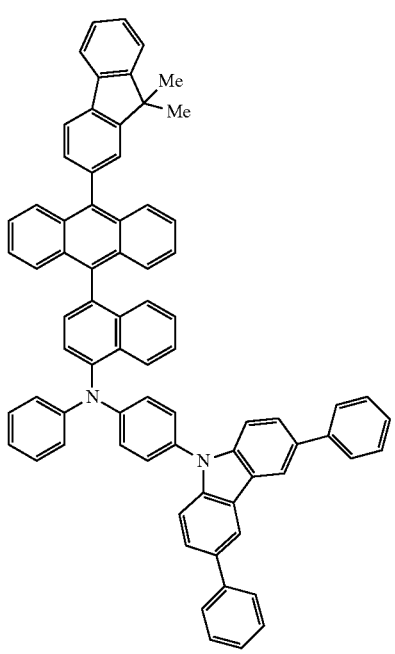
(217)
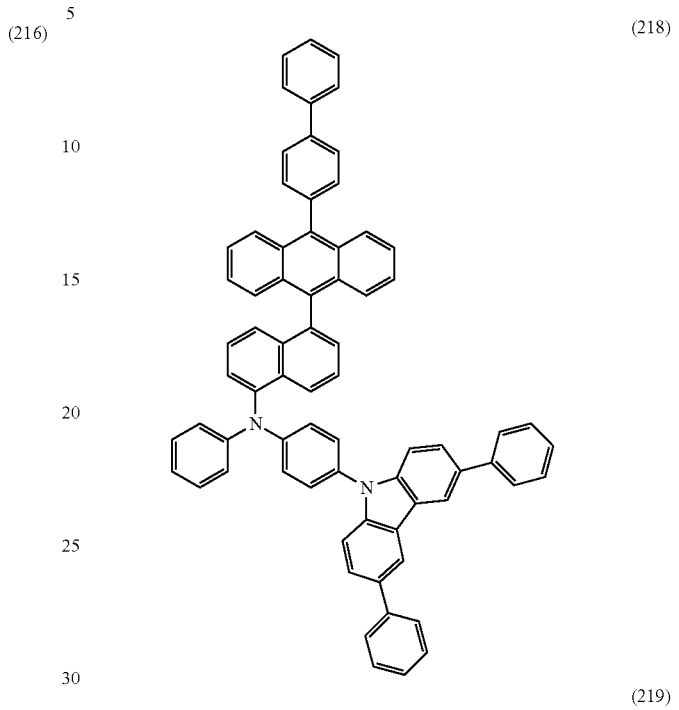
(218)
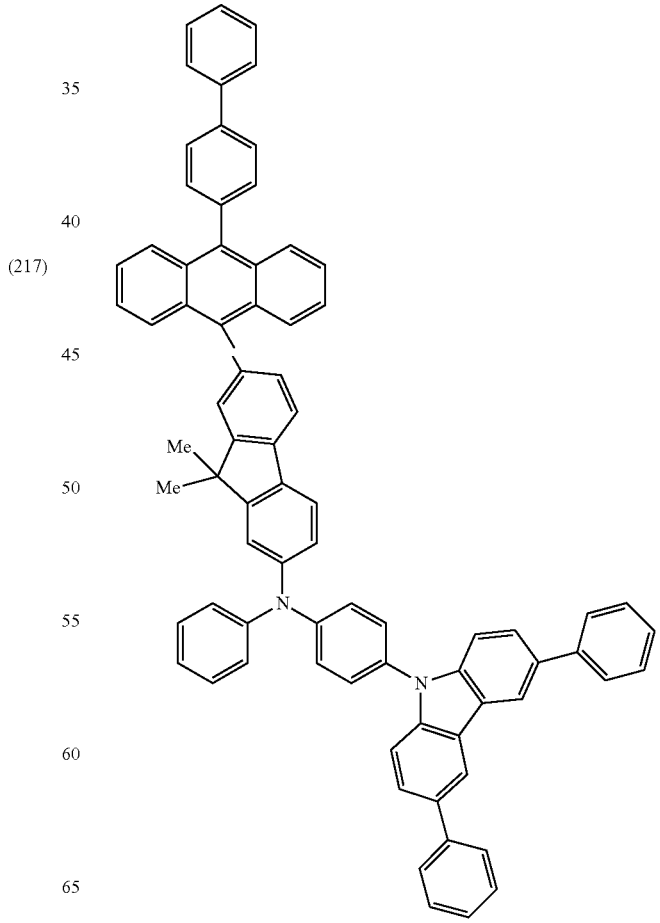
(219)

127
-continued
(220)
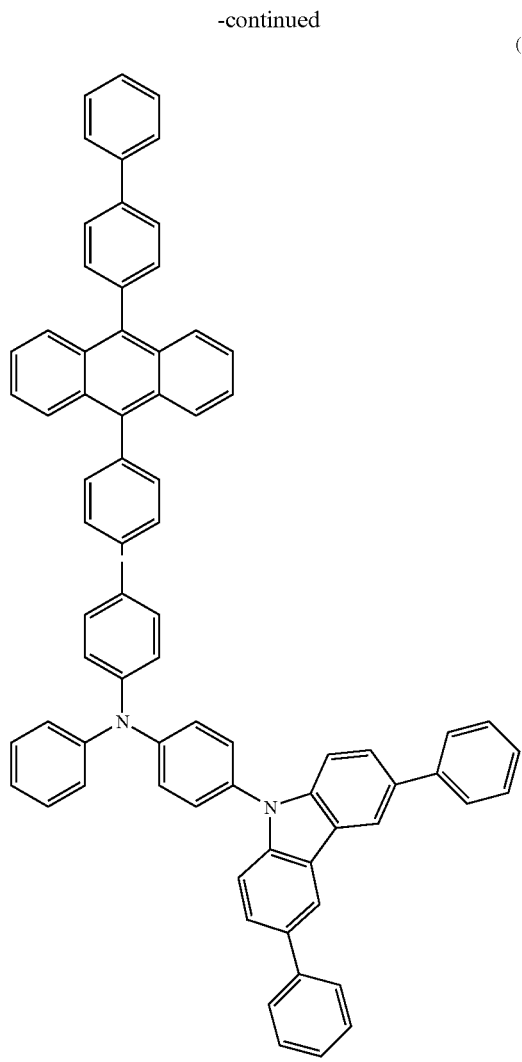
(221)
128
-continued
(222)
(223)
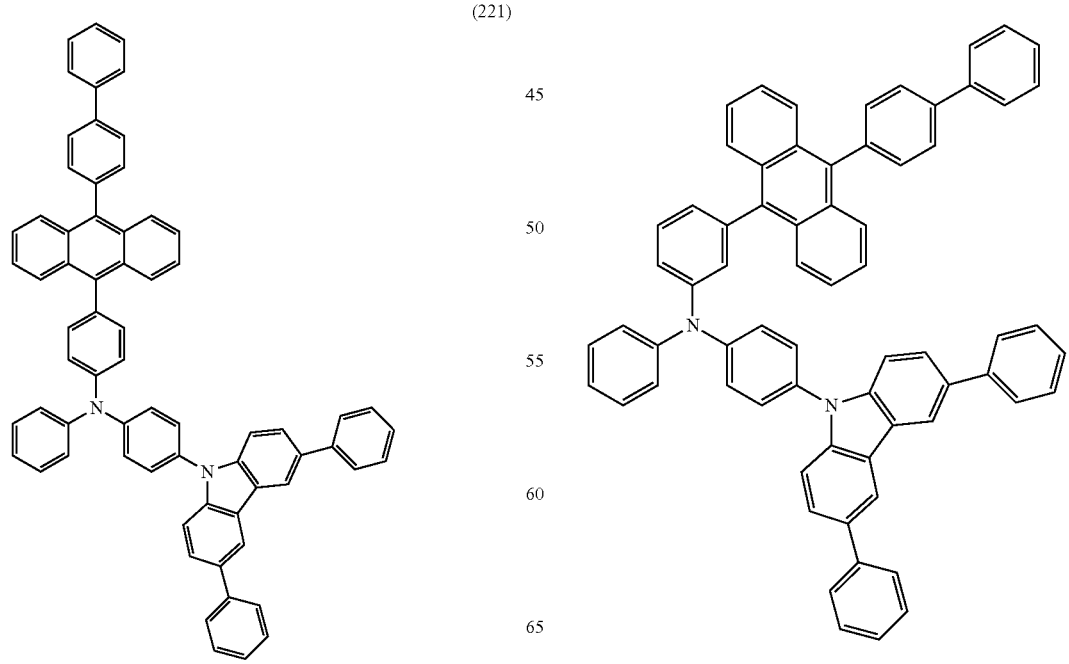

-continued
(224)
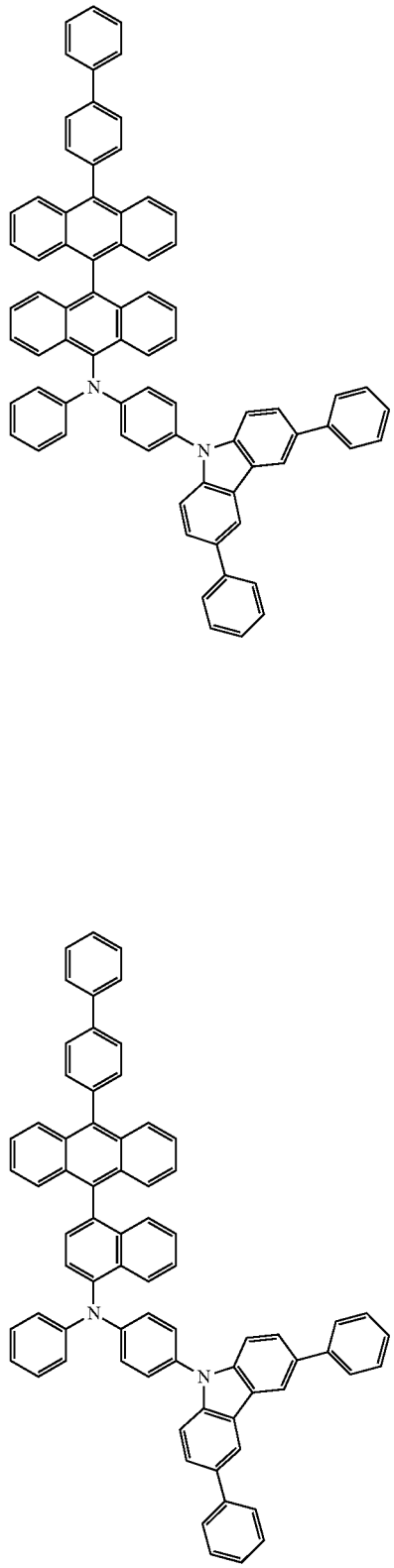
(225)
(226)
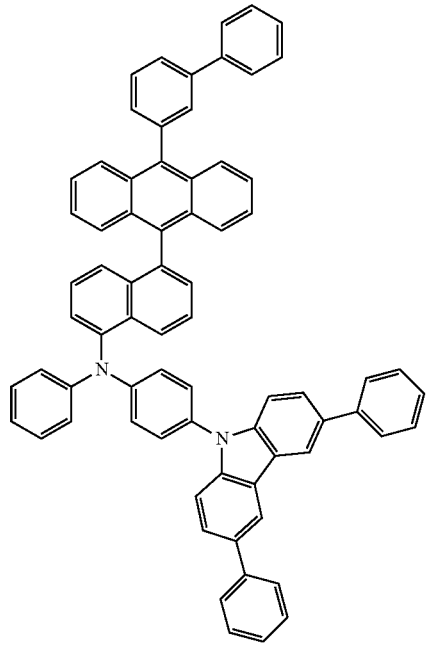
(227)
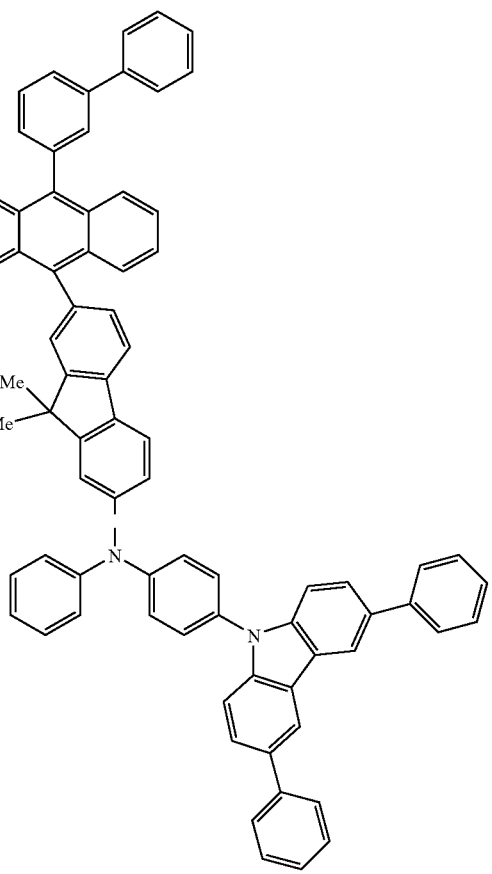

-continued
(228)
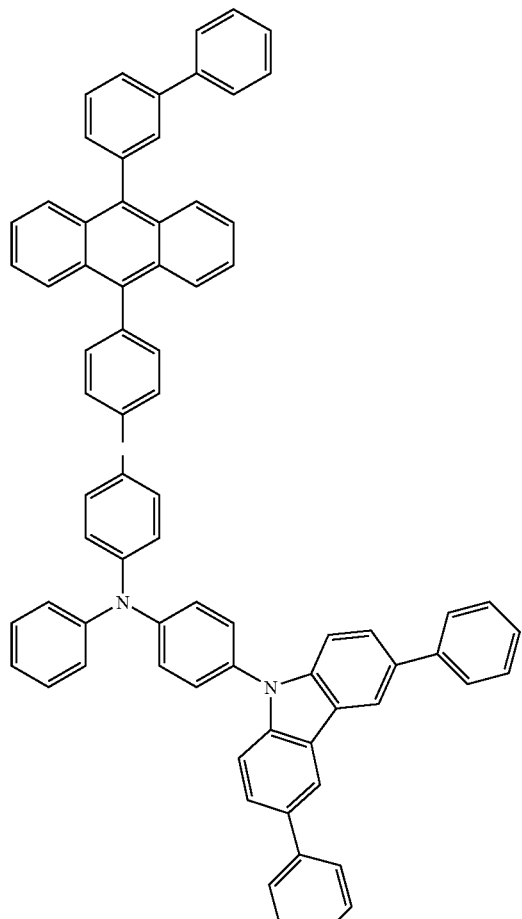
(229)
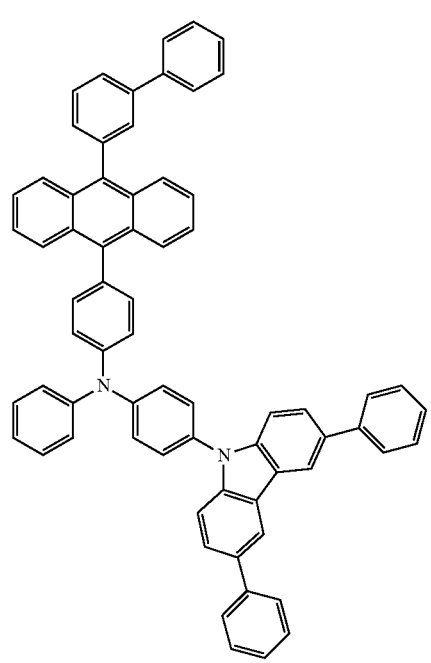
-continued
(230)
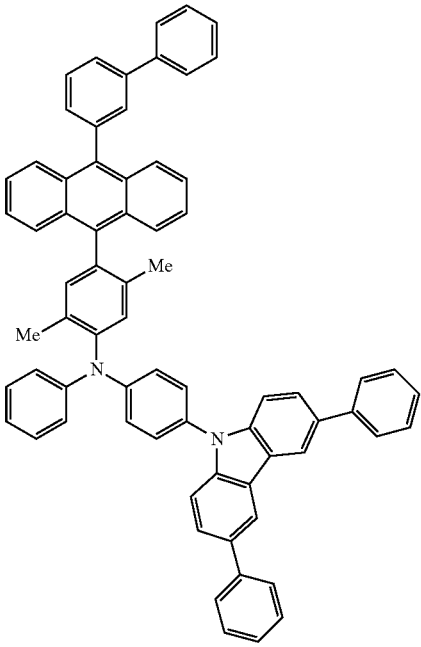
(231)
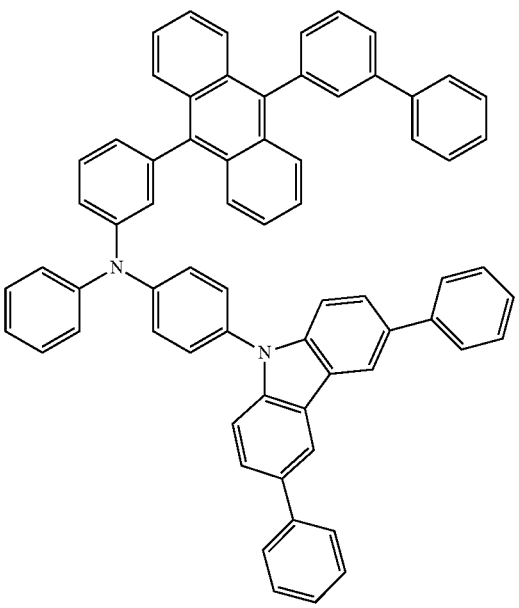

(232)
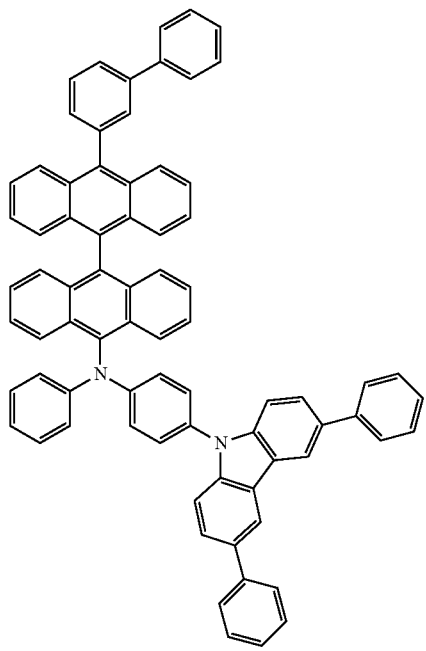
(234)
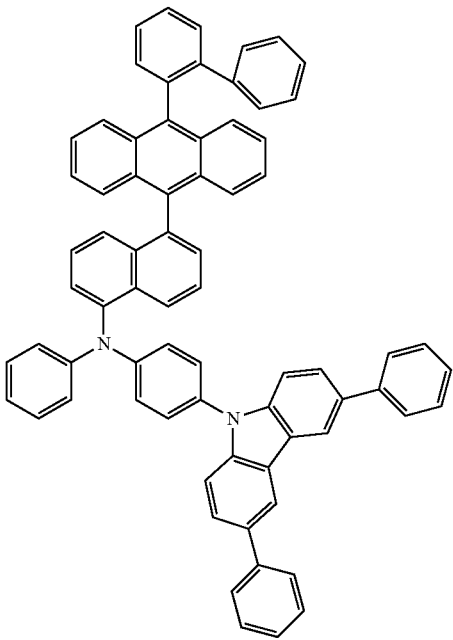
(233)
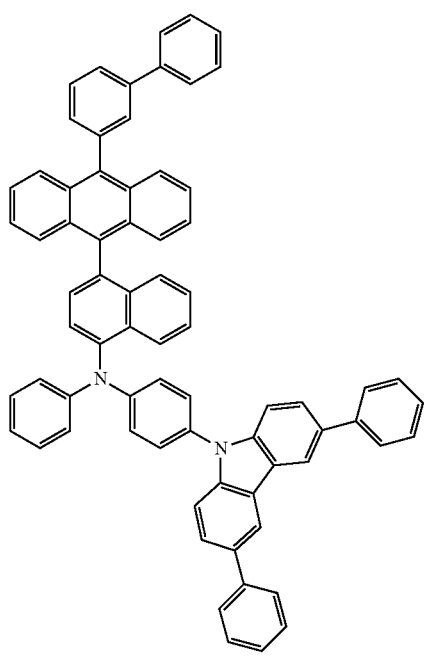
(235)
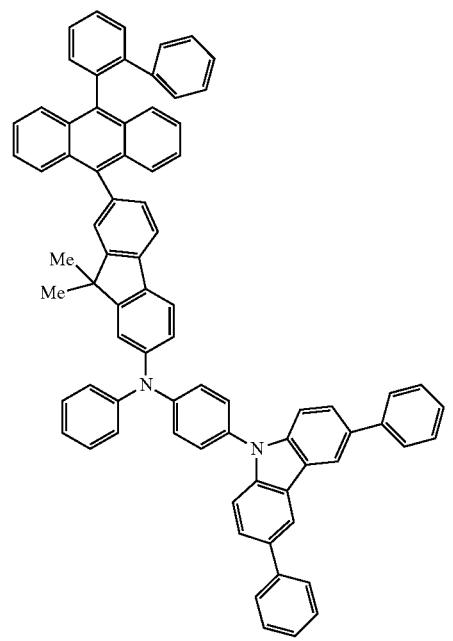

(236)
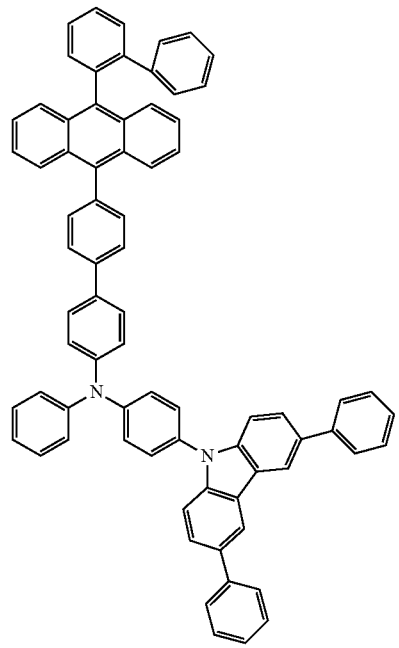
(238)
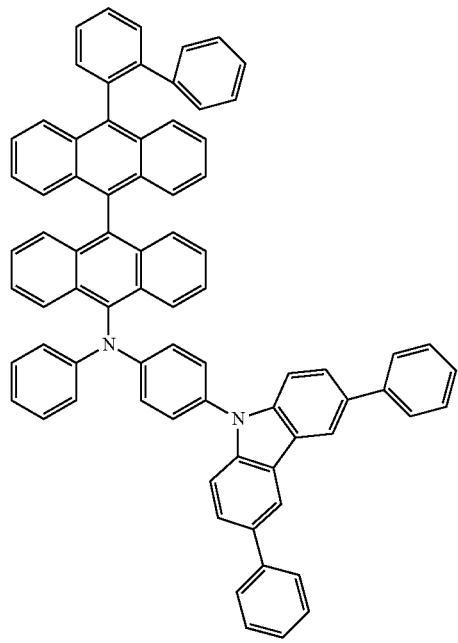
(237)
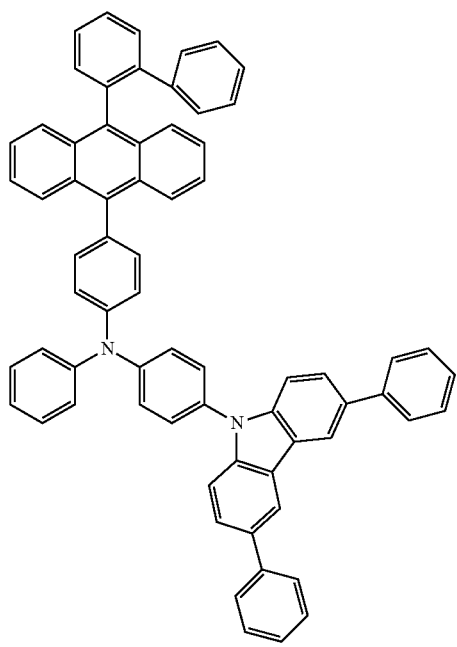
(239)
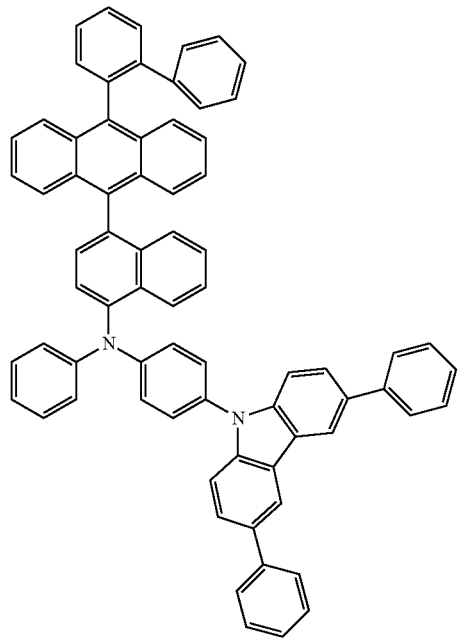

(240)
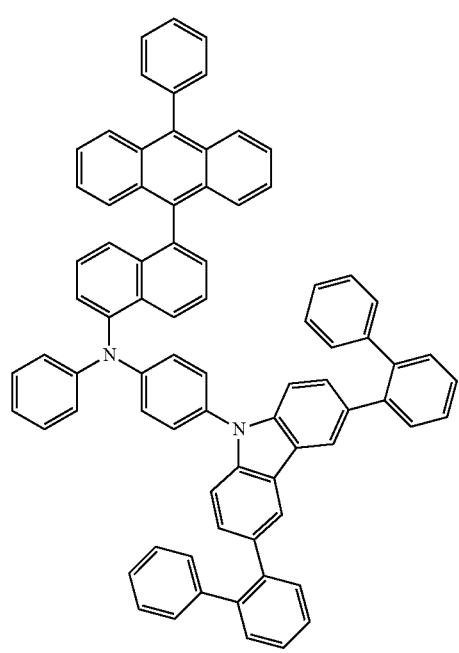
(241)
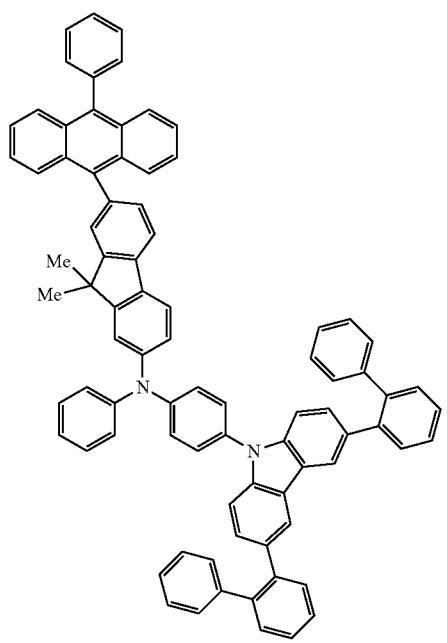
(242)
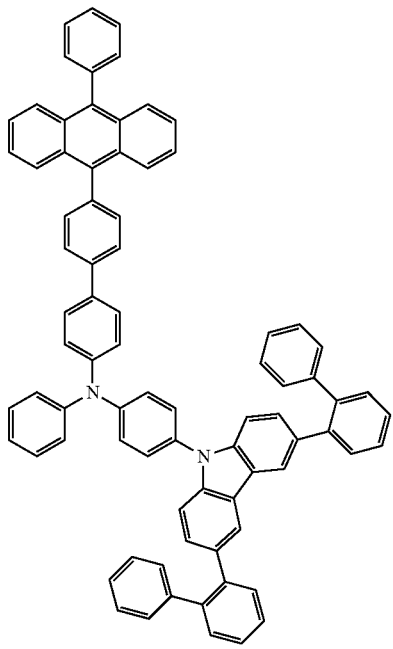
(243)
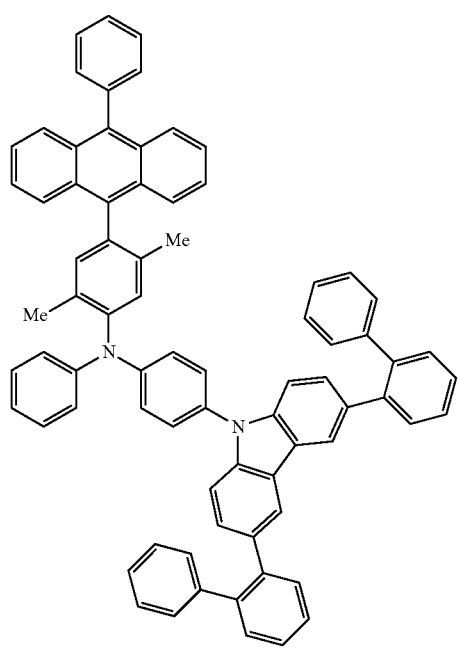

(244)
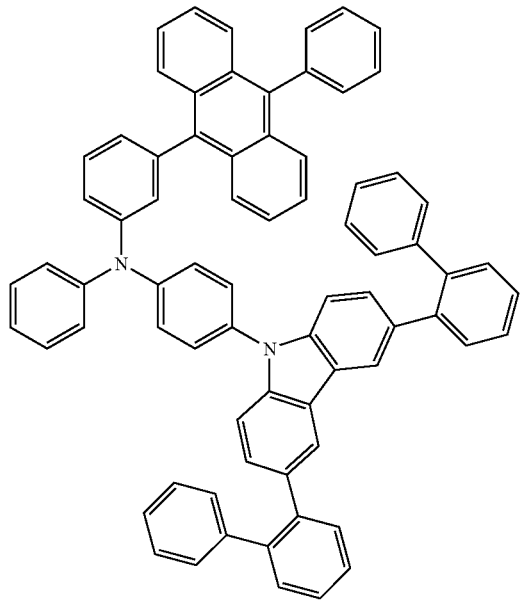
(245)
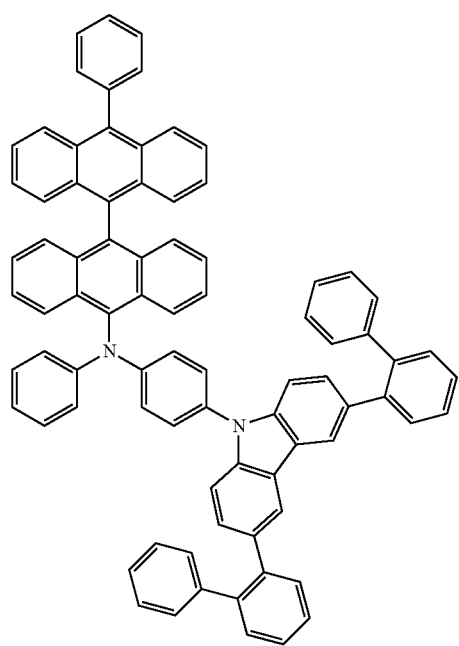
(246)
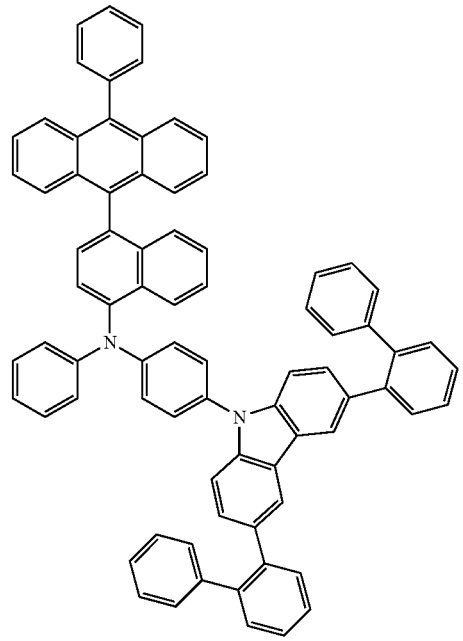
(247)
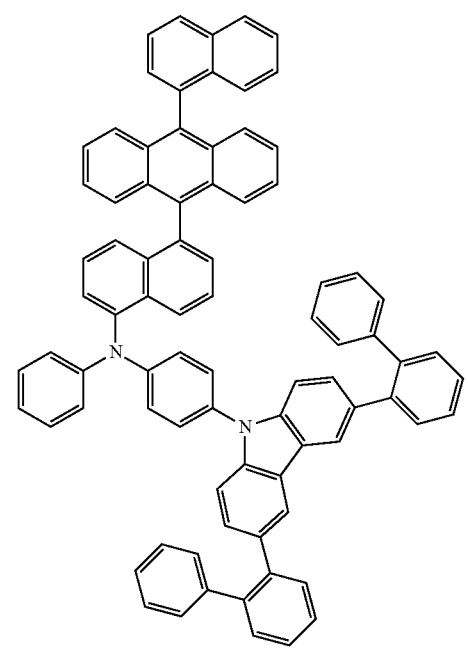

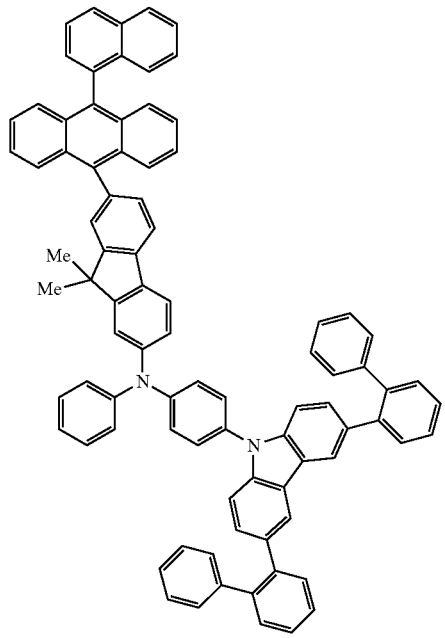
(248)
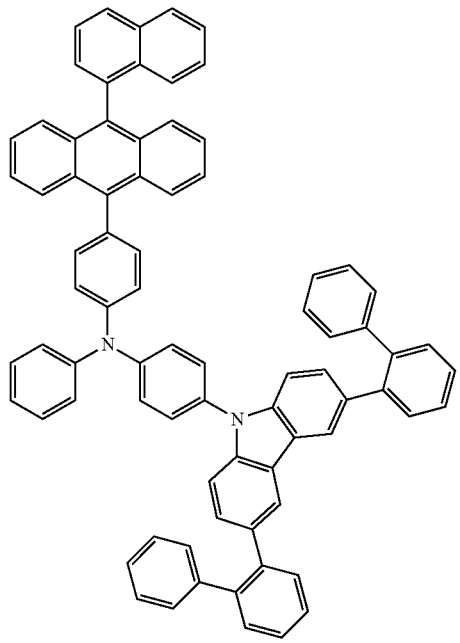
(250)
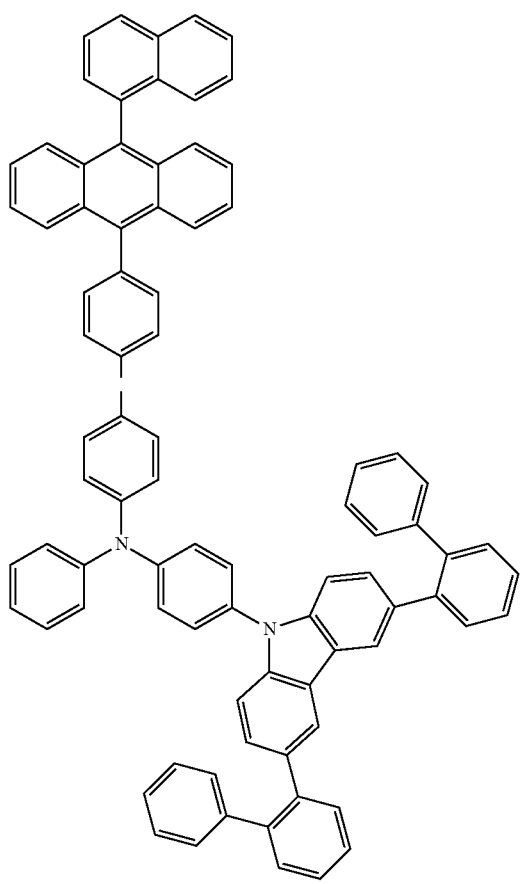
(249)
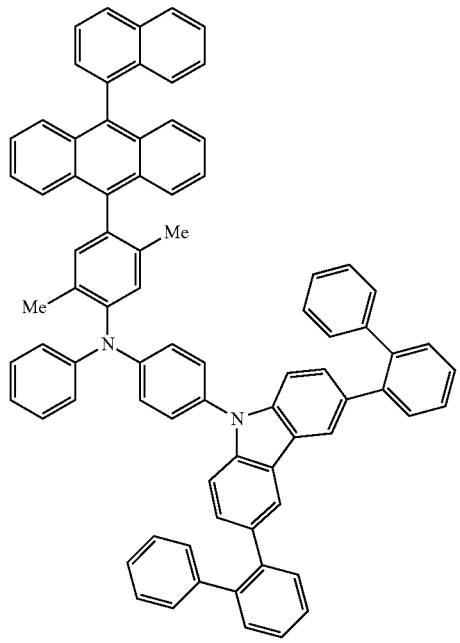
(251)

-continued
(252)
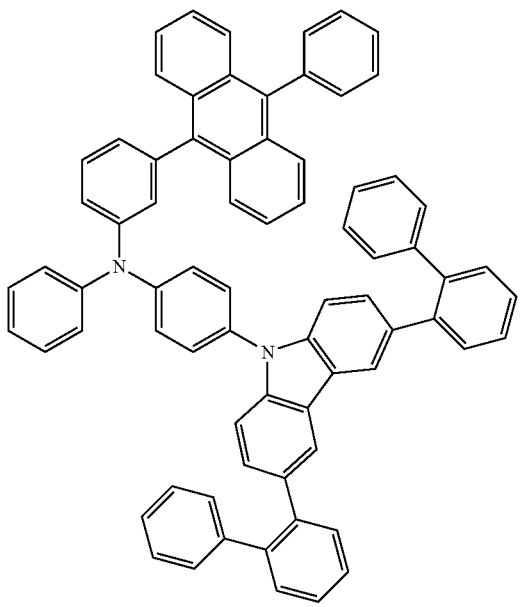
(253)
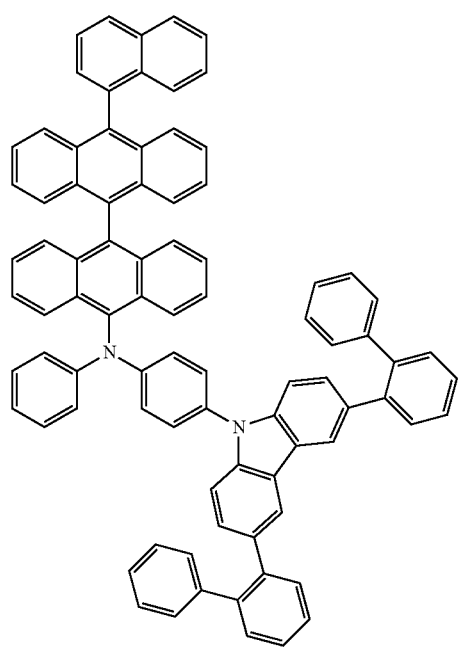
(254)
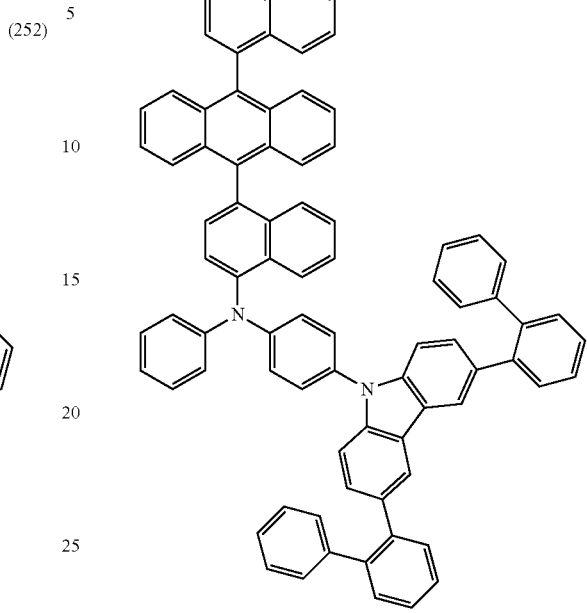
(255)
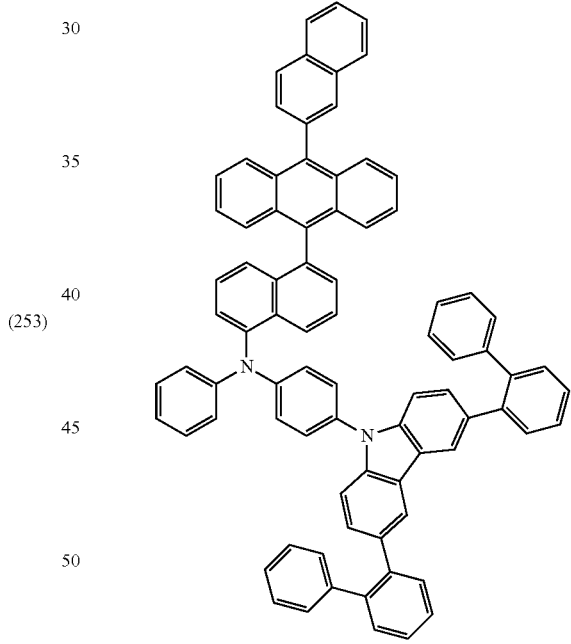
(256)

-continued
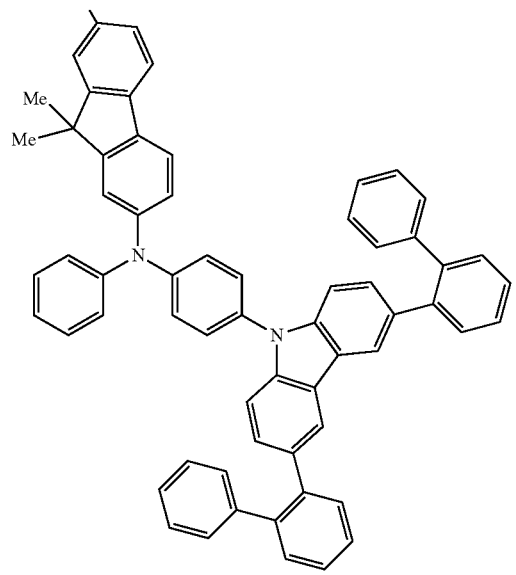
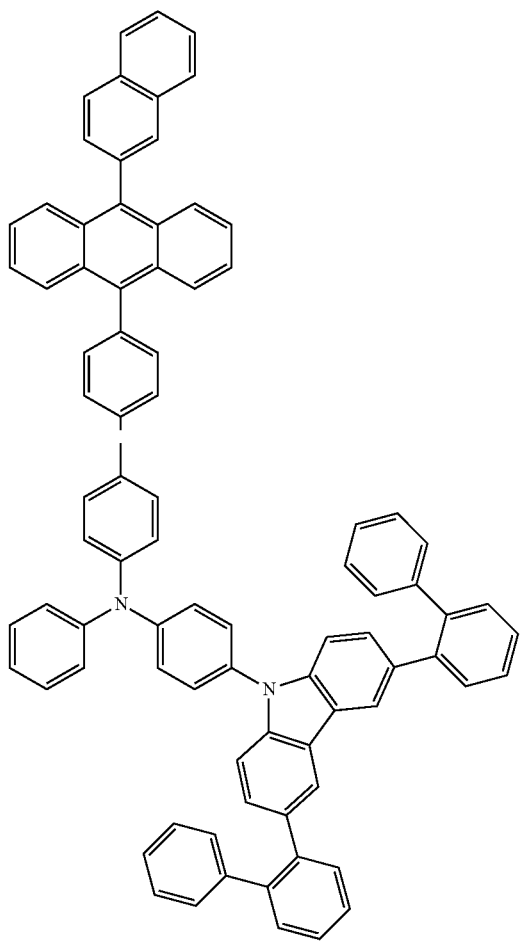
(257)
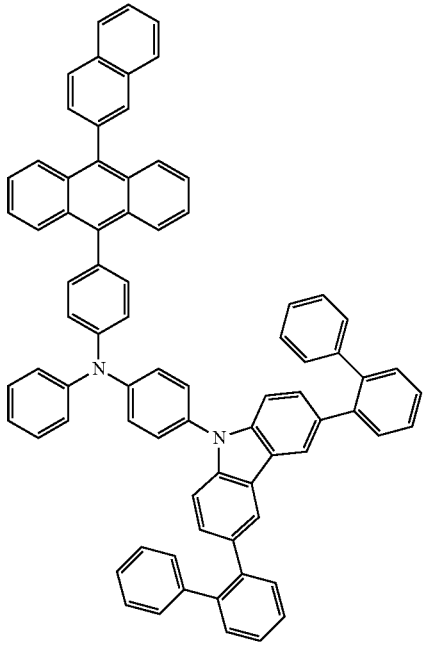
(258)
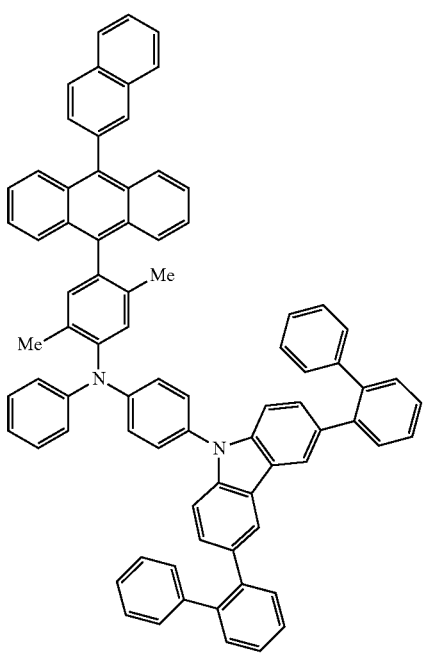
(259)

-continued
(260)
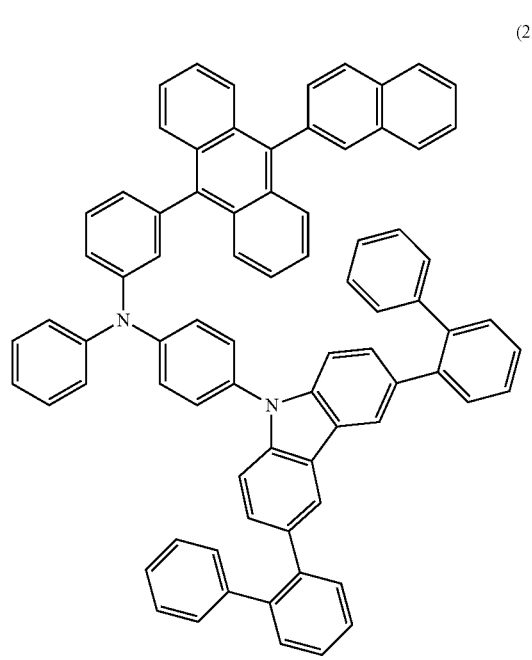
(261)
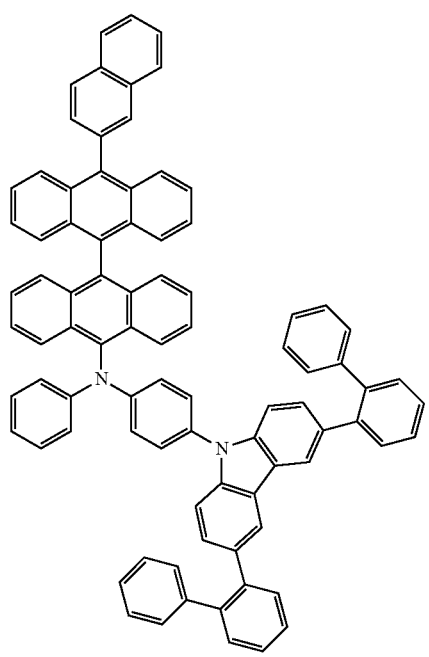
-continued
(262)
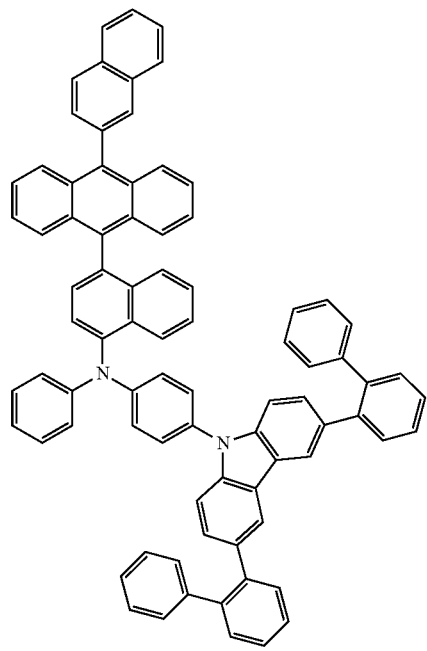
(263)
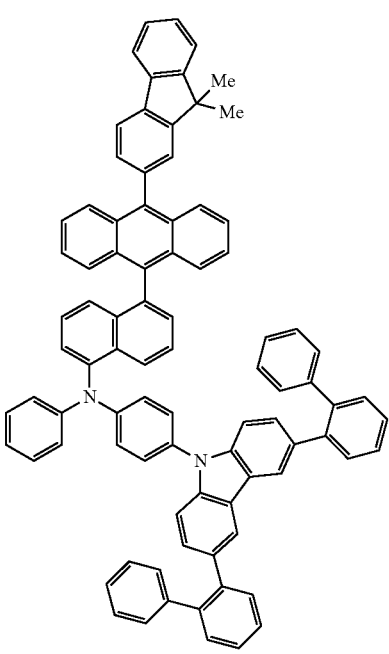

(264)
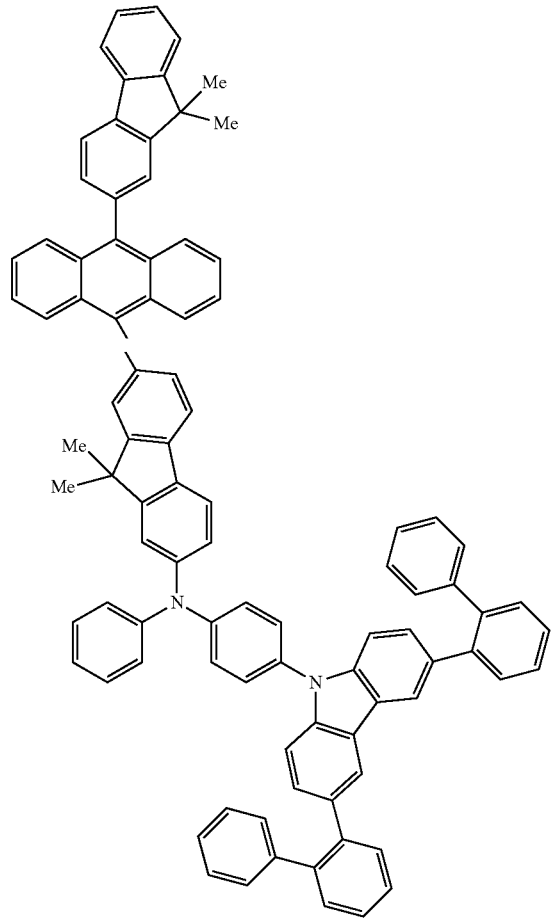
(265)
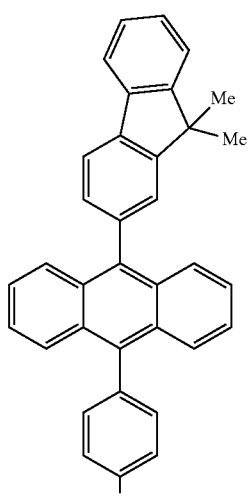
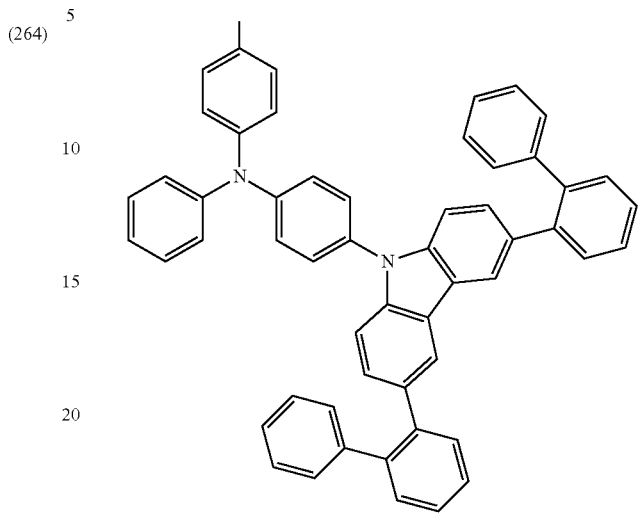
(266)
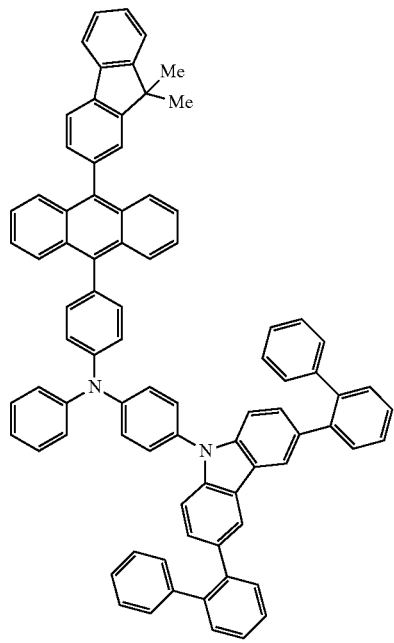

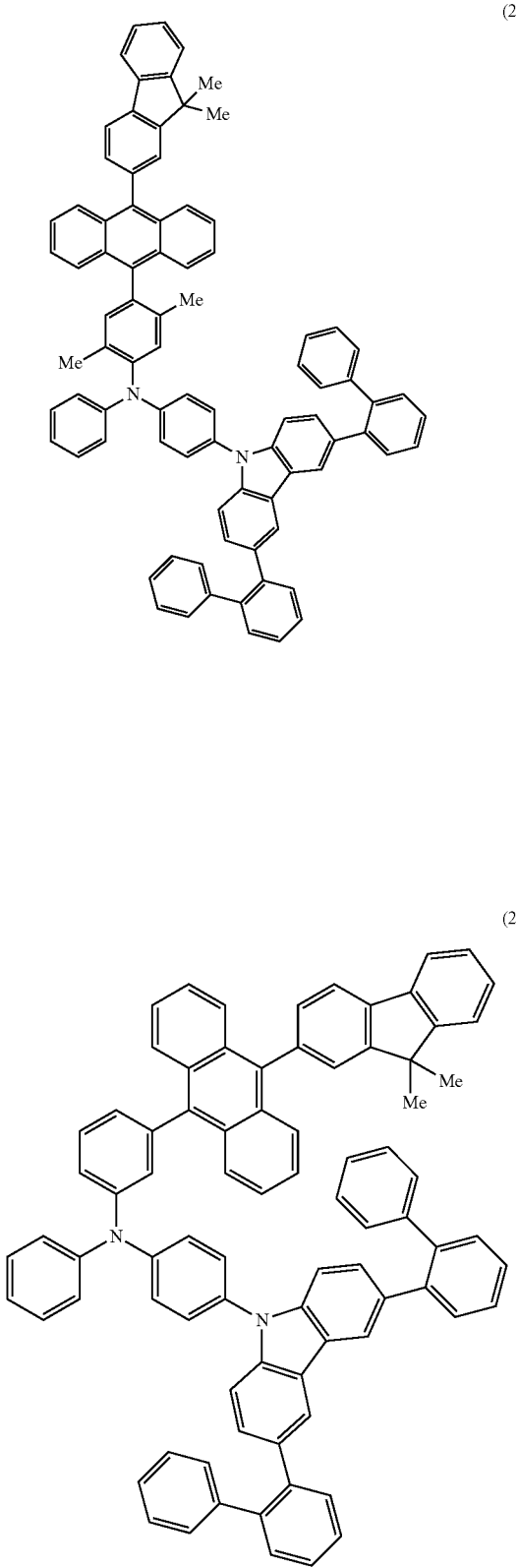
(267)
(268)
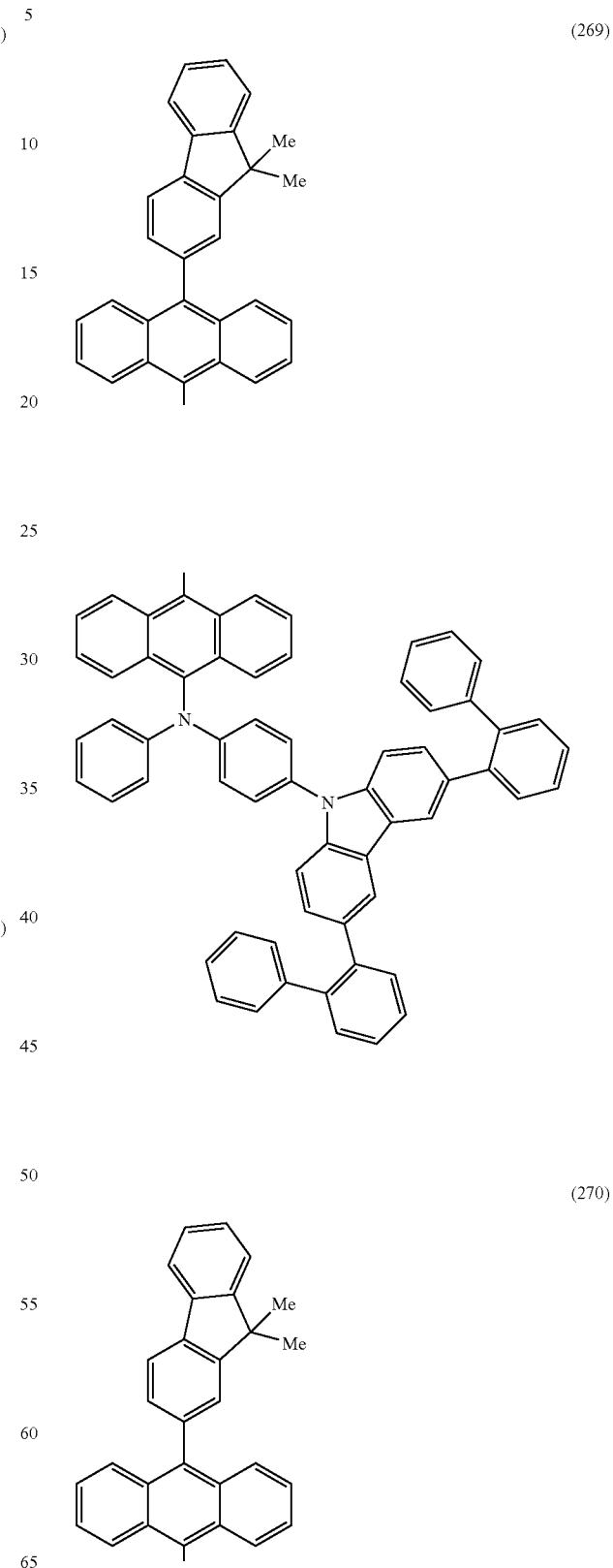
(269)
(270)

-continued
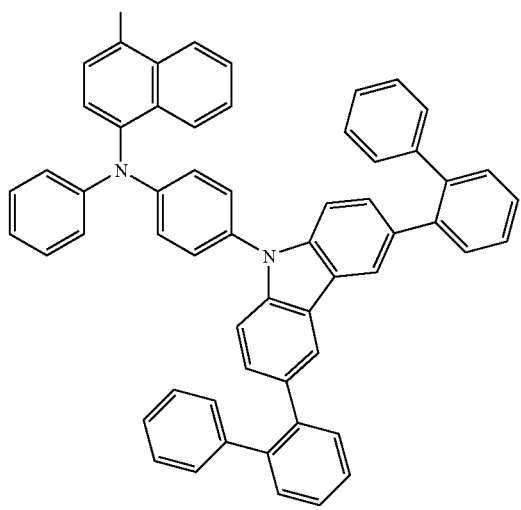
(271)
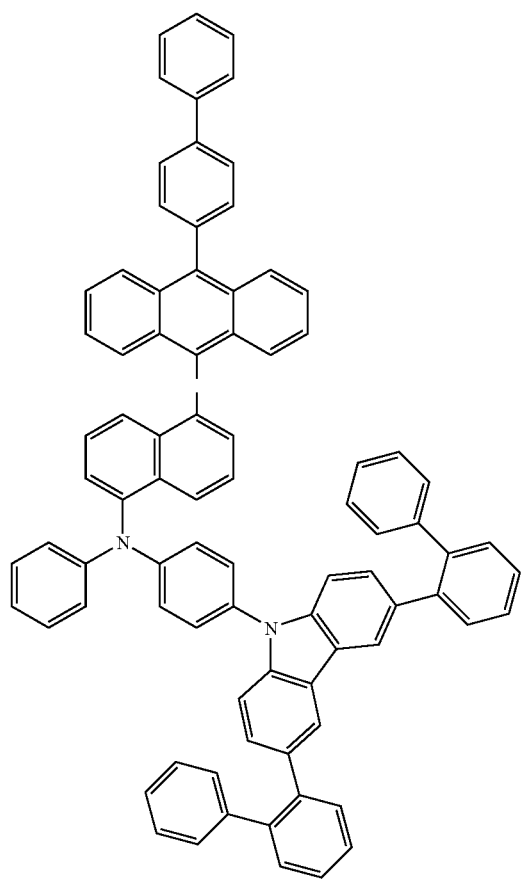
-continued
(272)
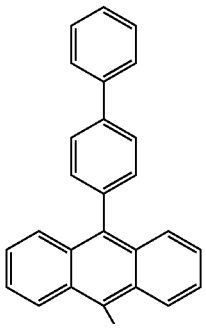
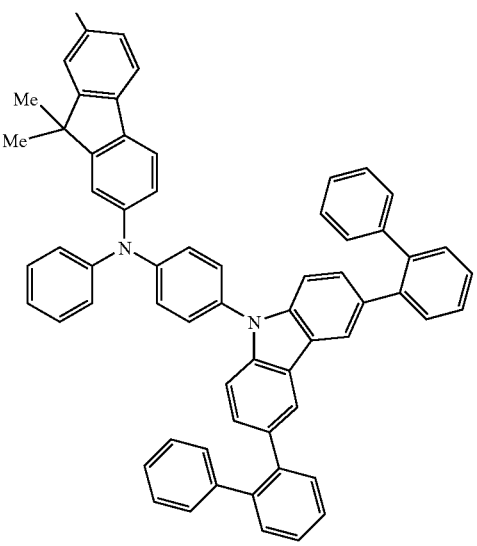
(273)
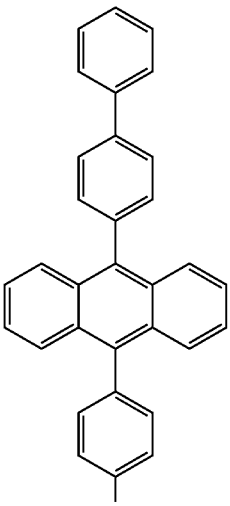

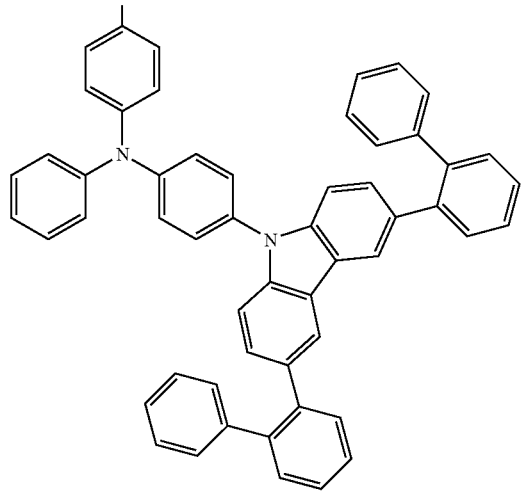
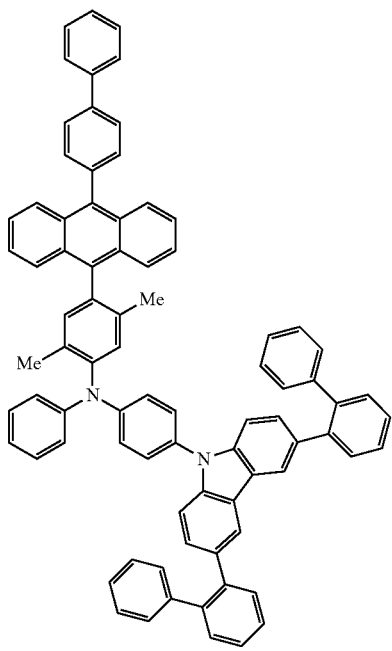
(275)
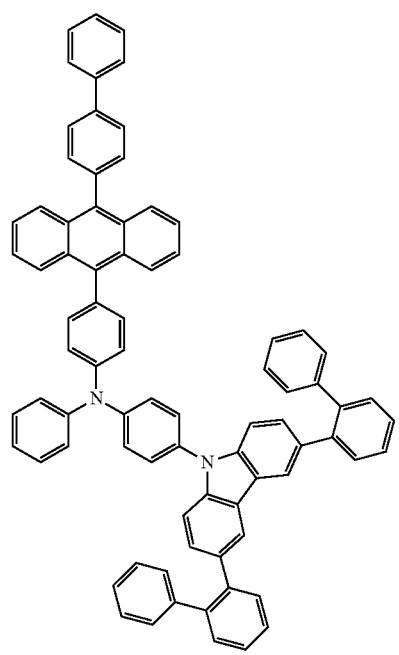
(274)
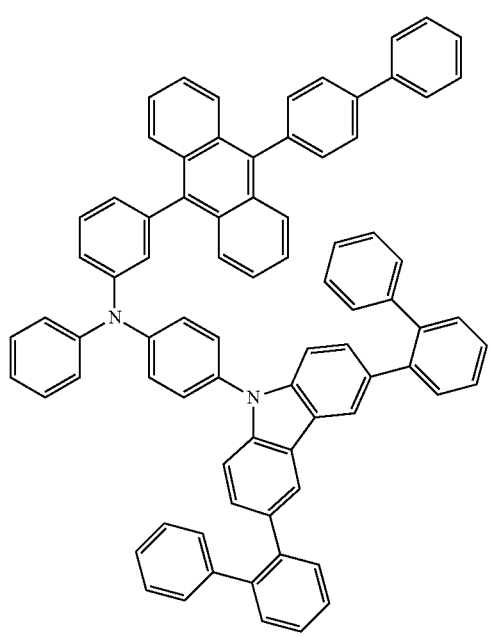
(276)

-continued
(277)
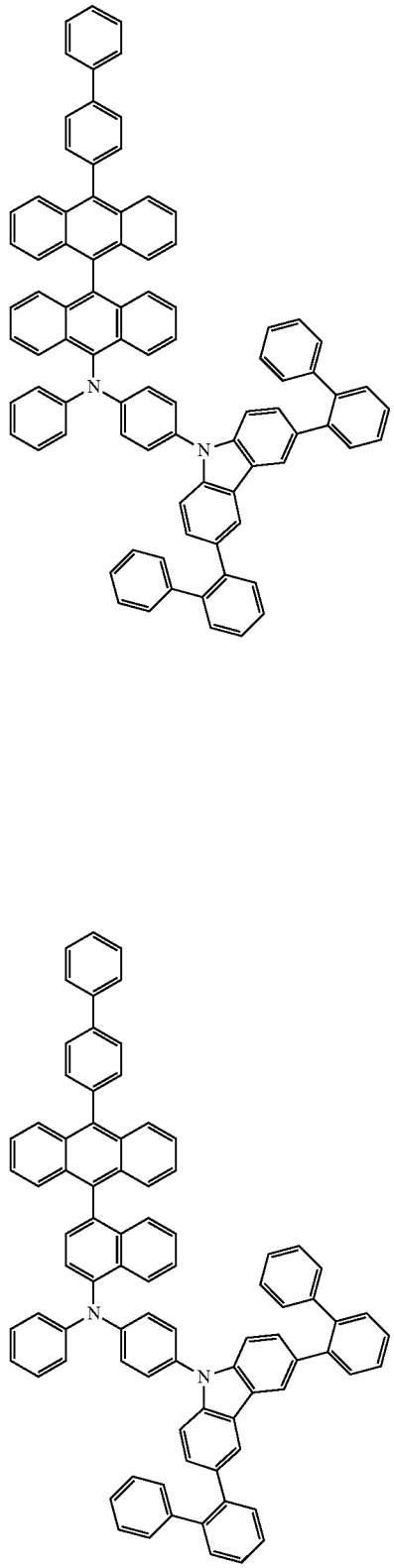
(278)
(279)
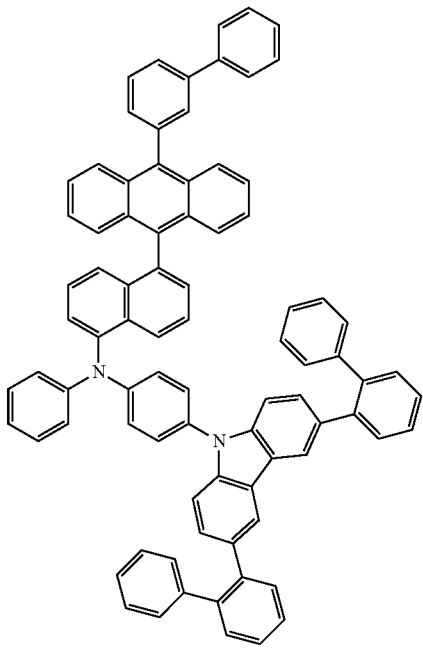
(280)
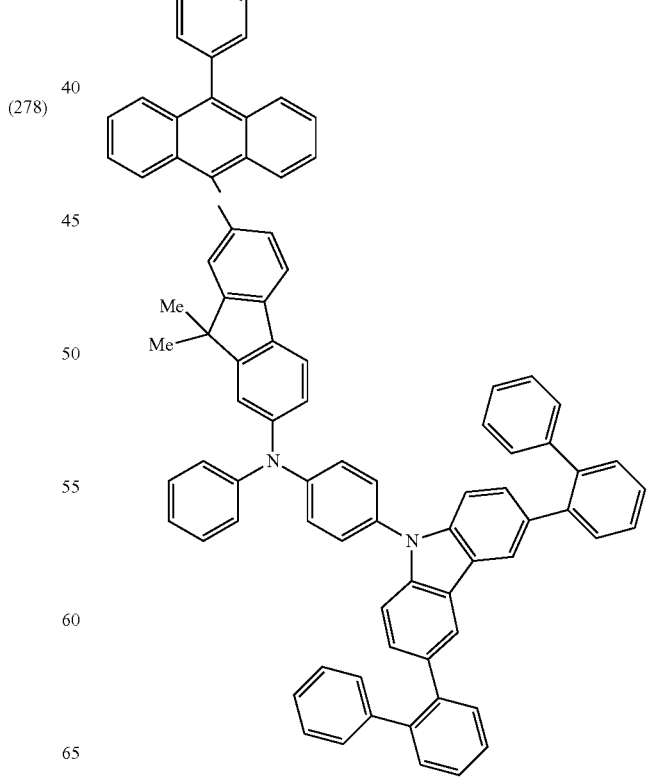

(281)
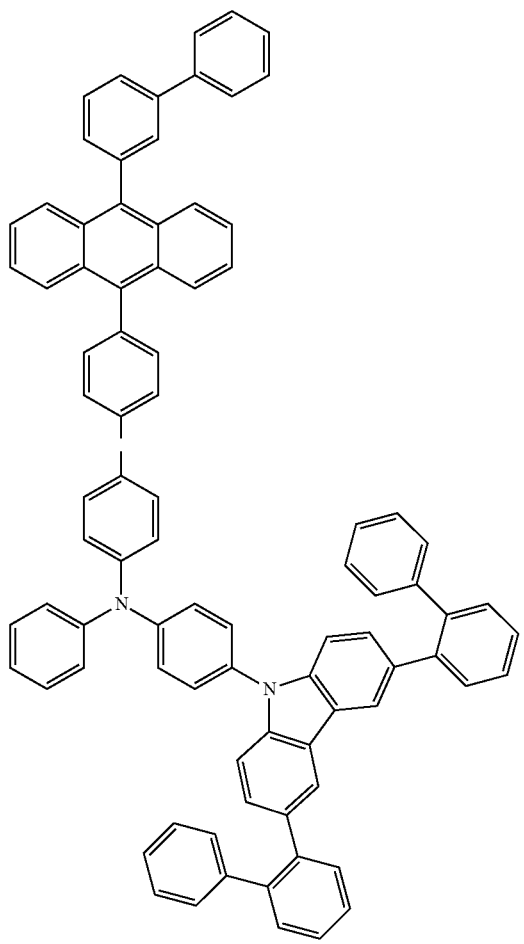
(282)
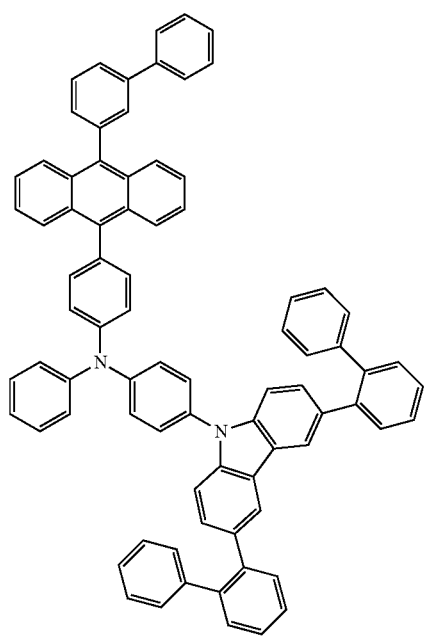
(283)
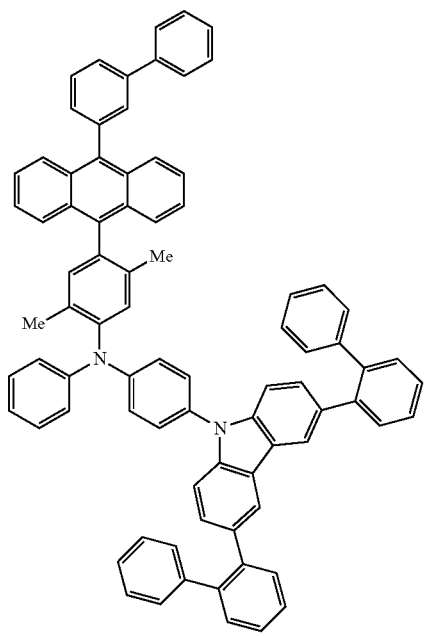
(284)
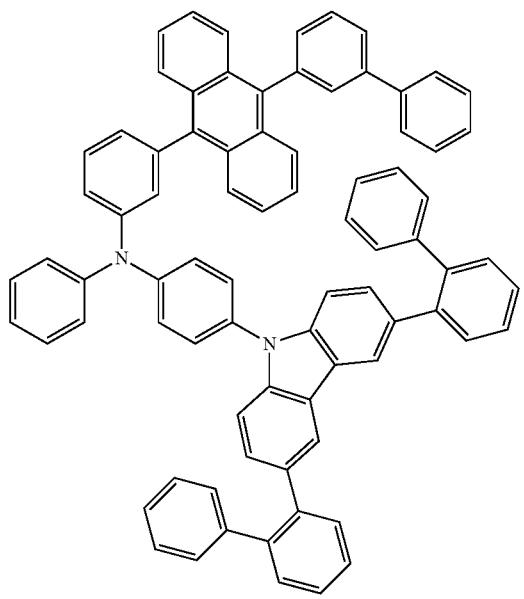

-continued
(285)
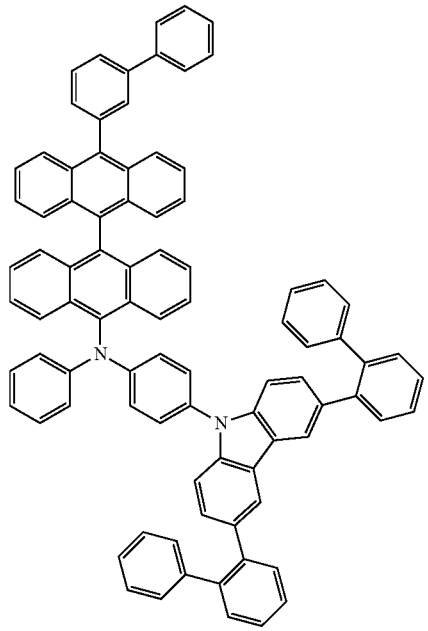
(287)
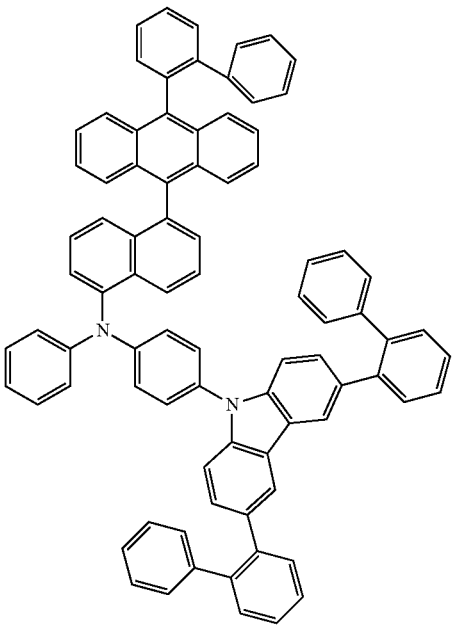
(286)
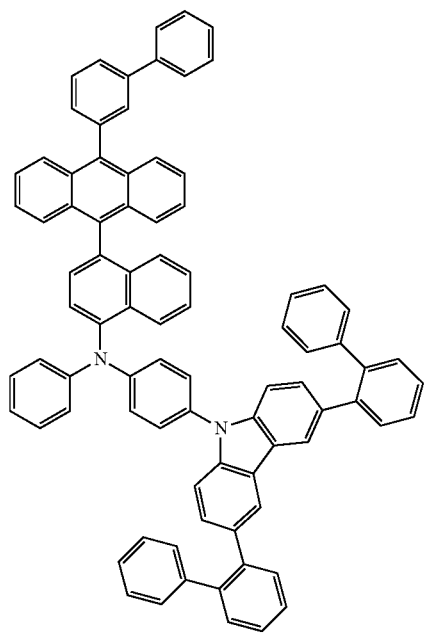
(288)
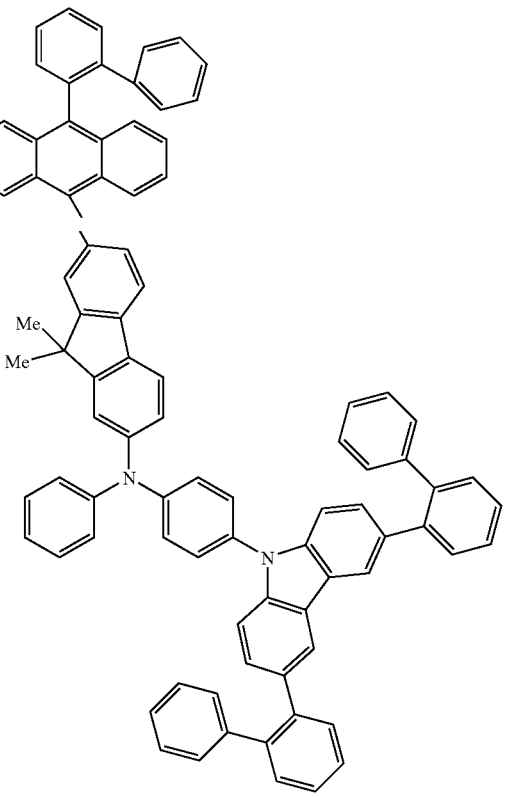

-continued
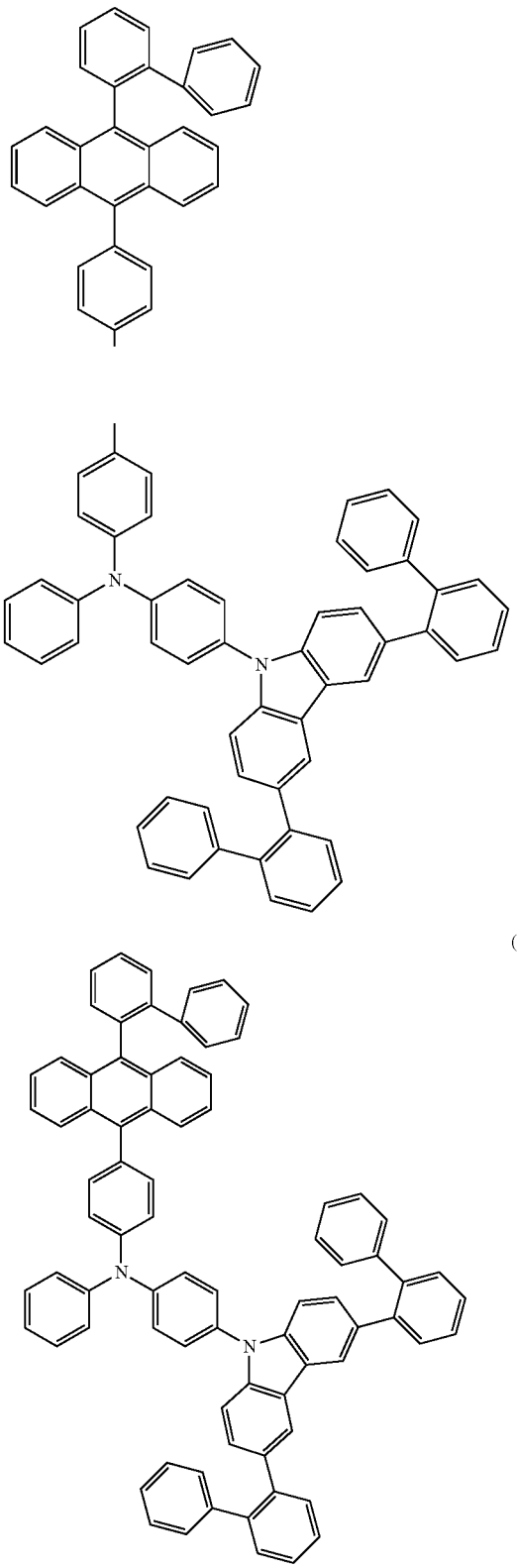
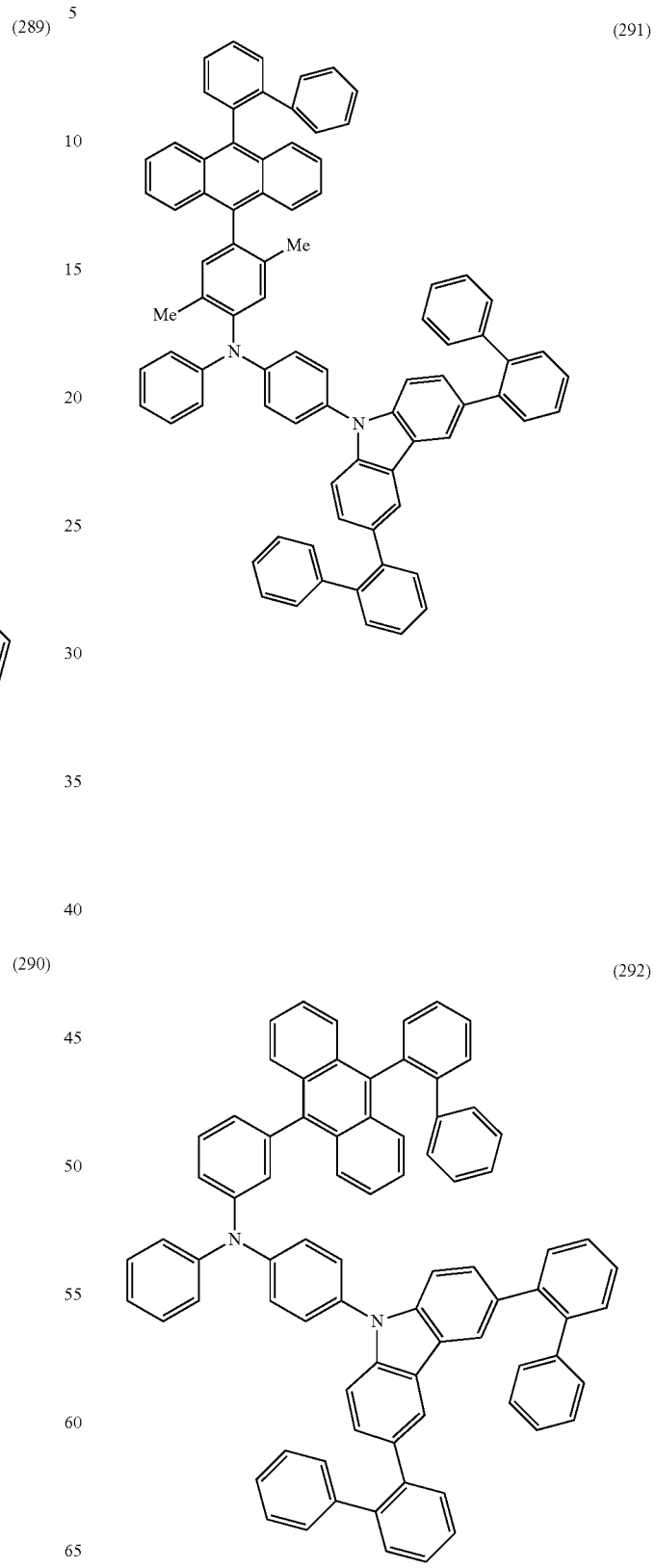

(293)
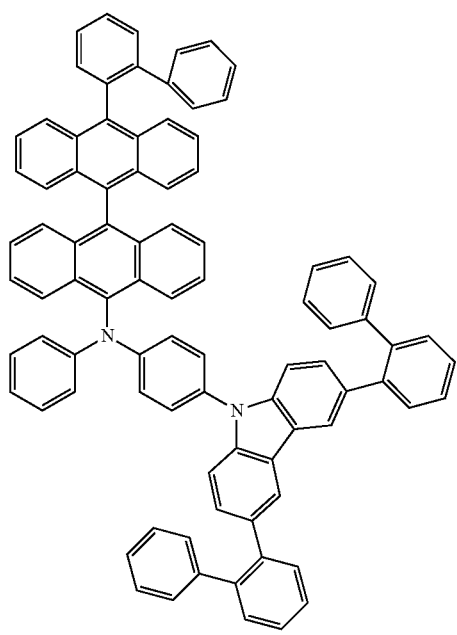
(294)
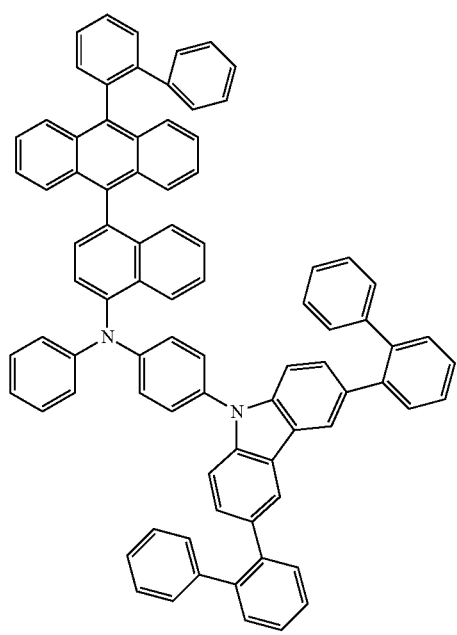
(295)
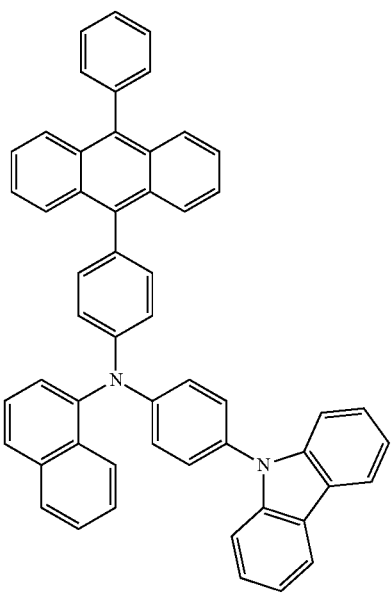
(296)
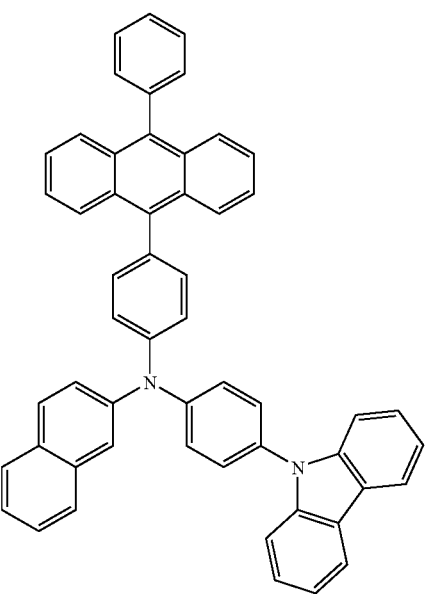

(297)
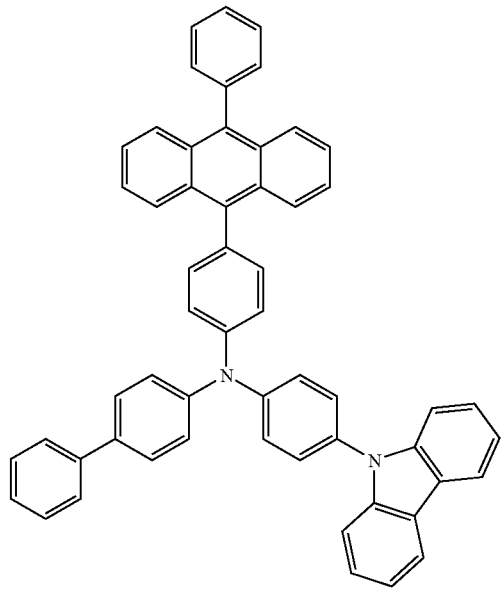
(298)
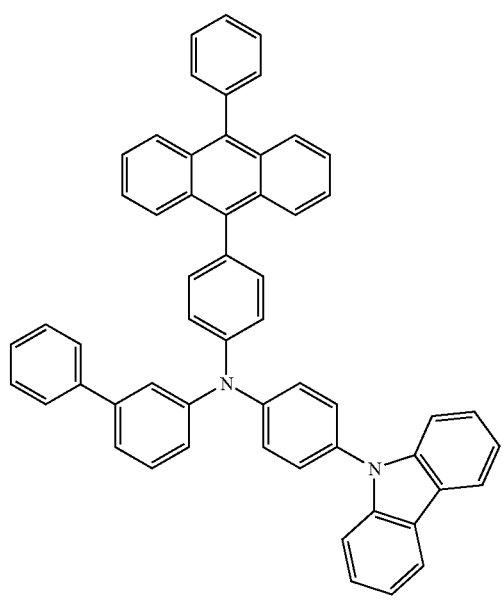
(299)
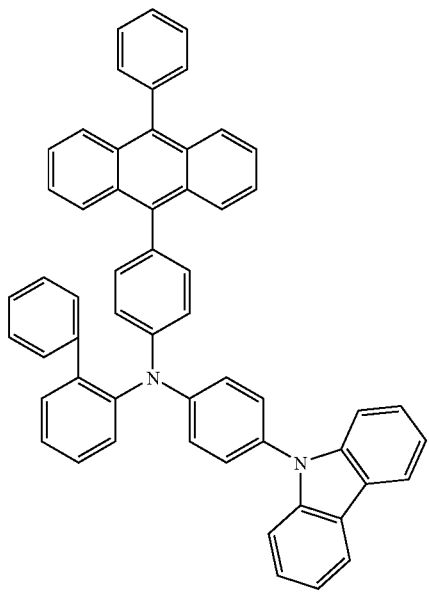
(300)
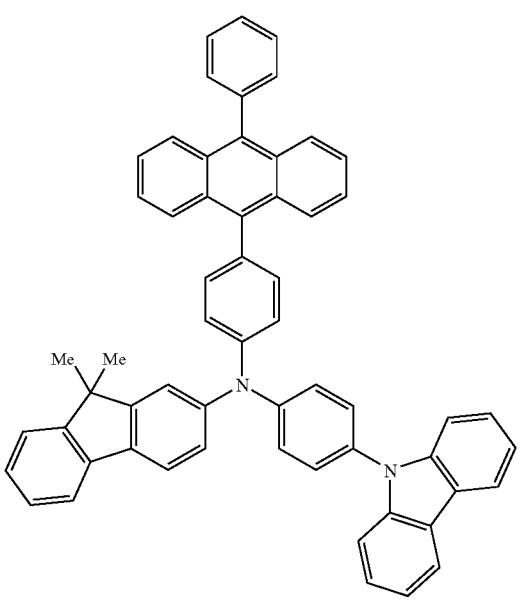

-continued

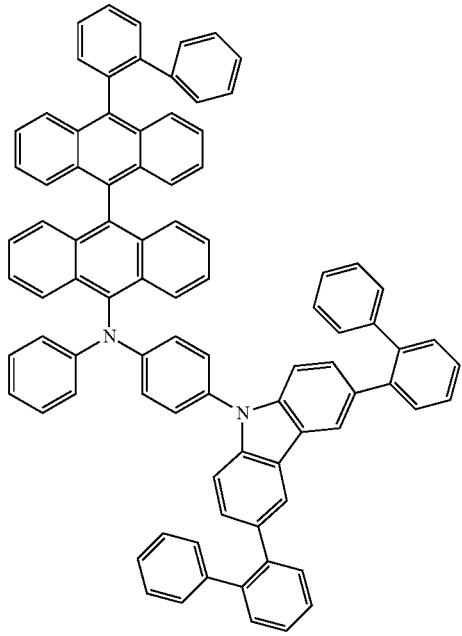

(301)

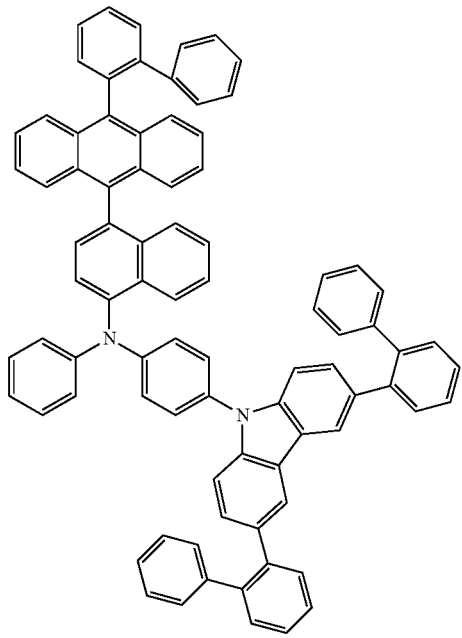

(302)

These anthracene derivatives of the present invention are designed based on expertise of the inventors of the present invention obtained from research results so that in an anthracene derivative having aromatic hydrocarbon groups in one or both of the 10-position and the 9-position, when any one of the aromatic hydrocarbon groups is substituted by a group represented by the following general formula (303), a material of a light emitting element having excellent color purity and excellent reliability can be obtained.

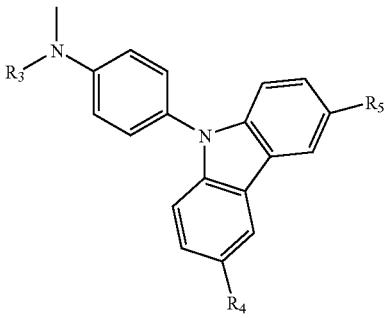

(303)

In the general formula (303), $R_3$ represents a substituent having 6 to 15 carbon atoms. As the substituent having 6 to 15 carbon atoms, aryl groups such as a phenyl group, a naphthyl group, a biphenylyl group, and a fluorenyl group can be given. When using a phenyl group among them, high chromaticity as a blue light emitting element can be obtained. Note that each of these aryl groups may have a substituent. When each of these aryl groups has a substituent, an alkyl group having 1 to 4 carbon atoms is preferable as the substituent. Specifically, a methyl group, an ethyl group, an n-propyl group, an i-propyl group, an n-butyl group, an i-butyl group, an s-butyl group, a t-butyl group, and the like can be given. Among them, a methyl group and a t-butyl group are preferable. Further, it is preferable that a fluorenyl group be a 9,9-dimethylfluorene-yl group.

In the general formula (303), $R_4$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. When each of these aryl groups has a substituent, an alkyl group having 1 to 4 carbon atoms is preferable as the substituent of the aryl group. Specifically, a methyl group, an ethyl group, an n-propyl group, an i-propyl group, an n-butyl group, an i-butyl group, an s-butyl group, a t-butyl group, and the like can be given. Among them, a methyl group and a t-butyl group are preferable. Further, it is preferable that a fluorenyl group be a 9,9-dimethylfluorene-yl group.

In the general formula (303), $R_5$ represents hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. When each of these aryl groups has a substituent, an alkyl group having 1 to 4 carbon atoms is preferable as the substituent of the aryl group. Specifically, a methyl group, an ethyl group, an n-propyl group, an i-propyl group, an n-butyl group, an i-butyl group, an s-butyl group, a t-butyl group, and the like can be given. Among them, a methyl group and a t-butyl group are preferable. Further, it is preferable that a fluorenyl group be a 9,9-dimethylfluorene-yl group.

Note that a substituent represented by the general formula (303) is an N-[4-(9-carbazolyl)phenyl]-N-arylamino group, and it may have a substituent in a $R_4$ or $R_5$ position. In an anthracene derivative having aryl groups in the 10- and 9-positions, when it is made to be an asymmetric molecule in which any one of the aryl groups is substituted by the substituent represented by the general formula (303), blue light emission with a short wavelength can be obtained. Further, a spectrum shape can be sharpened.

Further, in a case of using an anthracene derivative having aryl groups in the 10- and 9-positions in which any one of the aryl groups is the substituent represented by the general formula (303), as a light emitting element, a blue light emitting element with high reliability can be manufactured. Further, the anthracene derivative can be used as a host of a light emitting layer, and therefore, a light emitting element with high reliability can be obtained.

As shown in the following synthetic scheme, an anthracene derivative of this embodiment mode can be obtained in such a manner that a compound A containing an anthracene skeleton such as 9-aryl-10-(arylhalide)anthracene and a compound B containing an N-[4-(9-carbazolyl)phenyl]-N-arylamine skeleton are subjected to coupling reaction by using a metal catalyst such as a palladium catalyst. In this case, halogen in the 9-aryl-10-(arylhalide)anthracene is preferably bromine or iodine. Note that a method for synthesizing an anthracene derivative of this embodiment mode is not limited to the mentioned synthesizing method, and the anthracene derivative may be synthesized by using other synthesizing method.

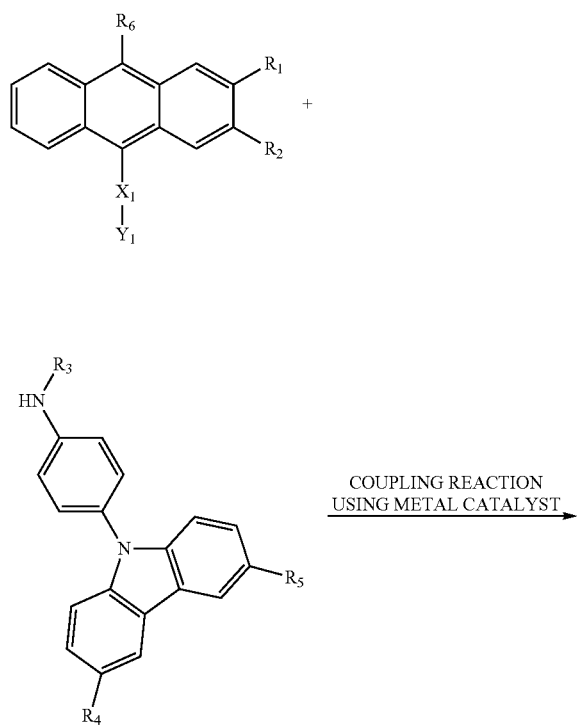

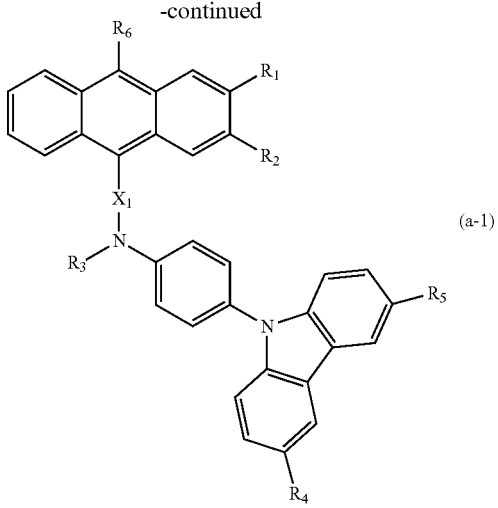

In a synthetic scheme (a-1), $R_1$ and $R_2$ individually represent hydrogen or an alkyl group having 1 to 4 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. Note that at least one of $R_1$ and $R_2$ is hydrogen. Further, the other of $R_1$ and $R_2$ is preferably any one of hydrogen, a methyl group, and a t-butyl group.

$R_3$ represents a substituent having 6 to 15 carbon atoms. As the substituent having 6 to 15 carbon atoms, aryl groups such as a phenyl group, a naphthyl group, a biphenylyl group, and a fluorenyl group can be given. When using a phenyl group as $R_3$ among them, high chromaticity as a blue light emitting element can be obtained. Note that each of these aryl groups may have a substituent. In a case where each of these aryl groups has a substituent, an alkyl group having 1 to 4 carbon atoms is preferable as the substituent of the aryl group, and specifically, a methyl group, an ethyl group, an n-propyl group, an i-propyl group, an n-butyl group, an i-butyl group, an s-butyl group, a t-butyl group, and the like can be given. Further, it is preferable that the fluorenyl group be a 9,9-dimethylfluorene-yl group.

$R_4$ and $R_5$ individually represent hydrogen, an alkyl group having 1 to 4 carbon atoms, or a substituent having 6 to 15 carbon atoms. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. As the substituent having 6 to 15 carbon atoms, aryl groups such as a phenyl group, a naphthyl group, a biphenylyl group, and a fluorenyl group can be given. Note that each of these aryl groups may have a substituent. When each of these aryl groups has a substituent, an alkyl group having 1 to 4 carbon atoms is preferable as the substituent of the aryl group. Specifically, a methyl group, an ethyl group, an n-propyl group, an i-propyl group, an n-butyl group, an i-butyl group, an s-butyl group, a t-butyl group, and the like can be given. Further, it is preferable that the fluorenyl group be a 9,9-dimethylfluorene-yl group.

$R_6$ represents a substituent having 6 to 36 carbon atoms, and it is preferable that $R_6$ be a substituent having 6 to 15 carbon atoms. As the substituent having 6 to 15 carbon atoms, aryl groups such as a phenyl group, a naphthyl group, an anthryl group, a biphenylyl group, and a fluorenyl group can be given. When using a phenyl group among them, high chromaticity along with high reliability as a blue light emitting element can be obtained. Note that each of these aryl groups may have a substituent. In a case where each of these aryl groups has a substituent, an alkyl group having 1 to 4 carbon atoms or a phenyl group is preferable as the substituent of the aryl group. As the alkyl group having 1 to 4 carbon atoms, a methyl group, an ethyl group, an n-propyl group, an i-propyl group, an n-butyl group, an i-butyl group, an s-butyl group, a t-butyl group, and the like can be given. Among them, a methyl group and a t-butyl group are preferable. Further, it is preferable that the fluorenyl group be a 9,9-dimethylfluorene-yl group.

$X_1$ represents a substituent having 6 to 22 carbon atoms, and it is preferable that $X_1$ be a substituent having 6 to 15 carbon atoms. As the substituent having 6 to 15 carbon atoms, arylene groups such as a phenylene group, a naphthylene group, an anthrylene group, and a florene-diyl group can be given. Each of these arylene groups may have a substituent or no substituent. When each of these arylene groups has a substituent, an alkyl group having 1 to 4 carbon atoms is preferable as the substituent of the arylene group, and specifically, a methyl group, an ethyl group, an n-propyl group, an i-propyl group, an n-butyl group, an i-butyl group, an s-butyl group, a t-butyl group, and the like can be given. Further, the florene-diyl group is preferably a 9,9-dimethyl-florene-diyl group.

A compound A can be obtained by a method represented by a synthetic scheme (a-2), for example. In the synthetic scheme (a-2), by synthesizing a compound containing a 9-anthracene halide (halogen is preferably bromine or iodine) skeleton and arylboronic acid (the arylboronic acid may be protected with an alkyl group or the like) by a coupling reaction using a metal catalyst, a compound containing a 9-arylanthracene skeleton in which an aryl group is introduced into the 9-position is obtained. Thereafter, by halogenating (bromination or iodination is preferable, and iodination is more preferable) the obtained compound, a compound containing a 9-aryl-10-anthracene halide skeleton is synthesized. Then, by a coupling reaction using a metal catalyst, the synthesized compound and aryl halide boronic acid (the aryl halide boronic acid may be protected with an alkyl group or the like, and halogen is preferably bromine or iodine) are synthesized so that the compound A, which is a compound containing a 9-aryl-10-(arylhalide)anthracene skeleton, is obtained.

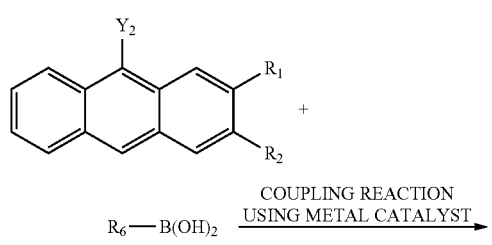

A compound B is obtained in such a manner that as shown in a synthetic scheme (a-3), a compound containing carbazole in a skeleton and 1,4-dihalogenated benzene (two pieces of halogen may be identical to or different from each other, and halogen is preferably bromine or iodine) are reacted to synthesize a compound containing N-(4-bromophenyl)carbazole in a skeleton, and then a coupling reaction using a metal catalyst is performed with arylamine.

-continued

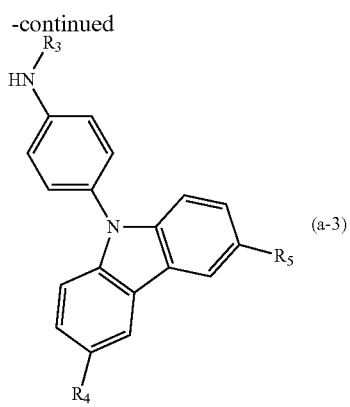

(a-3)

Embodiment Mode 2

In this embodiment mode, a light emitting element using an anthracene derivative described in Embodiment Mode 1 will be described.

A light emitting element of the present invention has a structure in which a layer containing a light emitting substance is interposed between a pair of electrodes. Note that the element structure is not particularly limited, and a known structure can be appropriately selected in accordance with any purpose.

FIG. 1 shows one example of an element structure of a light emitting element of the present invention. The light emitting element shown in FIG. 1 has a structure in which a layer 102 containing a light emitting substance is interposed between a first electrode 101 and a second electrode 103. Further, the layer 102 containing a light emitting substance contains an anthracene derivative described in Embodiment Mode 1. Note that an anode of the present invention indicates an electrode for injecting holes to a layer containing a light emitting substance. Further, a cathode of the present invention indicates an electrode for injecting electrons to a layer containing a light emitting substance. Any one of the first electrode 101 and the second electrode 103 is an anode, and the other is a cathode.

As the anode, a known material can be used, and metal, an alloy, a conductive compound, and a mixture thereof each having a high work function (specifically, 4.0 eV or more) is preferably used. Specifically, indium tin oxide (hereinafter, also referred to as ITO), indium tin oxide containing silicon, indium oxide containing 2 to 20% zinc oxide (ZnO), and the like can be given. A conductive metal oxide film made from such a material is generally formed by sputtering in many cases. Alternatively, it may be formed by a sol-gel method or the like. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride (TiN)), and the like can be used.

On the other hand, a cathode can be formed by using a known material. It is preferable to use metal, an alloy, a conductive compound, and a mixture thereof each having a low work function (specifically, 3.8 eV or less). Specifically, metal belonging to Group 1 or 2 of the periodic table, for example, alkali metal such as lithium (Li) and cesium (Cs), alkali earth metal such as magnesium (Mg), calcium (Ca), and strontium (Sr), an alloy containing these substances (such as an alloy of Mg and Ag and an alloy of Al and Li), rare earth metal such as europium (Er) and ytterbium (Yb), an alloy containing these substances, and the like can be given. Note that when using an electron injecting layer having a strong electron injecting property as the layer 102 containing a light emitting substance, a material having a high work function, i.e., a material, which is generally used for an anode, can be used to form a cathode. For example, a cathode can be formed using metal or a conductive inorganic compound such as Al, Ag, or ITO.

The layer 102 containing a light emitting substance can be formed using a known material, and either a low molecular material or a high molecular material can be used. Further, a material for forming the layer 102 containing a light emitting substance is not limited to a substance only containing an organic compound material, and a substance partly containing an inorganic compound material may be used for the layer 102 containing a light emitting substance. Furthermore, the layer 102 containing a light emitting substance may be formed by a single layer or by appropriately combining functional layers having various functions such as a hole injecting layer, a hole transporting layer, a hole blocking layer, a light emitting layer, an electron transporting layer, and an electron injecting layer. The above mentioned functional layers may contain a layer having two or more same functional layers.

Further, the layer 102 containing a light emitting substance can be formed by using evaporation, ink-jet, spin coating, dip coating, or the like regardless of a wet type or a dry type.

A light emitting element of the present invention is formed by using the anthracene derivatives described in Embodiment Mode 1. Since each of the anthracene derivatives described in Embodiment Mode 1 have a large bandgap, they can emit short-wavelength light. Therefore, blue light emission with good color purity can be obtained so that the anthracene derivatives described in Embodiment Mode 1 can be preferably used as light emitting materials for a light emitting layer. At this time, a light emitting layer can be formed as a so-called single layer by using only one kind of the anthracene derivatives described in Embodiment Mode 1. Further, the anthracene derivatives described in Embodiment Mode 1 can be used as dopant. In this case, it is preferable that a material serving as a host be doped with a small amount of an anthracene derivative (specifically, at a rate of 0.001 to 50 wt %, and more preferably 0.03 to 20 wt %). Light emission can be obtained while the doped anthracene derivative of the present invention serves as a light emitting center so that blue light emission with good color purity can be obtained. In this case, an anthracene derivative described in Embodiment Mode 1, which is used as dopant, is dispersed in a host material having a larger energy gap than that of the anthracene derivative to form a light emitting layer. As host materials, which can be used in a case of using the anthracene derivatives described in Embodiment Mode 1 as dopant, specifically, a tetraaryl silane derivative, a dinaphthalene derivative, a pyrene derivative, an oligothiophene derivative, a benzophenone derivative, a benzonitrile derivative, a diphenylanthracene derivative, and the like can be given. A light emitting element having a light emitting layer in which an anthracene derivative described in Embodiment Mode 1, which has a smaller bandgap than that of a host, is dispersed as dopant in the host made from the above mentioned substances, can emit blue light with good color purity. Further, by using the anthracene derivatives described in Embodiment Mode 1, a light emitting element with high reliability can be obtained. Note that when using an anthracene derivative of the present invention as dopant, change in characteristics (e.g., change in colors, change in light emitting efficiency, and the like) of a light emitting element is small with respect to a doping concentration so that the light emitting element has stable characteristics with a wide manufacturing margin.

Further, when a light emitting material (hereinafter, referred to as dopant) having a smaller bandgap than that of an anthracene derivative described in Embodiment Mode 1 is added to a layer formed using the anthracene derivative, light emission can be obtained from the dopant. In this case, the anthracene derivative described in Embodiment Mode 1 serves as a host. For example, a light emitting material having emission maximum in a wavelength of around 550 nm shows excellent green color purity. When using such a material as dopant, green light emission with excellent color purity can be obtained. Similarly, a light emitting material having emission maximum in a wavelength of around 650 nm shows excellent red color purity. When using such a material as dopant, red light emission with excellent color purity can also be obtained. Note that in regard to dopant having a long light emission wavelength, an absorption wavelength also exists in a long wavelength region in general. In a case where an anthracene derivative described in Embodiment Mode 1 is used as a host, it is preferable that a light emission wavelength of the anthracene derivative overlap an absorption wavelength of the dopant. In the case where the light emission wavelength of the host overlaps the absorption wavelength of the dopant, energy is easily transferred. Note that in a case of a material emitting blue light, when the material has a smaller bandgap than that of an anthracene derivative described in Embodiment Mode 1, the material can be used as dopant.

In a case where in a light emitting layer, dopant is added to a host including an anthracene derivative described in Embodiment Mode 1 and light emission is obtained from the dopant, either a fluorescent light emitting material or a phosphorescent light emitting material can be used as a light emitting material to be added. Note that in a case of using a phosphorescent light emitting material, it is required that a triplet level of the phosphorescent light emitting material is lower than that of anthracene. As examples of these light emitting materials, concretely, a coumarin derivative, an oligophenylene derivative, an oxazole derivative, a stilbene derivative, a quinolone derivative, an acridone derivative, an anthracene derivative, a pyrene derivative, a phenanthrene derivative, and the like are preferable. A small amount of such dopant is added (concretely, at a rate of 0.001 to 50 wt %, and preferably 0.03 to 20 wt %).

As a material having a hole injecting property used for forming a hole injecting layer, a known material can be used. Specifically, metal oxide such as vanadium oxide, molybdenum oxide, ruthenium oxide, and aluminum oxide, or the like is preferable. An appropriate organic compound may be mixed in such oxide. Alternatively, in a case of an organic compound, a porphyrin compound is effective, and phthalocyanine (abbreviation: $H_2$-Pc), copper phthalocyanine (abbreviation: Cu-Pc), and the like can be used. Further, there is a material in which a conductive high molecular compound is subjected to chemical doping, and polyethylene dioxythiophene (abbreviation: PEDOT) doped with polystyrene sulfonate (abbreviation: PSS), polyaniline (abbreviation: PAni), and the like can be used.

As a material having an electron injecting property for forming an electron injecting layer, a known material can be used. Specifically, alkali metal salt such as lithium fluoride, lithium oxide, and lithium chloride, alkali earth metal salt such as calcium fluoride, and the like are preferable. Further, a layer in which a compound having a donating property such as lithium is added to a material having an electron transporting property such as tris(8-quinolinolato)aluminum (abbreviation: $Alq_3$) or bathocuproin (abbreviation: BCP) can also be used.

By using an electron injecting layer and a hole injecting layer, a carrier injection barrier is reduced and carriers are efficiently injected to a light emitting element, which results in reduction of driving voltage.

Furthermore, it is preferable to provide a carrier transporting layer between a carrier injecting layer and a light emitting layer. This is because when the carrier injecting layer is in contact with the light emitting layer, part of light emission obtained from the light emitting layer is quenched (inhibited) so that there is a probability of reducing light emitting efficiency. A hole transporting layer is provided between a hole injecting layer and a light emitting layer. As a preferable material for the hole transporting layer, an aromatic amine compound (i.e., having a benzene ring-nitrogen bond) is given. As materials widely used for the hole transporting layer, 4,4'-bis[N-(3-methylphenyl)-N-phenyl-amino]-biphenyl; 4,4'-bis[N-(1-naphthyl)-N-phenyl-amino]-biphenyl (hereinafter, referred to as NPB), which is a derivative of 4,4'-bis[N-(3-methylphenyl)-N-phenyl-amino]-biphenyl; a starburst aromatic amine compound such as 4,4',4"-tris(N,N-diphenyl-amino)-triphenylamine, and 4,4',4"-tris[N-(3-methylphenyl)-N-phenyl-amino]-triphenylamine can be given.

Meanwhile, when using an electron transporting layer, it is provided between a light emitting layer and an electron injecting layer. As a suitable material for the electron transporting layer, typical metal complexes such as tris(8-quinolinolato) aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-(4-hydroxy-biphenyl)-aluminum (abbreviation: BAlq), bis[2-(2-hydroxyphenyl)-benzoxazolato]zinc (abbreviation: $Zn(BOX)_2$), and bis[2-(2-hydroxyphenyl)-benzothiazolato]zinc (abbreviation: $Zn(BTZ)_2$) can be given. Further, a hydrocarbon compound such as 9,10-diphenylanthracene and 4,4'-bis(2,2-diphenylethenyl)biphenyl and the like are also preferable. Furthermore, a triazole derivative such as 3-(4-tert-buthylphenyl)-4-(4-ethylphenyl)-5-(4-biphenylyl)-1,2,4-triazole; a phenanthroline derivative such as bathophenanthroline and bathocuproin may be used.

The anthracene derivatives described in Embodiment Mode 1 are materials emitting favorable blue light. Accordingly, a light emitting element of the present invention using an anthracene derivative described in Embodiment Mode 1 as a light emitting material for a light emitting layer or a light emitting element of the present invention using it as a dopant can emit blue light with good color purity. In addition, a light emitting element using an anthracene derivative described in Embodiment Mode 1 can have high reliability. Furthermore, a light emitting element of the present invention having a light emitting layer, which uses an anthracen derivative described in Embodiment Mode 1 as a host material, can have high reliability.

Note that a structure of a light emitting element in which light emission is obtained only from a light emitting layer is shown in this embodiment mode. Alternatively, it is possible to design a structure of a light emitting element such that light emission is obtained from another functional layer (for example, an electron transporting layer or a hole transporting layer). For example, by adding dopant to an electron transporting layer or a hole transporting layer, light emission can also be obtained from the transporting layer. When light emitting materials used for a light emitting layer and a transporting layer have different light emission wavelengths, a spectrum in which these light emission wavelengths are overlapped with each other, can be obtained. In a case where a light emission color of the light emitting layer and a light emission color of the transporting layer are complementary colors, white light emission can be obtained.

Note that by changing combination of a material of the first electrode 101 and a material of the second electrode 103, various light emitting elements can be manufactured. When using a material having a light transmitting property for the first electrode 101, light can be emitted through the first electrode 101 side. Further, when using a material having a light shielding property (in particular, reflexivity) for the first electrode 101 and a material having a light transmitting property for the second electrode 103, light can be emitted through the second electrode 103 side. Furthermore, when using a material having a light transmitting property for both of the first electrode 101 and the second electrode 103, light can be emitted through both of the first electrode 101 side and the second electrode 103 side.

Embodiment Mode 3

A method for manufacturing a light emitting device of the present invention will be described in this embodiment mode with reference to FIGS. 2A to 2E and FIGS. 3A to 3C. Although an example of manufacturing an active matrix light emitting device will be shown in this embodiment mode, the present invention is also applicable to a passive matrix light emitting device as a matter of course.

Figure 2A:
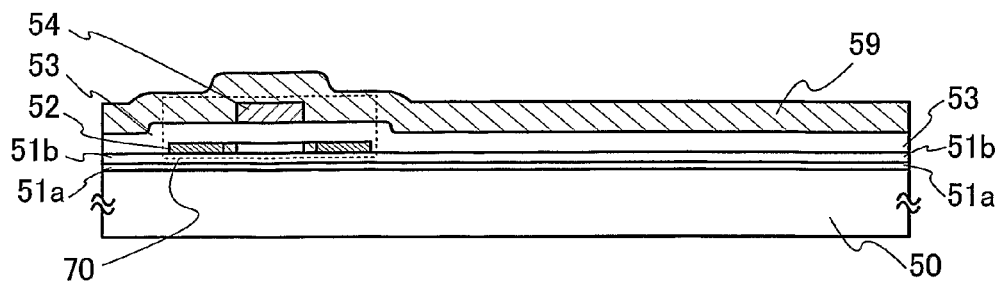
FIGS. 2A to 2E are cross sectional views explaining a method for manufacturing an active matrix light emitting device of the present invention.

First, a first base insulating layer 51a and a second base insulating layer 51b are formed over a first substrate 50, and then a semiconductor layer is formed over the second base insulating layer 51b (FIG. 2A).

As the first substrate 50, glass, quartz, plastic (such as polyimide, acrylic, polyethyleneterephthalate, polycarbonate, polyacrylate, and polyethersulfone), and the like can be used. The first substrate 50 made from such a material can be polished by CMP or the like, if required. In this embodiment mode, a glass substrate is used.

The first base insulating layer 51a and the second base insulating layer 51b are provided to prevent an element such as alkali metal and alkali earth metal, which is contained in the first substrate 50 and adversely affects a characteristic of the semiconductor layer from dispersing in the semiconductor layer. As materials of the first and second base insulating layers, silicon oxide, silicon nitride, silicon oxide containing nitrogen, silicon nitride containing oxygen, and the like can be used. In this embodiment mode, the first base insulating layer 51a is formed using silicon nitride and the second base insulating layer 51b is formed using silicon oxide. A base insulating film including two layers of the first base insulating layer 51a and the second base insulating layer 51b is provided in this embodiment mode. Alternatively, a base insulating layer including a single layer or two or more layers may be provided. Further, if the amount of an impurity element dispersing from the substrate does not adversely affect a characteristic of the semiconductor layer, the base insulating layers are not necessary to be provided.

Next, a semiconductor layer is formed. The semiconductor layer is obtained by crystallizing an amorphous silicon film by laser beam in this embodiment mode. The amorphous silicon film is formed over the second base insulating layer 51b to have a thickness of 25 to 100 nm (preferably, 30 to 60 nm). As a method for forming the amorphous silicon film, a known method such as sputtering, reduced pressure CVD, and plasma CVD, can be used. Thereafter, heat treatment is performed at 500° C. for one hour to perform dehydrogenation.

Subsequently, the amorphous silicon film is crystallized by using a laser irradiation apparatus to form a crystalline silicon film. In this embodiment mode, an excimer laser is used in laser crystallization. A laser beam oscillated from the laser irradiation apparatus is processed into a linear beam spot by using an optical system. The amorphous silicon film is crystallized by being irradiated with the linear beam spot. The thus obtained crystalline silicon film is used as the semiconductor layer.

Other methods for crystallizing an amorphous silicon film will be shown below. For example, there are a method by which crystallization is performed only by heat treatment, a method by which crystallization is performed by heat treatment with use of a catalytic element promoting crystallization, and the like. As an element promoting crystallization, nickel, iron, palladium, tin, lead, cobalt, platinum, copper, gold, and the like can be given. When using such an element promoting crystallization, the crystallization can be carried out at a lower temperature for shorter time as compared with a method by which crystallization is performed only by heat treatment. Therefore, the glass substrate and the like are less damaged by the crystallization. When using the method by which crystallization is performed only by heat treatment, a quartz substrate, which is resistant to heat, or the like may be used as the first substrate 50.

Subsequently, a minute amount of an impurity is added to the semiconductor layer (so-called channel doping) so as to control a threshold value, if required. To obtain a required threshold value, an impurity (such as phosphorus and boron) imparting N-type conductivity or P-type conductivity is added to the semiconductor layer by ion doping or the like.

Thereafter, as shown in FIG. 2A, the semiconductor layer is patterned in to a predetermined shape to obtain an island-like semiconductor layer 52. The patterning is performed in such a way that a photoresist is formed over the semiconductor layer, the photoresist is exposed to form a predetermined mask shape, and then the photoresist is baked. A resist mask is formed over the semiconductor layer in such a manner. Then, by etching the semiconductor layer while utilizing the resist mask as a mask, the island-like semiconductor layer 52 can be formed.

Next, a gate insulating layer 53 is formed to cover the island-like semiconductor layer 52. The gate insulating layer 53 is formed using an insulating layer containing silicon by plasma CVD or sputtering so as to have a thickness of 40 to 150 nm. In this embodiment mode, silicon oxide is used to form the gate insulating layer 53.

Next, a gate electrode 54 is formed over the gate insulating layer 53. The gate electrode 54 may be formed by using an element selected from tantalum, tungsten, titanium, molybdenum, aluminum, copper, chromium, and niobium; or an alloy material or a compound material mainly containing these elements. Further, a semiconductor film typified by a polycrystalline silicon film doped with an impurity element such as phosphorus may be used. Furthermore, an AgPdCu alloy may be used.

In this embodiment mode, the gate electrode 54 is formed to have a single layer. Alternatively, the gate electrode 54 may have a stacked structure including two or more layers. For example, a stacked structure including a lower layer made from tungsten and an upper layer made from molybdenum is given. In a case where the gate electrode is formed to have a stacked structure, the materials mentioned in the preceding paragraph are preferably used for each layer. Further, a combination of these materials may be appropriately selected. The gate electrode 54 is etched by utilizing a mask made from a photoresist.

Subsequently, a high concentration impurity is added to the island-like semiconductor layer 52 while utilizing the gate electrode 54 as a mask. Thus, a thin film transistor 70 including the island-like semiconductor layer 52, the gate insulating layer 53, and the gate electrode 54, is formed.

Note that steps of manufacturing the thin film transistor are not particularly limited, and may be appropriately changed so as to manufacture a transistor having a desired structure.

In this embodiment mode, a top-gate thin film transistor using the crystalline silicon film, which is crystallized by laser crystallization, is used. Alternatively, a bottom-gate thin film transistor using an amorphous semiconductor film can be used for a pixel portion. The amorphous semiconductor film can be formed by using not only silicon but also silicon germanium. When using silicon germanium, a concentration of germanium is preferably set to be about 0.01 to 4.5 atomic %.

Next, an impurity element is added to the island-like semiconductor layer 52 while utilizing the gate electrode 54 as a mask. The impurity element is an element which can impart one conductivity to the island-like semiconductor layer 52. As an impurity element imparting N-type conductivity, phosphorus is given. Further, as an impurity element imparting P-type conductivity, boron or the like is typically given. When the first electrode 101 of the light emitting element serves as an anode, an impurity element imparting P-type conductivity is desirably selected. Meanwhile, when the first electrode 101 of the light emitting element serves as a cathode, an impurity element imparting N-type conductivity is desirably selected.

Thereafter, an insulating film (hydrogenated film) 59 is formed by using silicon nitride so as to cover the gate electrode 54 and the gate insulating layer 53. After forming the insulating film (hydrogenated film) 59, the insulating film is heated at 480° C. for about one hour to activate the impurity element and hydrogenate the island-like semiconductor layer 52.

Figure 2B:
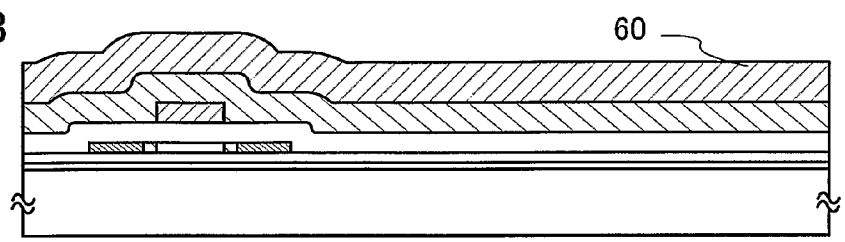

A first interlayer insulating layer 60 is next formed to cover the insulating film (hydrogenated film) 59. As a material for forming the first interlayer insulating layer 60, silicon oxide, acrylic, polyimide, siloxane, a low-k material, or the like is preferably used. In this embodiment mode, a silicon oxide film is formed as the first interlayer insulating layer 60 (FIG. 2B).

Figure 2C:
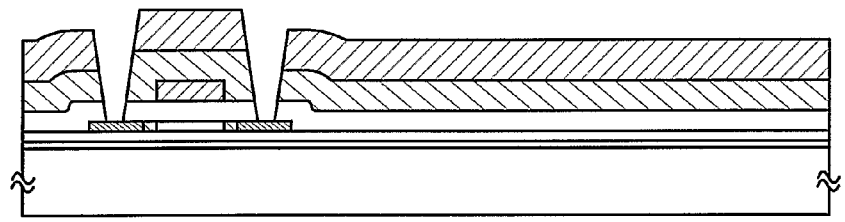

Next, contact holes that reach the island-like semiconductor layer 52 are formed. The contact holes can be formed by etching while using a resist mask to expose the island-like semiconductor layer 52 through the contact holes. The contact holes can be formed by either wet etching or dry etching. Note that etching may be performed at one time or plural times. Further, when etching is performed at plural times, both wet etching and dry etching may be used (FIG. 2C).

Figure 2D:
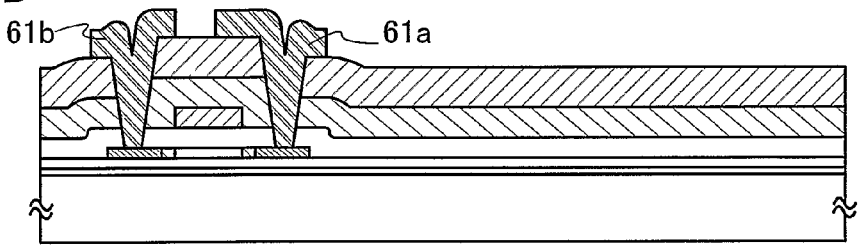

A conductive layer is formed to cover the contact holes and the first interlayer insulating layer 60. This conductive layer is processed into a desired shape to form a connection portion 61a, a first wiring 61b, and the like. This wiring may include a single layer made from aluminum, copper, an aluminum-carbon-nickel alloy, an aluminum-carbon-molybdenum alloy, or the like. Further, the wiring may have a structure formed by sequentially stacking molybdenum, aluminum, and molybdenum, a structure formed by sequentially stacking titanium, aluminum, and titanium, or a structure formed by sequentially stacking titanium, titanium nitride, aluminum, and titanium (FIG. 2D).

Figure 2E:
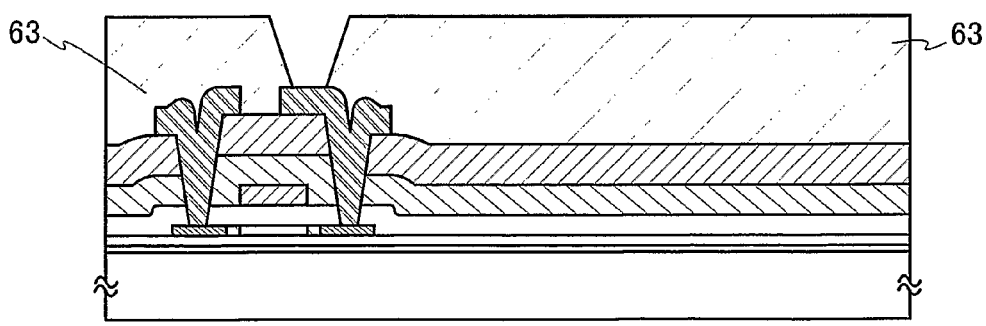

Thereafter, a second interlayer insulating layer 63 is formed to cover the connection portion 61a, the first wiring 61b, and the first interlayer insulating layer 60. As a material of the second interlayer insulating layer 63, acrylic, polyimide, siloxane, or the like having a self-planarizing property is preferably used. In this embodiment mode, siloxane is used to form the second interlayer insulating layer 63 (FIG. 2E).

Subsequently, an insulating layer may be formed using silicon nitride or the like over the second interlayer insulating layer 63. Providing this insulating layer makes it possible to prevent the second interlayer insulating layer 63 from being etched more than necessary in etching a pixel electrode that is formed later. Therefore, when selectivity of the etching rates between the pixel electrode and the second interlayer insulating layer 63 is large, this insulating layer may not be provided. Next, a contact hole, which reaches the connection portion 61a through the second interlayer insulating layer 63, is formed.

A conductive layer having a light transmitting property is formed to cover the contact hole and the second interlayer insulating layer 63 (or the insulating layer). Thereafter, the conductive layer having the light transmitting property is processed to form a lower electrode 64 of a thin-film light emitting element. The lower electrode 64 is electrically connected to the connection portion 61a.

As a material of the lower electrode 64, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), and titanium (Ti); an alloy thereof such as an aluminum-silicon (Al—Si) alloy, an aluminum-titanium (Al—Ti) alloy, and an aluminum-silicon-copper (Al—Si—Cu) alloy; nitride of a metal material such as titanium nitride (TiN); a metal compound such as indium tin oxide (ITO), ITO containing silicon, and indium zinc oxide (IZO) in which 2 to 20% zinc oxide (ZnO) is mixed in indium oxide; and the like can be used.

Figure 3A:
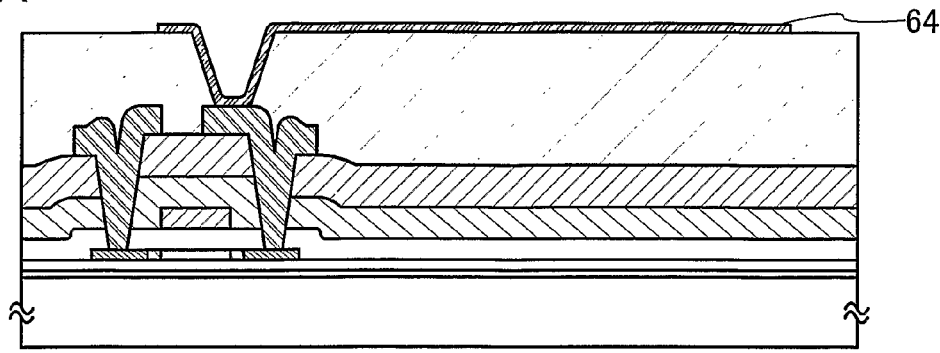
FIGS. 3A to 3C are cross sectional views explaining a method for manufacturing an active matrix light emitting device of the present invention.

Further, an electrode through which light is emitted is formed using a conductive film having a light transmitting property. As a material for the conductive film having the light transmitting property, in addition to a metal compound such as ITO (indium tin oxide), ITO containing silicon (hereinafter also referred to as ITSO), and IZO (indium zinc oxide) in which 2 to 20% zinc oxide (ZnO) is mixed in indium oxide, an extremely thin film of metal such as Al and Ag is used. When light is emitted through the second electrode 103, the lower electrode 64 can be formed by using a material having high reflectivity (such as Al and Ag). In this embodiment mode, ITSO is used for the lower electrode 64 (FIG. 3A).

Figure 3B:
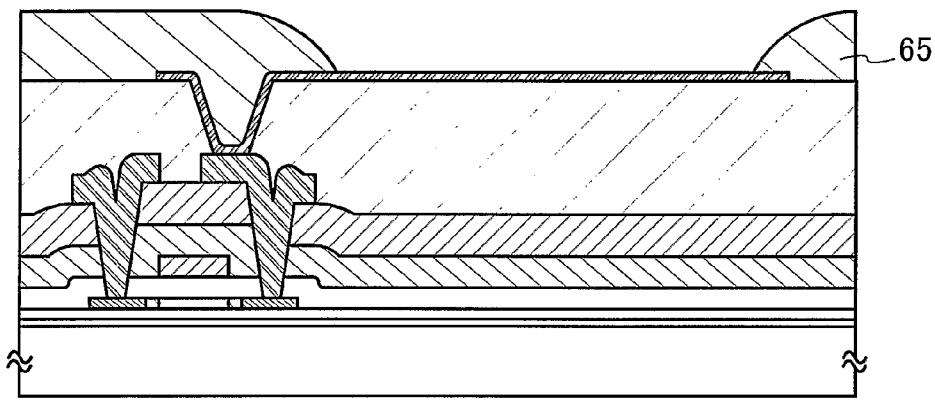
Figure 3C:
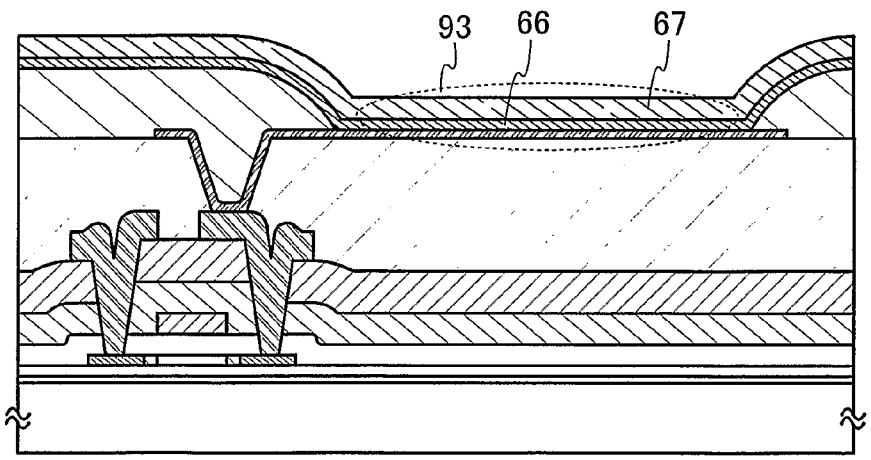

Next, an insulating layer is formed using an organic material or an inorganic material to cover the second interlayer insulating layer 63 (or the insulating layer) and the lower electrode 64. Subsequently, the insulating layer is processed to expose part of the lower electrode 64 so as to form a partition wall 65. A photosensitive organic material (such as acrylic and polyimide) is preferably used as a material for the partition wall 65. Note that the partition wall may be formed using a nonphotosensitive organic or inorganic material. Further, a black pigment such as titanium black and carbon nitride or a dye may be dispersed in a material of the partition wall 65 by using a dispersant or the like so that the partition wall 65 may be used as a black matrix. Desirably, an edge of the partition wall 65, where faces the first electrode, has a tapered shape such that the curvature is continuously varied (FIG. 3B).

Subsequently, a layer 66 containing a light emitting substance is formed. Subsequently, an upper electrode 67 is formed to cover the layer 66 containing the light emitting substance. Therefore, a light emitting element portion 93 including the layer 66 containing the light emitting substance between the lower electrode 64 and the upper electrode 67 can be manufactured. Then, by applying higher voltage to the lower electrode 64 than the upper electrode 67, light emission can be obtained. As an electrode material used for forming the upper electrode 67, the same material as the lower electrode 64 can be used. In this embodiment mode, aluminum is used for the upper electrode 67.

Further, the layer 66 containing the light emitting substance is formed by evaporation, ink-jet, spin coating, dip coating, or the like. The layer 66 containing the light emitting substance contains an anthracene derivative described in Embodiment Mode 1. The layer 66 containing the light emitting substance may be a stacked layer of layers having various functions or a single layer of a light emitting layer as described in Embodiment Mode 2. Further, the layer 66 containing the light emitting substance contains an anthracene derivative described in Embodiment Mode 1 as a light emitting layer. Further, an anthracene derivative described in Embodiment Mode 1 may be contained as one or both of a host and dopant of a light emitting layer. Furthermore, an anthracene derivative described in Embodiment Mode 1 may be contained in a layer other than the light emitting layer or part thereof in the layer containing the light emitting substance. In particular, since an anthracene derivative of the present invention having a diarylamino group has an excellent hole transporting property, it can be used as a hole transporting layer. Further, a material used in combination with the anthracene derivative described in Embodiment Mode 1 may be a low molecular-based material, an intermediate molecular material (including oligomer and dendrimer), or a high molecular-based material. Further, as a material used for the layer 66 containing the light emitting substance, in many cases, a single layer or a stacked layer of an organic compound is generally used. In the present invention, the layer 66 containing the light emitting substance may also be formed using a structure in which an inorganic compound is used for part of a film made from an organic compound.

Afterwards, a silicon oxide film containing nitrogen is formed as a passivation film by plasma CVD. When using a silicon oxide film containing nitrogen, a silicon oxynitride film may be formed using $SiH_4$, $N_2O$, and $NH_3$ by plasma CVD, or a silicon oxynitride film may be formed using $SiH_4$ and $N_2O$ by plasma CVD, or a silicon oxynitride film may be formed using a gas in which $SiH_4$ and $N_2O$ are diluted with Ar, by plasma CVD.

Alternatively, as the passivation film, a hydrogenated silicon oxynitride film formed using $SiH_4$, $N_2O$, and $H_2$ may be used. The passivation film is, of course, not limited to a single layer structure, and it may have a single layer structure or a stacked structure of other insulating layer containing silicon. In addition, a multilayer film including a carbon nitride film and a silicon nitride film, a multilayer film including styrene polymer, a silicon nitride film, or a diamond like carbon film may be formed instead of the silicon oxide film containing nitrogen.

Subsequently, to protect the light emitting element from a substance which promotes deterioration of the light emitting element (such as moisture), a display portion is sealed. When the display portion is sealed with a second substrate 94, the second substrate is attached with a sealing material having an insulating property such that an external connection portion is exposed. A space between the second substrate 94 and the element substrate may be filled with an inert gas such as dried nitrogen. Alternatively, a sealing material may be applied over the entire surface of the pixel portion and then the second substrate 94 may be attached thereto. An ultraviolet curing resin or the like is preferably used as the sealing material. A drying agent or a particle for maintaining a constant gap between the substrates may be mixed in the sealing material. Subsequently, a flexible wiring substrate is attached to the external connection portion. Thus, a light emitting device is completed.

Examples of structures of a light emitting device formed above will be described with reference to FIGS. 4A and 4B. Further, portions having similar functions are sometimes denoted by the same reference numerals, though they have different shapes so as to omit explanation. In this embodiment mode, the thin film transistor 70 having an LDD structure is connected to the light emitting element portion 93 through the connection portion 61a.

Figure 4A:
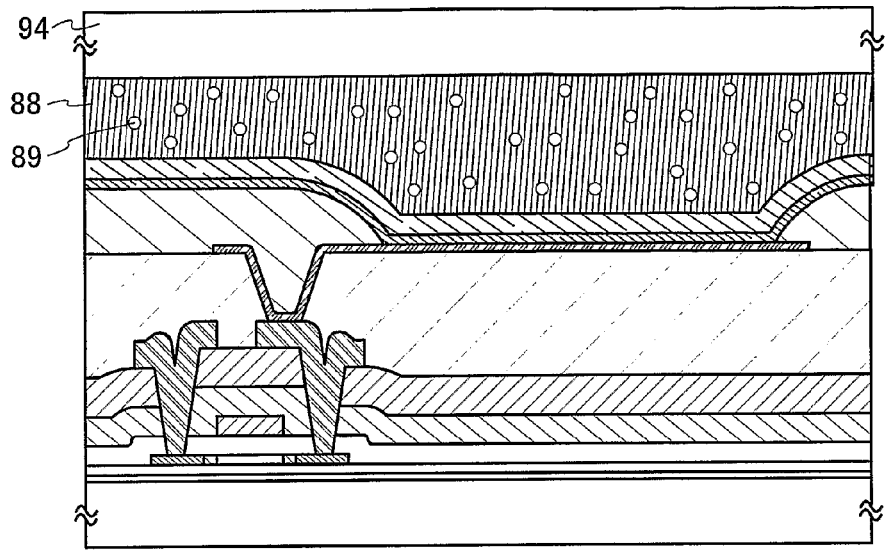
FIGS. 4A and 4B are cross sectional views of light emitting devices of the present invention.

FIG. 4A shows a structure where the lower electrode 64 is formed using a conductive film having a light transmitting property, and light generated in the layer 66 containing the light emitting substance is emitted toward the first substrate 50. Further, after forming the light emitting element portion 93, the second substrate 94 is firmly attached to the first substrate 50 using a sealing material or the like. A space between the second substrate 94 and the light emitting element portion 93 is filled with a resin 88 or the like having a light transmitting property to seal the light emitting element portion. Accordingly, the light emitting element portion 93 can be prevented from being deteriorated by moisture or the like. Desirably, the resin 88 having the light transmitting property also has a hygroscopic property. More desirably, to prevent an adverse influence of moisture, a drying agent 89 with a high light transmitting property is dispersed in the resin 88.

Figure 4B:
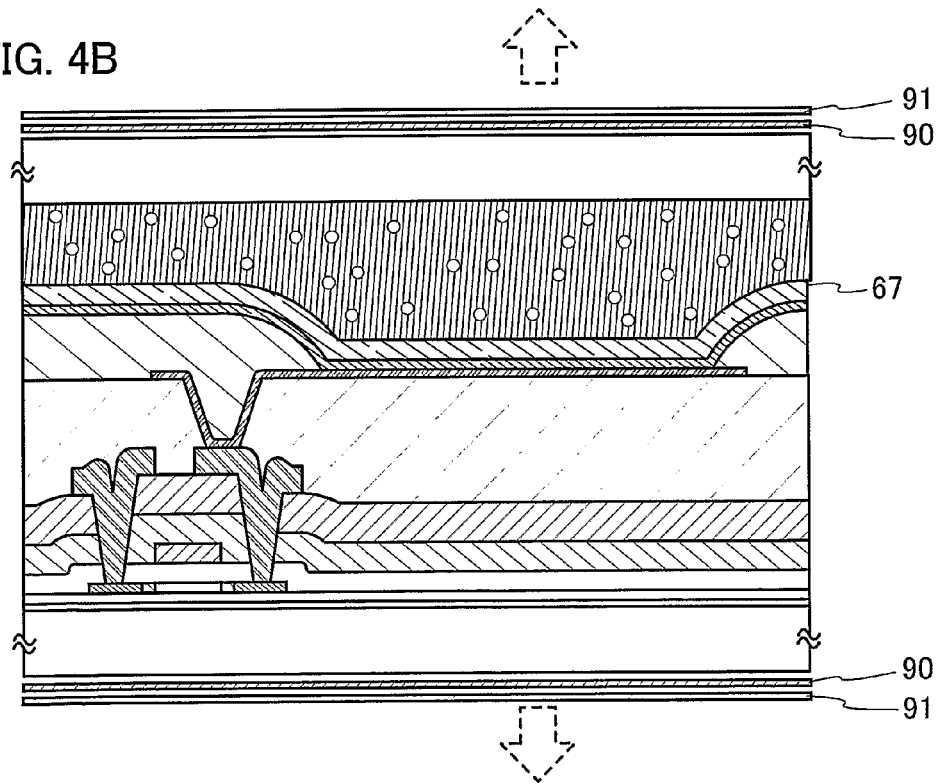

FIG. 4B shows a structure where both the lower electrode 64 and the upper electrode 67 are formed using conductive films having light transmitting properties and light can be emitted toward both the first substrate 50 and the second substrate 94. In this structure, by providing outer polarizing plates 90 outside of the first substrate 50 and the second substrate 94, a screen can be prevented from being transparent, thereby improving visibility. Protection films 91 are preferably provided outside of the outer polarizing plates 90.

The light emitting device according to the present invention with a display function may employ either analog video signals or digital video signals. When using the digital video signals, light emitting display devices are classified into one in which the video signals use voltage and one in which the video signals use current. When light emitting elements emit light, video signals input to pixels are classified into one at constant voltage and one at constant current. The video signals at constant voltage include one in which constant voltage is applied to a light emitting element and one in which constant current flows through a light emitting element. The video signals at constant current include one in which constant voltage is applied to a light emitting element and one in which constant current flows though a light emitting element. The case where constant voltage is applied to a light emitting element indicates a constant voltage drive whereas the case where constant current flows though a light emitting element indicates a constant current drive. In the constant current drive, constant current flows regardless of the change in resistance of a light emitting element. The light emitting device of the invention and a method for driving the light emitting device may use any driving method as described above.

A light emitting device of the present invention having such a structure has high reliability and can provide blue light emission with good color purity. Furthermore, the light emitting device of the present invention having such a structure has excellent color reproducibility.

This embodiment mode can be implemented by being combined with a suitable structure of Embodiment Mode 1 and Embodiment Mode 2.

Embodiment Mode 4

Figure 5A:
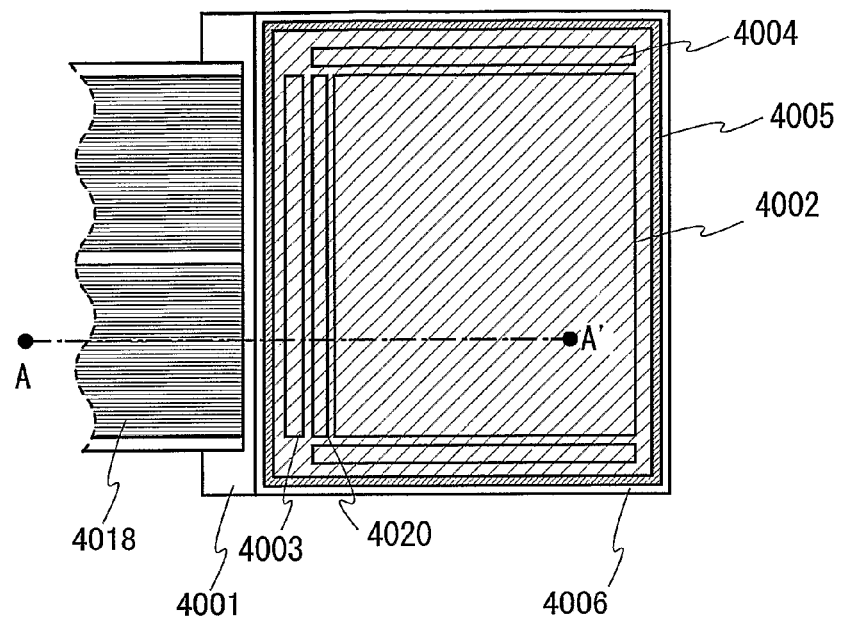
FIG. 5A is a top view and FIG. 5B is a cross sectional view of a light emitting device of the present invention.
Figure 5B:
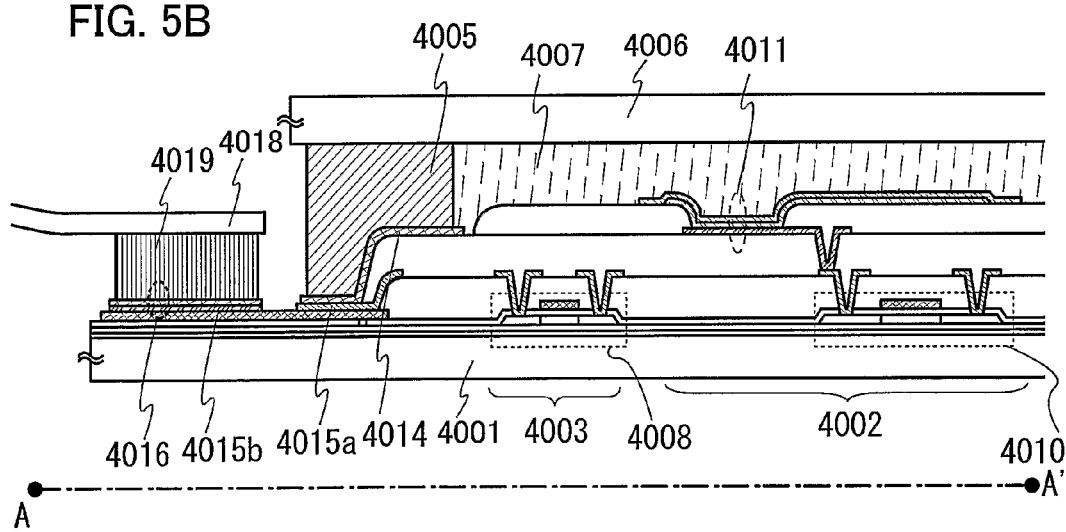

In this embodiment mode, an exterior appearance of a panel, which is a light emitting device of the present invention, will be described with reference to FIGS. 5A and 5B. FIG. 5A is a top view of the panel in which a transistor and a light emitting element formed over a substrate are sealed with a sealing material provided between the substrate and a counter substrate 4006. FIG. 5B is a cross sectional view of FIG. 5A. Further, a structure of the light emitting element mounted over this panel is the same as the structure shown in Embodiment Mode 2.

A sealing material 4005 is provided around a pixel region 4002, a signal line driver circuit 4003, and a scanning line driver circuit 4004 provided over a TFT substrate 4001. Further, the counter substrate 4006 is provided over the pixel region 4002, the signal line driver circuit 4003, and the scanning line driver circuit 4004. Accordingly, the pixel region 4002, the signal line driver circuit 4003, and the scanning line driver circuit 4004 are hermetically sealed with the TFT substrate 4001, the sealing material 4005, and the counter substrate 4006 along with a filler 4007.

Further, each of the pixel region 4002, the signal line driver circuit 4003, and the scanning line driver circuit 4004 provided over the TFT substrate 4001 has a plurality of thin film transistors. A thin film transistor 4008 of the driver circuit portion, which is included in the signal line driver circuit 4003, and a thin film transistor 4010 of the pixel portion, which is included in the pixel region 4002, are shown in FIG. 5B.

A light emitting element portion 4011 is electrically connected to the thin film transistor 4010 of the pixel portion.

A first leading wiring 4014 corresponds to a wiring for supplying signals or power supply voltage to the pixel region 4002, the signal line driver circuit 4003, and the scanning line driver circuit 4004. The first leading wiring 4014 is connected to a connection terminal 4016 through a second leading wiring 4015a and a third leading wiring 4015b. The connection terminal 4016 is electrically connected through a terminal of a flexible printed circuit (FPC) 4018 and an anisotropic conductive film 4019.

Note that as the filler 4007, in addition to an inert gas such as nitrogen and algon, an ultraviolet curing resin or a thermosetting resin can be used. Specifically, polyvinylchloride, acrylic, polyimide, an epoxy resin, a silicon resin, polyvinylbutyral, or ethylene vinylene acetate can be used.

Note that a light emitting device of the present invention includes a panel provided with a pixel portion having a light emitting element and a module in which an IC is mounted on the panel.

The light emitting device of the present invention as described above has the light emitting element described in Embodiment Mode 2 as a light emitting element included in a pixel portion, and therefore, the light emitting device has the pixel portion with high reliability and emit blue light with good color purity. Further, the light emitting device of the present invention has the light emitting element described in Embodiment Mode 2 as the light emitting element included in the pixel portion, and hence, the light emitting device has excellent color reproducibility along with high display quality.

This embodiment mode can be implemented by being appropriately combined with a suitable structure of Embodiment Mode 1 through Embodiment Mode 3.

Embodiment Mode 5

A pixel circuit and a protection circuit included in the panel or the module shown in Embodiment Mode 4, and operations thereof will be described in this embodiment mode. Note that the cross sectional views shown in FIGS. 2A to 2E and FIGS. 3A to 3C correspond to cross sectional views of a driving TFT 1403 and a light emitting element portion 1405.

Figure 6A:
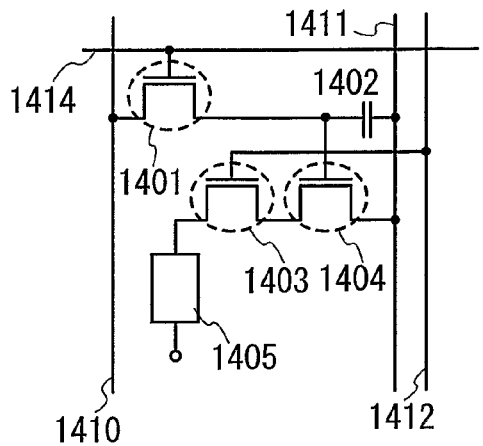
FIGS. 6A to 6F are diagrams showing examples of a pixel circuit of a light emitting device of the present invention.

In a structure of a pixel shown in FIG. 6A, a signal line 1410, power supply lines 1411 and 1412 are arranged in columns, whereas a scanning line 1414 is arranged in a row. The pixel also includes a switching TFT 1401, a driving TFT 1403, a current controlling TFT 1404, a capacitor element 1402, and a light emitting element portion 1405.

Figure 6B:
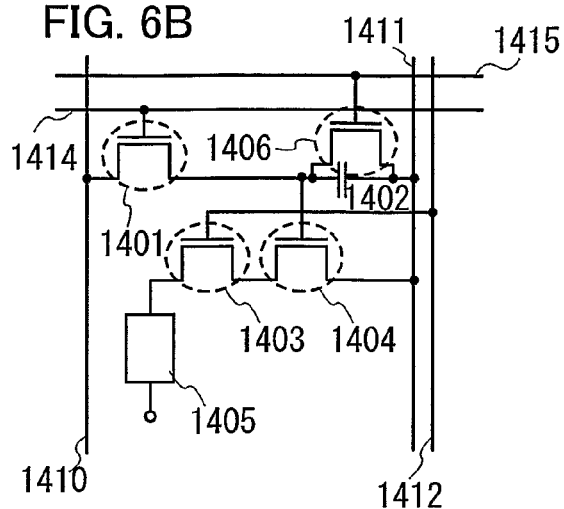
Figure 6C:
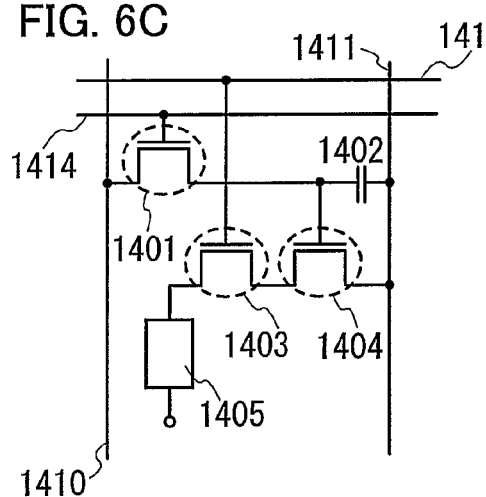
Figure 6D:
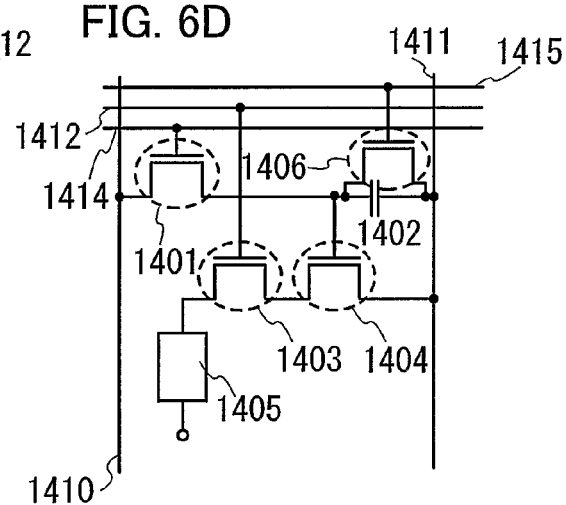

A structure of a pixel shown in FIG. 6C has a similar structure to the one shown in FIG. 6A, except that a gate of the driving TFT 1403 is connected to a power supply line 1412 that is arranged in a row. That is, both pixels illustrated in FIGS. 6A and 6C show similar equivalent circuit diagrams. However, respective power supply lines 1412 are formed of conductive films in different layers between the case where the power supply line 1412 is arranged in a column (FIG. 6A) and the case where the power supply line 1412 is arranged in a row (FIG. 6C). In order to emphasis on the different arrangements of the wirings connected to the gates of the driving TFTs 1403, the equivalent circuit diagrams are individually illustrated in FIGS. 6A and 6C.

In each pixel as shown in FIGS. 6A and 6C, the driving TFT 1403 and the current controlling TFT 1404 are connected in series in each pixel, and the channel length L (driving TFT 1403) and the channel width W (driving TFT 1403) of the driving TFT 1403 and the channel length L (current controlling TFT 1404) and the channel width W (current controlling TFT 1404) of the current controlling TFT 1404 are preferably set to satisfy the relation of L (driving TFT 1403)/W (driving TFT 1403): L (current controlling TFT 1404)/W (current controlling TFT 1404)=5 to 6,000:1.

The driving TFT 1403 is operated in a saturation region and controls the value of current flowing through the light emitting element portion 1405. The current controlling TFT 1404 is operated in a linear region and controls current supplied to the light emitting element portion 1405. The both TFTs 1403 and 1404 preferably have the same conductivity type in view of the manufacturing process. In this embodiment mode, n-channel TFTs are formed as both the TFTs 1403 and 1404. Also, a depletion type TFT may be used as the driving TFT 1403 instead of an enhancement type TFT. In a light emitting device of the present invention having the above structure, since the current controlling TFT 1404 is operated in the linear region, slight variations in $V_{gs}$ of the current controlling TFT 1404 do not adversely affect the value of current flowing through the light emitting element portion 1405. That is, the value of current flowing through the light emitting element portion 1405 can be determined by the driving TFT 1403 operated in the saturation region. In accordance with the above described structure, it is possible to provide a light emitting device in which image quality is improved by improving variations in luminance of a light emitting element due to variations in characteristics of the TFTs.

The switching TFT 1401 of each pixel as shown in FIGS. 6A to 6D controls input of a video signal with respect to the pixel. When the switching TFT 1401 is turned on, a video signal is input to the pixel, and then voltage of the video signal is held in the capacitor element 1402. Although the arrangement in which each pixel includes the capacitor element 1402 is shown in each of FIGS. 6A and 6C, the present invention is not limited thereto. In a case where a gate capacitor or the like has a sufficient capacitance value for holding a video signal, the capacitor element 1402 may not be provided.

A pixel shown in FIG. 6B has a similar structure to the one shown in FIG. 6A, except that an erasing TFT 1406 and a scanning line 1414 are added thereto. Similarly, a pixel shown in FIG. 6D has a similar structure to the one shown in FIG. 6C, except that an erasing TFT 1406 and a scanning line 1414 are added thereto.

The erasing TFT 1406 is controlled to be turned on/off by the newly provided scanning line 1414. When the erasing TFT 1406 is turned on, charge held in the capacitor element 1402 is discharged, thereby turning the current controlling TFT 1404 off. That is, supply of current flowing through the light emitting element portion 1405 can be forcibly stopped by providing the erasing TFT 1406. Therefore, a lighting period can start simultaneously with or immediately after a writing period starts before signals are written in all the pixels in accordance with the structures shown in FIGS. 6B and 6D, and hence, the duty ratio can be improved.

Figure 6E:
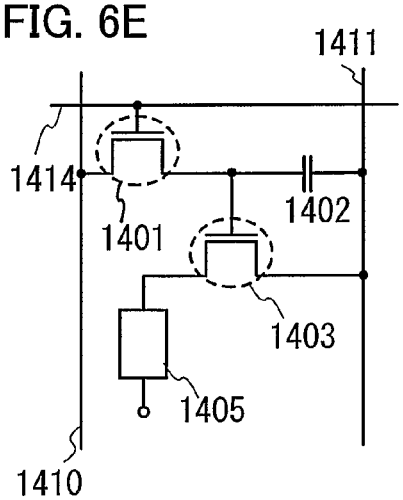
Figure 6F:
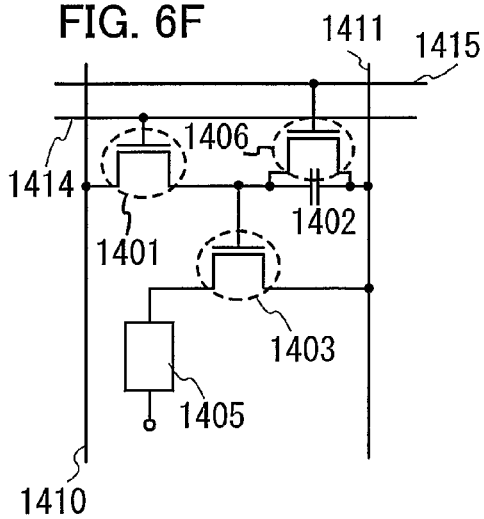

In a pixel shown in FIG. 6E, a signal line 1410 and a power supply line 1411 are arranged in columns while a scanning line 1414 is arranged in a row. The pixel further includes a switching TFT 1401, a driving TFT 1403, a capacitor element 1402, and a light emitting element portion 1405. A pixel shown in FIG. 6F has a similar structure to the one shown in FIG. 6E, except that an erasing TFT 1406 and a scanning line 1415 are added thereto. Further, providing the erasing TFT 1406 makes it also possible to improve a duty ratio in the structure of FIG. 6F.

As described above, the present invention can employ various kinds of pixel circuits. In particular, when a thin film transistor is formed using an amorphous semiconductor film, the size of a semiconductor layer of the driving TFT 1403 is preferably made large. Therefore, in the above pixel circuits, a top emission type in which light generated in a light emitting stacked body is emitted through a sealing substrate, is preferably employed.

It is thought that such an active matrix light emitting device has an advantage that when pixel density is increased, the light emitting device can be driven at low voltage since a TFT is provided for each pixel.

An active matrix light emitting device in which a TFT is provided in each pixel is described in this embodiment mode; however, this embodiment mode is also applicable to a passive matrix light emitting device. The passive matrix light emitting device has an advantage that it can be manufactured by a simple manufacturing method. In addition, since a TFT is not provided in each pixel in the passive matrix light emitting device, a high aperture ratio is obtained. In a case of a light emitting device in which light generated in a light emitting stacked body is emitted toward both sides of the light emitting stacked body, when a passive matrix light emitting device is employed, an aperture ratio can be increased.

Subsequently, a case in which diodes are connected as protection circuits to a scanning line 1414 and a signal line 1410, will be described using an equivalent circuit diagram shown in FIG. 6E.

Figure 7:
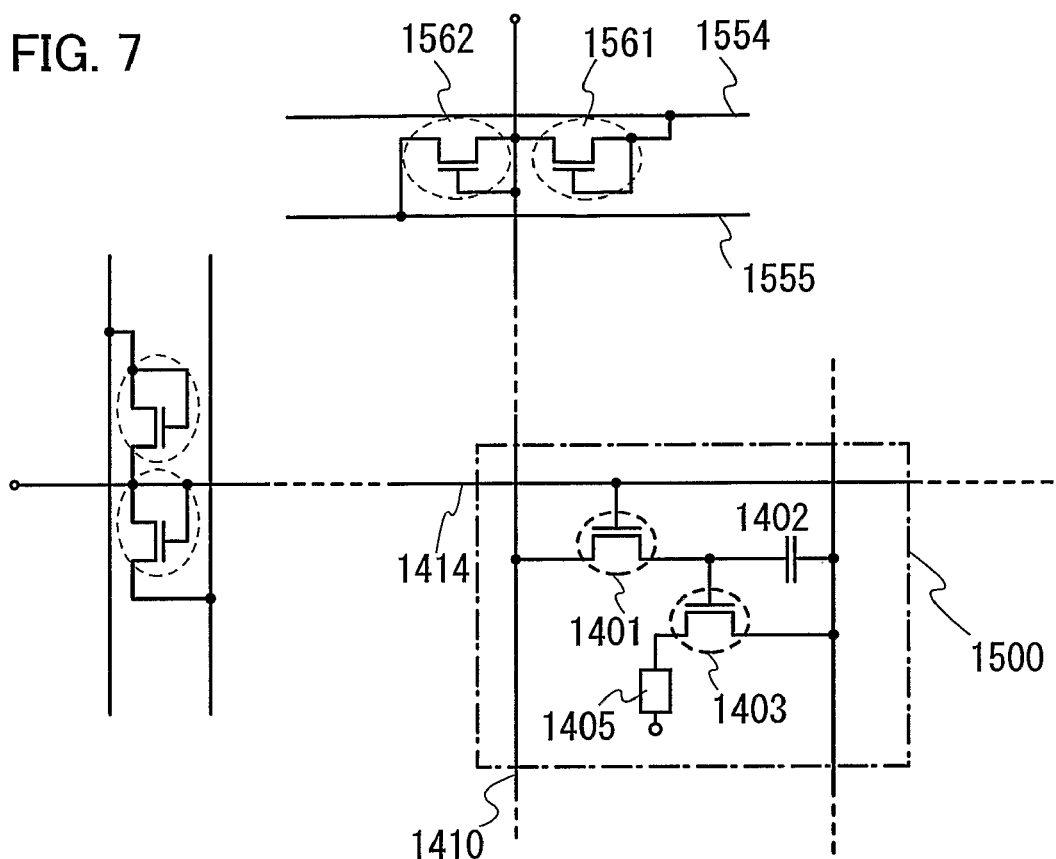
FIG. 7 is a diagram showing an example of a protection circuit of a light emitting device of the present invention.

In FIG. 7, switching TFTs 1401, a driving TFT 1403, a capacitor element 1402, and a light emitting element portion 1405 are provided in a pixel portion 1500. In the signal line 1410, diodes 1561 and 1562 for protection circuits are provided. The diodes 1561 and 1562 for the protection circuits can be manufactured in accordance with the above described embodiment mode as well as the switching TFT 1401 and the driving TFT 1403. Therefore, each diode includes a gate electrode, a semiconductor layer, a source electrode, a drain electrode, and the like. By connecting the gate electrode to the drain electrode or the source electrode, the diodes 1561 and 1562 for the protection circuits are operated.

Common potential lines 1554 and 1555 connecting to the diodes are formed in the same layer as the gate electrodes. Therefore, it is necessary to form contact holes in a gate insulating layer so as to be in contact with the source electrodes or the drain electrodes of the diodes.

A diode provided in the scanning line 1414 has the similar structure.

As mentioned above, protection diodes provided in an input stage can be formed at the same time of a TFT. Further, the positions of the protection diodes are not limited thereto, and they can be provided between a driver circuit and a pixel.

This embodiment mode can be implemented by being appropriately combined with a suitable structure of Embodiment Mode 1 through Embodiment Mode 4.

A light emitting device of the present invention including such protection circuits has high reliability along with excellent color purity of blue light emission. Further, the light emitting device has excellent color reproducibility, thereby making it possible to further improve the reliability.

Embodiment Mode 6

As electronic appliances mounted with light emitting devices (modules) of the present invention, a camera such as a video camera and a digital camera; a goggle type display (a head mounted display); a navigation system; an audio reproducing device (e.g., a car audio component); a computer; a game machine; a portable information terminal (e.g., a mobile computer, a mobile phone, a portable game machine, an electronic book, and the like); an image reproducing device equipped with a recording medium (concretely, a device having a display that can reproduce a recording medium such as a digital versatile disc (DVD) and can display an image thereof); and the like can be given. Specific examples of these electronic appliances are shown in FIGS. 8A to 8E.

Figure 8A:
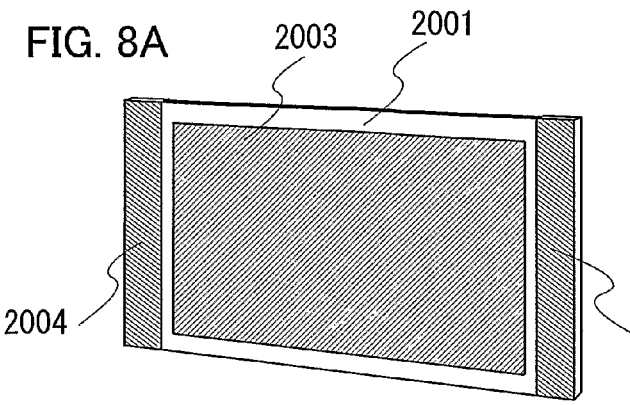
FIGS. 8A to 8E are diagrams showing examples of electronic appliances to which the present invention is applicable.

FIG. 8A shows a light emitting device which corresponds to a monitor of a television set, a personal computer, or the like. The light emitting device includes a housing 2001, a display portion 2003, speaker portions 2004, and the like. The display portion 2003 of the light emitting device of the present invention has high display quality, and the light emitting device has high reliability. To improve the contrast, a polarizing plate or a circular polarizing plate is preferably provided in a pixel portion. For example, a ¼λ plate, a ½λ plate, and a polarizing plate are preferably provided over a sealing substrate in this order. In addition, an antireflection film may be provided on the polarizing plate.

Figure 8B:
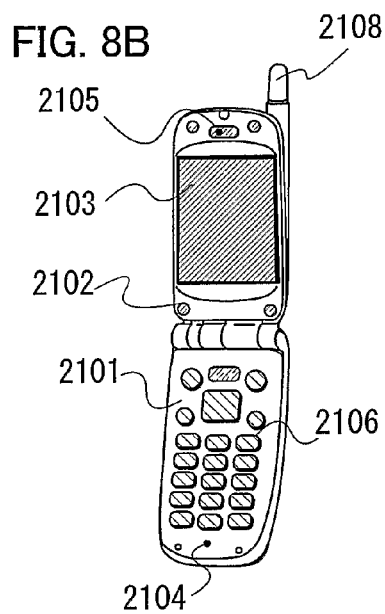

FIG. 8B shows a mobile phone, including a main body 2101, a housing 2102, a display portion 2103, an audio input portion 2104, an audio output portion 2105, operation keys 2106, an antenna 2108, and the like. The display portion 2103 of the mobile phone of the present invention has high display quality, and the mobile phone has high reliability.

Figure 8C:
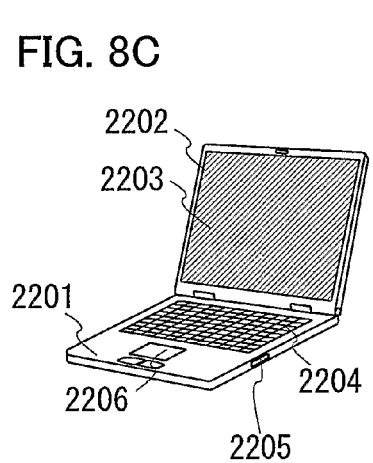

FIG. 8C shows a computer, including a main body 2201, a housing 2202, a display portion 2203, a keyboard 2204, an external connection port 2205, a pointing mouse 2206, and the like. The display portion 2203 of the computer of the present invention has high display quality, and the computer has high reliability. Although a laptop computer is shown in FIG. 8C, the present invention can also be applied to a desktop computer in which a hard disk and a display portion are combined, and the like.

Figure 8D:
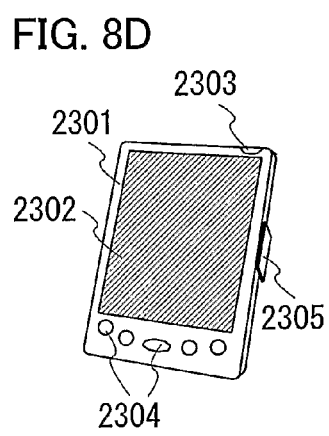

FIG. 8D shows a mobile computer, including a main body 2301, a display portion 2302, a switch 2303, operation keys 2304, an infrared port 2305, and the like. The display portion 2302 of the mobile computer of the present invention has high display quality, and the mobile computer has high reliability.

Figure 8E:
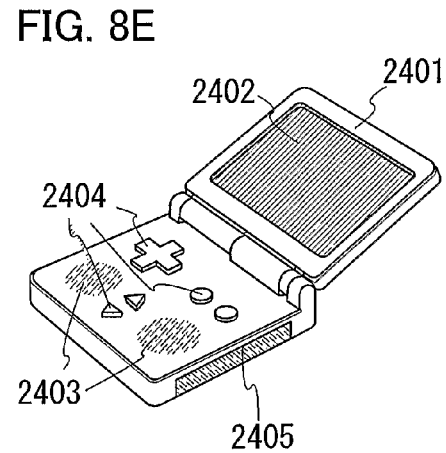

FIG. 8E shows a portable game machine, including a housing 2401, a display portion 2402, speaker portions 2403, operation keys 2404, a recording medium insertion portion 2405, and the like. The display portion 2402 of the portable game machine of the present invention has high display quality, and the portable game machine has high reliability.

As set forth above, the application range of the present invention is extremely wide so that the present invention can be used for electronic appliances in various fields.

This embodiment mode can be implemented by being appropriately combined with a suitable structure of Embodiment Mode 1 through Embodiment Mode 5.

Embodiment 1

A method for synthesizing a compound represented by the structural formula (9) as one example of the anthracene derivatives of the present invention, which is 9-(4{N-[4-(9-carbazolyl)phenyl)-N-phenylamino}phenyl)-10-phenylanthracene (hereinafter, referred to as YGAPA), will be described.

Step 1: Synthesis of
9-[4-(N-phenylamino)phenyl]carbazole (i) Synthesis of N-(4-bromophenyl)carbazole First, 56.3 g (0.24 mol) of 1,4-dibromobenzene, 31.3 g (0.18 mol) of carbazole, 4.6 g (0.024 mol) of copper iodide, 66.3 g (0.48 mol) of potassium carbonate, and 2.1 g (0.008 mol) of 18-crown-6-ether were put in a three-neck flask of 300 mL. After nitrogen was substituted for air in the three-neck flask, 8 mL of 1,3-dimethyl-3,4,5,6-tetrahydro-2(1H)-pyrimidinone (DMPU) was added thereto, and the mixture was stirred at 180° C. for 6 hours. The reactive mixture was cooled to a room temperature, and then a precipitate was removed by suction filtration. Then, the filtrate was washed with diluted hydrochloric acid, a saturated sodium hydrogen carbonate aqueous solution, and saturated saline in this order. After the washing, the filtrate was dried with magnesium sulfate. After the drying, the reactive mixture was naturally filtrated. After the filtration, the filtrate was concentrated. Then, the thus-obtained oily substance was purified by silica gel column chromatography (hexane:ethyl acetate=9:1), and thereafter, it was recrystallized by chloroform and hexane. Thus, 20.7 g (yield: 35%) of a light brown plate crystal, which was target matter, was obtained.

The $^1$H-NMR of this compound is shown below.

The $^1$H-NMR (300 MHz, DMSO-$d_6$) δ ppm: 8.14 (d, J=7.8 Hz, 2H), 7.73 (d, J=8.7 Hz, 2H), 7.46 (d, J=8.4 Hz, 2H), 7.42-7.26 (m, 6H).

Further, a synthetic scheme (b-1) of N-(4-bromophenyl)carbazole will be shown below.

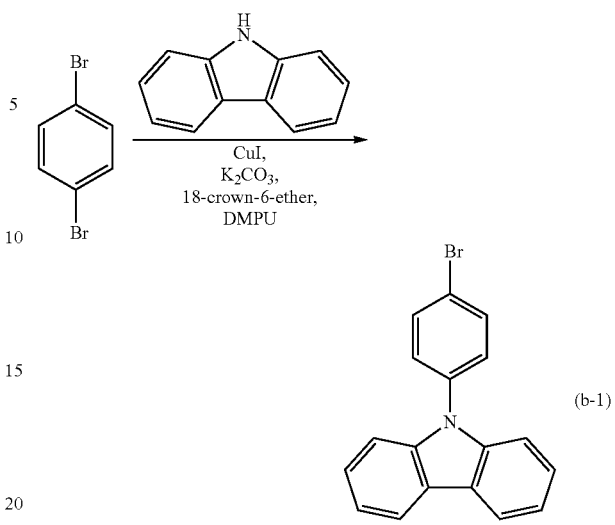

(ii) Synthesis of
9-[4-(N-phenylamino)phenyl]carbazole

First, 5.4 g (17.0 mmol) of N-(4-bromophenyl)carbazole, 1.8 mL (20.0 mmol) of aniline, 100 mg (0.17 mmol) of bis(benzylideneacetone)palladium(0) (abbreviation: Pd(dba)$_2$), and 3.9 g (40 mmol) of sodium-tert-butoxide (abbreviation: tert-BuONa) were put in a three-neck flask of 200 mL. After nitrogen was substituted for air in the three-neck flask, 0.1 mL of a hexane solution containing 10 wt % of tri(tert-butyl)phosphine (abbreviation: P(tert-Bu)$_3$) and 50 mL of toluene were added thereto, and the mixture was stirred at 80° C. for 6 hours. The reactive mixture was filtrated through florisil, celite, and alumina. After the filtration, the filtrate was washed with water and saturated saline in this order. After the washing, the filtrate was dried with magnesium sulfate. After the reactive mixture was naturally filtrated, the filtrate was concentrated, and the thus-obtained oily substance was purified by silica gel column chromatography (hexane:ethyl acetate=9:1). Thus, 4.1 g (yield: 73%) of target matter was obtained. It was confirmed that this compound was 9-[4-(N-phenylamino)phenyl]carbazole by a nuclear magnetic resonance (NMR) method.

Figure 9A:
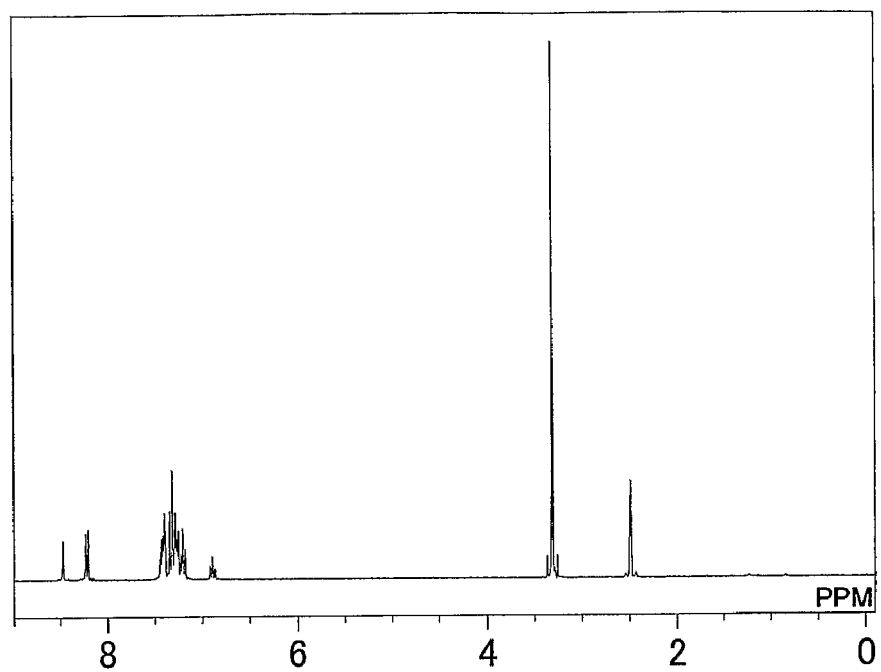
FIGS. 9A and 9B are $^1$H-NMR charts of 9-[4-(N-phenylamino)phenyl]carbazole.
Figure 9B:
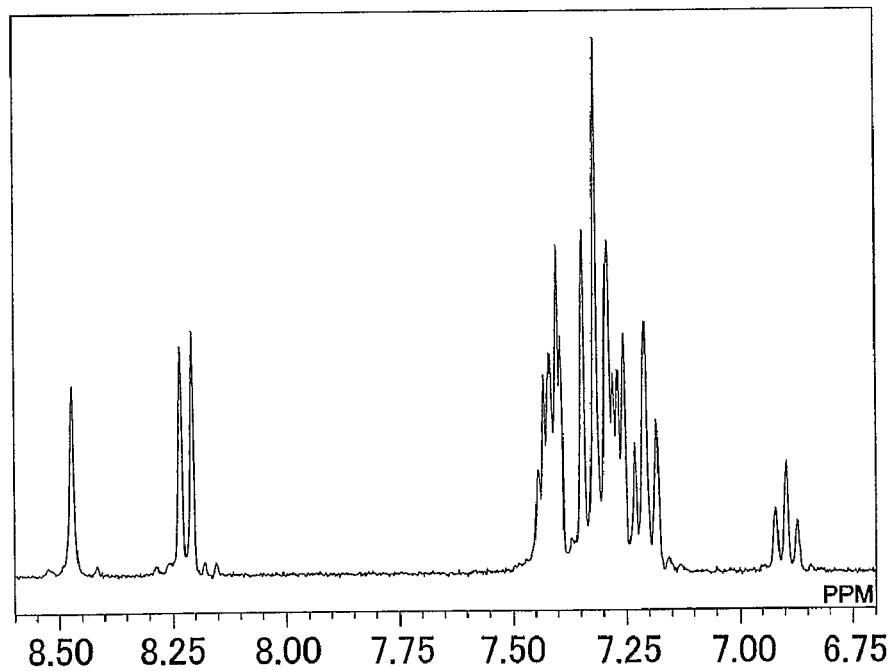

Next, the $^1$H-NMR of this compound is shown. Further, $^1$H-NMR charts are shown in FIGS. 9A and 9B. Note that FIG. 9B is a chart showing an enlarged portion of FIG. 9A in a range of 6.7 to 8.6 ppm.

The $^1$H-NMR (300 MHz, DMSO-$d_6$) δ ppm: 8.47 (s, 1H), 8.22 (d, J=7.8 Hz, 2H), 7.44-7.16 (m, 14H), 6.92-6.87 (m, 11H).

Further, a synthetic scheme (b-2) of 9-[4-(N-phenylamino)phenyl]carbazole is shown below.

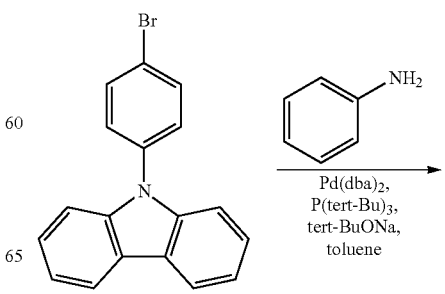

-continued

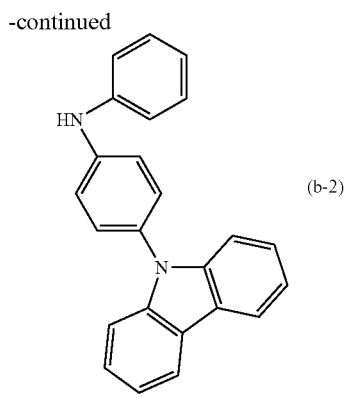

(b-2)

Step 2: Synthesis of 9-(4-bromophenyl)-10-phenylanthracene (Abbreviation: PA)

(i) Synthesis of 9-phenylanthracene

First, 5.4 g (21.1 mmol) of 9-bromoanthracene, 2.6 g (21.1 mmol) of phenylboronic acid, 60 mg (0.21 mmol) of palladium acetate(O) (abbreviation: Pd(OAc)$_2$), 10 mL (20 mmol) of an aqueous solution containing 2 mol/l of a potassium carbonate (K$_2$CO$_3$), 263 mg (0.84 mmol) of tri(orthotolyl)phosphine (P(o-tolyl)$_3$), and 20 mL of 1,2-dimethoxyethane (abbreviation: DME) were mixed. Then, the mixture was stirred at 80° C. for 9 hours. After the reaction, a precipitated solid was collected by suction filtration. The collected solid was dissolved in toluene, and then was filtrated through florisil, celite, and alumina. Thereafter, the filtrate was washed with water and saturated saline in this order. After the washing, the product was dried with magnesium sulfate. After the product was naturally filtrated, the filtrate was concentrated. Thus, 21.5 g (yield: 85%) of a light brown solid of 9-phenylanthracene, which was target matter, was obtained (synthetic scheme (b-3)).

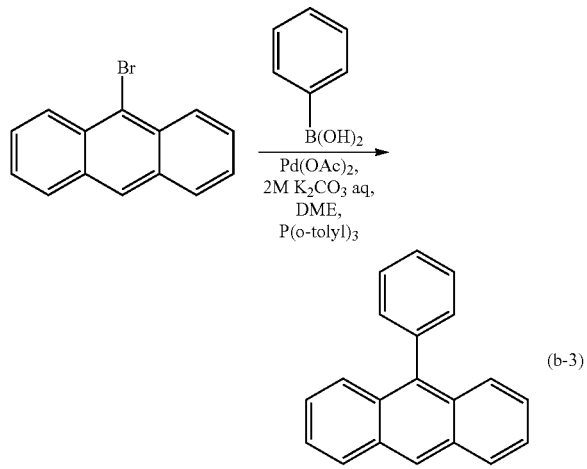

(b-3)

(ii) Synthesis of 9-bromo-10-phenylanthracene

First, 6.0 g (23.7 mmol) of 9-phenylanthracene was dissolved in 80 mL of carbon tetrachloride. Then, a solution in which 3.80 g (21.1 mmol) of bromine was dissolved in 10 mL of carbon tetrachloride was dropped in the reactive solution by using a dropping funnel. After the dropping, the mixture was stirred at a room temperature for one hour. After the reaction, the reaction was stopped by adding a sodium thiosulfate aqueous solution. An organic layer was washed with a sodium hydroxide aqueous solution and saturated saline in this order. After the washing, the product was dried with magnesium sulfate. After the product was naturally filtrated, the filtrate was concentrated and then was dissolved in toluene. Thereafter, this solution was filtrated through florisil, celite, and alumina. After the filtrate was concentrated, the concentrated filtrate was recrystallized by dichloromethane and hexane. Thus, 7.0 g (yield: 89%) of a light yellow solid of 9-bromo-10-phenylanthracene, which was target matter, was obtained (synthetic scheme (b-4)).

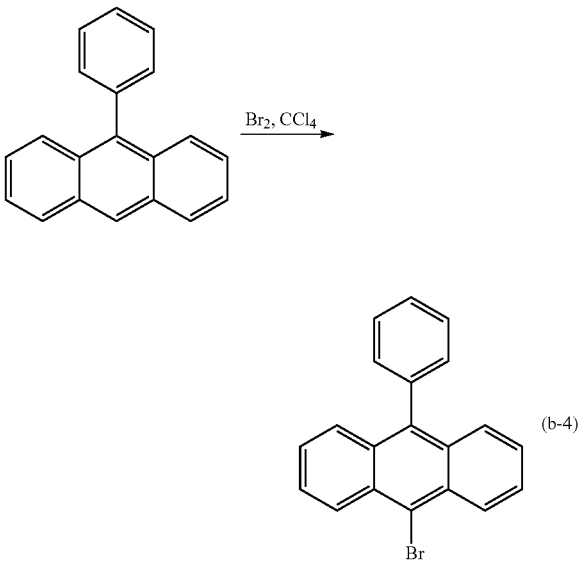

(b-4)

(iii) Synthesis of 9-iodine-10-phenylanthracene

First, 3.33 g (10 mmol) of 9-bromo-10-phenylanthracene was dissolved in 80 mL of tetrahydrofuran (abbreviation: THF). Thereafter, the mixture was cooled to −78° C., and then 7.5 mL (12.0 mmol) of n-butyllithium (1.6 M) was dropped in the reactive solution by using a dropping funnel. Thereafter, the mixture was stirred for one hour. A solution in which 5 g (20.0 mmol) of iodine was dissolved in 20 mL of THF was dropped. Afterwards, the mixture was stirred at −78° C. for 2 hours. After the reaction, the reaction was stopped by adding a sodium thiosulfate aqueous solution. Then, an organic layer was washed with a sodium thiosulfate aqueous solution and saturated saline in this order. After the washing, the organic layer was dried with magnesium sulfate. After the product was naturally filtrated, the filtrate was concentrated. The thus-obtained solid was recrystallized by ethanol. Thus, 3.1 g (yield: 83%) of a light yellow solid of 9-iodine-10-phenylanthracene, which was target matter, was obtained (synthetic scheme (b-5)).

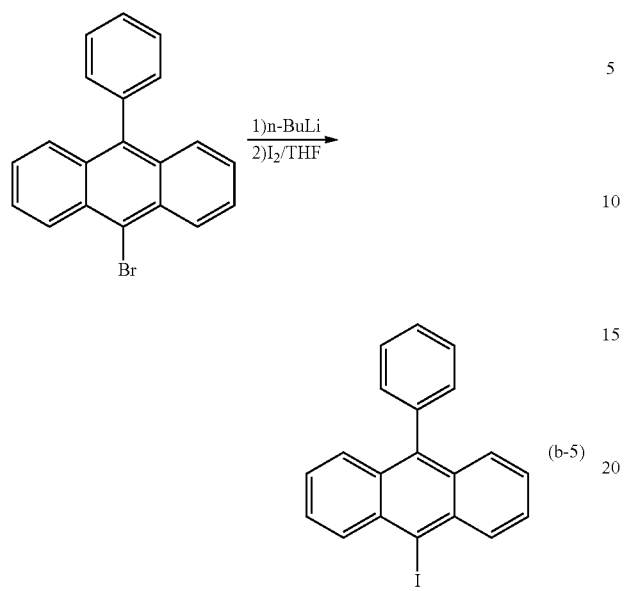

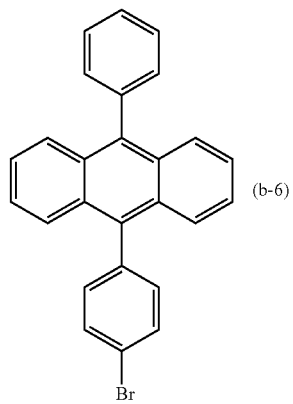

(iv) Synthesis of 9-(4-bromophenyl)-10-phenylanthracene (Abbreviation: PA)

First, 1.0 g (2.63 mmol) of 9-iodine-10-phenylanthracene, 542 mg (2.70 mmol) of p-bromophenyl boronic acid, 46 mg (0.03 mmol) of tetrakis(triphenylphosphine)palladium (O) (abbreviation: Pd(PPh$_3$)$_4$), 3 mL (6 mmol) of an aqueous solution containing 2 mol/L of a potassium carbonate (K$_2$CO$_3$), and 10 mL of toluene were stirred at 80° C. for 9 hours. After the reaction, toluene was added to the product. Then, this solution was filtrated through florisil, celite, and alumina. Subsequently, the filtrate was washed with water and saturated saline in this order. After the washing, the washed filtrate was dried with magnesium sulfate. The product was naturally filtrated and then the filtrate was concentrated. Thereafter, the concentrated filtrate was recrystallized by chloroform and hexane. Thus, 562 mg (yield: 45%) of a light brown solid of 9-(4-bromophenyl)-10-phenylanthracene, which was target matter, was obtained (synthetic scheme (b-6)).

Step 3: Synthesis of YGAPA

First, 409 mg (1.0 mmol) of 9-(4-bromophenyl)-10-phenylanthracene, 339 mg (1.0 mmol) of 9-[4-(N-phenylamino)phenyl]carbazole, 6 mg (0.01 mmol) of Pd(dba)$_2$, 500 mg (5.2 mol) of tert-BuONa, 0.1 mL of P(tert-Bu)$_3$, and 10 mL of toluene were stirred at 80° C. for 4 hours. After the reaction, the solution was washed with water. After the washing, a water layer was extracted with toluene. Then, the water layer was washed by saturated saline along with the organic layer, which was previously washed. After the washing, the product was dried with magnesium sulfate. The product was naturally filtrated, and the filtrate was concentrated. The thus-obtained oily substance was purified by silica gel column chromatography (hexane:toluene=7:3). Thereafter, the product was recrystallized by dichloromethane and hexane. Thus, 534 mg (yield: 81%) of a yellow powder solid of YGAPA, which was target matter, was obtained (synthetic scheme (b-7)). When this compound was measured by a nuclear magnetic resonance (NMR) method, it was confirmed that this compound was YGAPA.

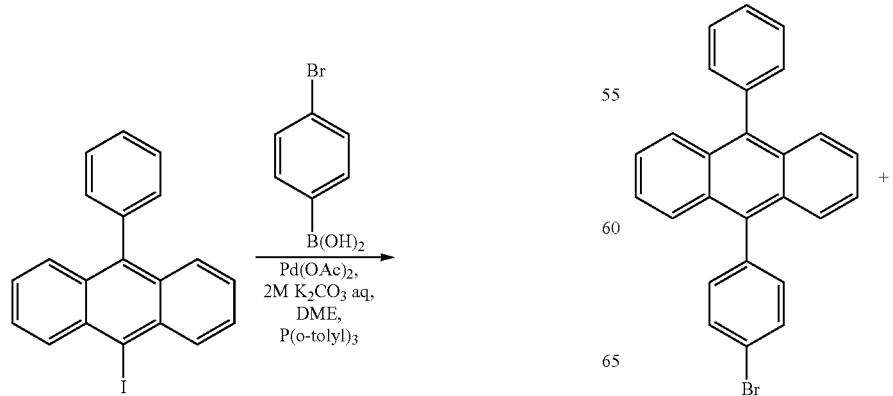

-continued

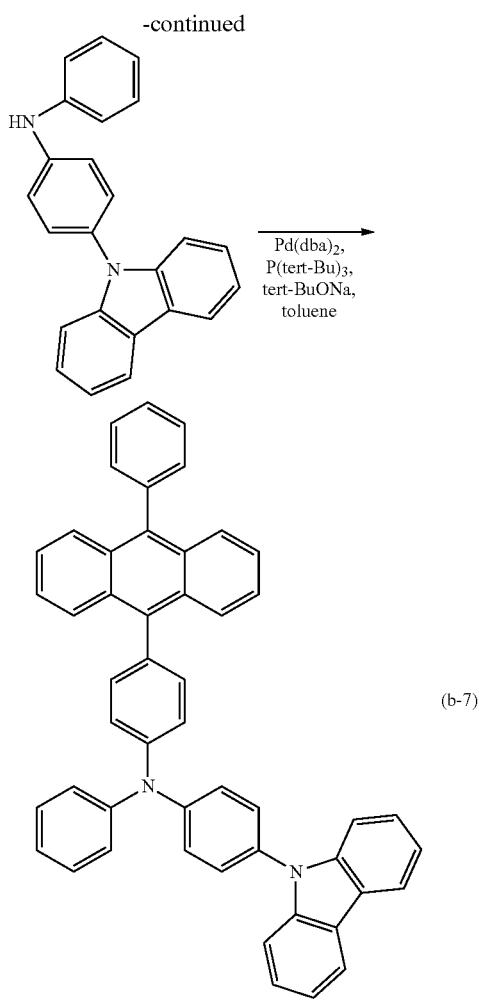

(b-7)

Figure 10A:
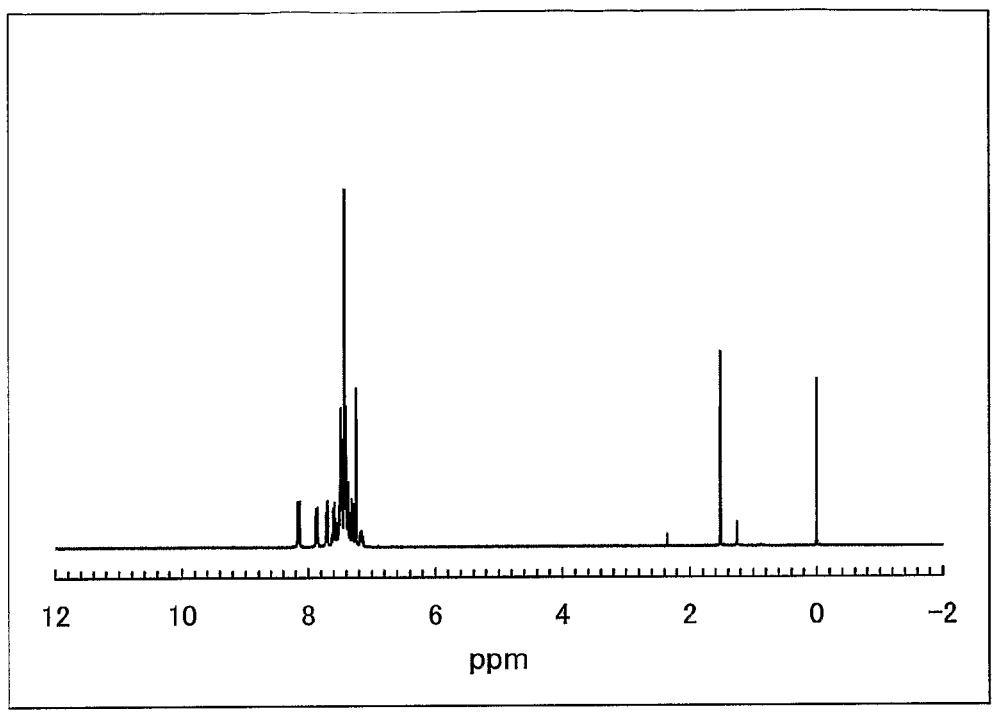
FIGS. 10A and 10B are $^1$H-NMR charts of YGAPA.
Figure 10B:
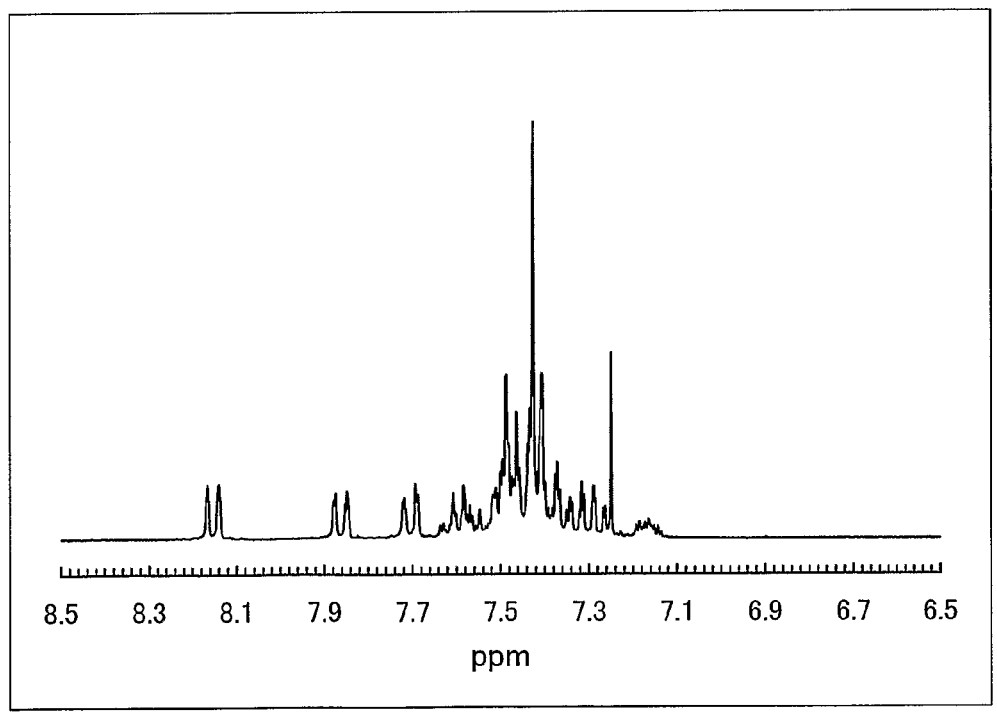

The $^1$H-NMR of this compound is shown in FIGS. 10A and 10B. Further, $^1$H-NMR charts are shown in FIGS. 10A and 10B. Note that FIG. 10B is a chart showing an enlarged portion of FIG. 10A in a range of 6.5 to 8.5 ppm.

Figure 11:
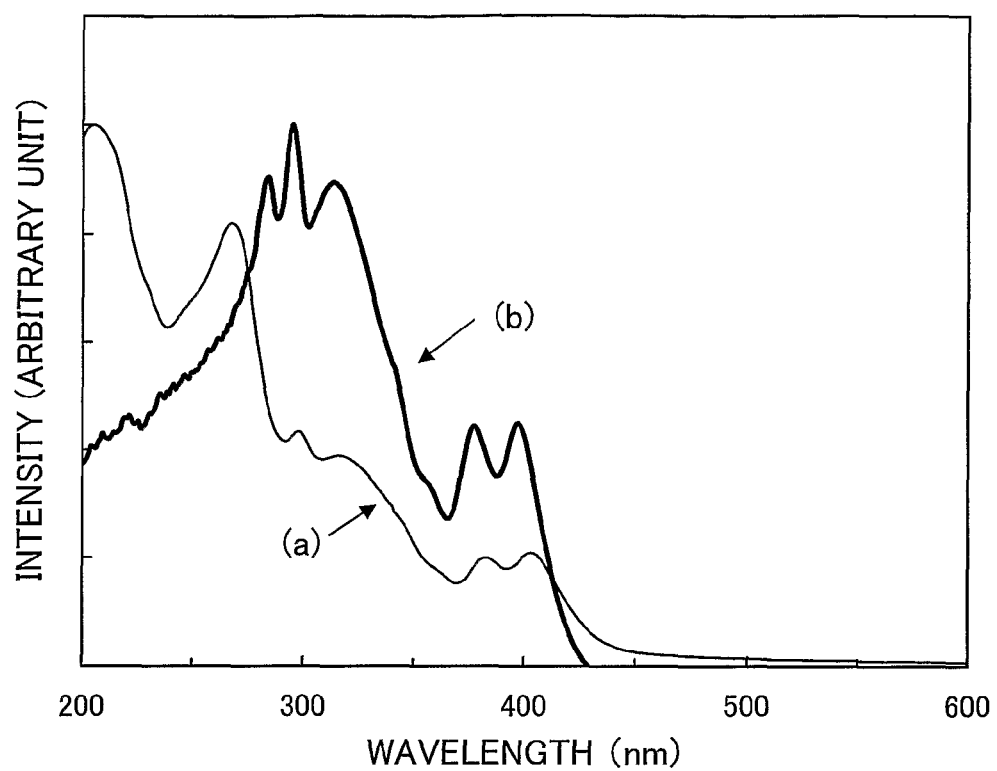
FIG. 11 is a graph showing an absorption spectrum of YGAPA.
Figure 12:
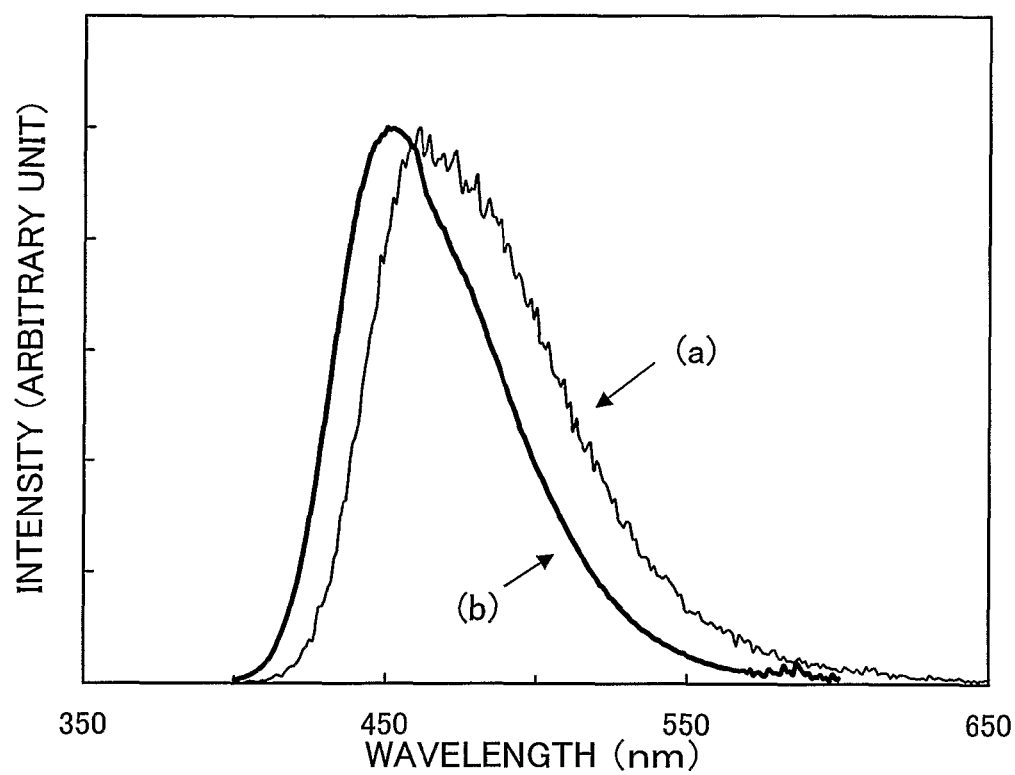
FIG. 12 is a graph showing a light emission spectrum of YGAPA.

Further, an absorption spectrum of YGAPA is shown in FIG. 11. In FIG. 11, a horizontal axis indicates wavelength (nm) and a longitudinal axis indicates intensity (arbitrary unit). Further, in FIG. 11, a curve (a) indicates an absorption spectrum in a single film state. On the other hand, a curve (b) indicates an absorption spectrum in a state where YGAPA was dissolved in a toluene solution. Further, a light emission spectrum of YGAPA is shown in FIG. 12. In FIG. 12, a horizontal axis indicates wavelength (nm) whereas a longitudinal axis indicates light emission intensity (arbitrary unit). Further, a curve (a) indicates a light emission spectrum in a single film state (excitation wavelength: 390 nm). On the other hand, a curve (b) indicates a light emission spectrum in a state where YGAPA was dissolved in a toluene solution (excitation wavelength: 370 nm). According to FIG. 12, light emission from YGAPA has a peak in 461 nm in the single film state. Further, it is also known that light emission from YGAPA has a peak in 454 nm in the toluene solution. Such light emission was confirmed as blue light emission by sight. Accordingly, it was known that YGAPA is a substance suitable as a light emitting substance emitting blue light.

Then, a film was formed using the above-obtained YGAPA by evaporation. When ionization potential of YGAPA in a thin film state was measured by using a photoelectron spectrometer (#AC-2 manufactured by RIKEN KENKI Co. Ltd.), it was 5.55 eV. Further, an absorption spectrum of YGAPA in a thin film state was measured by using a UV/visible light spectrophotometer (#V-550 manufactured by JASCO Corporation). A wavelength of an absorption edge in a long-wavelength side of an absorption spectrum was set as an energy gap (2.95 eV), and then a LUMO level was obtained. As a result of the measurement, the LUMO level was −2.60 eV.

Further, a decomposition temperature Td of the thus-obtained YGAPA was measured by a thermo-gravimetric/differential thermal analyzer (#TG/DTA 320, Seiko Instruments Inc.). The Td was 402° C. or more and it was known that the YGAPA showed a preferable heat resistance property.

Further, a redox reaction characteristic of YGAPA was measured by cyclic voltammetry (CV) measurement. Note that an electrochemical analyzer (# ALS model 600A manufactured by BAS Inc.) was used for the measurement.

A solution used for the CV measurement used dehydrated dimethyl formamide (DMF) as a solvent and tetra-n-buthylammonium perchlorate (n-Bu$_4$NClO$_4$), which was supporting electrolyte, was dissolved in the solvent to be a concentration of 100 mmol/L. Then, YGAPA, which was a target of the measurement, was dissolved and prepared in this solution to be a concentration of 1 mmol/L. Further, a platinum electrode (a PTE platinum electrode manufactured by BAS Inc.) was used as a work electrode, a platinum electrode (a VC-3 Pt counter electrode (5 cm) manufactured by BAS Inc.) was used as an auxiliary electrode, and an Ag/Ag$^+$ electrode (an RE5 nonaqueous solvent-based reference electrode manufactured by BAS Inc.) was used as a reference electrode.

An oxidation reaction characteristic of YGAPA was measured as follows. Potential of the work electrode with respect to the reference electrode was changed to 0.75 V from −0.35 V. Thereafter, scanning for changing potential to −0.35 V from 0.75 V was set to be one cycle and measurement was performed at 100 cycles. Note that the scanning rate of the CV measurement was set to be 0.1 V/s.

A reduction reaction characteristic was measured as follows. Potential of the work electrode with respect to the reference electrode was changed to −2.4 V from −0.55 V. Thereafter, scanning for changing potential to −0.55 V from −2.4 V was set to be one cycle and measurement was performed at 100 cycles. Note that the scanning rate of the CV measurement was set to be 0.1 V/s.

Figure 13A:
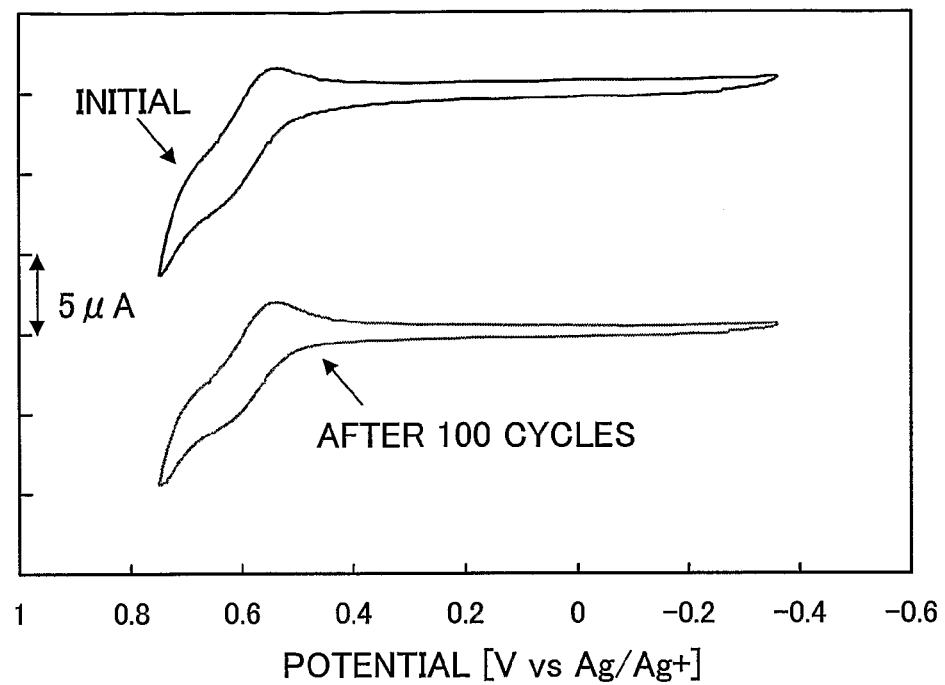
FIGS. 13A and 13B are graphs showing CV curves of YGAPA.
Figure 13B:
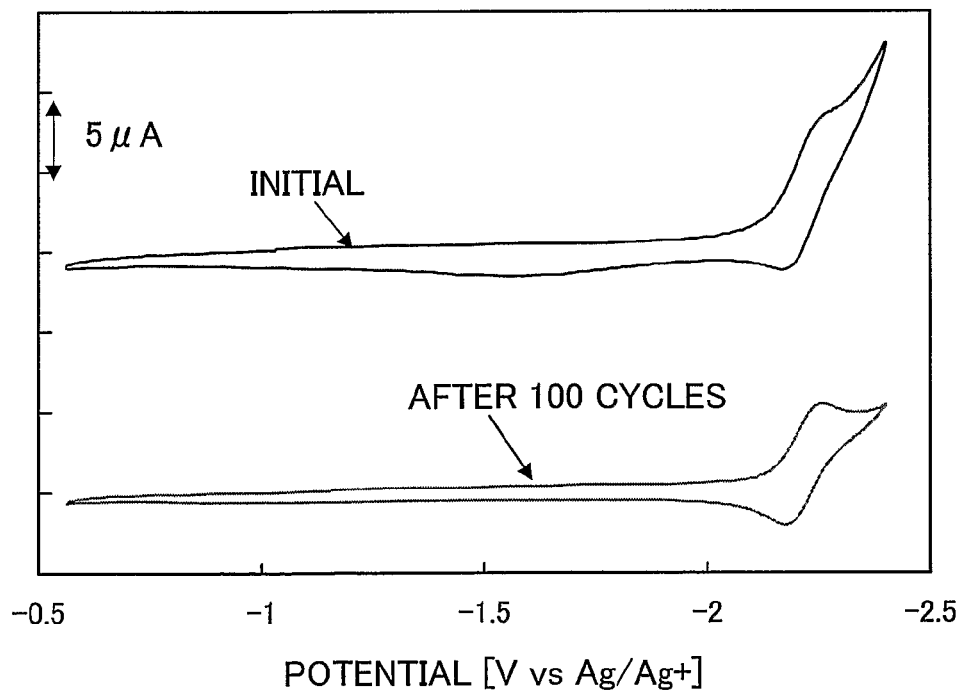

Measurement results of the oxidation reaction characteristic of YGAPA are shown in FIG. 13A. Measurement results of the reduction reaction characteristic of YGAPA are shown in FIG. 13B. In each of FIGS. 13A and 13B, a horizontal axis indicates voltage (V) of the work electrode with respect to the reference electrode whereas a longitudinal axis indicates the value of current (1×10$^{-5}$ A) flowing between the work electrode and the auxiliary electrode.

According to FIG. 13A, it was known that oxidation potential was 0.6 V (vs. Ag/Ag$^+$ electrode). According to FIG. 13B, it was also known that reduction potential was −2.29 V (vs. Ag/Ag$^+$ electrode). Further, it was observed that each of the CV curves of the oxidation reaction and the reduction reaction has a clear peak regardless of the repetition of scanning at 100 cycles. Accordingly, it was known that an anthracene derivative of the present invention is a substance showing an excellent reversibility with respect to a redox reaction, and in particular, an oxidation reaction. Therefore, it can be said that an anthracene derivative of the present invention has an excellent resistance property to the oxidation reaction.

Note that when YGAPA was synthesized by the method described in the embodiment modes, it can be synthesized with extremely good yield.

Embodiment 2

In this embodiment, a light emitting element manufactured using an anthracene derivative of the present invention will be described.

The light emitting element was formed over a glass substrate. First, an ITSO film was formed as a first electrode to have a thickness of 110 nm. The ITSO film was formed by sputtering. Thereafter, the first electrode was etched to have a square shape of 2 mm×2 mm. Then, prior to forming the light emitting element over the first electrode, a surface of the substrate was washed with a porous resin (typically, manufactured by PVA (polyvinyl alcohol), nylon or the like). Further, after performing heat treatment at 200° C. for one hour, UV ozone treatment was carried out for 370 seconds.

Next, a hole injecting layer was formed to have a thickness of 50 nm. Subsequently, an NPB film was formed as a hole transporting layer to have a thickness of 10 nm. Then, over these stacked layers, a light emitting layer was formed using 9-[4-(N-carbazolyl)]phenyl-10-phenylanthracene (abbreviation: CzPA) and YGAPA, which is an anthracene derivative described in Embodiment Mode 1, such that a mass ratio between CzPA and YGAPA was set to be 1:0.04. The thickness of the light emitting layer was set to be 40 nm. As an electron transporting layer, an $Alq_3$ film was formed to have a thickness of 10 nm. Then, an electron injecting layer was formed using $Alq_3$ and lithium such that a mass ratio between $Alq_3$ and lithium was 1:0.01. The thickness of the electron injecting layer was set to be 10 nm. Subsequently, as a second electrode, an Al film was formed to have a thickness of 200 nm. Thus, the light emitting element was completed. Finally, the light emitting element was sealed under a nitrogen atmosphere so as not to be exposed to atmospheric air.

Note that each of the films from the hole injecting layer to the second electrode was formed by vacuum evaporation using resistance heating. Here, an element using a material in which a hole injecting layer was formed using NPB and molybdenum oxide such that a mass ratio between NPB and molybdenum oxide was 4:2 was denoted by an element 1. An element using a material in which a hole injecting layer was formed using DNTPD and molybdenum oxide such that a mass ratio between DNTPD and molybdenum oxide was 4:2 was denoted by an element 2. Further, an element in which a hole injecting layer was formed only using DNTPD was denoted by an element 3. Further, as a comparative example, an element 4 was formed as follows: an element structure other than a light emitting layer was formed in the same manner as the element 1, and the light emitting layer was formed using CzPA and 9,10-diphenylanthracene such that a mass ratio between CzPA and 9,10-diphenylanthracene was 1:0.25.

Each light emitting element manufactured above can emit light upon being applied with voltage, which is not less than a certain level, such that voltage of the first electrode is higher than that of the second electrode. This is because holes injected from the first electrode and electrons injected from the second electrode are recombined in the light emitting layer to generate light emission.

Figure 14:
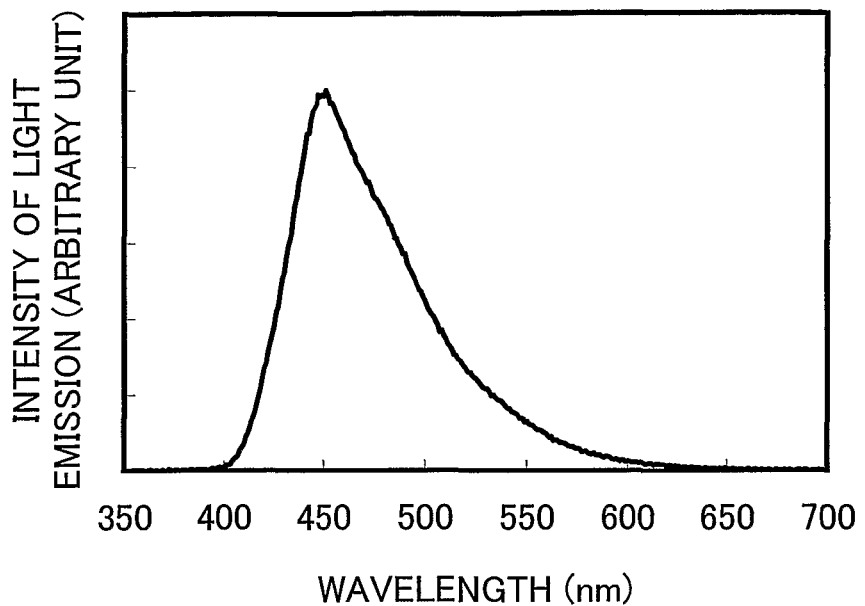
FIG. 14 is a graph showing a light emission spectrum of an element 1.
Figure 15:
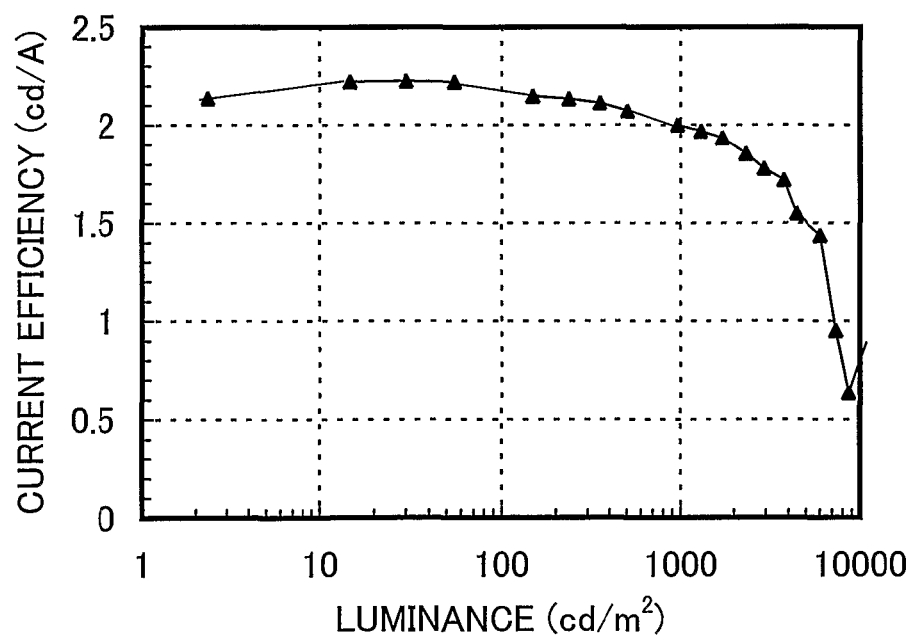
FIG. 15 is a graph showing a luminance-current efficiency characteristic of the element 1.
Figure 16:
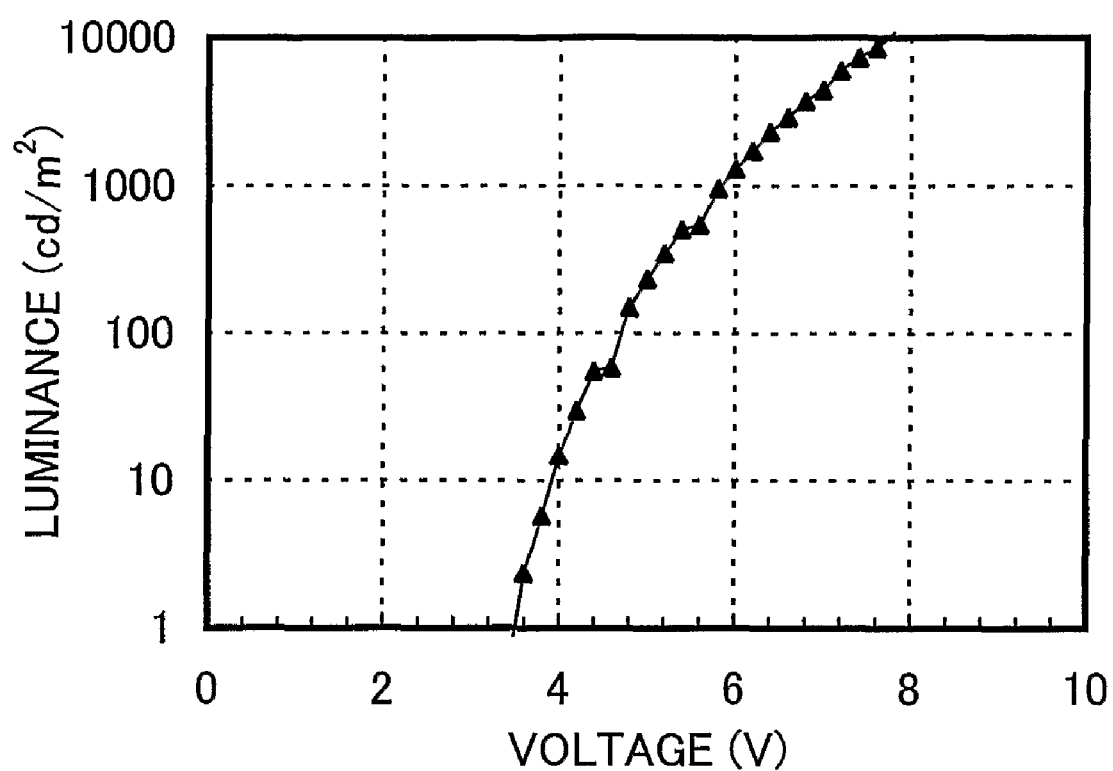
FIG. 16 is a graph showing a voltage-luminance characteristic of the element 1.
Figure 17:
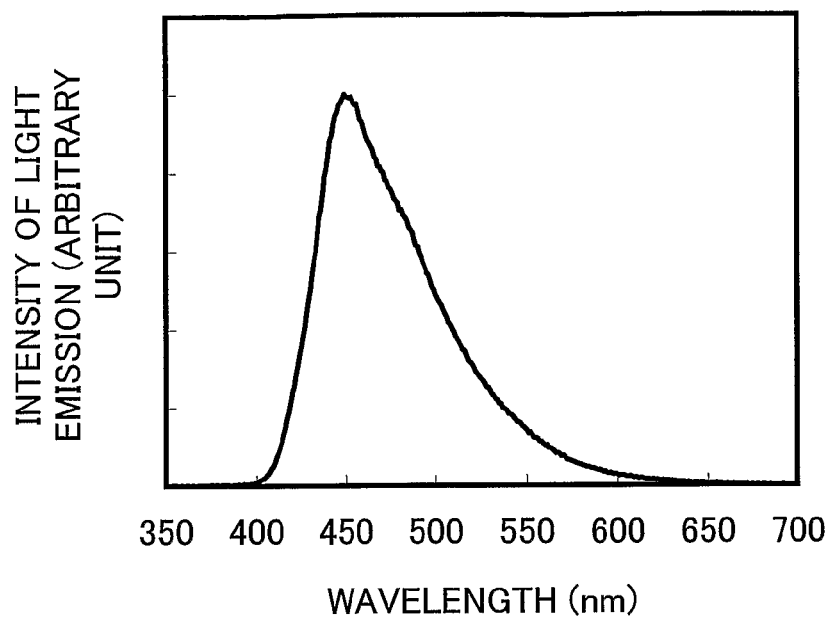
FIG. 17 is a graph showing a light emission spectrum of an element 2.
Figure 18:
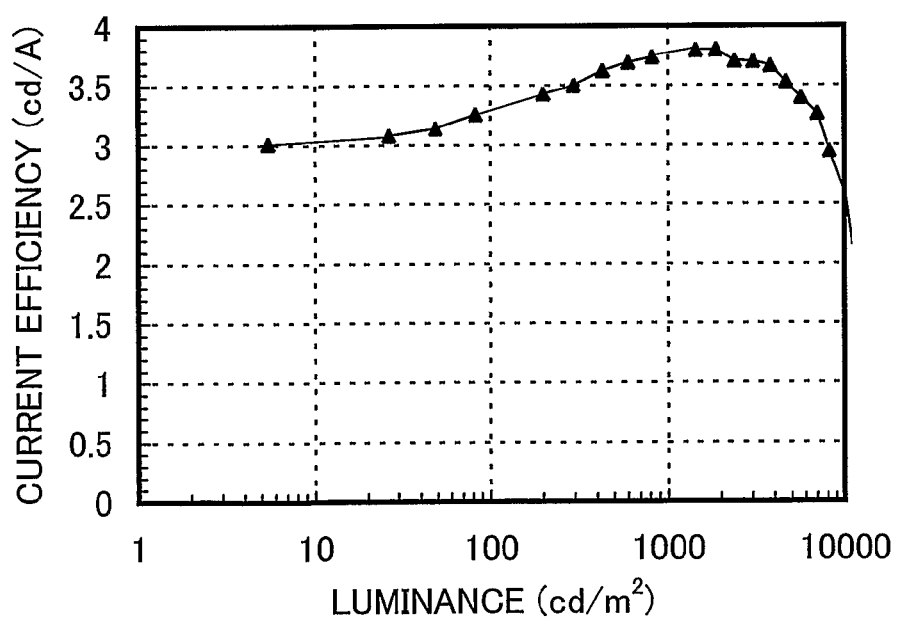
FIG. 18 is a graph showing a luminance-current efficiency characteristic of the element 2.
Figure 19:
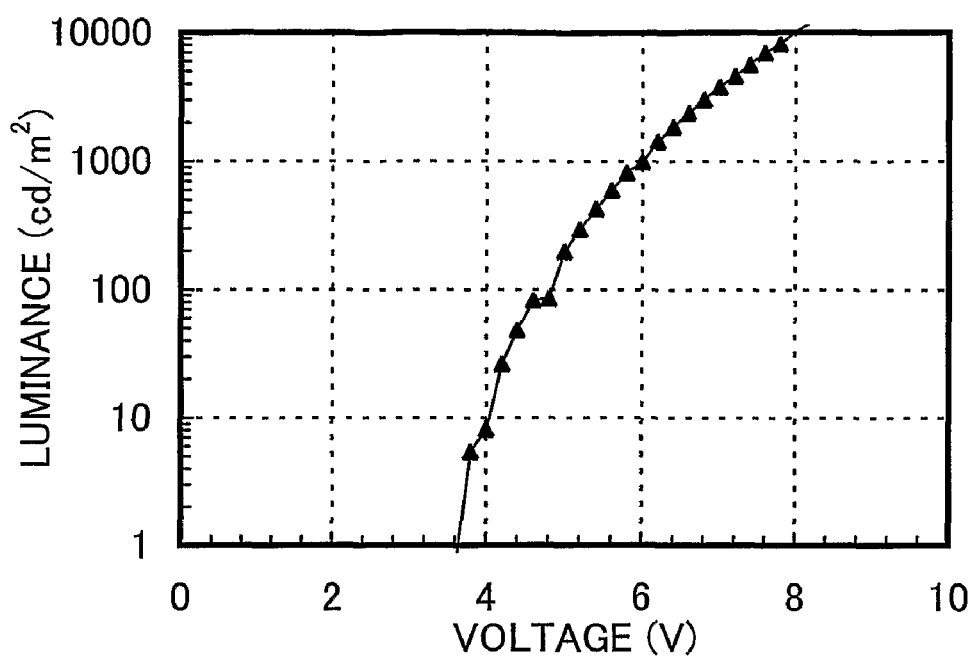
FIG. 19 is a graph showing a voltage-luminance characteristic of the element 2.
Figure 20:
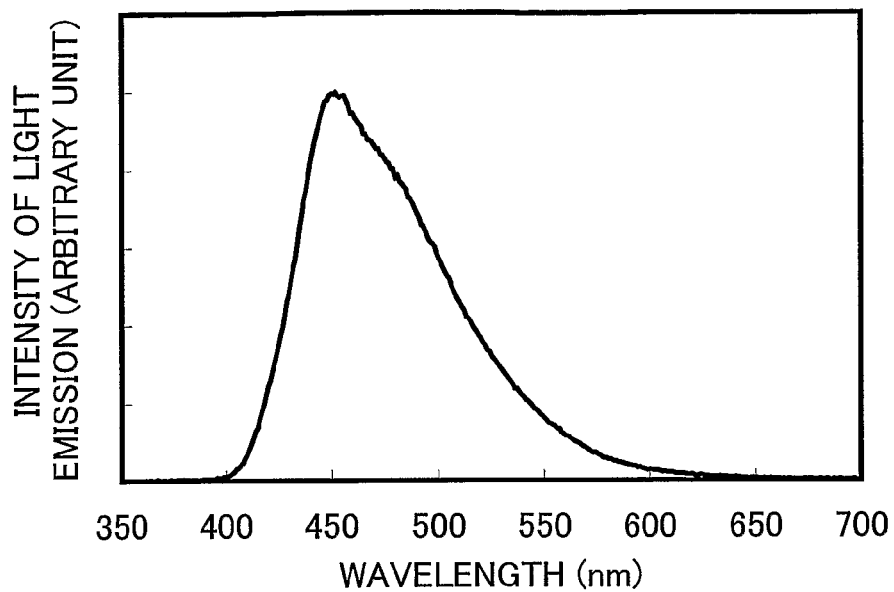
FIG. 20 is a graph showing a light emission spectrum of an element 3.
Figure 21:
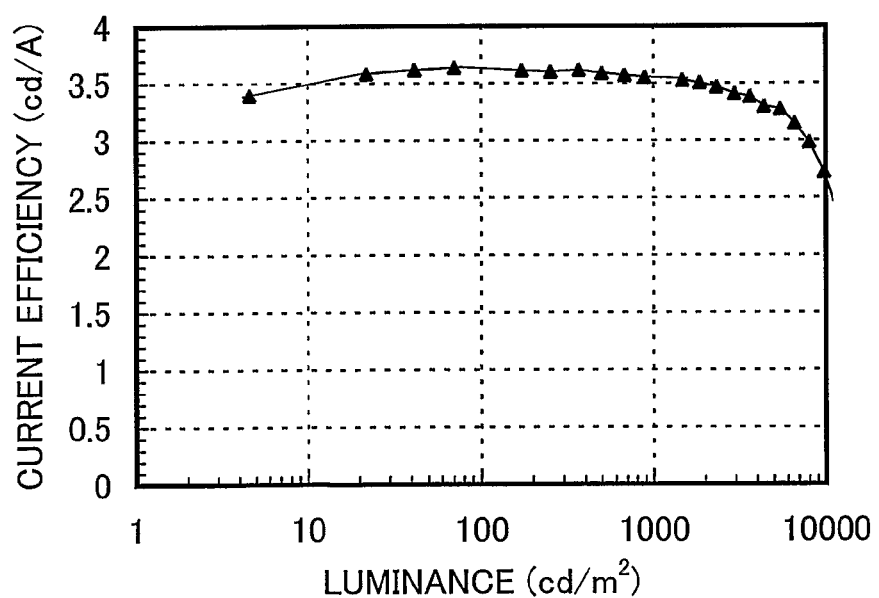
FIG. 21 is a graph showing a luminance-current efficiency characteristic of the element 3.
Figure 22:
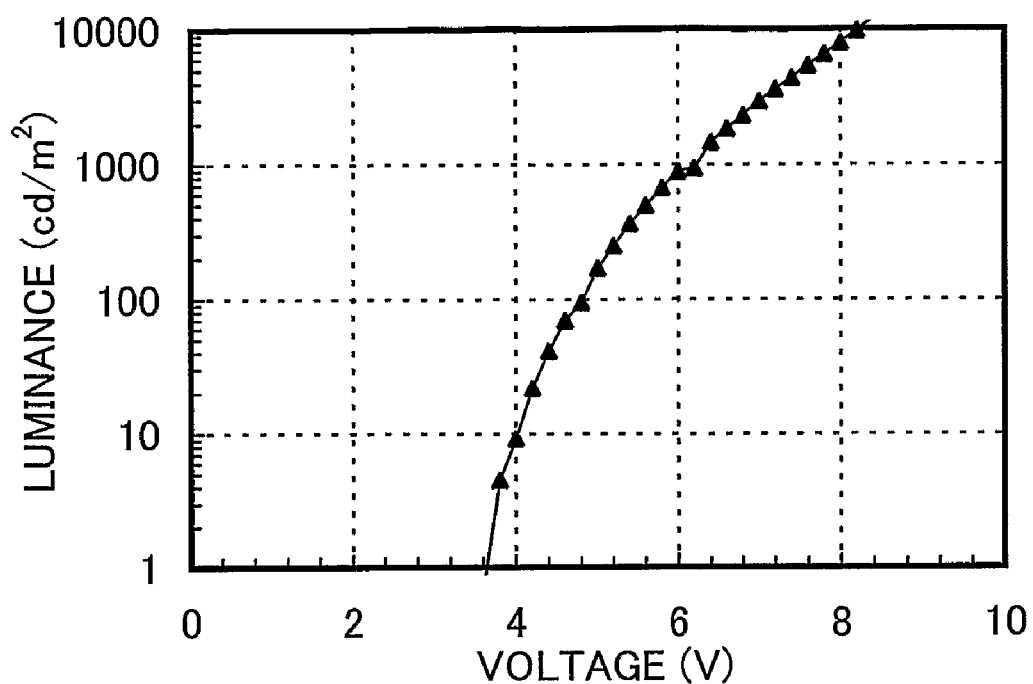
FIG. 22 is a graph showing a voltage-luminance characteristic of the element 3.
Figure 23:
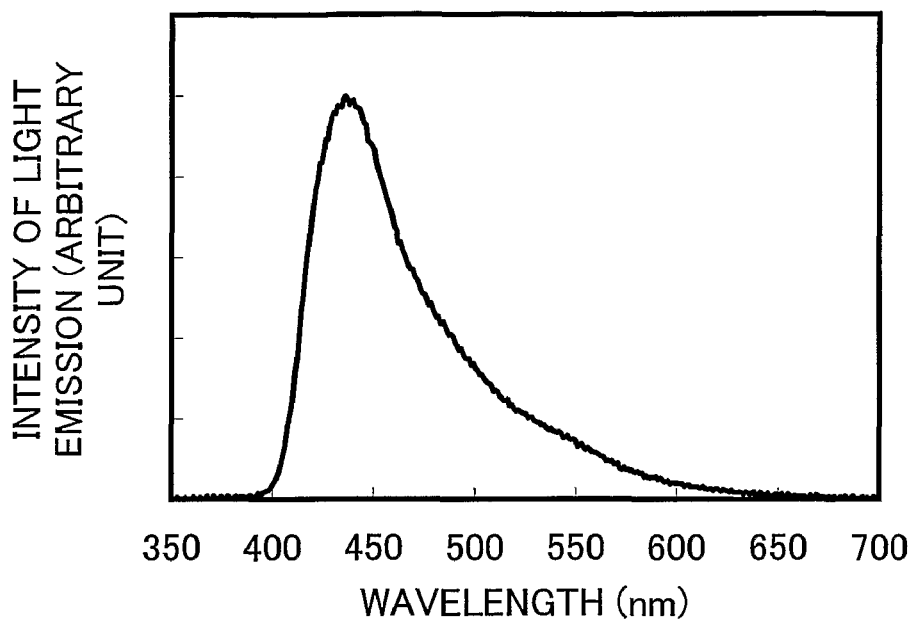
FIG. 23 is a graph showing a light emission spectrum of an element 4.
Figure 24:
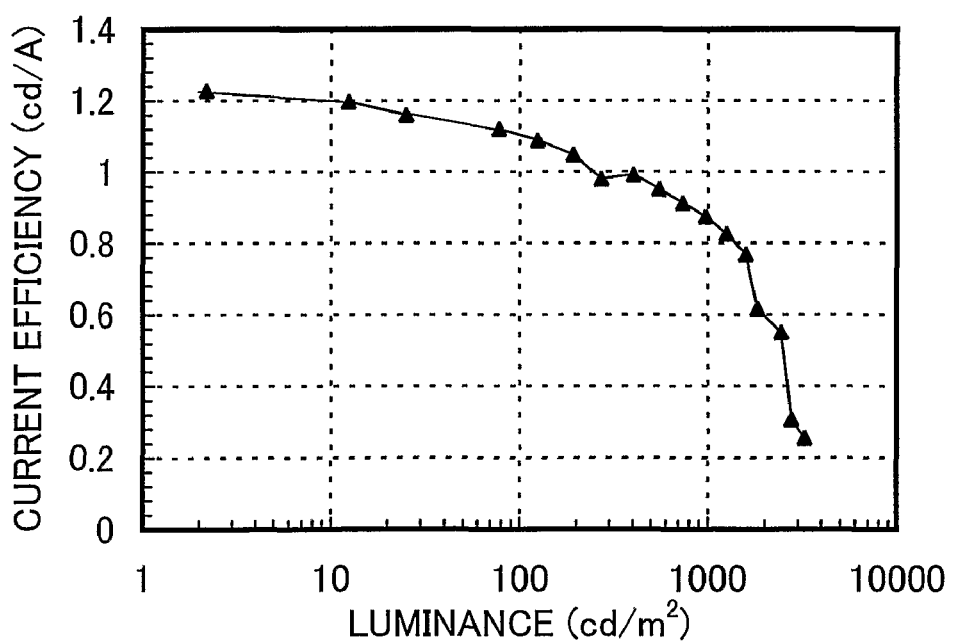
FIG. 24 is a graph showing a luminance-current efficiency characteristic of the element 4.
Figure 25:
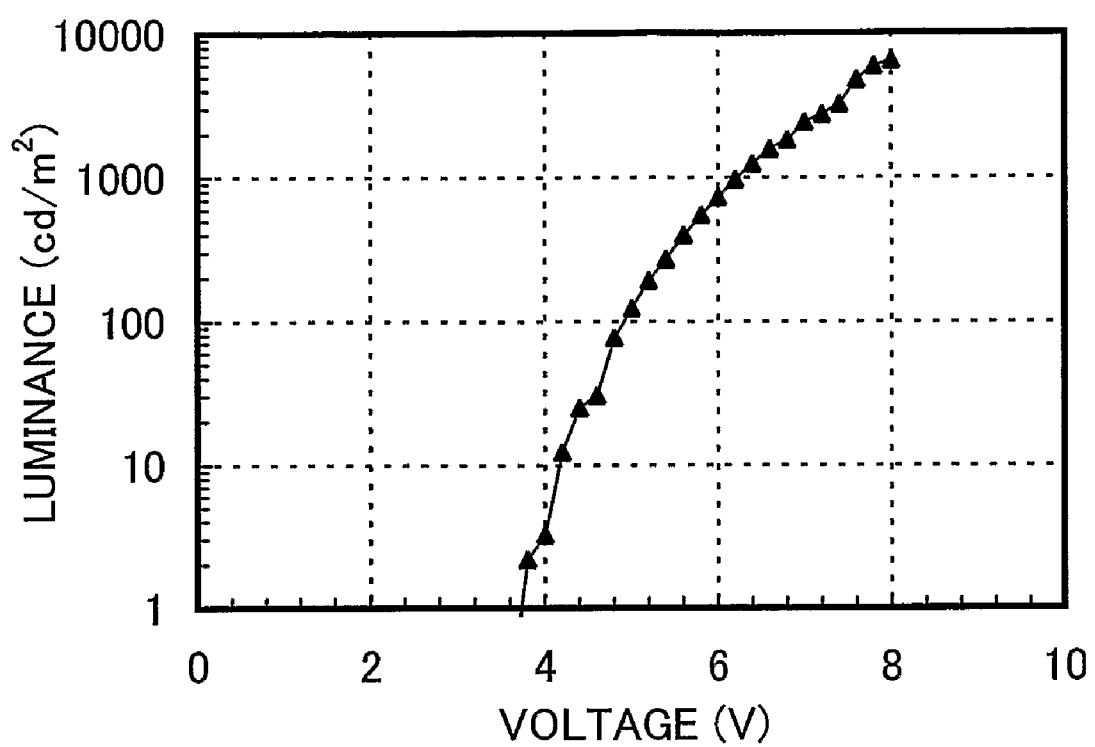
FIG. 25 is a graph showing a voltage-luminance characteristic of the element 4.

A light emission spectrum, a luminance-current efficiency characteristic, and a voltage-luminance characteristic of the element 1 are shown in FIG. 14, FIG. 15, and FIG. 16, respectively. A light emission spectrum, a luminance-current efficiency characteristic, and a voltage-luminance characteristic of the element 2 are shown in FIG. 17, FIG. 18, and FIG. 19, respectively. A light emission spectrum, a luminance-current efficiency characteristic, and a voltage-luminance characteristic of the element 3 are shown in FIG. 20, FIG. 21, and FIG. 22, respectively. Further, a light emission spectrum, a luminance-current efficiency characteristic, and a voltage-luminance characteristic of the element 4 using 9,10-diphenylanthracene, which is a representative blue light emitting material, as a light emitting material are shown in FIG. 23, FIG. 24, and FIG. 25, respectively.

Further, element characteristics in cases of making the elements 1 through 4 emit light at about 1,000 $cd/m^2$ are shown in Table 1.

TABLE 1

| | Voltage(V) | Maximal light emission wavelength (nm) | Chromaticity x | Chromaticity y | Current efficiency (cd/A) | Power efficiency (lm/W) |
|---|---|---|---|---|---|---|
| Element 1 | 5.8 | 456 | 0.16 | 0.14 | 2.00 | 1.08 |
| Element 2 | 6.0 | 452 | 0.16 | 0.16 | 3.46 | 1.81 |
| Element 3 | 6.2 | 453 | 0.16 | 0.17 | 2.93 | 1.48 |
| Element 4 | 6.2 | 440 | 0.16 | 0.12 | 0.88 | 0.44 |

* at the time of about 1,000 $cd/m^2$

The light emitting elements 1 to 3, which are light emitting elements of the present invention, have maximal light emission wavelengths in a range of 452 to 457 nm. Further, the elements 1 to 3 emit blue light with excellent color purity as follows: chromaticity coordinates in a CIE color coordinate system of the element 1 are (x, y)=(0.16, 0.14), chromaticity coordinates in the CIE color coordinate system of the element 2 are (x, y)=(0.16, 0.16), and chromaticity coordinates in the CIE color coordinate system of the element 3 are (x, y)=(0.16, 0.17). Further, it was also known that the elements 1 to 3 showed more preferable characteristics than the element 4, which used 9,10-diphenylanthracene as a light emitting material. That is, as compared with the element 4, each of the elements 1 to 3 has higher current efficiency and higher power efficiency. In addition, stronger light emission to voltage to be applied can be obtained in the elements 1 to 3 than the element 4.

Figure 26:
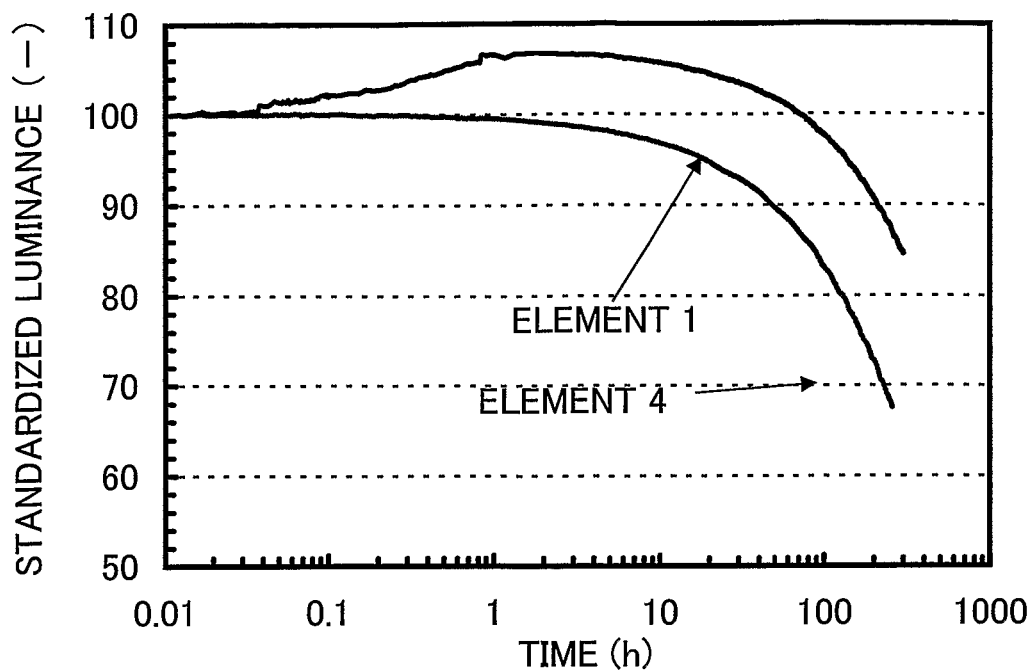
FIG. 26 is a graph showing reliability of the element 1 and the element 4.

Further, measurement results of change in luminance with respect to driving time of the element 1 and the element 4 are shown in FIG. 26. A graph of FIG. 26 shows change in luminance when the elements 1 and 4 were driven under a condition of initial luminance of 500 $cd/m^2$ and constant current density. As apparent from FIG. 26, it took 300 hours until the luminance of the element 1 deceased to 85% with respect to the initial luminance whereas it took 260 hours until the luminance of the element 4 using 9,10-diphenylanthracene as a light emitting material, which is a representative blue light emitting material, decreased to 65% with respect to the initial luminance. Accordingly, it is known that change in luminance with respect to driving time of the element 1, which is a light emitting element of the present invention, i.e., reliability of the element 1 is more drastically improved as compared with the element 4 using 9,10-diphenylanthracene as a light emitting material, which is a representative blue light emitting material.

Reference Example

An example of a method for synthesizing 9-[4-(N-carbazolyl)]phenyl-10-phenylanthracene (CzPA) represented by the following structural formula (304), which is a new substance used in this embodiment, will be shown below.

A synthesizing method of CzPA using 9-(4-bromophenyl)-10-phenylanthracene, which is obtained by the step 2 of Embodiment 1, as a starting material, will be shown. A mixture of 1.3 g (3.2 mmol) of 9-(4-bromophenyl)-10-phenylanthracene, 578 mg (3.5 mmol) of carbazole, 50 mg (0.017 mmol) of bis(dibenzylideneacetone)palladium (O), 1.0 mg (0.010 mmol) of t-butoxysodium, 0.1 mL of tri(t-butylphosphine), and 30 mL of toluene was refluxed with heating at 110° C. for 10 hours. After the reaction, the reactive solution was washed with water. After the washing, a water layer was extracted with toluene. After the extraction, the extract was washed with saturated saline along with an organic layer. After the washing, the product was dried with magnesium sulfate. After the product was naturally filtrated, the filtrate was concentrated. The thus-obtained oily substance was purified by silica gel column chromatography (hexane:toluene 7:3). Thereafter, the purified matter was recrystallized by dichloromethane and hexane. Thus, 1.5 g (yield: 93%) of CzPA, which was target matter, was obtained. When 5.50 g of the thus-obtained CzPA was sublimed and purified at 270° C. for 20 hours under argon stream (flow rate: 3.0 mL/min) and under a condition of 6.7 Pa of pressure, 3.98 g was collected (collection rate was 72%). A synthetic scheme of CzPA from 9-phenyl-10-(4-bromophenyl)anthracene will be shown below.

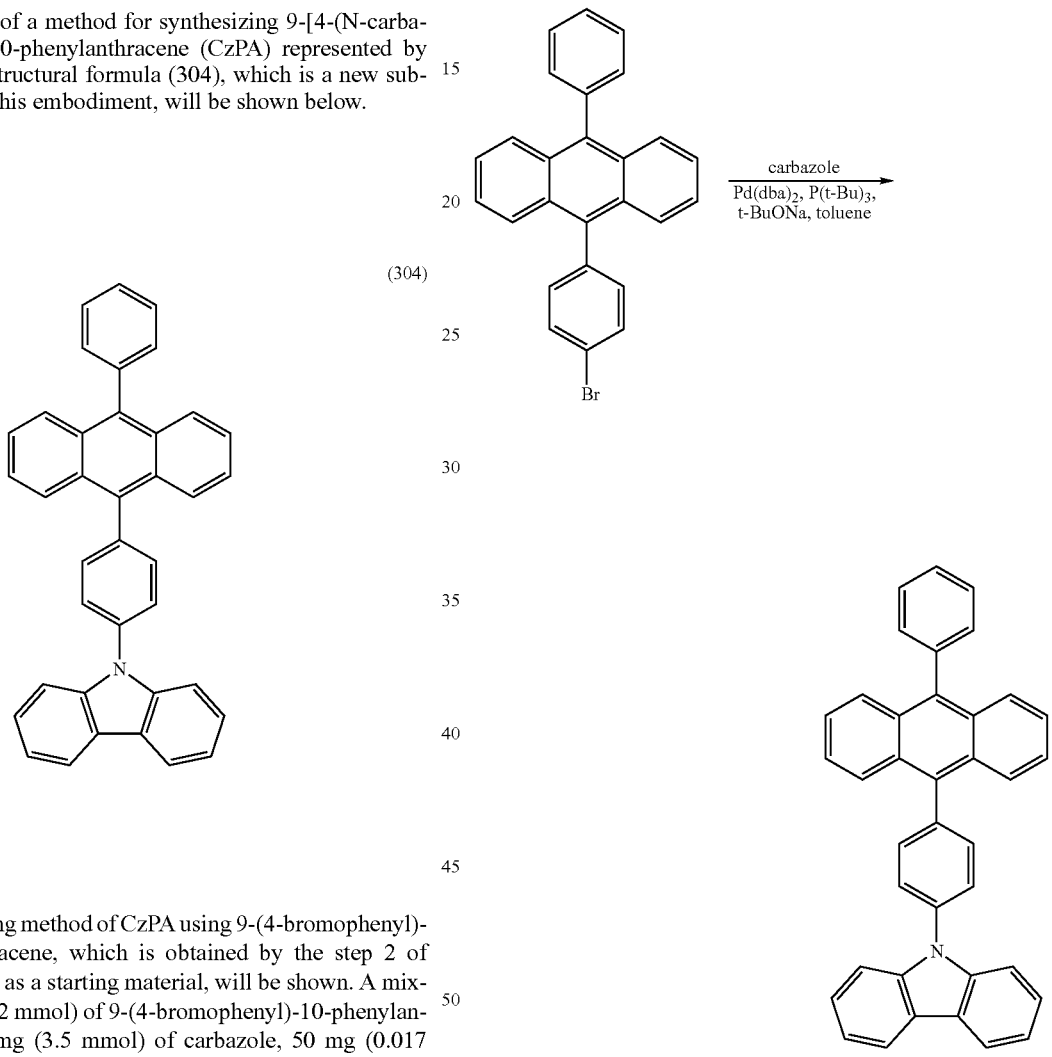

Figure 27:
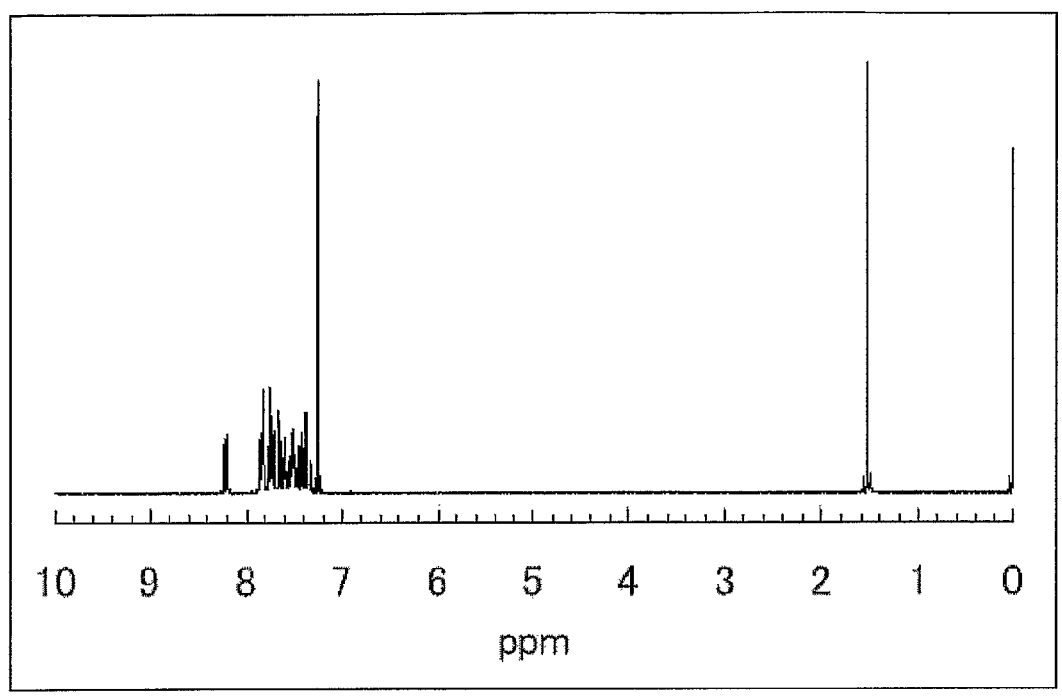
FIG. 27 is a $^1$H-NMR chart of CzPA.

NMR data of the thus-obtained CzPA is shown below. The $^1$H NMR (300 MHz, CDCl$_3$); δ ppm: 8.22 (d, J=7.8 Hz, 2H), 7.86-7.82 (m, 3H), 7.61-7.36 (m, 20H). Further, a chart of the $^1$H NMR is shown in FIG. 27.

CzPA was a light yellow power solid. A thermogravimetry-differential thermal analysis (TG-DTA) of CzPA was carried out. A thermo-gravimetric/differential thermal analyzer (#TG/DTA 320, Seiko Instruments Inc.) was used for the measurement. Then, a thermophysical property was evaluated at 10° C./min of temperature increase rate under a nitrogen atmosphere. As a result of a relation between gravity and temperature (thermogravimetric measurement), in a kick-off temperature under normal pressure, the temperature that the gravity becomes less than 95% of the gravity at the start of the measurement was 348° C. Further, a glass transition temperature and a melting point of CzPA were measured by using a differential scanning calorimetry (DSC) analysis device (#Pyrisl DSC manufactured by PerkinElmer Inc.). As a result of the measurement, the glass transition temperature was 125° C. and the melting point was 305° C. so that it was known that CzPA was thermally-stable.

This application is based on Japanese Patent Application Serial No. 2005-216971 filed in Japan Patent Office on Jul. 27, 2005, the entire contents of which are hereby incorporated by reference.

The invention claimed is:

1. An anthracene derivative represented by the following general formula:

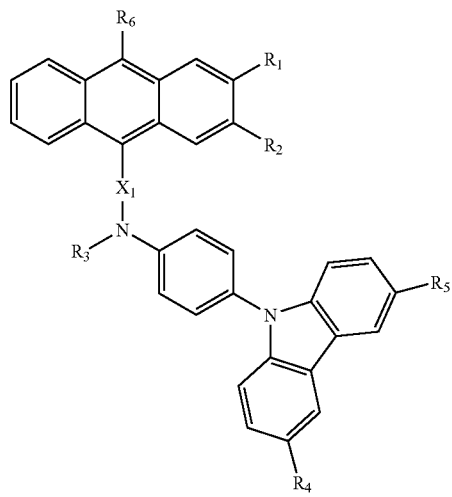

wherein $R_1$ and $R_2$ individually represent hydrogen or an alkyl group having 1 to 4 carbon atoms, and at least one of $R_1$ and $R_2$ is hydrogen, wherein $R_3$ represents an aryl group having 6 to 15 carbon atoms, wherein $R_4$ represents any one selected from hydrogen, an alkyl group having 1 to 4 carbon atoms, and an aryl group having 6 to 15 carbon atoms, wherein $R_5$ represents any one selected from hydrogen, an alkyl group having 1 to 4 carbon atoms, and an aryl group having 6 to 15 carbon atoms, wherein $R_6$ represents an aryl group having 6 to 15 carbon atoms, and wherein $X_1$ represents an arylene group having 6 to 15 carbon atoms.

2. An anthracene derivative represented by the following general formula:

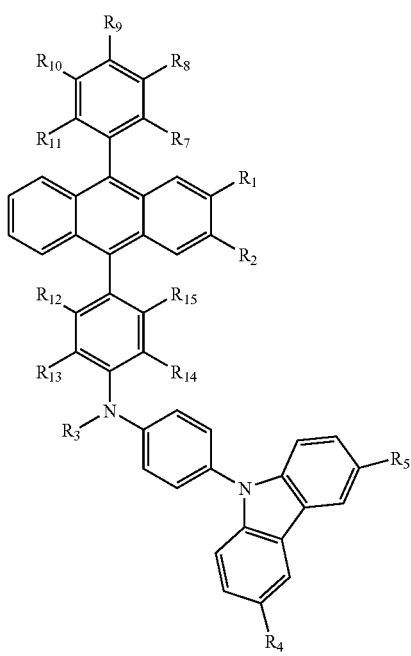

wherein $R_1$ and $R_2$ individually represent hydrogen or an alkyl group having 1 to 4 carbon atoms, and at least one of $R_1$ and $R_2$ is hydrogen, wherein $R_3$ represents an aryl group having 6 to 15 carbon atoms, wherein $R_4$ represents any one selected from hydrogen, an alkyl group having 1 to 4 carbon atoms, and an aryl group having 6 to 15 carbon atoms, wherein $R_5$ represents any one selected from hydrogen, an alkyl group having 1 to 4 carbon atoms, and an aryl group having 6 to 15 carbon atoms, wherein $R_7$ to $R_{11}$ individually represent any of hydrogen, an alkyl group having 1 to 4 carbon atoms, and a phenyl group, and wherein $R_{12}$ to $R_{15}$ individually represent hydrogen or an alkyl group having 1 to 4 carbon atoms.

3. An anthracene derivative represented by the following general formula:

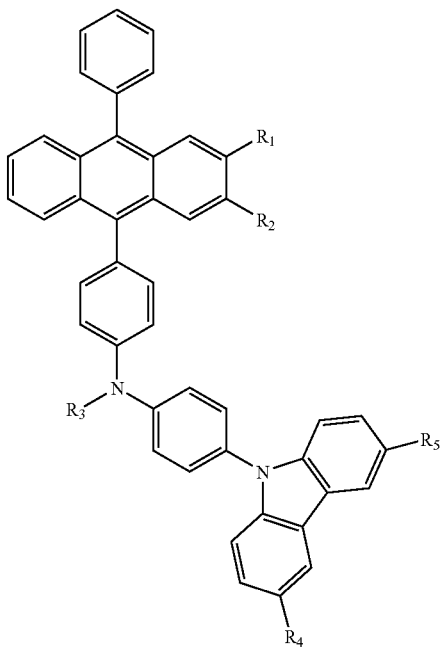

wherein $R_1$ and $R_2$ individually represent hydrogen or an alkyl group having 1 to 4 carbon atoms, and at least one of $R_1$ and $R_2$ is hydrogen, wherein $R_3$ represents an aryl group having 6 to 15 carbon atoms, wherein $R_4$ represents any one selected from hydrogen, an alkyl group having 1 to 4 carbon atoms, and an aryl group having 6 to 15 carbon atoms, and wherein $R_5$ represents any one selected from hydrogen, an alkyl group having 1 to 4 carbon atoms, and an aryl group having 6 to 15 carbon atoms.

4. An anthracene derivative represented by the following general formula:

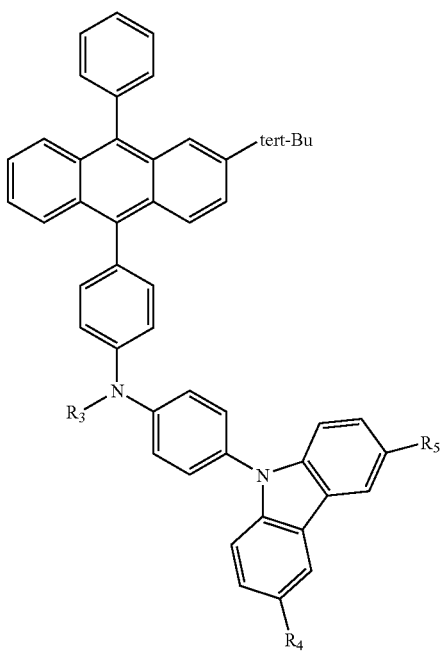

wherein $R_3$ represents an aryl group having 6 to 15 carbon atoms, wherein $R_4$ represents any one selected from hydrogen, an alkyl group having 1 to 4 carbon atoms, and an aryl group having 6 to 15 carbon atoms, and wherein $R_5$ represents any one selected from hydrogen, an alkyl group having 1 to 4 carbon atoms, and an aryl group having 6 to 15 carbon atoms.

5. An anthracene derivative represented by the following general formula:

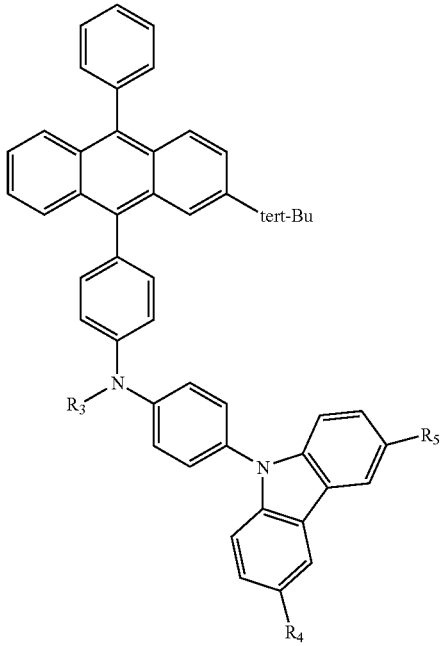

wherein $R_3$ represents an aryl group having 6 to 15 carbon atoms, wherein $R_4$ represents any one selected from hydrogen, an alkyl group having 1 to 4 carbon atoms, and an aryl group having 6 to 15 carbon atoms, and wherein $R_5$ represents any one selected from hydrogen, an alkyl group having 1 to 4 carbon atoms, and an aryl group having 6 to 15 carbon atoms.

6. A light emitting element material containing the anthracene derivative according to any one of claim 1 to claim 5.

7. A light emitting element comprising:
a layer containing at least an organic compound layer interposed between a first electrode and a second electrode,
wherein the organic compound layer contains the anthracene derivative according to any one of claim 1 to claim 5.

8. A light emitting device comprising:
the light emitting element described in claim 7; and
a means for controlling light emission of the light emitting element.

9. An electronic appliance comprising:
a display portion comprising the light emitting element described in claim 7; and
a means for controlling the light emitting element.

10. The anthracene derivative according to any one of claim 1 to claim 5,
wherein $R_3$ represents one of a naphthyl group, a biphenylyl group, and a fluorenyl group.

* * * * *